US012490652B2

(12) United States Patent
Kim et al.

(10) Patent No.: US 12,490,652 B2
(45) Date of Patent: Dec. 2, 2025

(54) ORGANIC OPTOELECTRONIC DEVICE AND DISPLAY DEVICE

(71) Applicant: SAMSUNG SDI CO., LTD., Yongin-si (KR)

(72) Inventors: Byungku Kim, Yongin-si (KR); Giwook Kang, Yongin-si (KR); Dong Min Kang, Yongin-si (KR); Jun Seok Kim, Yongin-si (KR); Eun Sun Yu, Yongin-si (KR); Sangshin Lee, Yongin-si (KR); Sangil Lee, Yongin-si (KR); Kipo Jang, Yongin-si (KR); Jinhyun Lui, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 553 days.

(21) Appl. No.: 16/675,543

(22) Filed: Nov. 6, 2019

(65) Prior Publication Data

US 2020/0144510 A1 May 7, 2020

(30) Foreign Application Priority Data

Nov. 7, 2018 (KR) ........................ 10-2018-0136029

(51) Int. Cl.
*H10K 85/60* (2023.01)
*H10K 50/11* (2023.01)
(Continued)

(52) U.S. Cl.
CPC ......... *H10K 85/636* (2023.02); *H10K 85/622* (2023.02); *H10K 85/633* (2023.02);
(Continued)

(58) Field of Classification Search
None
See application file for complete search history.

(56) References Cited

U.S. PATENT DOCUMENTS 9,466,803 B1 10/2016 Park et al.
2012/0112174 A1* 5/2012 Lee ................................ 257/40
(Continued)

FOREIGN PATENT DOCUMENTS

CN 104903421 A 9/2015
CN 107056746 A 8/2017
(Continued)

OTHER PUBLICATIONS

English translation of KR 2018/0069475 A and the original KR 2018/0069475 A, Hoe Moon Kim, Jun. 25, 2018 (Year: 2018).*
(Continued)

*Primary Examiner* — Seokmin Jeon
(74) *Attorney, Agent, or Firm* — Lee IP Law, P.C.

(57) ABSTRACT

An organic optoelectronic device includes an anode and a cathode facing each other, a light emitting layer disposed between the anode and the cathode, the light emitting layer including a first compound represented by a combination of Chemical Formula 1 and Chemical Formula 2, and a second compound represented by Chemical Formula 3, a hole transport layer disposed between the anode and the light emitting layer, and a hole transport auxiliary layer disposed between the light emitting layer and the hole transport layer, the hole transport auxiliary layer including a third compound represented by Chemical Formula 4. Details of Chemical Formula 1 to Chemical Formula 4 are the same as described in the specification.

11 Claims, 1 Drawing Sheet

(51) Int. Cl.
*H10K 101/00* (2023.01)
*H10K 101/10* (2023.01)

(52) U.S. Cl.
CPC ......... *H10K 85/654* (2023.02); *H10K 85/657* (2023.02); *H10K 85/6572* (2023.02); *H10K 85/6574* (2023.02); *H10K 85/6576* (2023.02); *H10K 50/11* (2023.02); *H10K 2101/10* (2023.02); *H10K 2101/90* (2023.02)

(56) References Cited

U.S. PATENT DOCUMENTS

| | | | | |
|---|---|---|---|---|
| 2015/0280136 | A1 | 10/2015 | Ryu et al. | |
| 2016/0028021 | A1 | 1/2016 | Zeng et al. | |
| 2017/0054081 | A1* | 2/2017 | Kim | H01L 51/0061 |
| 2017/0237013 | A1* | 8/2017 | Park | H01L 51/0061 |
| 2017/0288148 | A1 | 10/2017 | Park et al. | |
| 2018/0358563 | A1 | 12/2018 | Park et al. | |
| 2019/0189927 | A1 | 6/2019 | Lee et al. | |
| 2019/0229271 | A1 | 7/2019 | Lee et al. | |
| 2019/0296244 | A1 | 9/2019 | Mun et al. | |
| 2020/0227644 | A1* | 7/2020 | Lee | H01L 51/0061 |
| 2022/0336757 | A1* | 10/2022 | Jung | H01L 51/0074 |

FOREIGN PATENT DOCUMENTS

| | | | |
|---|---|---|---|
| KR | 10-2014-0087883 | A | 7/2014 |
| KR | 10-1423173 | B1 | 7/2014 |
| KR | 10-2014-0142923 | A | 12/2014 |
| KR | 10-2015-0071685 | A | 6/2015 |
| KR | 10-2016-0006633 | A | 1/2016 |
| KR | 10-1604647 | | 3/2016 |
| KR | 10-1614739 | B1 | 4/2016 |
| KR | 10-1668448 | B1 | 10/2016 |
| KR | 10-2017-0023388 | A | 3/2017 |
| KR | 10-2017-0086277 | A | 7/2017 |
| KR | 10-2017-0112913 | A | 10/2017 |
| KR | 10-1789998 | B1 | 10/2017 |
| KR | 10-2018-0008286 | A | 1/2018 |
| KR | 10-2018-0011429 | A | 2/2018 |
| KR | 10-2018-0013713 | A | 2/2018 |
| KR | 10-2018-0031874 | A | 3/2018 |
| KR | 10-2018-0069475 | A | 6/2018 |
| WO | WO 2015-093878 | A1 | 6/2015 |
| WO | WO 2018-110958 | A1 | 6/2018 |

OTHER PUBLICATIONS

English translation of KR 2017/0089599 A and the original KR 2017/0089599 A, Se-Jin Lee (Year: 2016).*
Korean Office action dated Aug. 24, 2021.
Korean Office action dated Dec. 3, 2020.
Chinese Office action and Search Report dated Jun. 6, 2022.

* cited by examiner

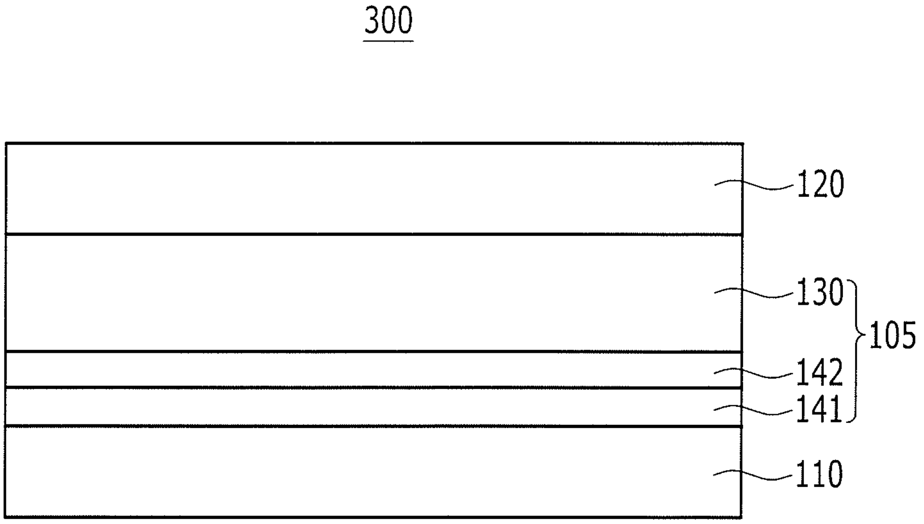
300
120
130
105
142
141
110

ORGANIC OPTOELECTRONIC DEVICE AND DISPLAY DEVICE

CROSS-REFERENCE TO RELATED APPLICATION

Korean Patent Application No. 10-2018-0136029, filed on Nov. 7, 2018, in the Korean Intellectual Property Office, and entitled: "Organic Optoelectronic Device and Display Device," is incorporated by reference herein in its entirety.

BACKGROUND OF THE INVENTION

1. Field

An organic optoelectronic device and a display device are disclosed.

2. Description of the Related Art

An organic optoelectronic device is a device that converts electrical energy into photoenergy, and vice versa.

An organic optoelectronic device may be classified as follows in accordance with its driving principles. One is a photoelectric device where excitons generated by photoenergy are separated into electrons and holes and the electrons and holes are transferred to different electrodes respectively and electrical energy is generated, and the other is a light emitting device to generate photoenergy from electrical energy by supplying a voltage or a current to electrodes.

Examples of the organic optoelectronic device include an organic photoelectric device, an organic light emitting diode, an organic solar cell, and an organic photo conductor drum.

Among them, the organic light emitting diode (OLED) has recently drawn attention due to an increase in demand for flat panel displays. The organic light emitting diode converts electrical energy into light, and the performance of organic light emitting diode is greatly influenced by the organic materials disposed between electrodes.

SUMMARY OF THE INVENTION

Embodiments are directed to an organic optoelectronic device, including an anode and a cathode facing each other, a light emitting layer disposed between the anode and the cathode, the light emitting layer including a first compound represented by a combination of Chemical Formula 1 and Chemical Formula 2, and a second compound represented by Chemical Formula 3, a hole transport layer disposed between the anode and the light emitting layer, and a hole transport auxiliary layer disposed between the light emitting layer and the hole transport layer, the hole transport auxiliary layer including a third compound represented by Chemical Formula 4,

[Chemical Formula 1]

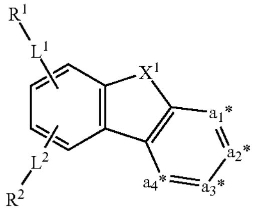

-continued

[Chemical Formula 2]

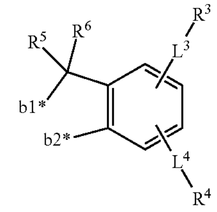

In Chemical Formula 1 and Chemical Formula 2, $X^1$ is O or S, adjacent two of $a_1$* to $a_4$* are C linked with $b_1$* and $b_2$* respectively, the remainders of $a_1$* to $a_4$* not linked with $b_1$* and $b_2$* are each independently C-$L^a$-$R^a$, $L^a$ and $L^1$ to $L^4$ are each independently a single bond, a substituted or unsubstituted C6 to C20 arylene group, a substituted or unsubstituted divalent C2 to C20 heterocyclic group, or a combination thereof, $R^a$ and $R^1$ to $R^6$ are each independently hydrogen, deuterium, a cyano group, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof, and at least one of $R^1$ to $R^4$ is a group represented by Chemical Formula a,

[Chemical Formula a]

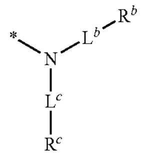

wherein, in Chemical Formula a, $L^b$ and $L^c$ are each independently a single bond, a substituted or unsubstituted C6 to C20 arylene group, a substituted or unsubstituted divalent C2 to C20 heterocyclic group, or a combination thereof, $R^b$ and $R^c$ are each independently a substituted or unsubstituted C6 to C30 aryl group, a substituted or unsubstituted C2 to C30 heterocyclic group, or a combination thereof, and

* is a linking point with $L^1$ to $L^4$;

[Chemical Formula 3]

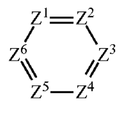

wherein, in Chemical Formula 3, $Z^1$ is N or C-$L^5$-$R^7$, $Z^2$ is N or C-$L^6$-$R^8$, $Z^3$ is N or C-$L^7$-$R^9$, $Z^4$ is N or C-$L^8$-$R^{10}$, $Z^5$ is N or C-$L^9$-$R^{11}$, $Z^6$ is N or C-$L^{10}$-$R^{12}$, at least two of $Z^1$ to $Z^6$ are N, $L^5$ to $L^{10}$ are each independently a single bond, a substituted or unsubstituted C6 to C20 arylene group, a substituted or unsubstituted divalent C2 to C20 heterocyclic group, or a combination thereof, $R^7$ to $R^{12}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, at least one of $R^7$ to $R^{12}$ is a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group, and $R^7$ to $R^{12}$ are each independently present or adjacent groups thereof are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring;

[Chemical Formula 4]

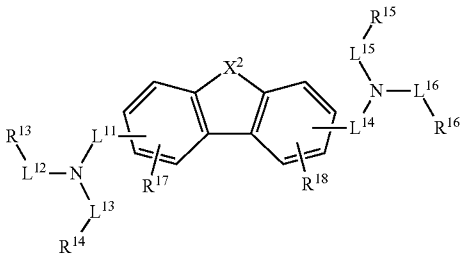

wherein, in Chemical Formula 4, $X^2$ is O or S, $L^{11}$ to $L^{16}$ are each independently a single bond, a substituted or unsubstituted C6 to C20 arylene group, a substituted or unsubstituted divalent C2 to C20 heterocyclic group, or a combination thereof, $R^{13}$ to $R^{16}$ are each independently a substituted or unsubstituted C6 to C30 aryl group, a substituted or unsubstituted C2 to C30 heterocyclic group, or a combination thereof, and $R^{17}$ and $R^{18}$ are each independently hydrogen, deuterium, a cyano group, or a substituted or unsubstituted C1 to C10 alkyl group.

According to another embodiment, a display device including the organic optoelectronic device is provided.

An organic optoelectronic device having high efficiency and a long life-span may be realized.

BRIEF DESCRIPTION OF THE DRAWINGS

Features will become apparent to those of skill in the art by describing in detail example embodiments with reference to the attached drawings in which:

The FIGURE illustrates a schematic cross-sectional view of an organic light emitting diode according to an example embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the FIGURE, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, or a C2 to C30 heteroaryl group. In addition, in specific examples, "substituted" refers to replacement of at least one hydrogen of a substituent or a compound by deuterium, a C1 to C20 alkyl group, a C6 to C30 aryl group, or a C2 to C30 heteroaryl group. In addition, in specific examples, "substituted" refers to replacement of at least one hydrogen of a substituent or a compound by deuterium, a C1 to C5 alkyl group, a C6 to C18 aryl group, a pyridinyl group, a quinolinyl group, an isoquinolinyl group, a dibenzofuranyl group, a dibenzothiophenyl group, or a carbazolyl group. In addition, in specific examples, "substituted" refers to replacement of at least one hydrogen of a substituent or a compound by deuterium, a C1 to C5 alkyl group, a C6 to C18 aryl group, a dibenzofuranyl group, or a dibenzothiophenyl group. In addition, in specific examples, "substituted" refers to replacement of at least one hydrogen of a substituent or a compound by deuterium, a methyl group, an ethyl group, a propyl group, a butyl group, a phenyl group, a biphenyl group, a terphenyl group, a naphthyl group, a triphenyl group, a dibenzofuranyl group, or a dibenzothiophenyl group.

As used herein, when a definition is not otherwise provided, "hetero" refers to one including one to three heteroatoms selected from N, O, S, P, and Si, and remaining carbons in one functional group.

As used herein, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarterphenyl group, and the like, and a group in which two or more hydrocarbon aromatic moieties are fused directly or indirectly to provide a non-aromatic fused ring, for example a fluorenyl group, and the like.

The aryl group may include a monocyclic, polycyclic or fused ring polycyclic (i.e., rings sharing adjacent pairs of carbon atoms) functional group.

As used herein, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, or a combination thereof, for example.

More specifically, the substituted or unsubstituted C2 to C30 heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, or a substituted or unsubstituted dibenzothiophenyl group, or a combination thereof, for example.

In the present specification, "adjacent groups thereof are linked with each other to form a substituted or unsubstituted aromatic monocyclic or polycyclic ring, or a substituted or unsubstituted heteroaromatic monocyclic or polycyclic ring" means that any two adjacent substituents directly substituting an aromatic ring or an heteroaromatic ring with a single bond without a linking group are linked to form an additional ring.

For example, adjacent groups are linked with each other to form a substituted or unsubstituted aromatic monocyclic or polycyclic ring and examples may be a substituted or unsubstituted aromatic monocyclic ring.

For example, any two substituents directly substituting a pyrimidine ring are linked with each other to form an additional ring, and thereby a substituted or unsubstituted quinazolinyl group may be formed along with the pyrimidine ring.

As used herein, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, an organic optoelectronic device according to an example embodiment is described.

The organic optoelectronic device may be any device to convert electrical energy into photoenergy and vice versa, and may be, for example an organic photoelectric device, an organic light emitting diode, an organic solar cell, and an organic photo-conductor drum.

Herein, an organic light emitting diode as one example of an organic optoelectronic device is described. Embodiments may be applied to other organic optoelectronic devices in the same manner.

The FIGURE is a cross-sectional view of an organic light emitting diode according to an example embodiment.

Referring to the FIGURE, an organic light emitting diode 300 according to an example embodiment includes an anode 110 and a cathode 120 facing each other, and an organic layer 105 disposed between the anode 110 and the cathode 120. The organic layer 105 may include a light emitting layer 130, a hole transport auxiliary layer 142, and a hole transport layer 141.

The anode 110 may be made of a conductor having a large work function to help hole injection, and may be for example metal, metal oxide and/or a conductive polymer. The anode 110 may be, for example a metal nickel, platinum, vanadium, chromium, copper, zinc, gold, and the like or an alloy thereof; metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDOT), polypyrrole, and polyaniline, for example.

The cathode 120 may be made of a conductor having a small work function to help electron injection, and may be for example metal, metal oxide and/or a conductive polymer. The cathode 120 may be, for example, a metal or an alloy thereof such as magnesium, calcium, sodium, potassium, titanium, indium, yttrium, lithium, gadolinium, aluminum, silver, tin, lead, cesium, barium, and the like; a multi-layer structure material such as LiF/Al, $LiO_2$/Al, LiF/Ca, LiF/Al and $BaF_2$/Ca, for example.

The light emitting layer 130 is disposed between the anode 110 and the cathode 120 and includes a plurality of hosts and at least one type of a dopant.

The light emitting layer 130 may include a first compound having relatively strong hole characteristics and a second compound having relatively strong electron characteristics as a host.

The first compound is a compound having relatively strong hole characteristics, and may be represented by a combination of Chemical Formula 1 and Chemical Formula 2.

[Chemical Formula 1]

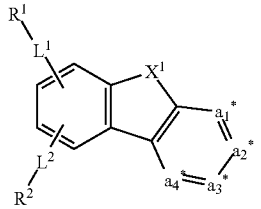

[Chemical Formula 2]

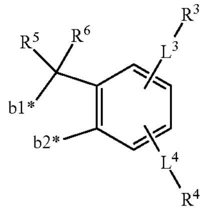

In Chemical Formula 1 and Chemical Formula 2, $X^1$ is O or S, adjacent two of $a_1$* to $a_4$* are C linked with $b_1$* and $b_2$* respectively, the remainders of $a_1$* to $a_4$* not linked with $b_1$* and $b_2$* are each independently C-$L^a$-$R^a$, $L^a$ and $L^1$ to $L^4$ are each independently a single bond, a substituted or unsubstituted C6 to C20 arylene group, a substituted or unsubstituted divalent C2 to C20 heterocyclic group, or a combination thereof, $R^a$ and $R^1$ to $R^6$ are each independently hydrogen, deuterium, a cyano group, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof, and at least one of $R^1$ to $R^4$ is a group represented by Chemical Formula a,

[Chemical Formula a]

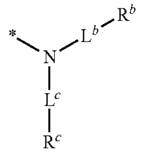

wherein, in Chemical Formula a, $L^b$ and $L^c$ are each independently a single bond, a substituted or unsubstituted C6 to C20 arylene group, a substituted or unsubstituted divalent C2 to C20 heterocyclic group, or a combination thereof, $R^b$ and $R^c$ are each independently a substituted or unsubstituted C6 to C30 aryl group, a substituted or unsubstituted C2 to C30 heterocyclic group, or a combination thereof, and

* is a linking point with $L^1$ to $L^4$.

The first compound has a structure of linking amine substituted with an aryl group and/or a heteroaryl group to a fused heterocycle of 6 membered ring-5 membered ring-6 membered ring-5 membered ring-6 membered ring and thus has high HOMO energy, as a HOMO electron cloud expands from the amine to the fused heterocycle, and exhibits excellent hole injection and transfer characteristics.

In addition, since the fused heterocycle of 6 membered ring-5 membered ring-6 membered ring-5 membered ring-6 membered ring has relatively high HOMO energy compared with bicarbazole and indolocarbazole, a device having a low driving voltage may be realized by applying the structure of linking the amine to the fused heterocycle.

In general, bicarbazole and indolocarbazole have high T1 energy and thus may not be appropriate as a red host. However, according to the present example embodiment, the structure of linking the amine to the fused heterocycle has an appropriate T1 energy as a red host.

Additionally, since the first compound includes the fused heterocycle and exhibits a decreased intramolecular symmetry and thus is suppressed from crystallization among the compounds, a dark spot generated due to the crystallization of the compounds during deposition of a material in a process of manufacturing a device may be suppressed, and accordingly, a life-span of the device may be improved.

Accordingly, a device manufactured by applying the first compound according to the present invention may realize high efficiency/long life-span characteristics.

Additionally, the first compound is included with the second compound and thus exhibits satisfactory interface characteristics and transportation capability of holes and electrons and accordingly, may lower a driving voltage of a device manufactured by applying the same.

In an example embodiment, $L^b$ and $L^c$ may each independently be a single bond or a substituted or unsubstituted C6 to C12 arylene group.

In an example embodiment, $L^b$ and $L^c$ may each independently be a single bond, a substituted or unsubstituted phenylene group, or a substituted or unsubstituted biphenylene group.

In an example embodiment, $R^b$ and $R^c$ may each independently be a substituted or unsubstituted phenyl group, a substituted or unsubstituted biphenyl group, a substituted or unsubstituted terphenyl group, a substituted or unsubstituted anthracenyl group, a substituted or unsubstituted naphthyl group, a substituted or unsubstituted phenanthrenyl group, a substituted or unsubstituted triphenylene group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by a combination of Chemical Formulae 1 and 2.

In an example embodiment, $R^b$ and $R^c$ may each independently be substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by a combination of Chemical Formulae 1 and 2.

In an example embodiment, $R^b$ and $R^c$ may each independently be a substituted or unsubstituted phenyl group, a substituted or unsubstituted biphenyl group, a substituted or unsubstituted naphthyl group, or a substituted or unsubstituted fluorenyl group.

In an example embodiment, $L^a$ and $L^1$ to $L^4$ may each independently be a single bond or a substituted or unsubstituted C6 to C20 arylene group.

In an example embodiment, $L^a$ and $L^1$ to $L^4$ may each independently be a single bond, a substituted or unsubstituted phenylene group, a substituted or unsubstituted biphenylene group, or a substituted or unsubstituted naphthylene group.

In an example embodiment, $L^a$ and $L^1$ to $L^4$ may each independently be a single bond or a substituted or unsubstituted p-phenylene group.

In an example embodiment, $R^a$ and $R^1$ to $R^4$ may each independently be hydrogen, deuterium, a cyano group, a substituted or unsubstituted C1 to C10 alkyl group, or a substituted or unsubstituted C6 to C20 aryl group.

In an example embodiment, $R^a$ and $R^1$ to $R^4$ may each independently be hydrogen, for example.

In an example embodiment, $R^5$ and $R^6$ may each independently be a substituted or unsubstituted C1 to C10 alkyl group or a substituted or unsubstituted C6 to C20 aryl group.

In an example embodiment, $R^5$ and $R^6$ may each independently be a substituted or unsubstituted C1 to C4 alkyl group or a substituted or unsubstituted C6 to C12 aryl group.

In an example embodiment, the first compound may be represented by one of Chemical Formula 1A to Chemical Formula 1F according to a combination position of Chemical Formula 1 and Chemical Formula 2.

[Chemical Formula 1A]

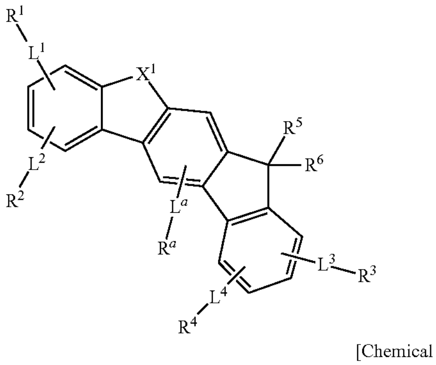

[Chemical Formula 1B]

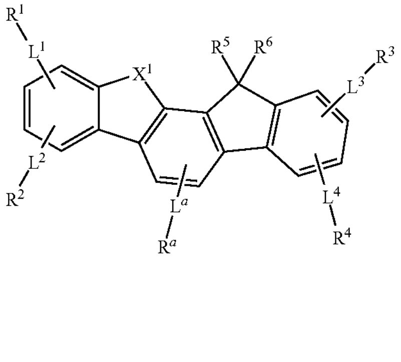

-continued

[Chemical Formula 1C]

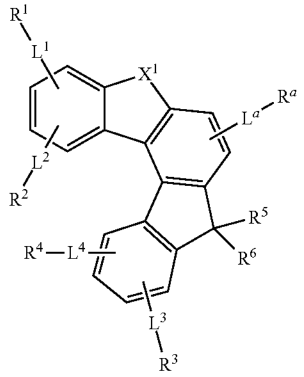

[Chemical Formula 1D]

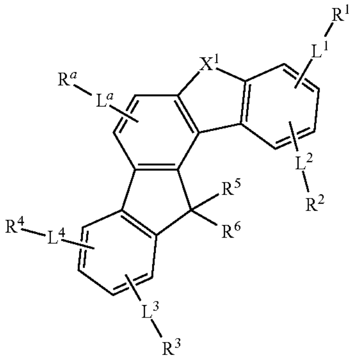

[Chemical Formula 1E]

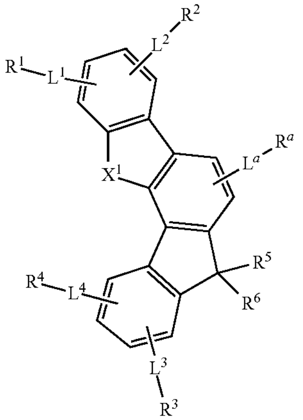

-continued

[Chemical Formula 1F]

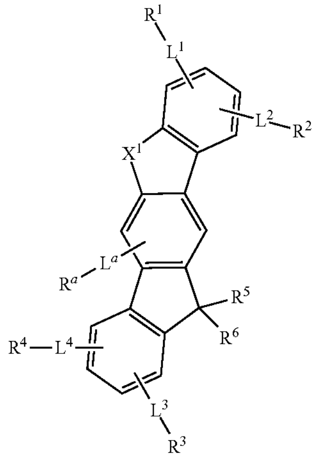

In Chemical Formula 1A to Chemical Formula 1F, $X^1$, $L^a$ and $L^1$ to $L^4$ and $R^a$ and $R^1$ to $R^6$ are the same as described above.

In an example embodiment, Chemical Formula 1A may be represented by Chemical Formula 1A-1 or Chemical Formula 1A-2 according to a substitution position.

[Chemical Formula 1A-1]

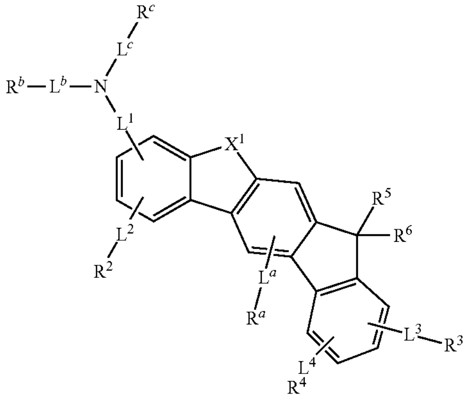

[Chemical Formula 1A-2]

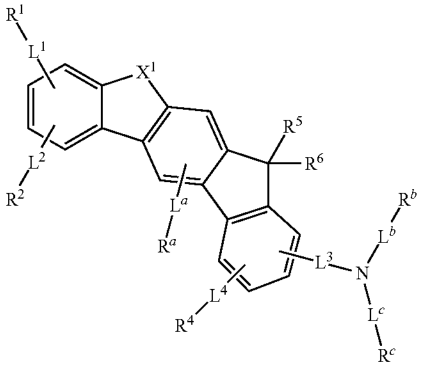

In Chemical Formula 1A-1 and Chemical Formula 1A-2, $X^1$, $L^a$, $L^b$, $L^c$ and $L^1$ to $L^4$, $R^a$, $R^1$ to $R^6$, $R^b$, and $R^c$ are the same as described above.

In an example embodiment, Chemical Formula 1A-1 may be represented by one of Chemical Formula 1A-1-1 to Chemical Formula 1A-1-4 according to a specific substitution position of the group represented by Chemical Formula a.

[Chemical Formula 1A-1-1]

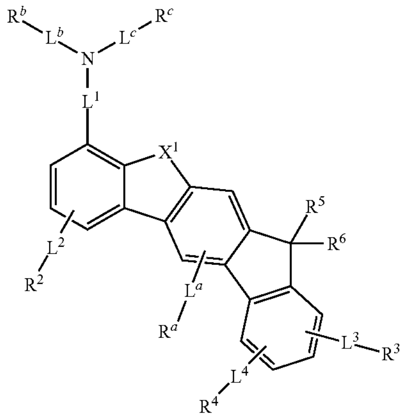

[Chemical Formula 1A-1-2]

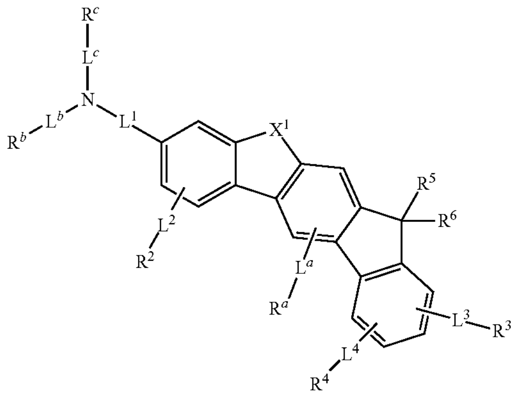

[Chemical Formula 1A-1-3]

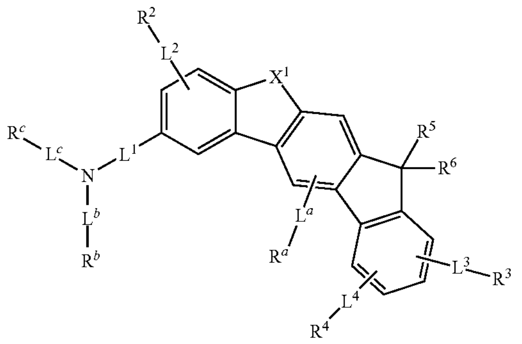

-continued

[Chemical Formula 1A-1-4]

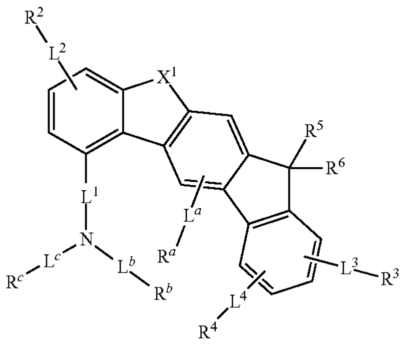

In Chemical Formula 1A-1-1 to Chemical Formula 1A-1-4, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1A-2 may be represented by one of Chemical Formula 1A-2-1 to Chemical Formula 1A-2-4 according to a specific substitution position of the group represented by Chemical Formula a.

[Chemical Formula 1A-2-1]

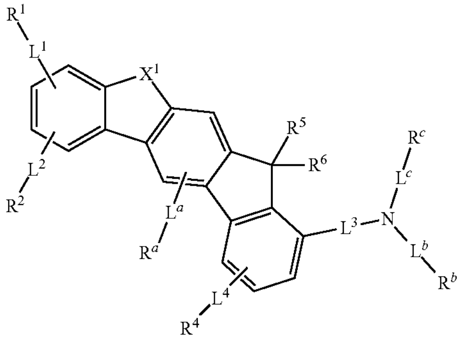

[Chemical Formula 1A-2-2]

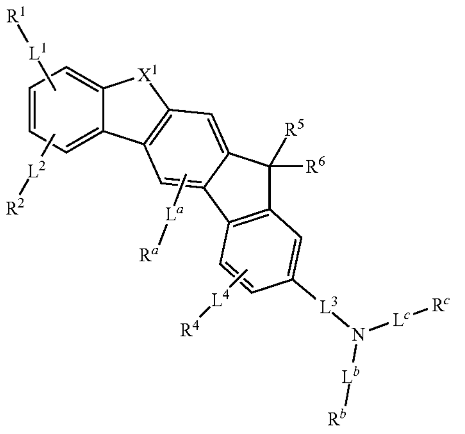

-continued

[Chemical Formula 1A-2-3]

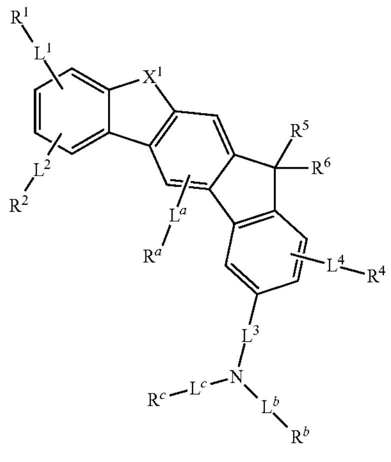

[Chemical Formula 1A-2-4]

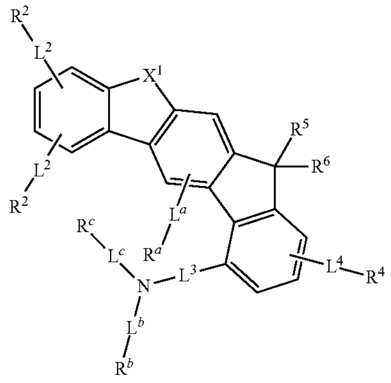

In Chemical Formula 1A-2-1 to Chemical Formula 1A-2-4, $X^1$, $L^a$, $L^b$, $L^c$, $L^1$ to $L^4$, $R^1$ to $R^6$, $R^b$, and $R^c$ are the same as described above.

In an example embodiment, Chemical Formula 1A may be represented by one of Chemical Formula 1A-1-1, Chemical Formula 1A-2-2, and Chemical Formula 1A-2-3.

In an example embodiment, Chemical Formula 1B may be represented by Chemical Formula 1B-1 or Chemical Formula 1B-2 according to a substitution position of the group represented by Chemical Formula a.

[Chemical Formula 1B-1]

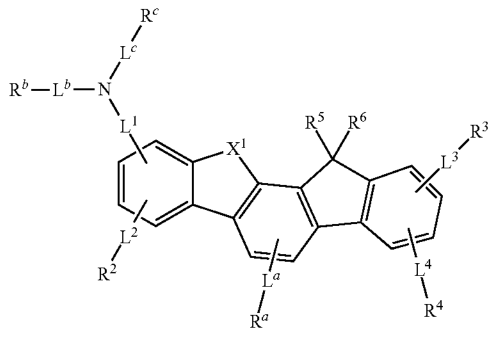

-continued

[Chemical Formula 1B-2]

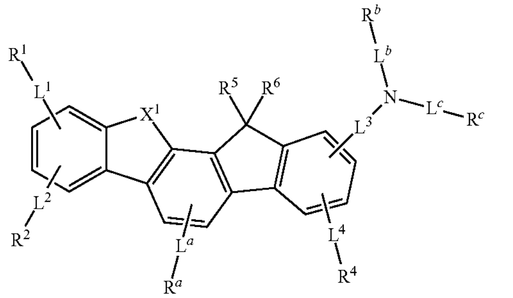

In Chemical Formula 1B-1 and Chemical Formula 1B-2, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1B-1 may be represented by one of Chemical Formula 1B-1-1 to Chemical Formula 1B-1-4 according to a specific substitution position of the group represented by Chemical Formula a.

[Chemical Formula 1B-1-1]

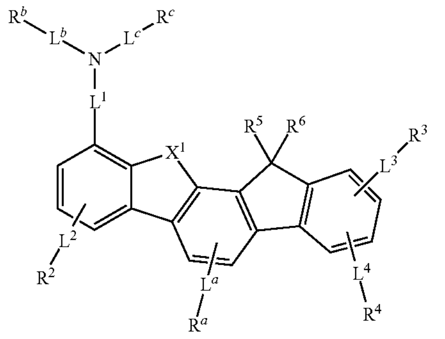

[Chemical Formula 1B-1-2]

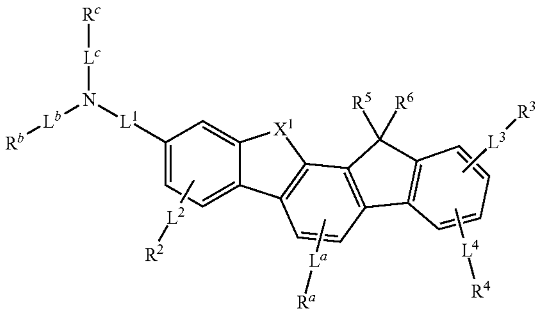

[Chemical Formula 1B-1-3]

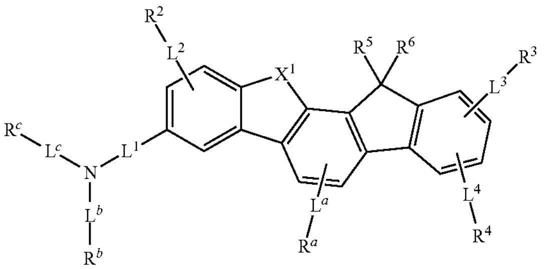

-continued

[Chemical Formula IB-1-4]

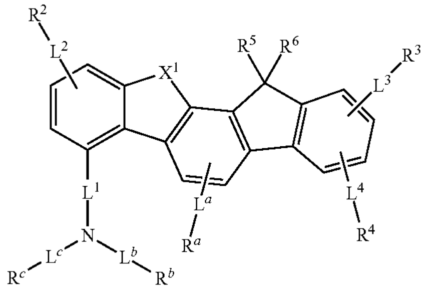

In Chemical Formula 1B-1-1 to Chemical Formula 1B-1-4, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1B-2 may be represented by one of Chemical Formula 1B-2-1 to Chemical Formula 1B-2-4 according to substitution position of the group represented by Chemical Formula a.

[Chemical Formula 1B-2-1]

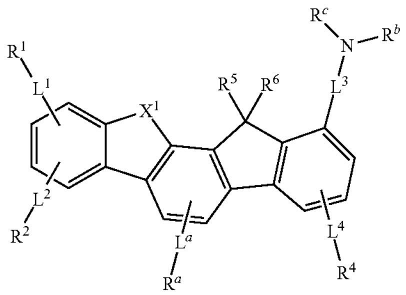

[Chemical Formula 1B-2-2]

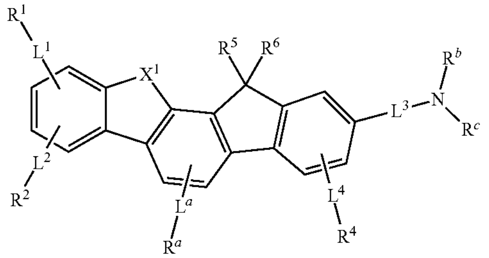

[Chemical Formula 1B-2-3]

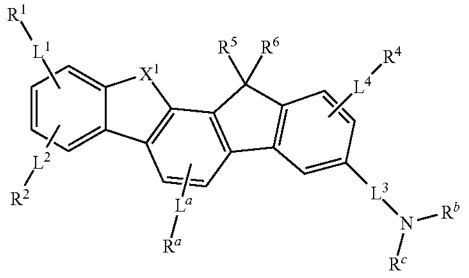

-continued

[Chemical Formula 1B-2-4]

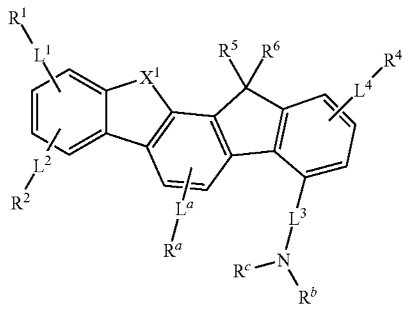

In Chemical Formula 1B-2-1 to Chemical Formula 1B-2-4, $X^1$, $L^a$, $L^b$, $L^c$, $L^1$ to $L^4$, $R^a$, to $R^6$, $R^b$, and $R^c$ are the same as described above.

In an embodiment, Chemical Formula 1B may be represented by one of Chemical Formula 1B-1-1, Chemical Formula 1B-2-2 and Chemical Formula 1B-2-3.

In an example embodiment, Chemical Formula 1C may be represented by Chemical Formula 1C-1 or Chemical Formula 1C-2 according to a substitution position of the group represented by Chemical Formula a.

[Chemical Formula 1C-1]

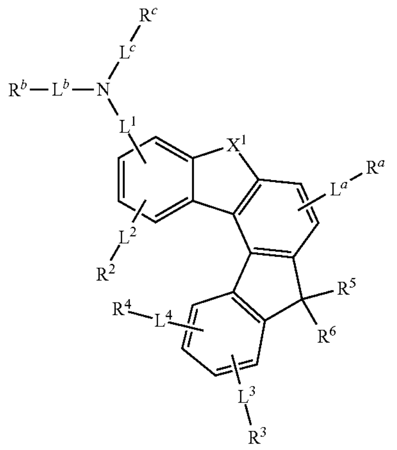

[Chemical Formula 1C-2]

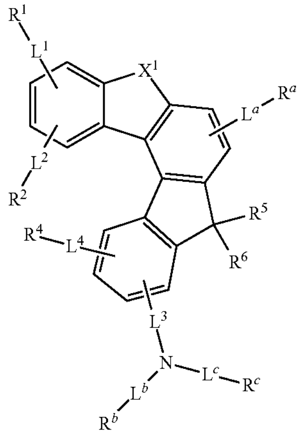

In Chemical Formula 1C-1 and Chemical Formula 1C-2, $X^1$, $L^a$, $L^b$, $L^c$ and $L^1$ to $L^4$, $R^a$, $R^1$ to $R^6$, $R^b$, and $R^c$ are the same as described above.

In an example embodiment, Chemical Formula 1C-1 may be represented by one of Chemical Formula 1C-1-1 to Chemical Formula 1C-1-4 according to a specific substitution position of the group represented by Chemical Formula a.

[Chemical Formula 1C-1-1]

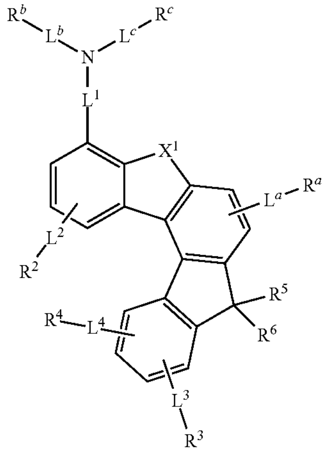

[Chemical Formula 1C-1-2]

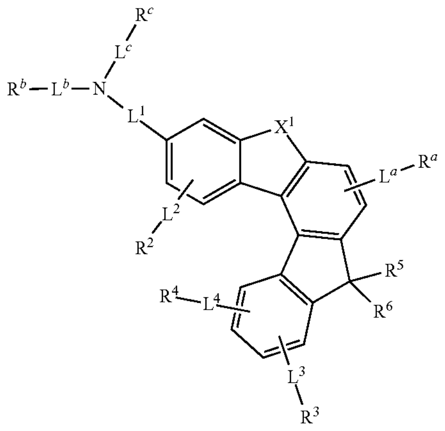

[Chemical Formula 1C-1-3]

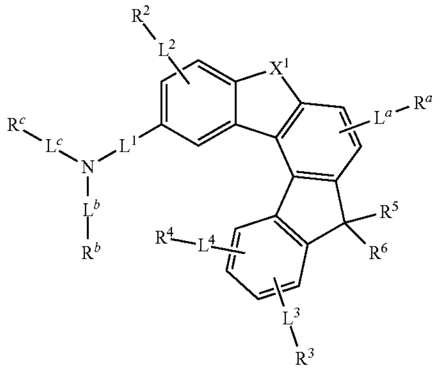

-continued

[Chemical Formula 1C-1-4]

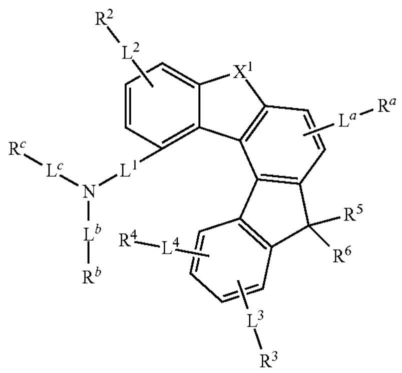

In Chemical Formula 1C-1-1 to Chemical Formula 1C-1-4, $X^1$, $L^a$, $L^b$, $L^c$ and $L^1$ to $L^4$, $R^a$, $R^1$ to $R^6$, $R^b$, and $R^c$ are the same as described above.

In an example embodiment, Chemical Formula 1C-2 may be represented by one of Chemical Formula 1C-2-1 to Chemical Formula 1C-2-4 according to a specific substitution position of the group represented by Chemical Formula a.

[Chemical Formula 1C-2-1]

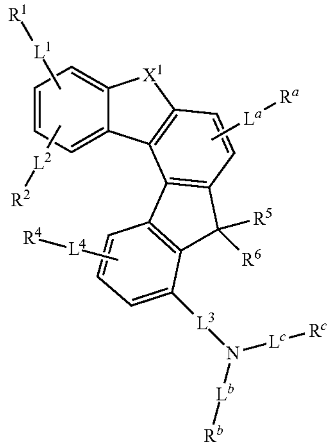

[Chemical Formula 1C-2-2]

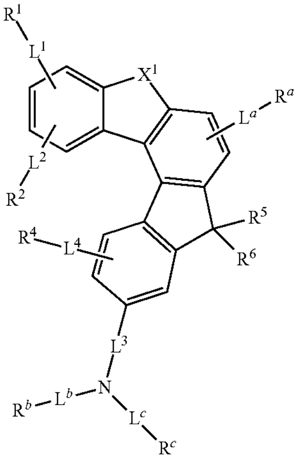

-continued

[Chemical Formula 1C-2-3]

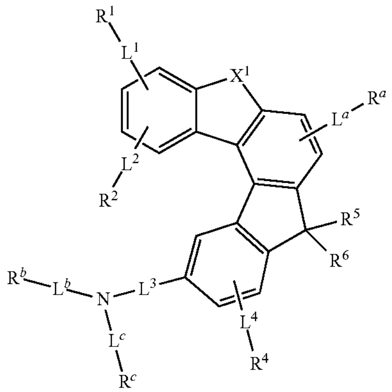

[Chemical Formula 1C-2-4]

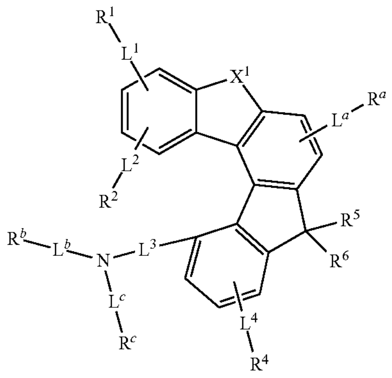

In an embodiment, Chemical Formula 1C may be represented by one of Chemical Formula 1C-1-1, Chemical Formula 1C-2-2, and Chemical Formula 1C-2-3.

In an example embodiment, Chemical Formula 1D may be represented by one of Chemical Formula 1D-1 or Chemical Formula 1D-2 according to a substitution position of the group represented by Chemical Formula a.

[Chemical Formula 1D-1]

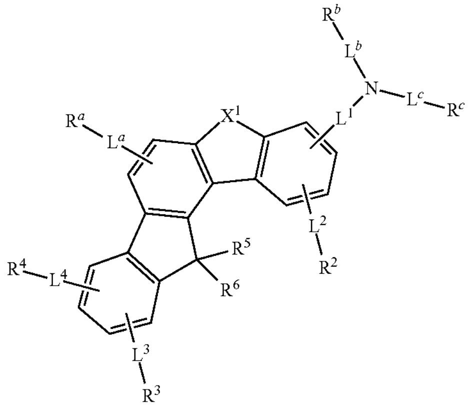

-continued

[Chemical Formula 1D-2]

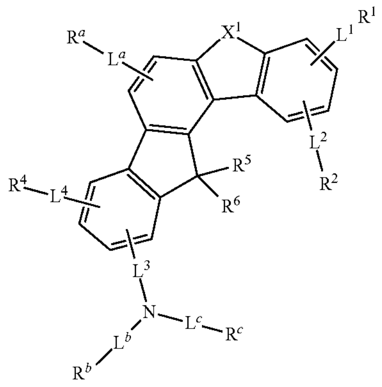

In Chemical Formula 1D-1 and Chemical Formula 1D-2, $X^1$, $L^a$, $L^b$, $L^c$, $L^1$ to $L^4$, $R^1$ to $R^6$, $R^b$, and $R^c$ are the same as described above.

In an example embodiment, Chemical Formula 1D-1 may be represented by one of Chemical Formula 1D-1-1 to Chemical Formula 1D-1-4 according to a specific substitution position of the group represented by Chemical Formula a.

[Chemical Formula 1D-1-1]

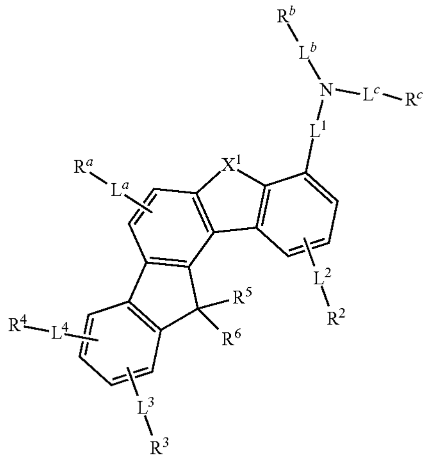

[Chemical Formula 1D-1-2]

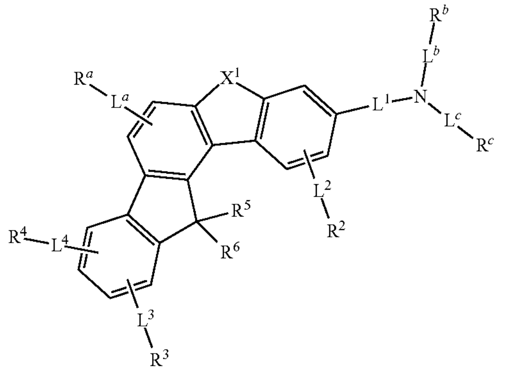

-continued

[Chemical Formula 1D-1-3]

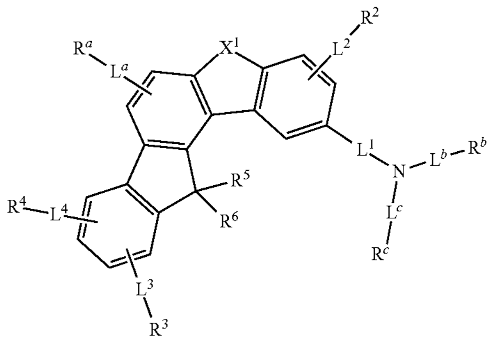

[Chemical Formula 1D-1-4]

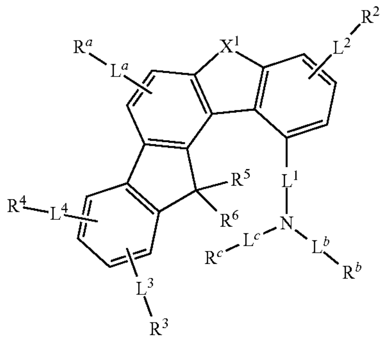

In Chemical Formula 1D-1-1 to Chemical Formula 1D-1-4, $X^1$, $L^a$, $L^b$, $L^c$, $L^1$ to $L^4$, $R^1$ to $R^6$, $R^b$, and $R^c$ are the same as described above.

In an example embodiment, Chemical Formula 1D-2 may be represented by one of Chemical Formula 1D-2-1 to Chemical Formula 1D-2-4 according to a according to a specific substitution position of the group represented by Chemical Formula a.

[Chemical Formula 1D-2-1]

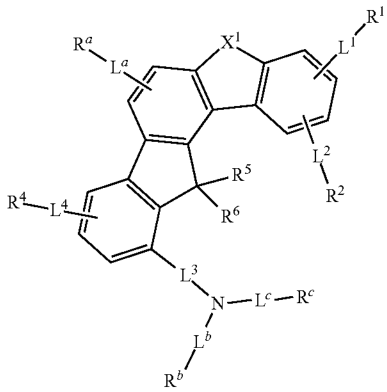

-continued

[Chemical Formula 1D-2-2]

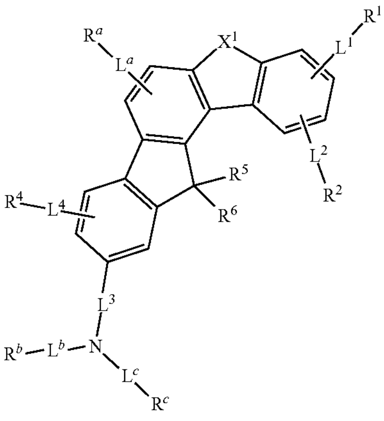

[Chemical Formula 1D-2-3]

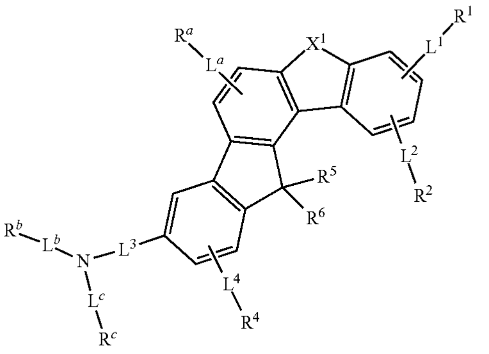

[Chemical Formula 1D-2-4]

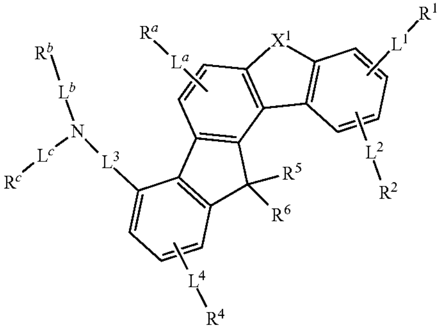

In Chemical Formula 1D-2-1 to Chemical Formula 1D-2-4, $X^1$, $L^a$, $L^b$, $L^c$, $L^1$ to $L^4$, $R^1$ to $R^6$, $R^b$, and $R^c$ are the same as described above.

In an example embodiment, Chemical Formula 1D may be represented by one of Chemical Formula 1D-1-1, Chemical Formula 1D-2-2, and Chemical Formula 1D-2-3.

In an example embodiment, Chemical Formula 1E may be represented by one of Chemical Formula 1E-1 or Chemical Formula 1E-2 according to a substitution position of the group represented by Chemical Formula a.

[Chemical Formula 1E-1]

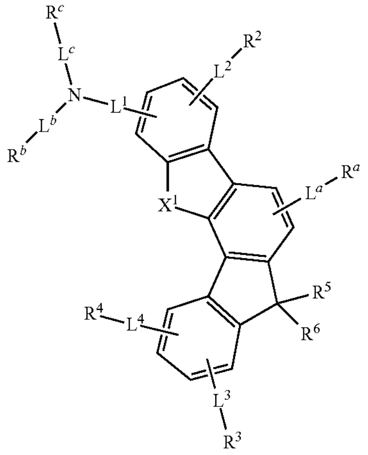

[Chemical Formula 1E-2]

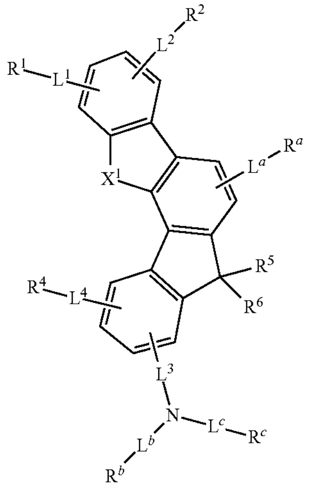

In Chemical Formula 1E-1 and Chemical Formula 1E-2, $X^1$, $L^a$, $L^b$, $L^c$, $L^1$ to $L^4$, $R^1$ to $R^6$, $R^b$, and $R^c$ are the same as described above.

In an example embodiment, Chemical Formula 1E-1 may be represented by one of Chemical Formula 1E-1-1 to Chemical Formula 1E-1-4 according to a specific substitution position of the group represented by Chemical Formula a.

[Chemical Formula 1E-1-1]

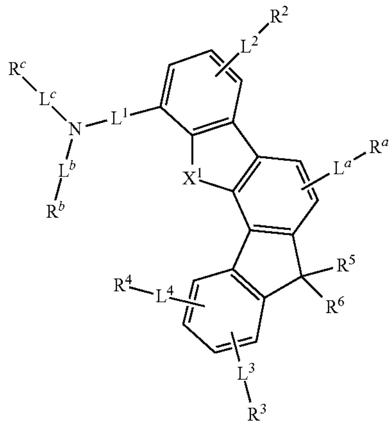

[Chemical Formula 1E-1-2]

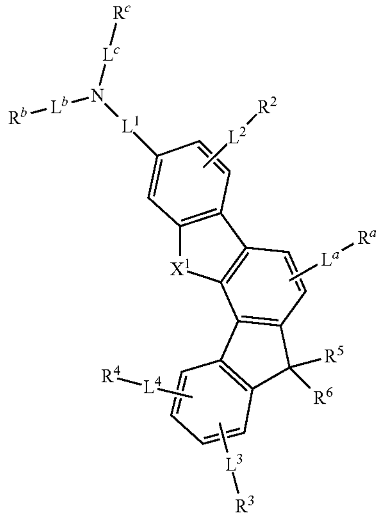

[Chemical Formula 1E-1-3]

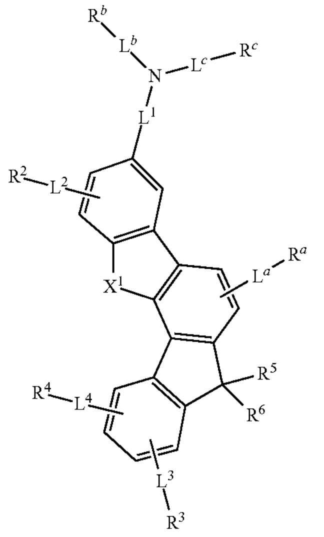

-continued

[Chemical Formula 1E-1-4]

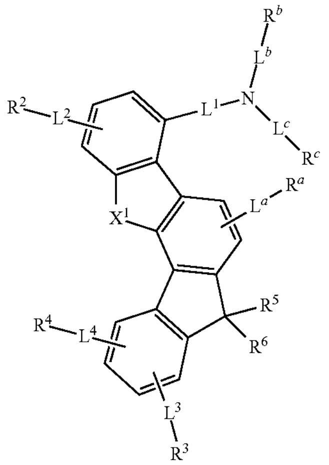

In Chemical Formula 1E-1-1 to Chemical Formula 1E-1-4, $X^1$, $L^a$, $L^b$, $L^c$, L $L^1$ to $L^4$, $R^1$ to $R^6$, $R^b$, and $R^c$ are the same as described above.

In an example embodiment, Chemical Formula 1E-2 may be represented by one of Chemical Formula 1E-2-1 to Chemical Formula 1E-2-4 according to a specific substitution position of the group represented by Chemical Formula a.

[Chemical Formula 1E-2-1]

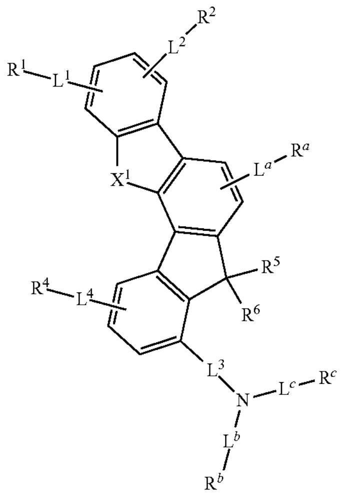

-continued

[Chemical Formula 1E-2-2]

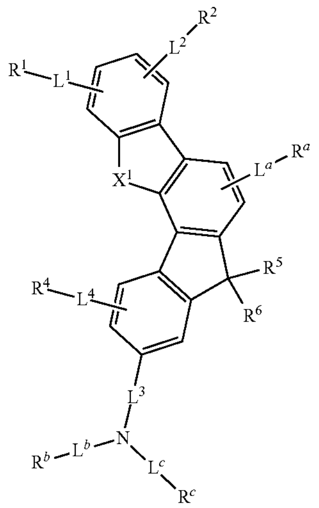

[Chemical Formula 1E-2-3]

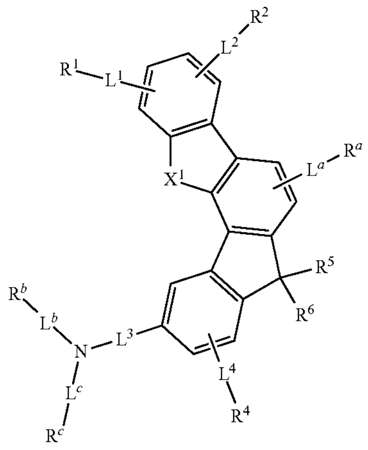

[Chemical Formula 1E-2-4]

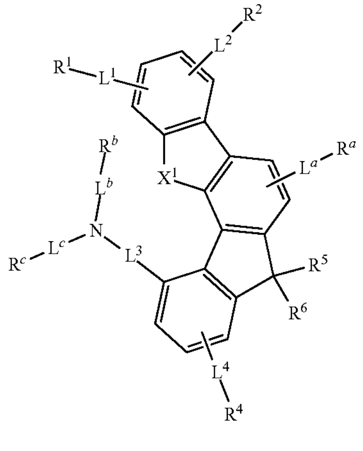

In Chemical Formula 1E-2-1 to Chemical Formula 1E-2-4, $X^1$, $L^a$, $L^b$, $L^c$, $L^1$ to $L^4$, $R^1$ to $R^6$, $R^b$, and $R^c$ are the same as described above.

In an embodiment, Chemical Formula 1E may be represented by one of Chemical Formula 1E-1-1 to Chemical Formula 1E-1-4, and Chemical Formula 1E-2-1 to Chemical Formula 1E-2-4.

In an example embodiment, Chemical Formula 1F may be represented by Chemical Formula 1F-1 or Chemical Formula 1F-2 according to a substitution position of the group represented by Chemical Formula a.

[Chemical Formula 1F-1]

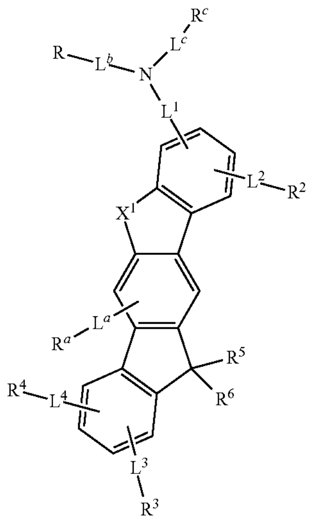

[Chemical Formula 1F-2]

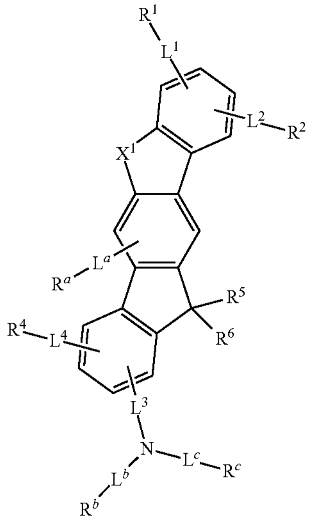

In Chemical Formula 1F-1 and Chemical Formula 1F-2, $X^1$, $L^a$, $L^b$, $L^c$, $L^1$ to $L^4$, $R^1$ to $R^6$, $R^b$, and $R^c$ are the same as described above.

In an example embodiment, Chemical Formula 1F-1 may be represented by one of Chemical Formula 1F-1-1 to Chemical Formula 1F-1-4 according to a specific substitution position of the group represented by Chemical Formula a.

-continued

[Chemical Formula 1F-1-1]

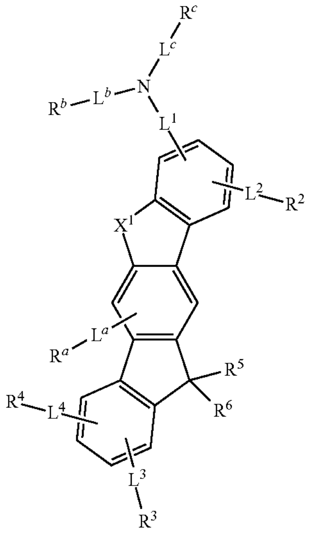

[Chemical Formula 1F-1-2]

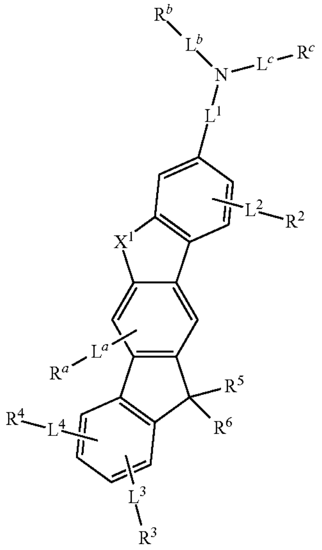

[Chemical Formula 1F-1-3]

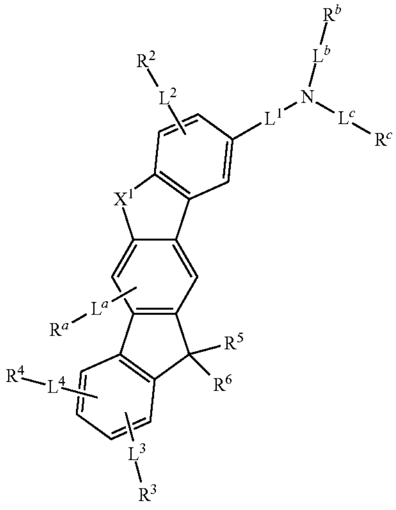

[Chemical Formula 1F-1-4]

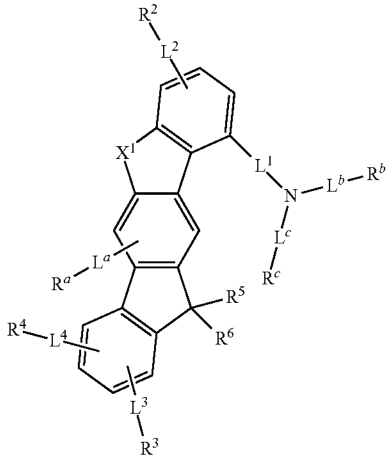

In Chemical Formula 1F-1-1 to Chemical Formula 1F-1-4, $X^1$, $L^a$, $L^b$, $L^c$, $L^1$ to $L^4$, $R^1$ to $R^6$, $R^b$, and $R^c$ are the same as described above.

In an example embodiment, Chemical Formula 1F-2 may be represented by one of Chemical Formula 1F-2-1 to Chemical Formula 1F-2-4 according to a specific substitution position of the group represented by Chemical Formula a.

[Chemical Formula 1F-2-1]

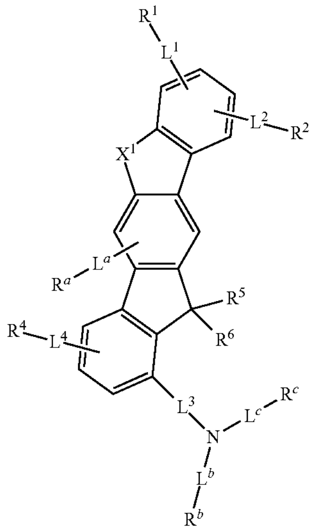

-continued

[Chemical Formula 1F-2-2]

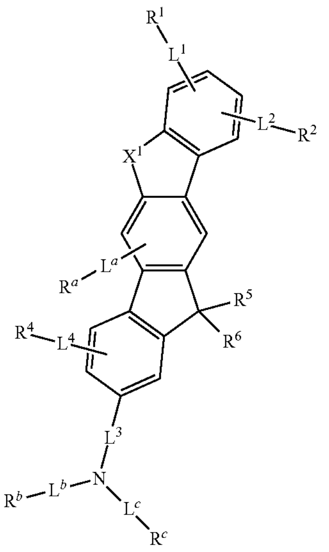

[Chemical Formula 1F-2-3]

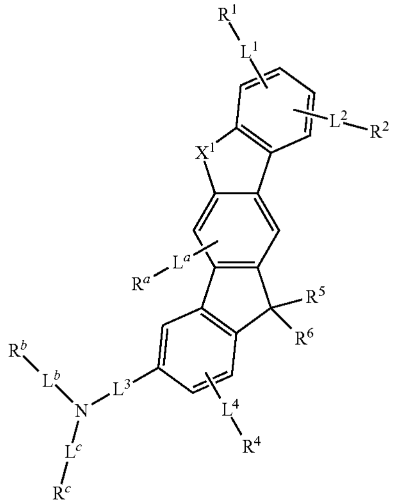

[Chemical Formula 1F-2-4]

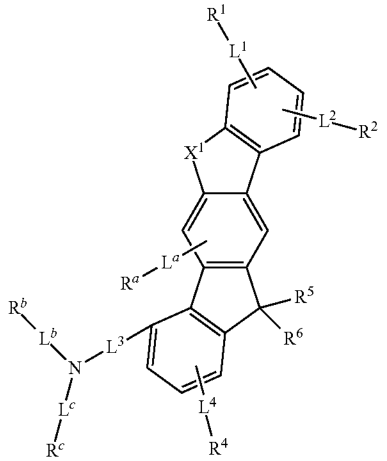

In Chemical Formula 1F-2-1 to Chemical Formula 1F-2-4, $X^1$, $L^a$, $L^b$, $L^c$, $L^1$ to $L^4$, $R^1$ to $R^6$, $R^b$, and $R^c$ are the same as described above.

In an example embodiment, Chemical Formula 1F may be represented by one of Chemical Formula 1F-1-1, Chemical Formula 1F-2-2, and Chemical Formula 1F-2-3.

In an example embodiment, the first compound may be represented by Chemical Formula 1A-1-1, Chemical Formula 1A-2-2, Chemical Formula 1A-2-3, Chemical Formula 1B-1-1, Chemical Formula 1B-2-2, Chemical Formula 1B-2-3, Chemical Formula 1C-1-1, Chemical Formula 1C-2-2, Chemical Formula 1C-2-3, Chemical Formula 1D-1-1, Chemical Formula 1D-2-2, Chemical Formula 1D-2-3, Chemical Formula 1F-1-1, Chemical Formula 1F-2-2, and Chemical Formula 1F-2-3, and more specifically Chemical Formula 1E-1-1 or Chemical Formula 1E-2-2.

The first compound may be, for example, one of compounds of Group 1, for example.

[Group 1]

[A-1]

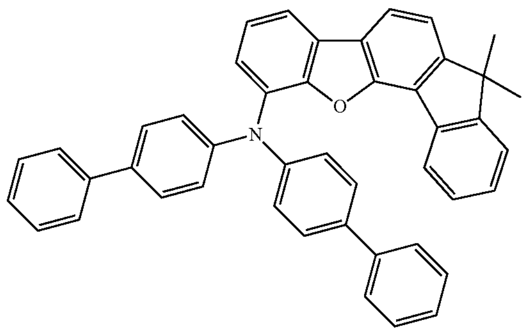

[A-2]

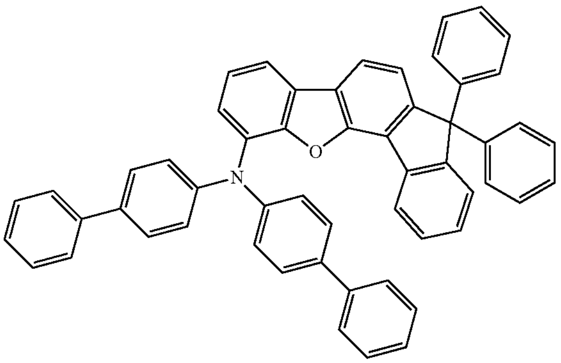

[A-3]

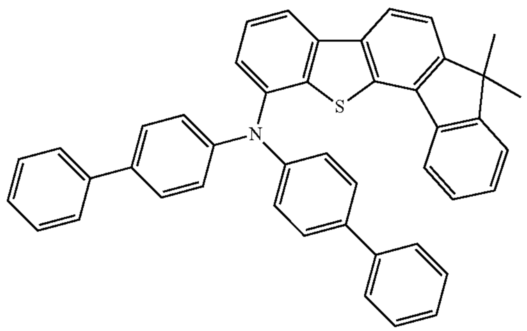

-continued
[A-4]
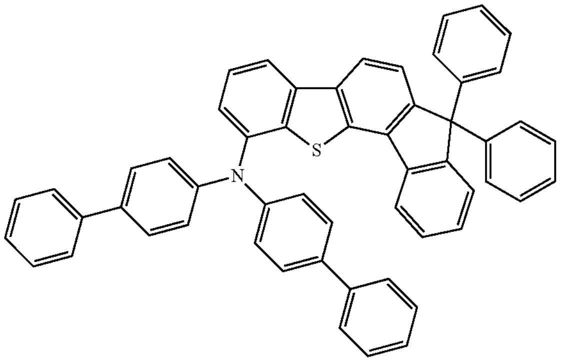
[A-5]
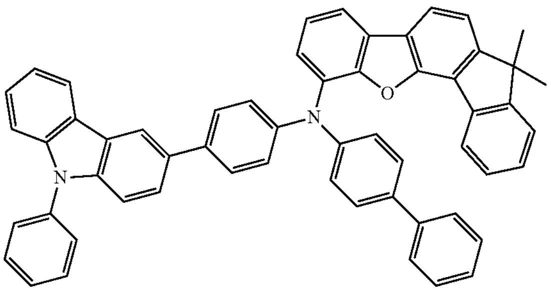
[A-6]
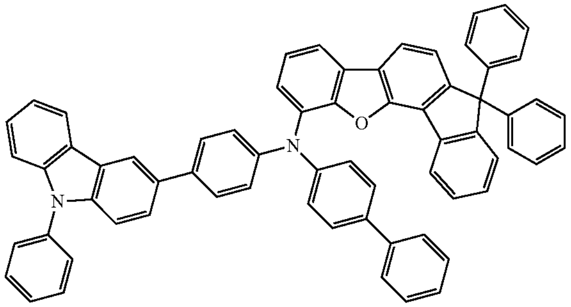
[A-7]
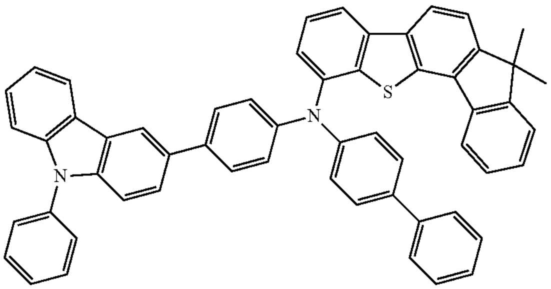
-continued
[A-9]
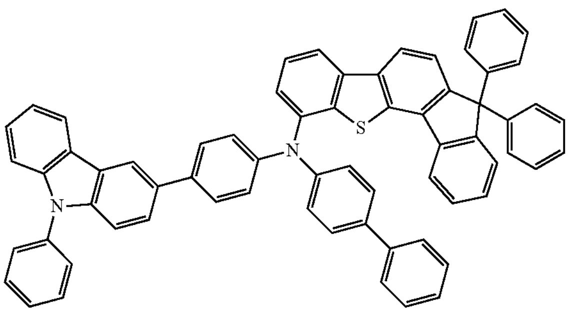
[A-10]
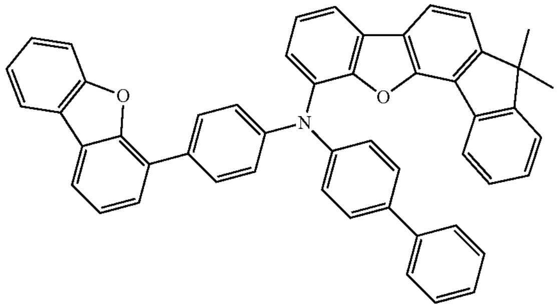
[A-11]
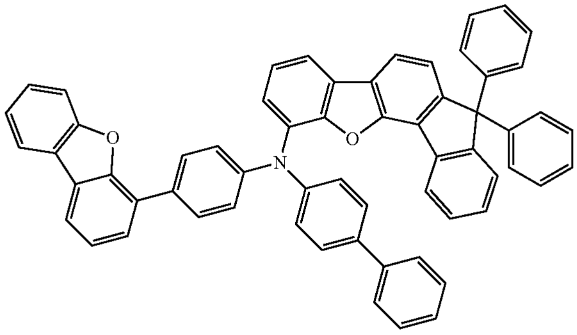
[A-12]
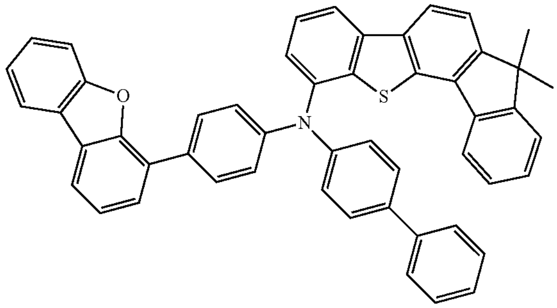

-continued
[A-13]
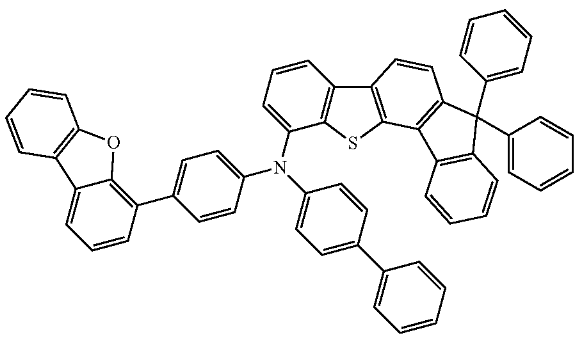
[A-14}
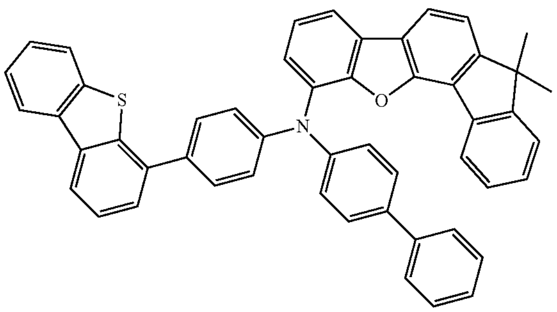
[A-15]
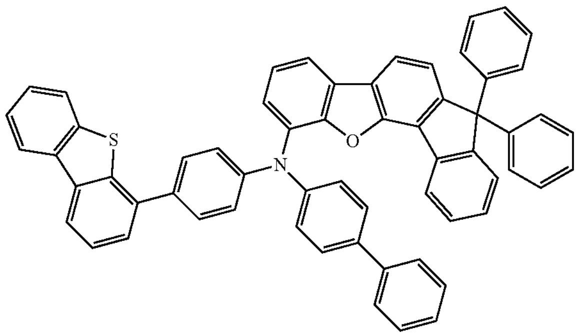
[A-16]
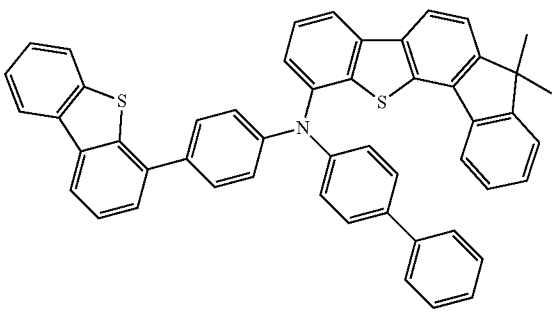
-continued
[A-17]
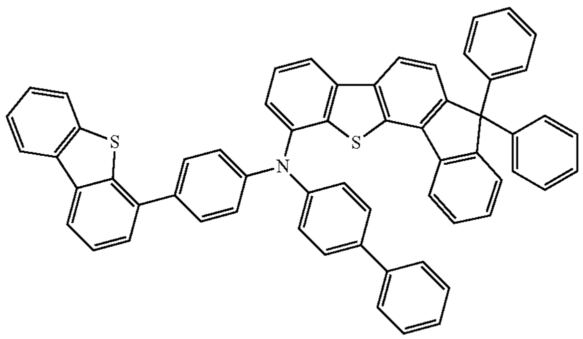
[A-18]
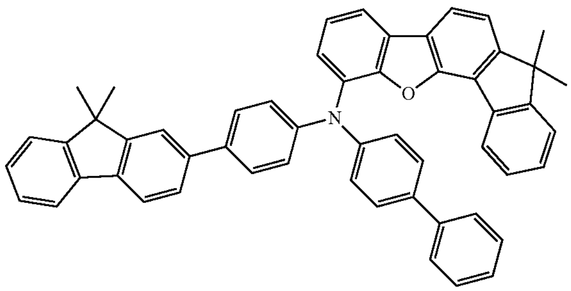
[A-19]
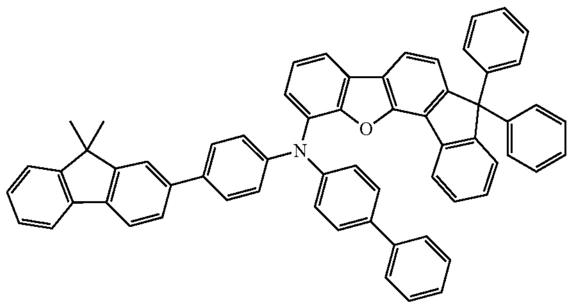
[A-20]
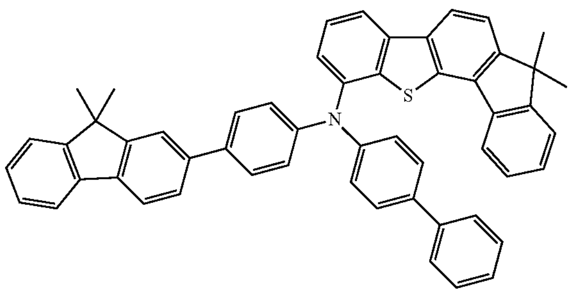
[A-21]
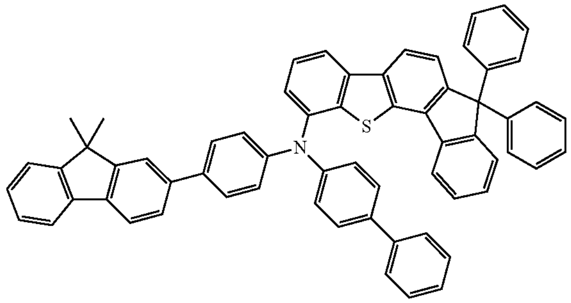

-continued
[A-22]
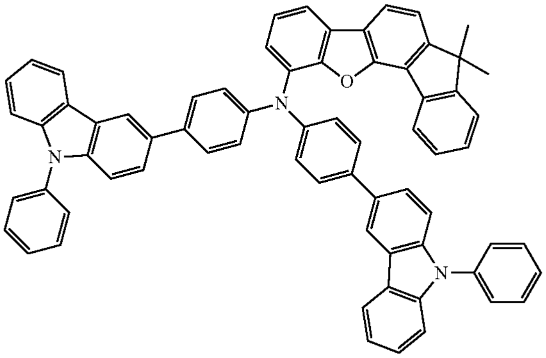
[A-23]
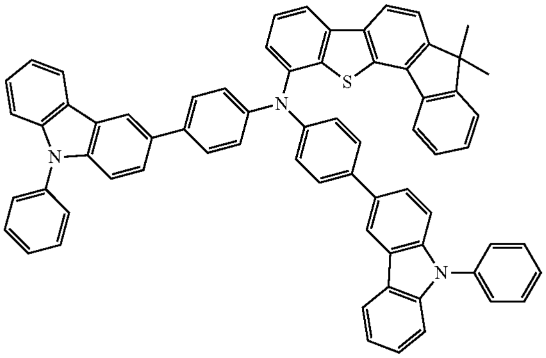
[A-24]
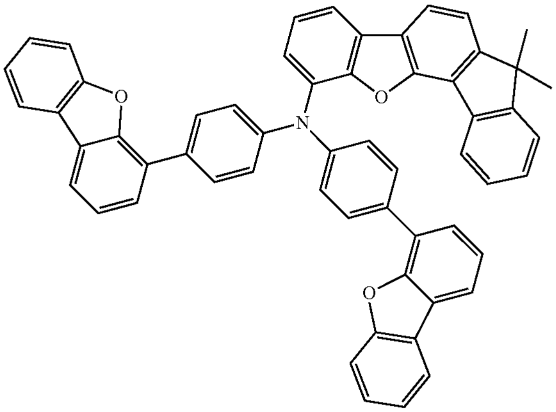
[A-25]
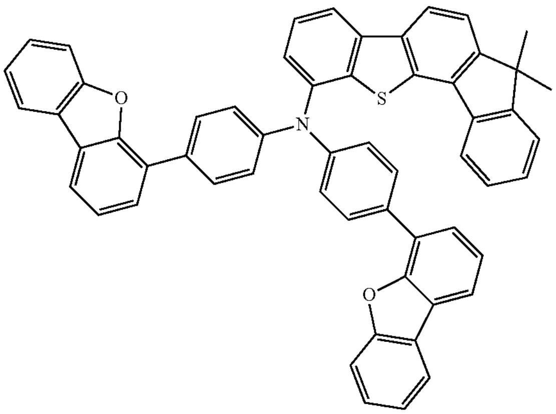
-continued
[A-26]
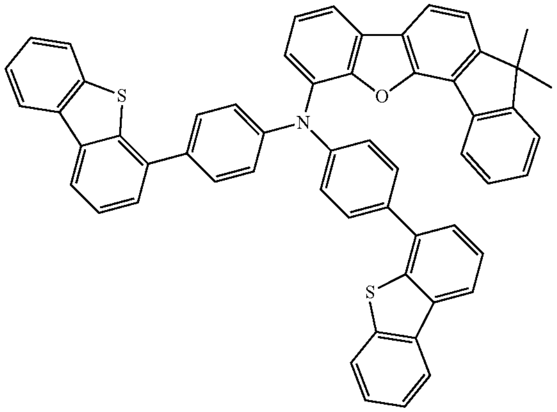
[A-27]
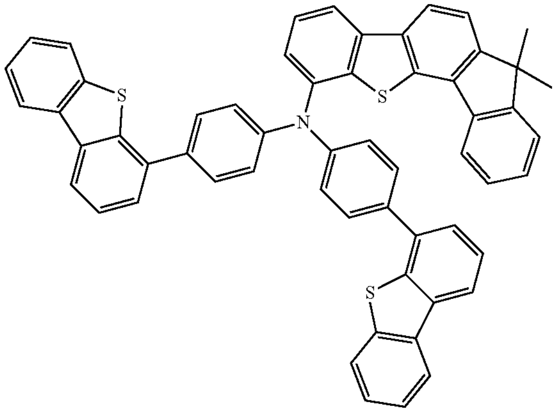
[A-28]
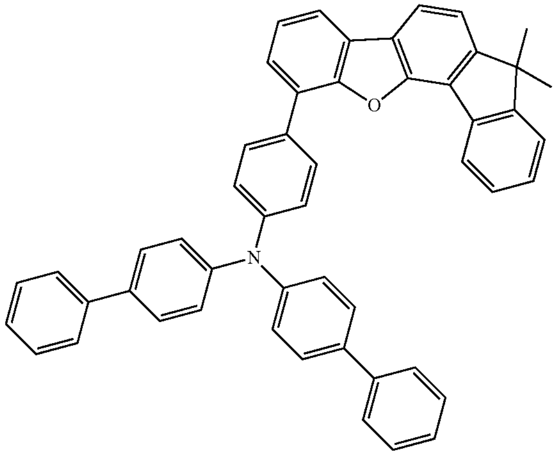

-continued
[A-29]
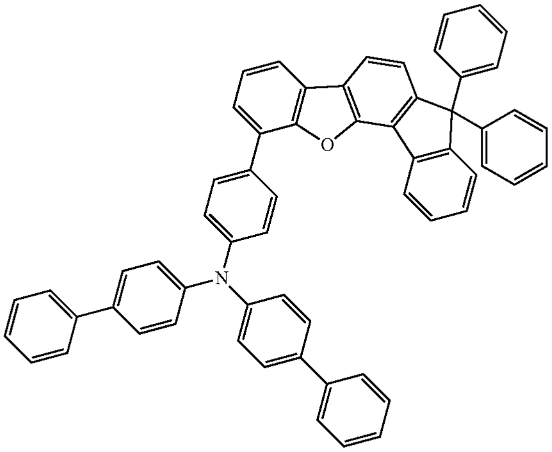
[A-30]
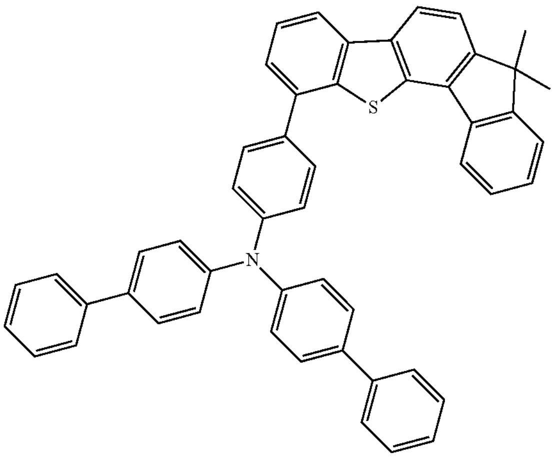
[A-31]
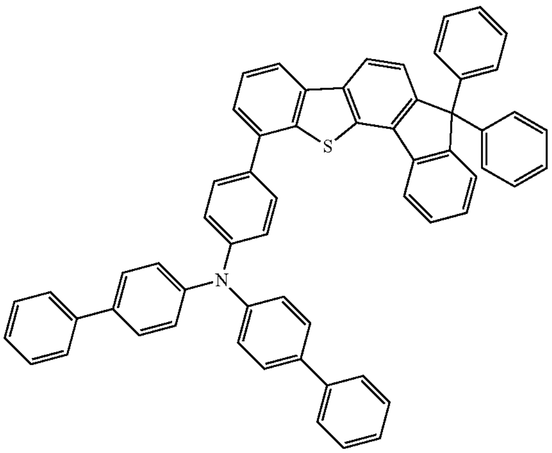
-continued
[A-32]
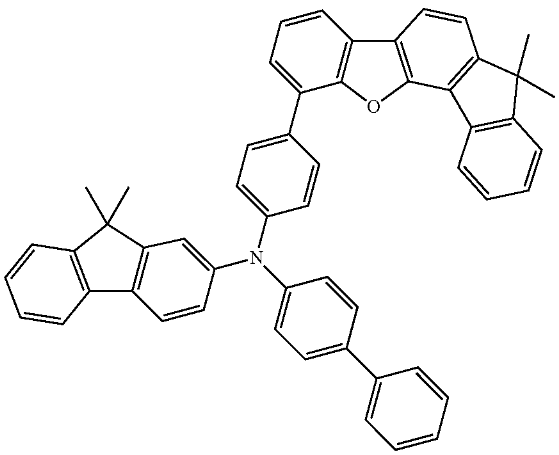
[A-33]
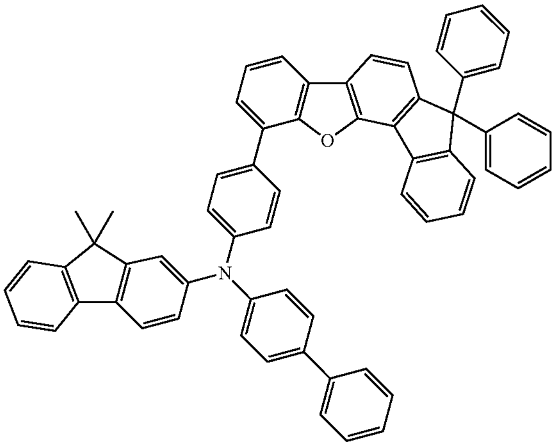
[A-34]
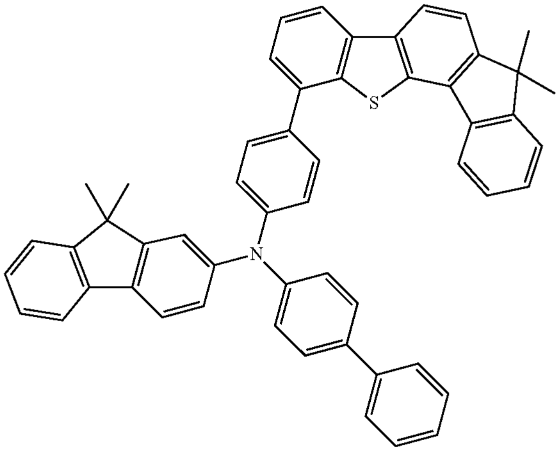

-continued
[A-35]
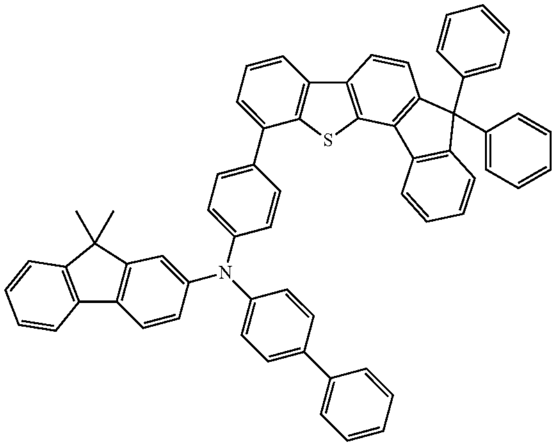
[A-36]
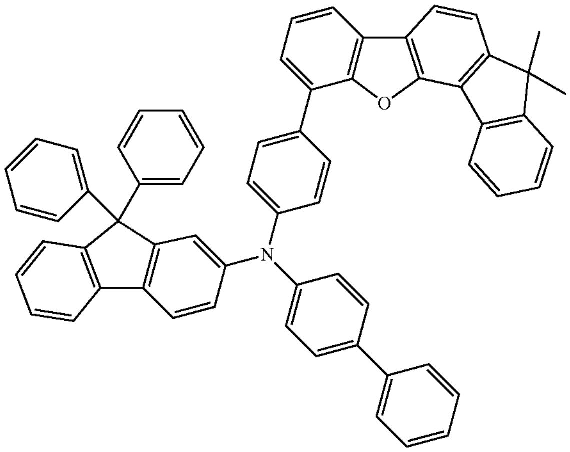
[A-37]
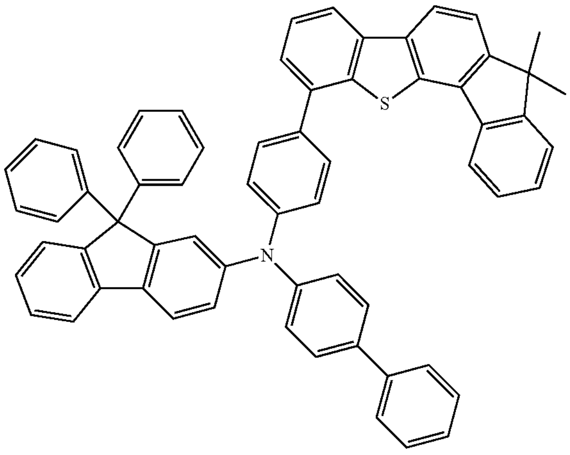
-continued
[A-38]
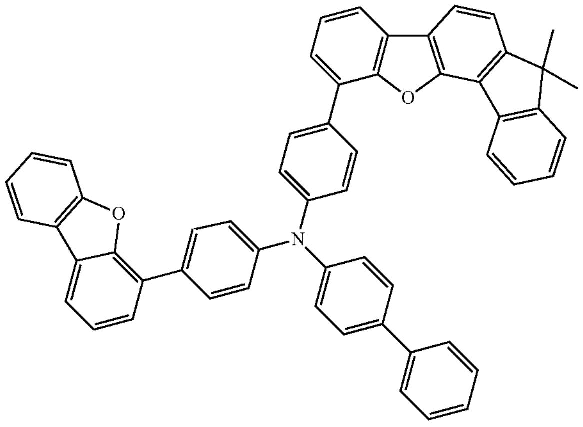
[A-39]
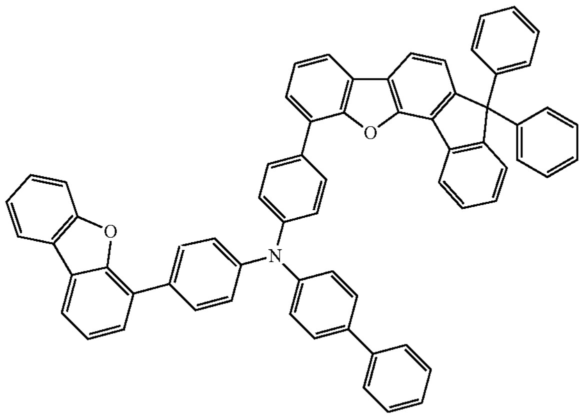
[A-40]
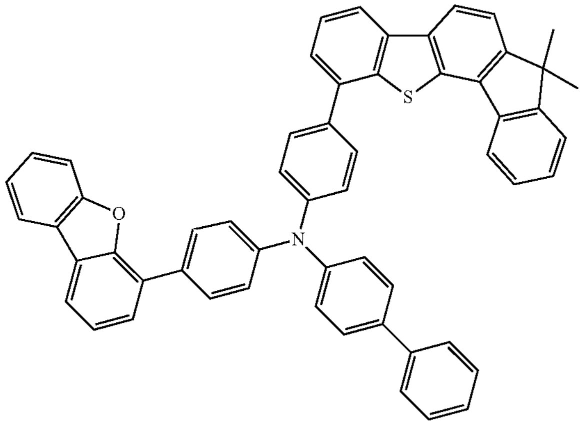

-continued
[A-41]
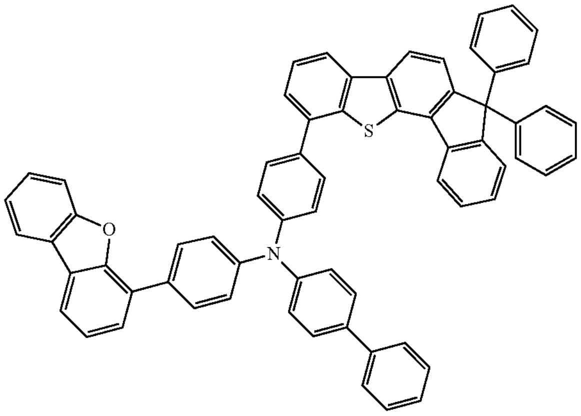
[A-42]
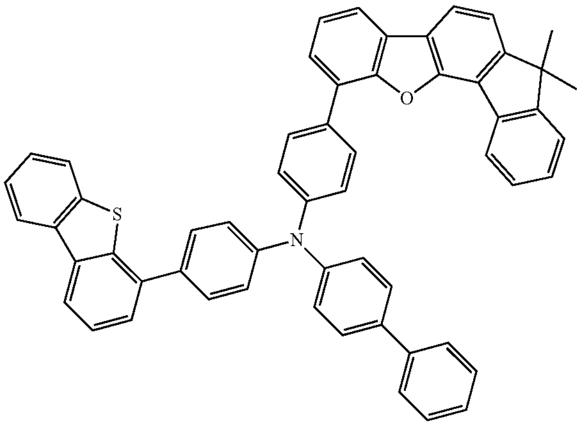
[A-43]
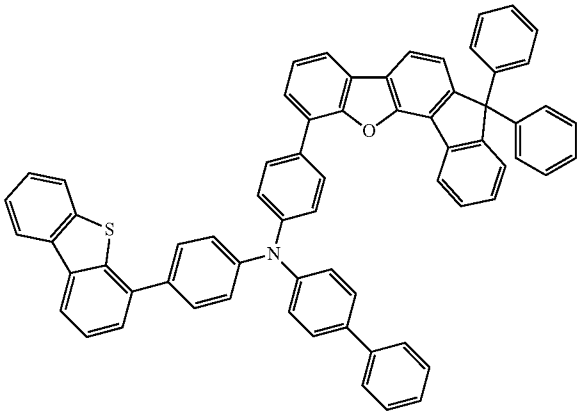
-continued
[A-44]
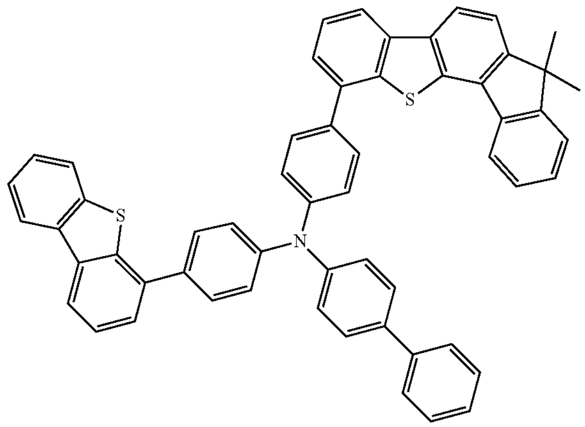
[A-45]
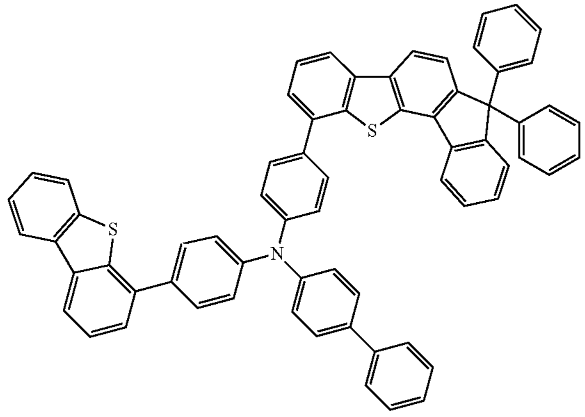
[A-46]
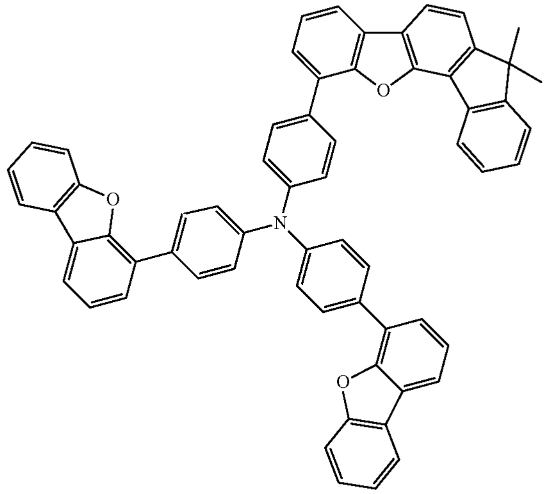

-continued
[A-47]
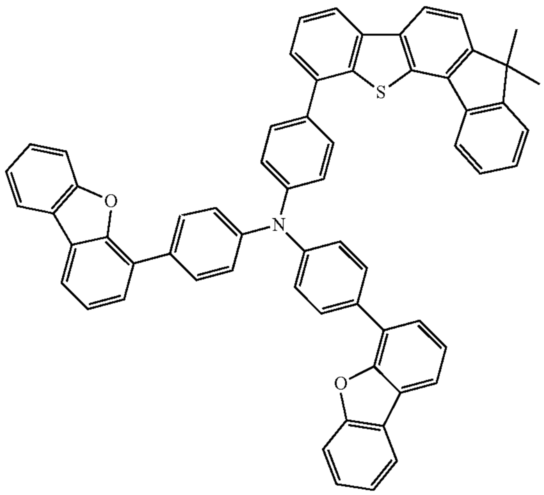
[A-48]
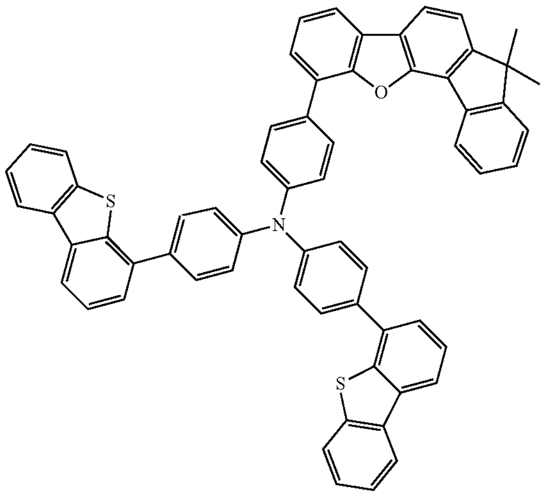
[A-49]
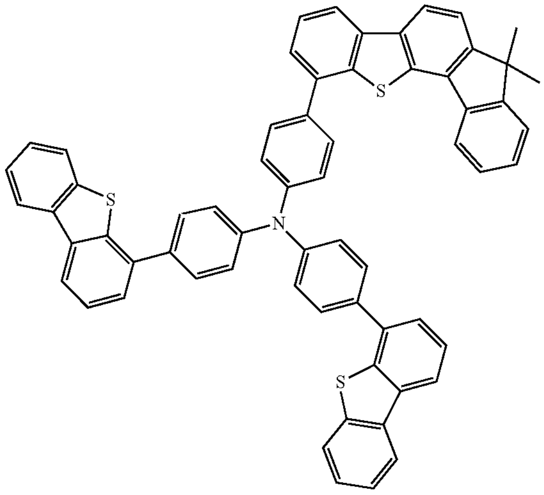
-continued
[A-50]
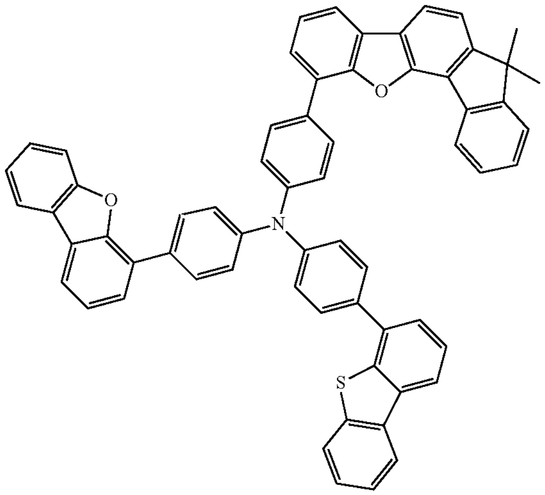
[A-51]
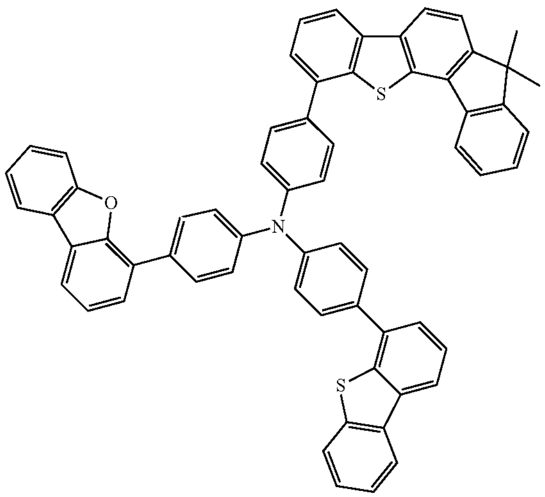
[A-52]
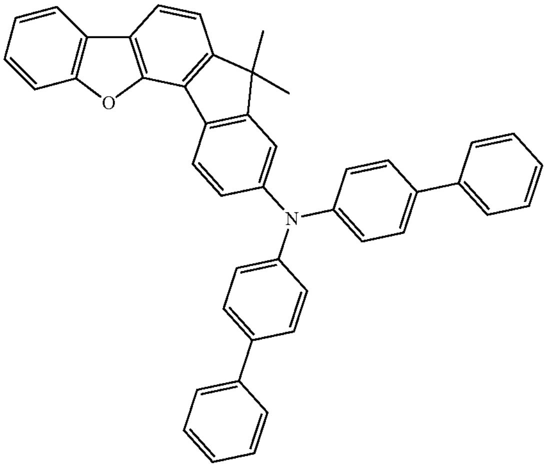

-continued
[A-53]
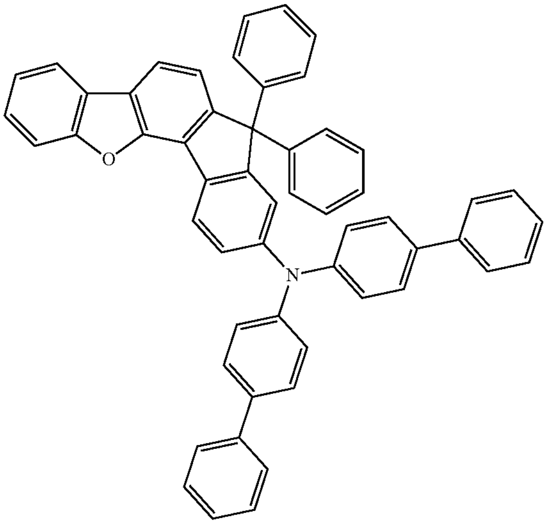
[A-54]
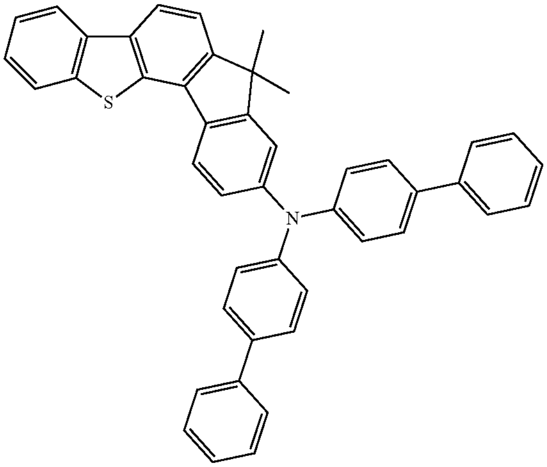
[A-55]
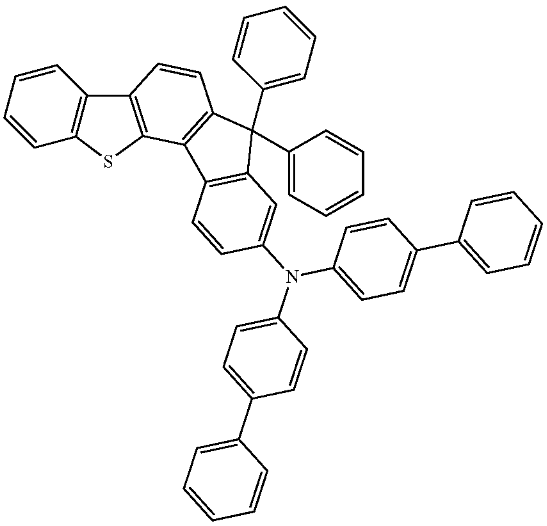
-continued
[A-56]
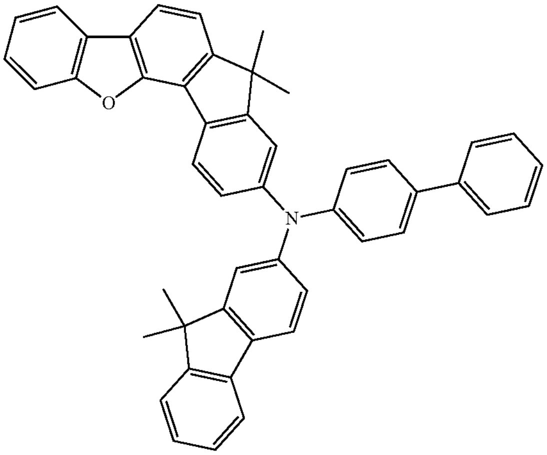
[A-57]
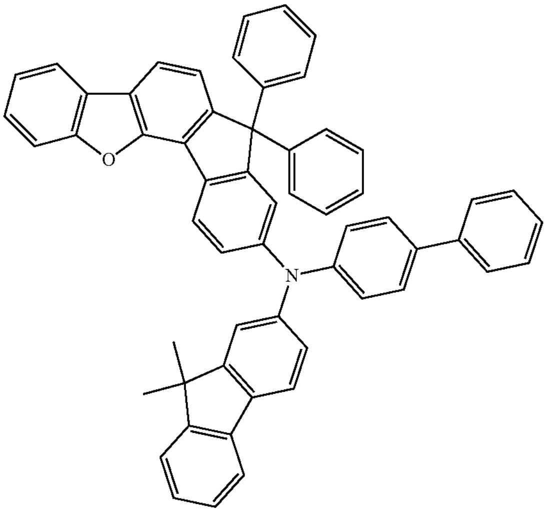
[A-58]
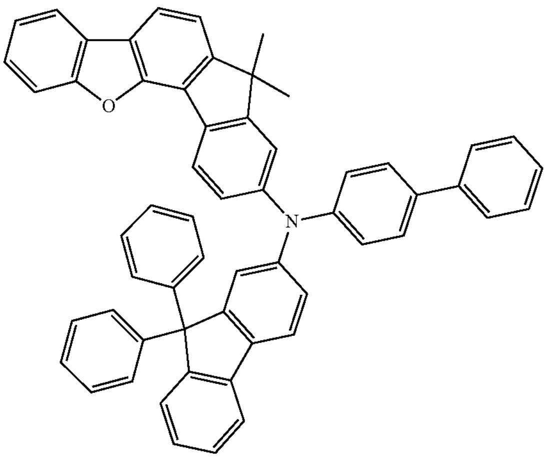

-continued
[A-59]
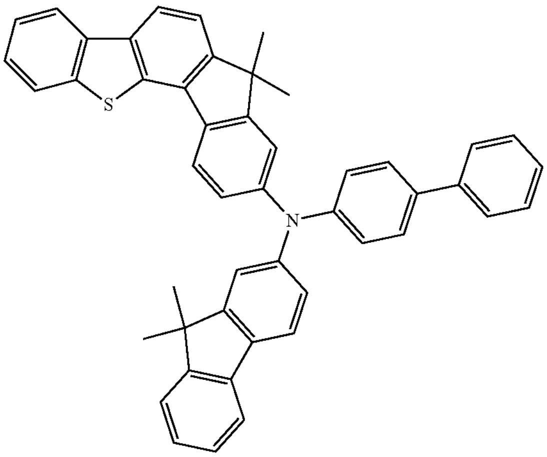
[A-60]
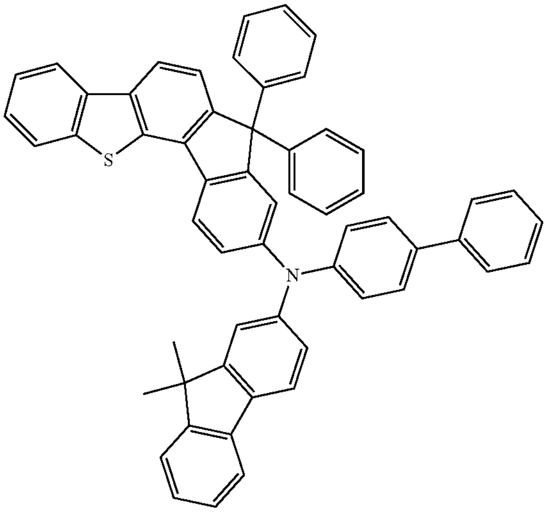
[A-61]
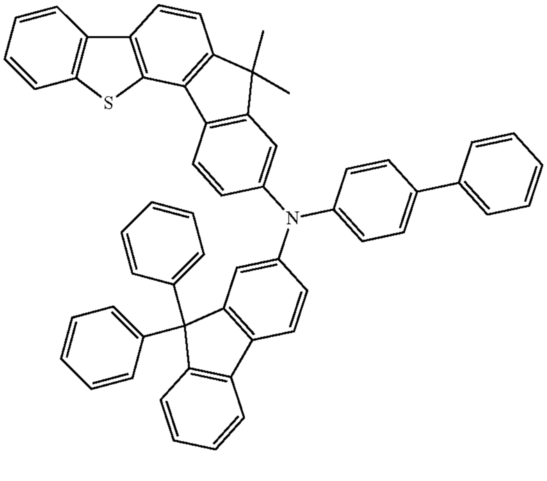
-continued
[A-62]
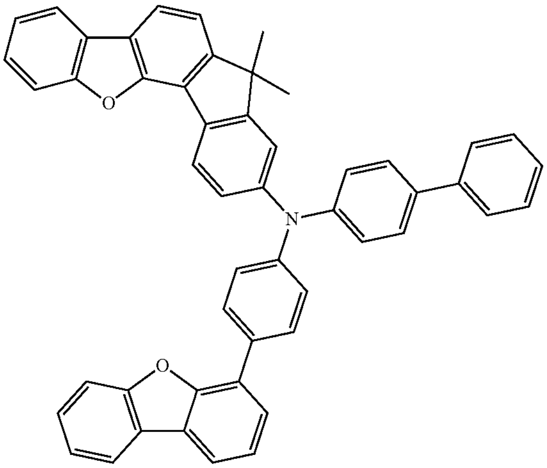
[A-63]
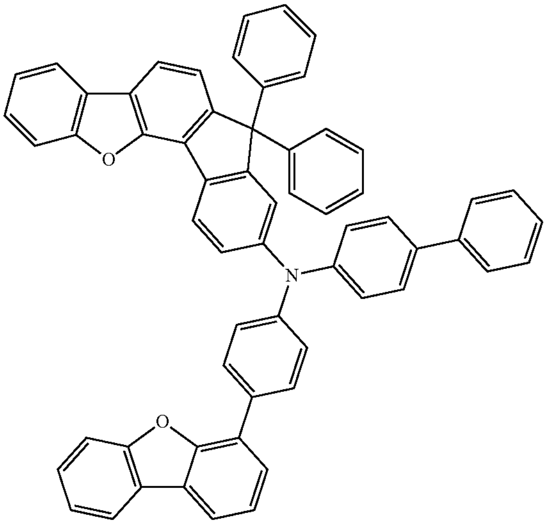
[A-64]
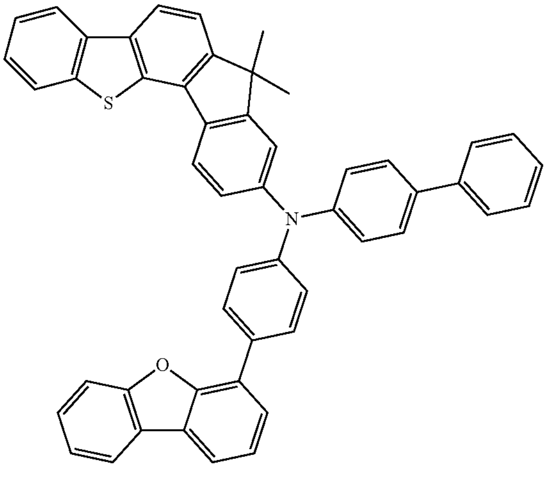

-continued
[A-65]
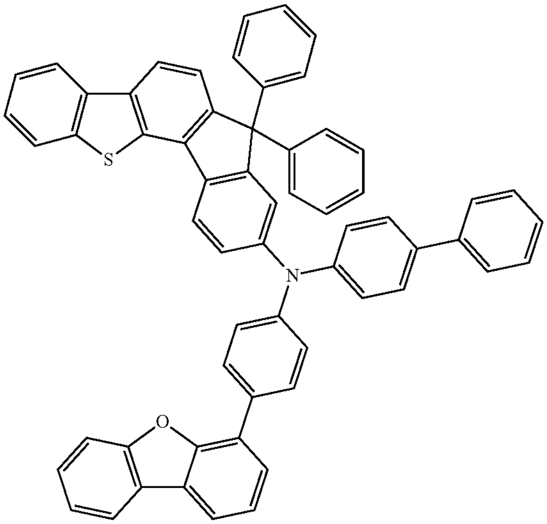
[A-66]
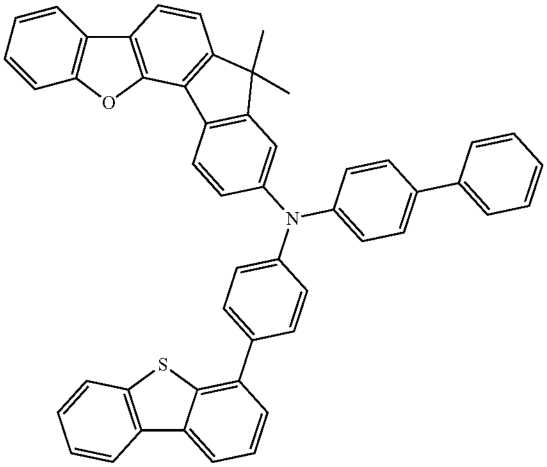
[A-67]
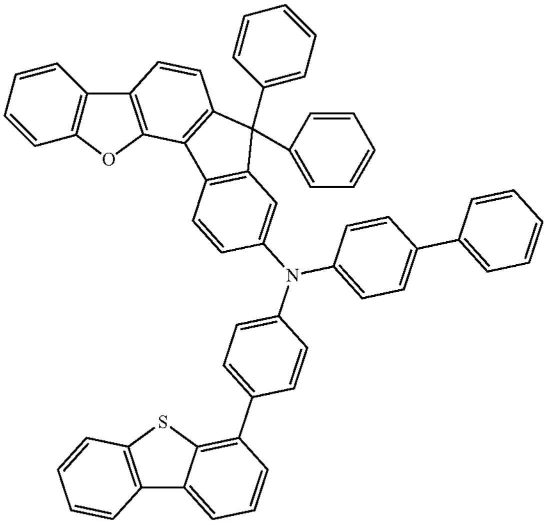
-continued
[A-68]
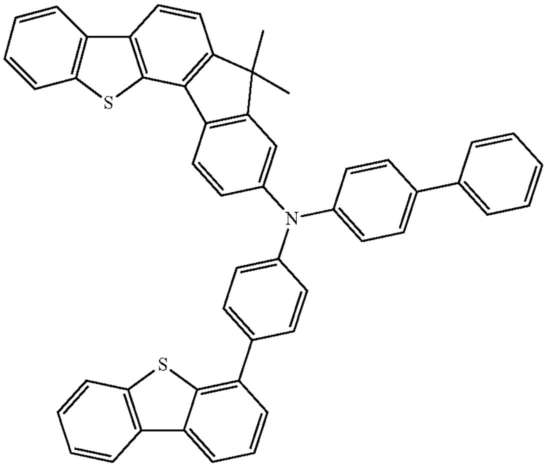
[A-69]
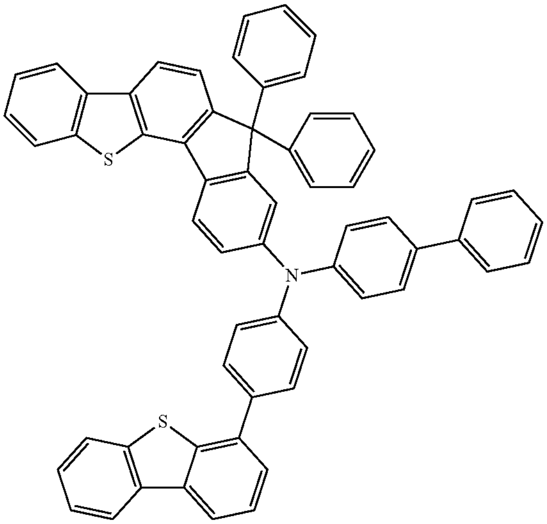
[A-70]
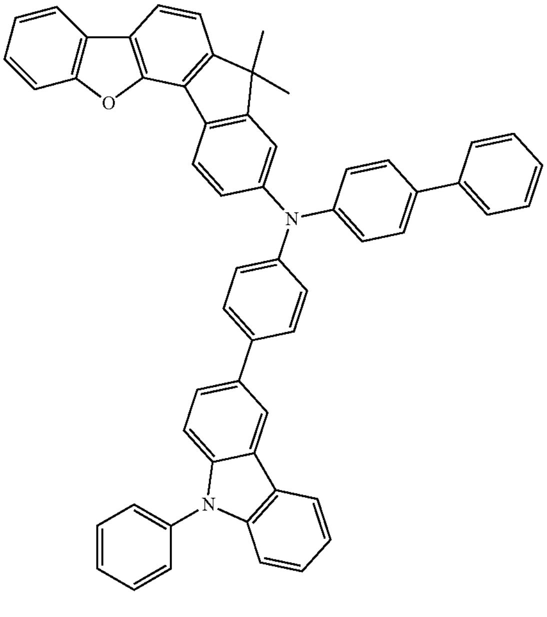

-continued
[A-71]
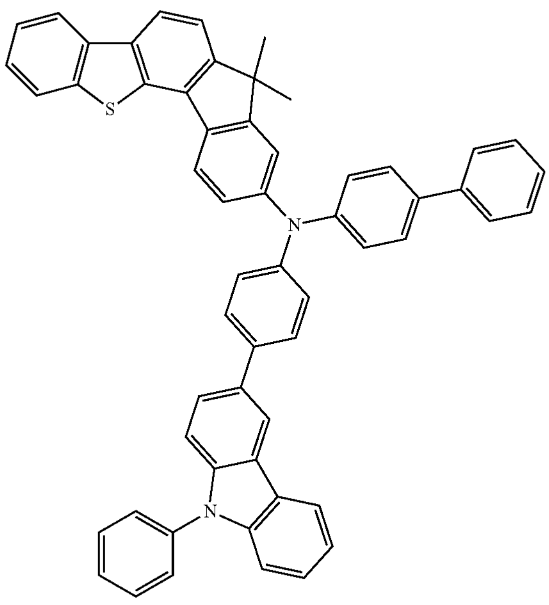
[A-72]
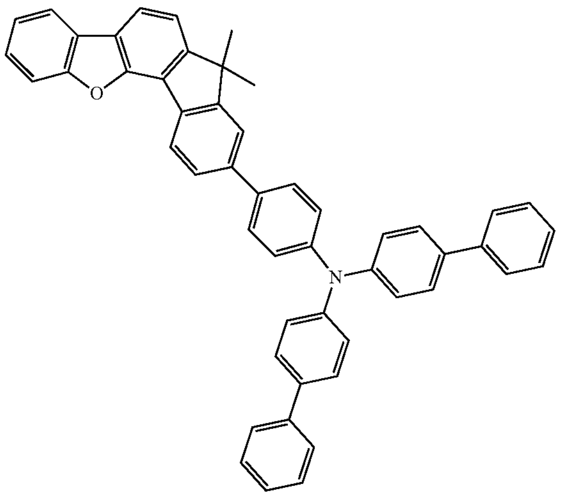
[A-73]
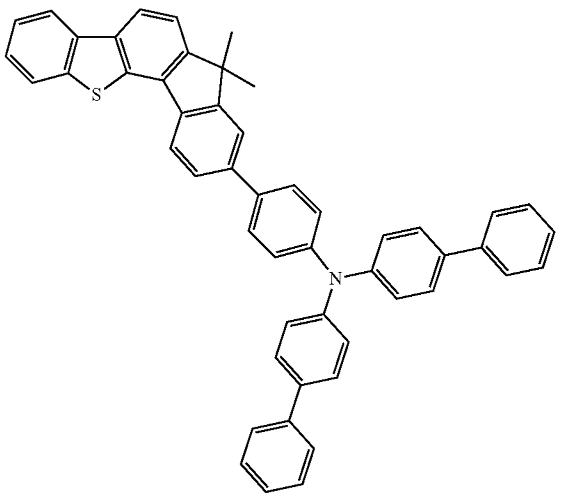
-continued
[A-74]
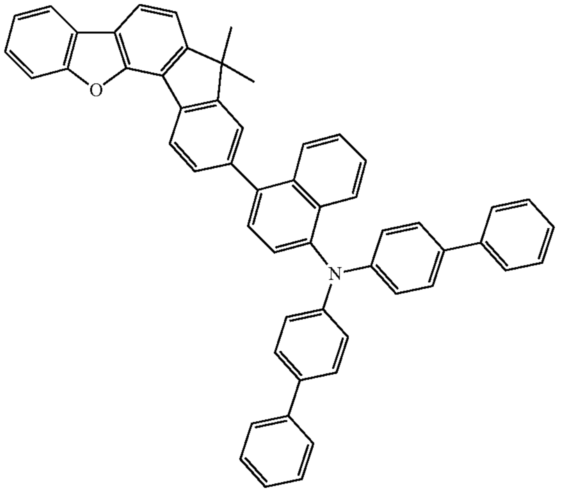
[A-75]
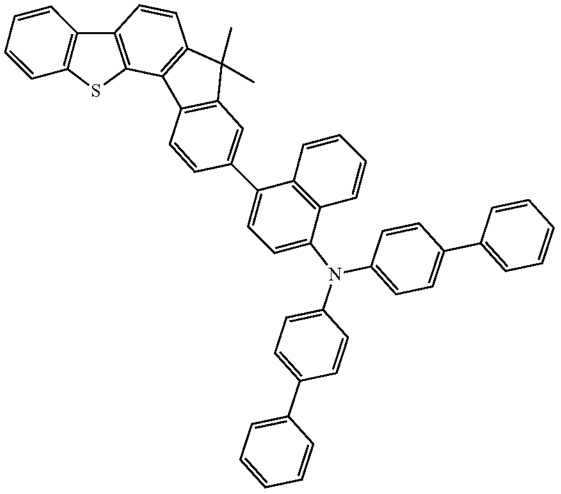
[A-76]
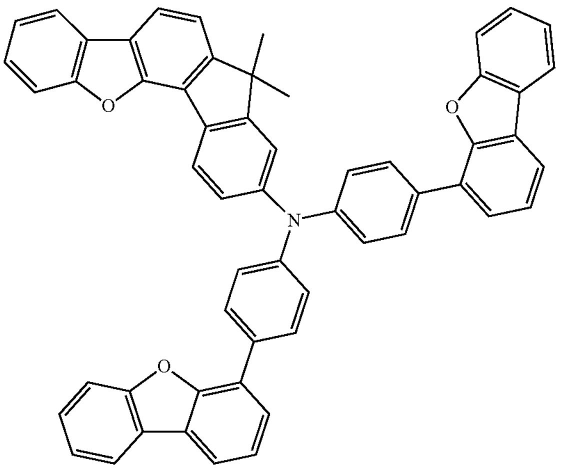

-continued
[A-77]
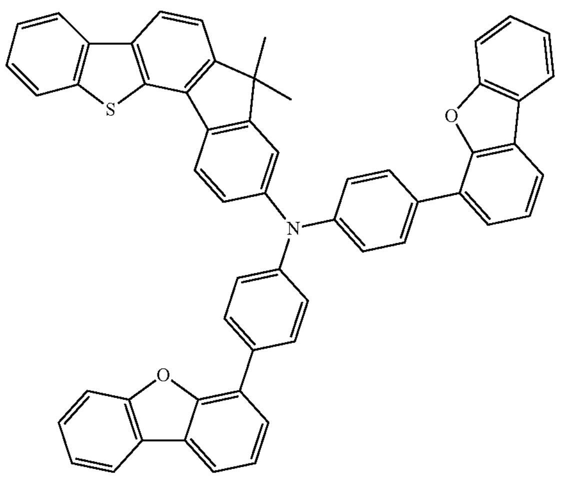
[A-78]
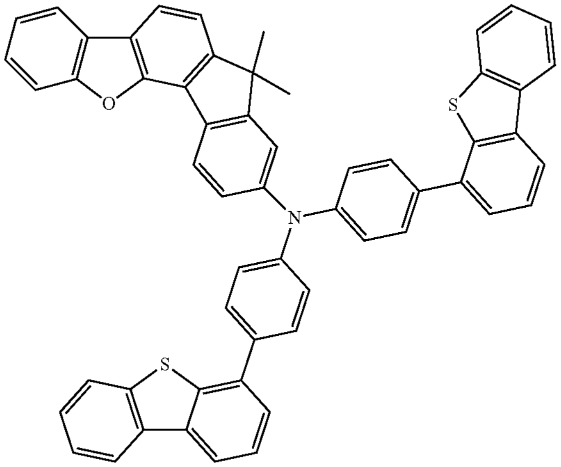
[A-79]
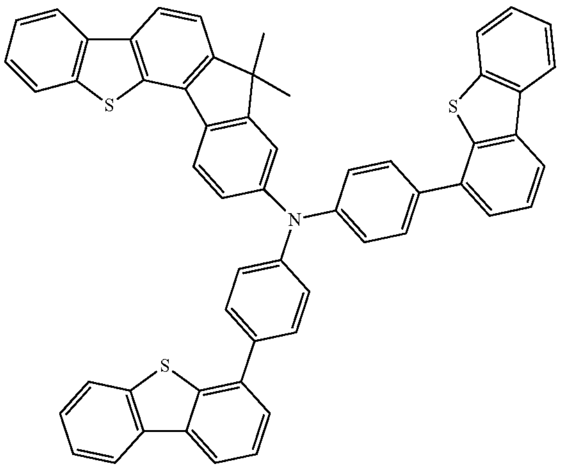
-continued
[A-80]
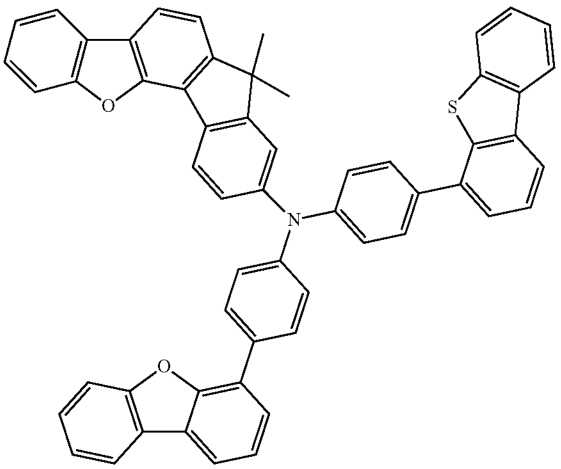
[A-81]
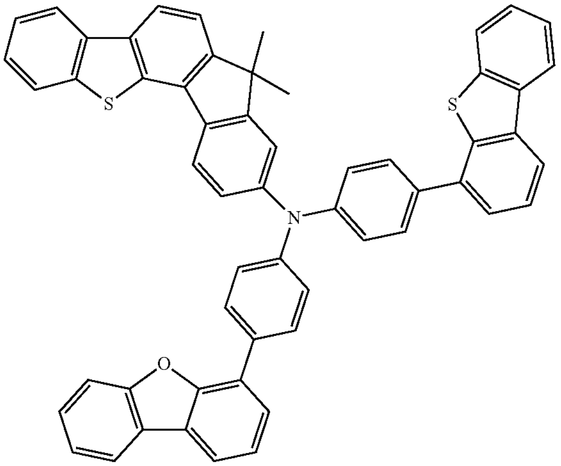
[A-82]
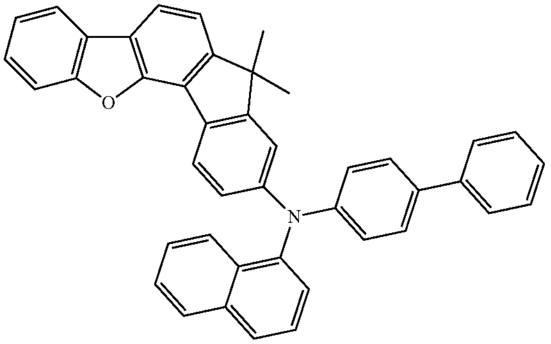

-continued
[A-83]
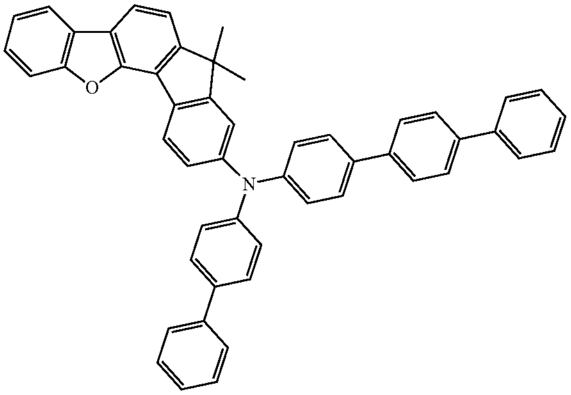
[A-84]
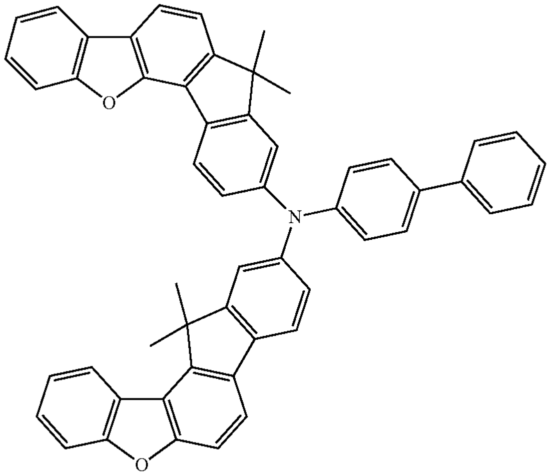
[A-85]
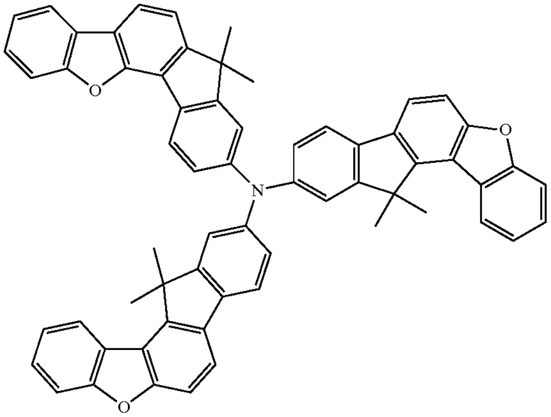
-continued
[A-86]
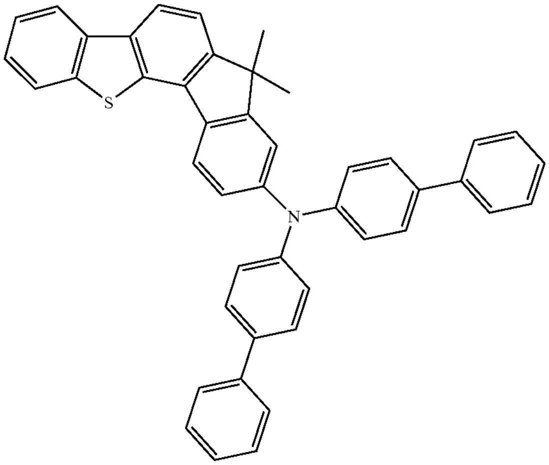
[A-87]
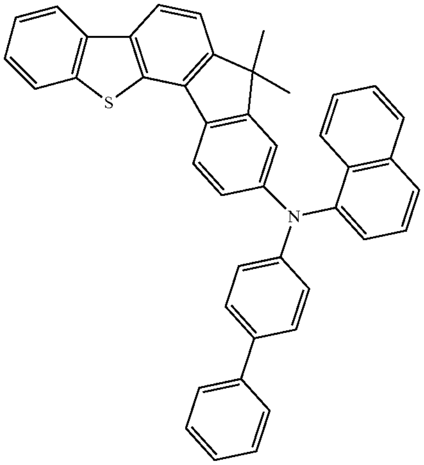
[A-88]
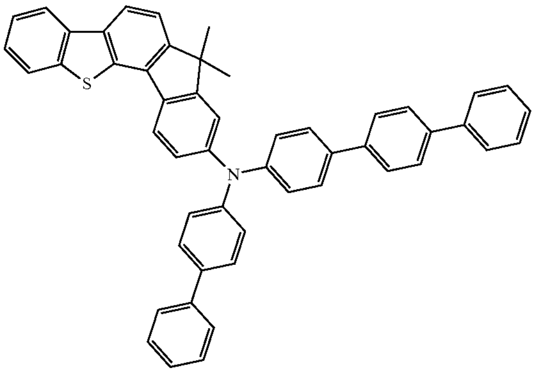

-continued
[A-89]
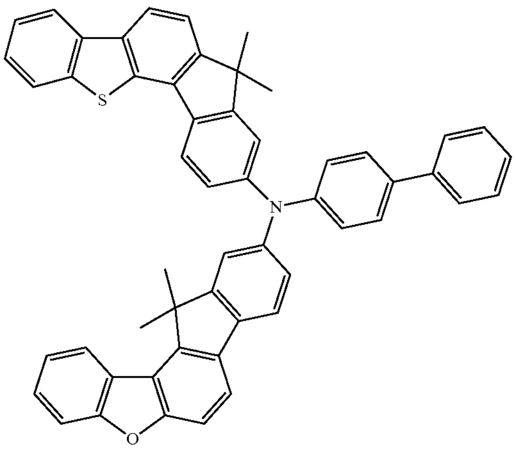
[A-90]
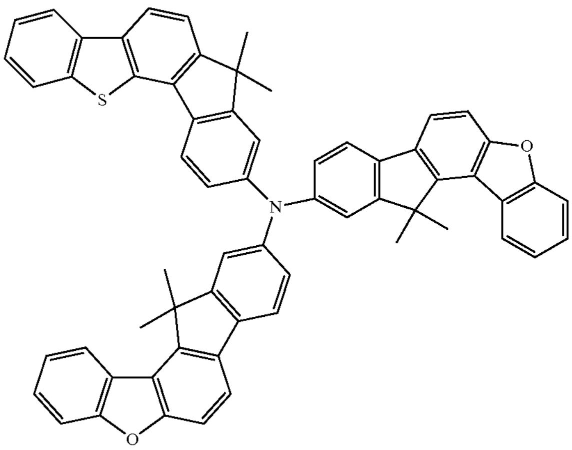
[A-91]
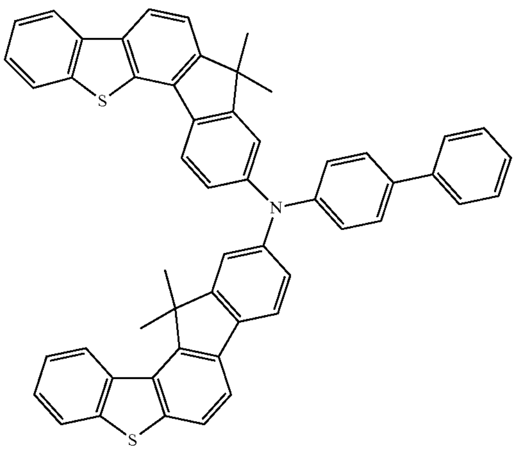
-continued
[A-92]
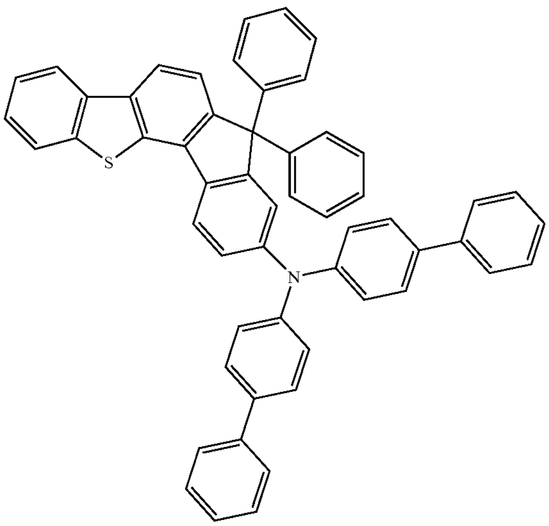
[A-93]
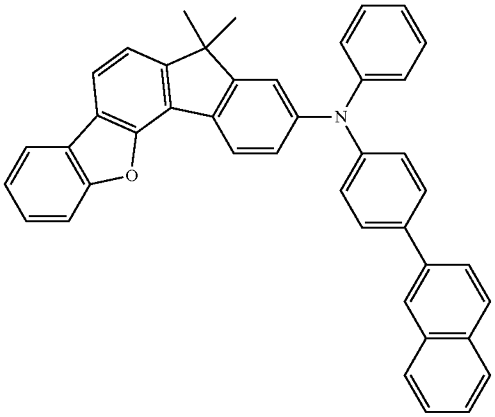
[A-94]
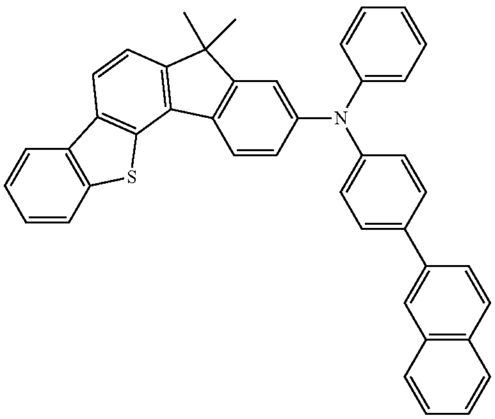

[A-95]
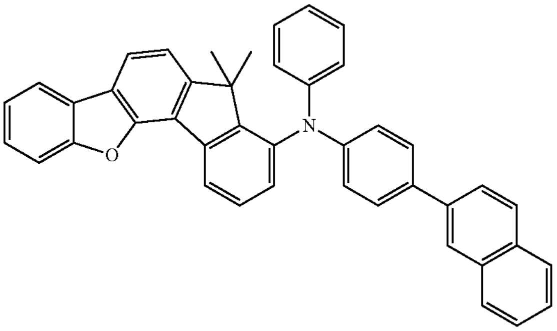
[A-96]
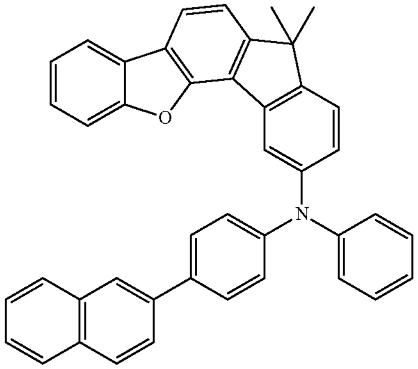
[A-97]
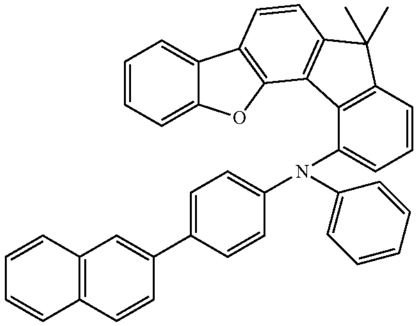
[A-98]
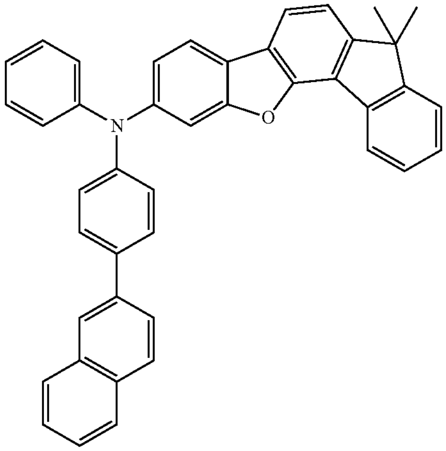
[A-99]
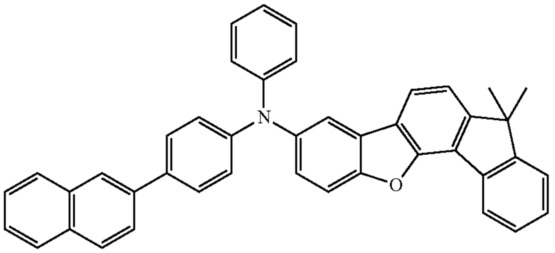
[A-100]
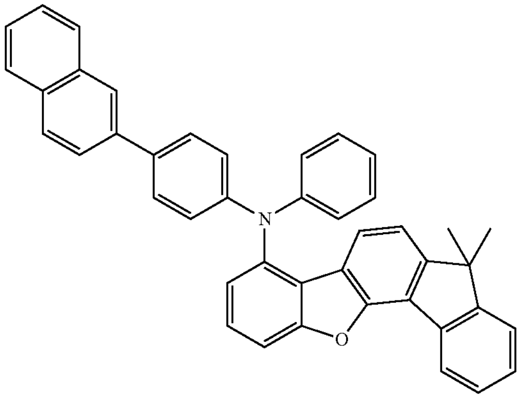
[A-101]
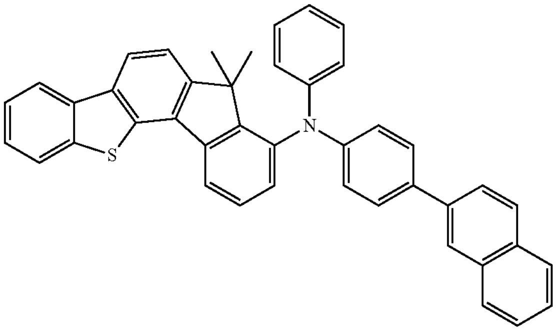
[A-102]
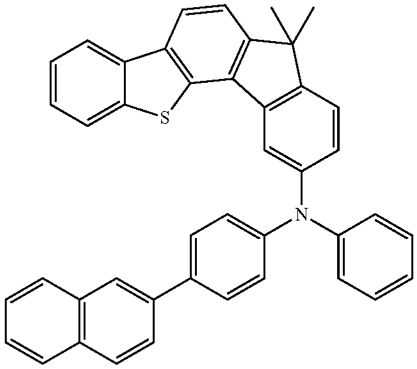

-continued
[A-103]
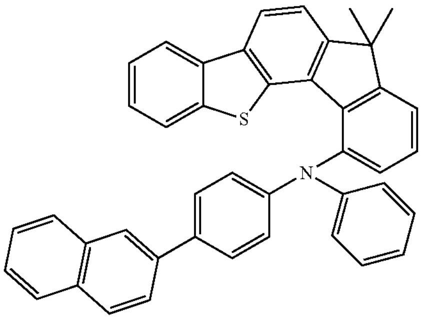
[A-104]
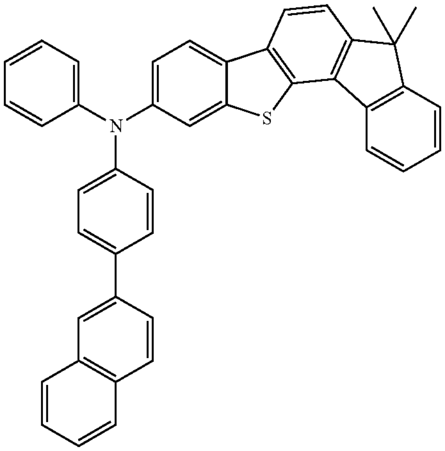
[A-105]
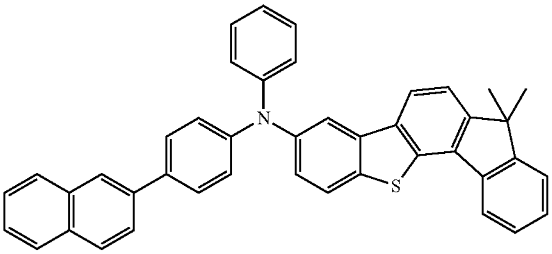
[A-106]
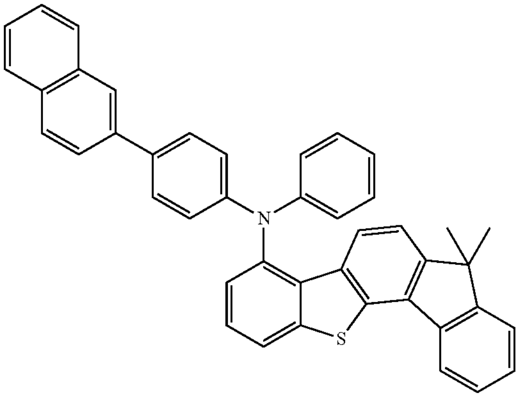
-continued
[A-107]
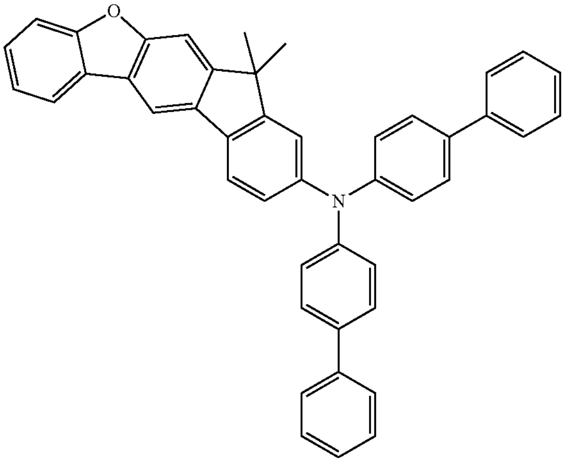
[A-108]
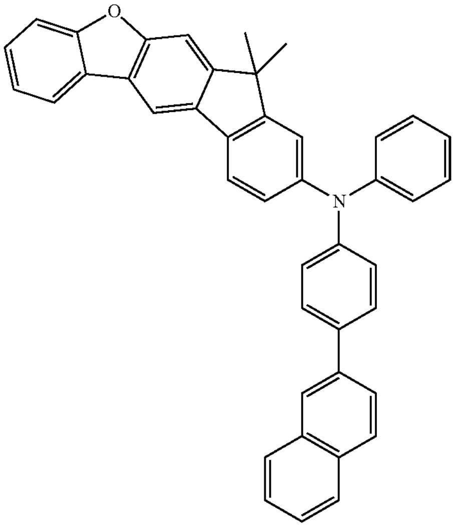
[A-109]
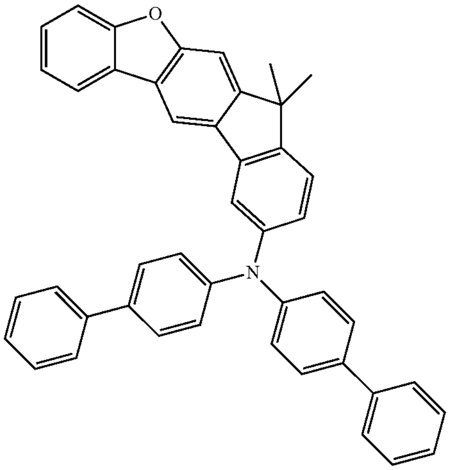

-continued
[A-110]
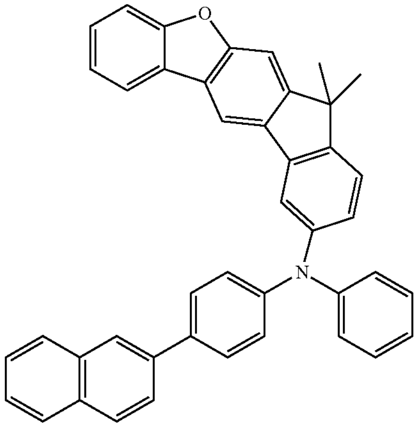
[A-111]
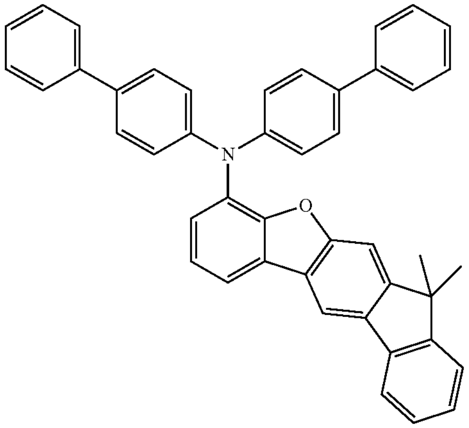
[A-112]
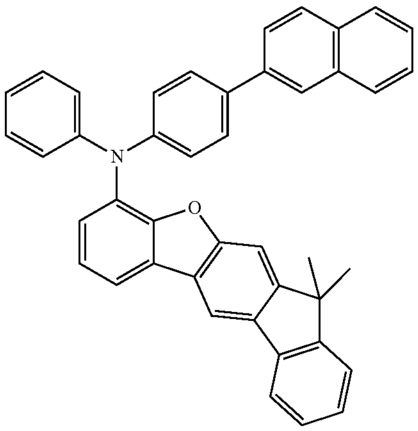
-continued
[A-113]
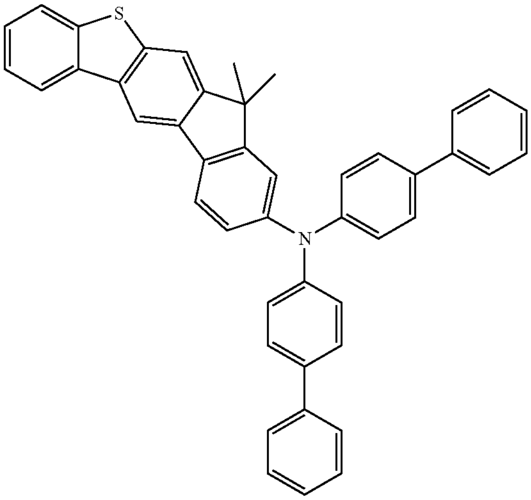
[A-114]
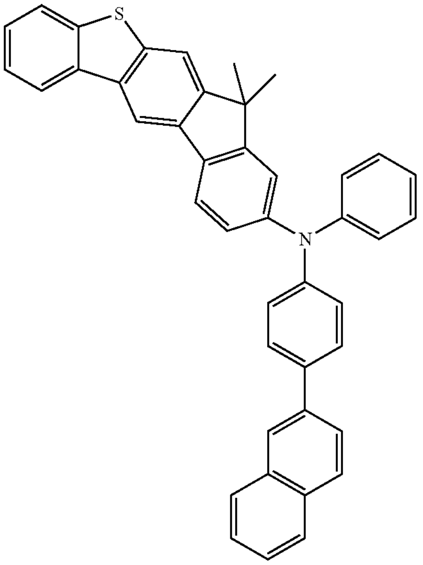
[A-115]
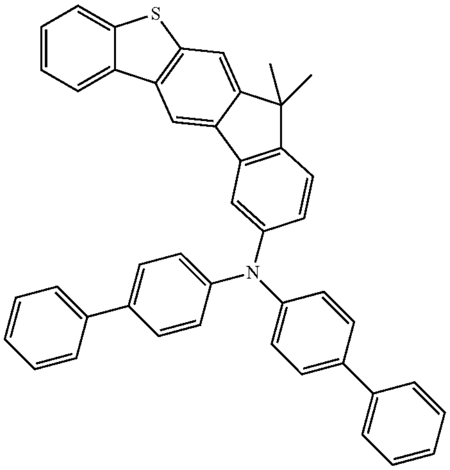

-continued
[A-116]
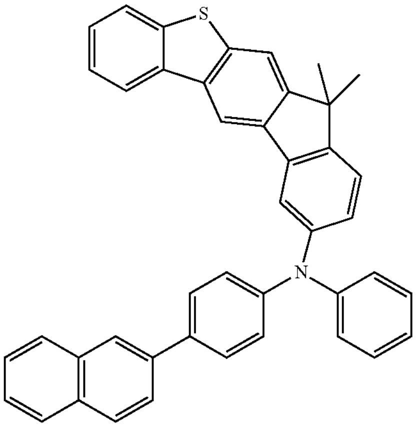
[A-117]
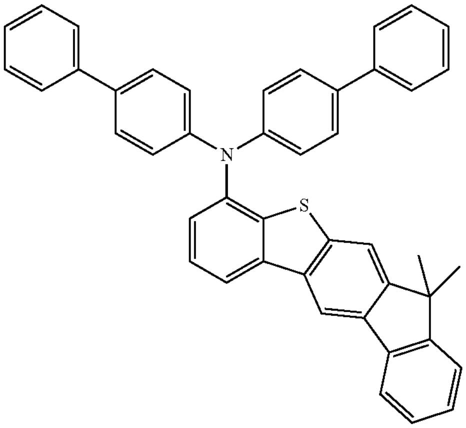
[A-118]
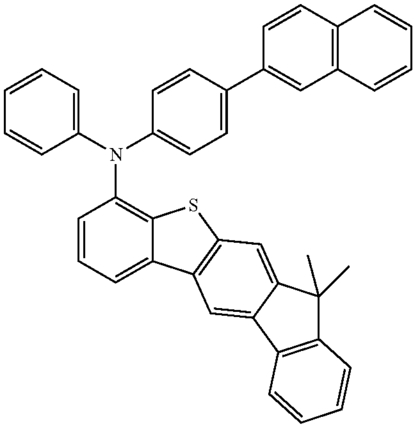
-continued
[A-119]
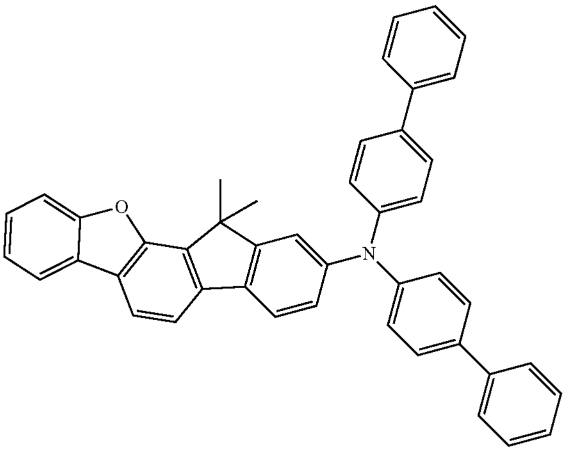
[A-120]
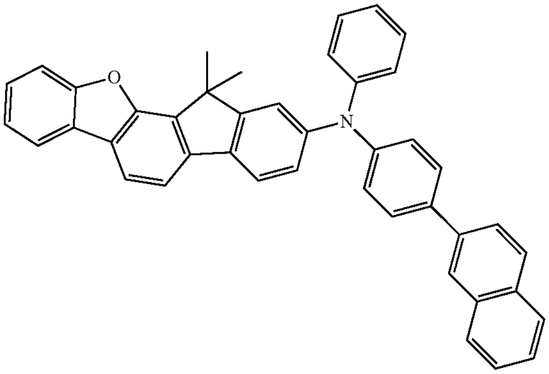
[A-121]
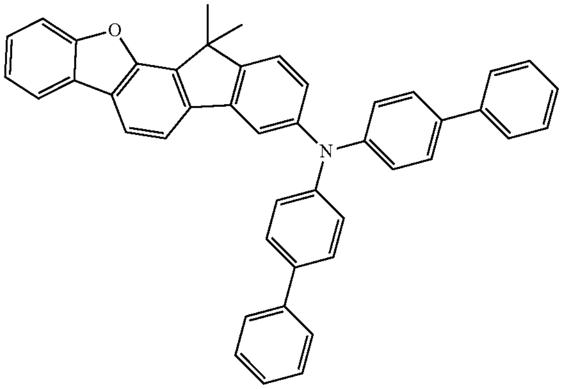

-continued
[A-122]
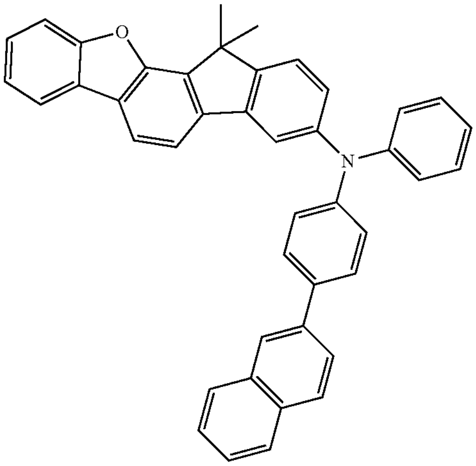
[A-123]
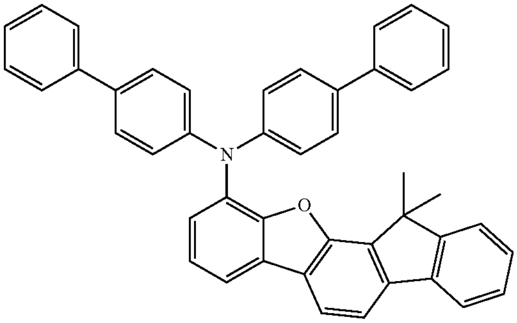
[A-124]
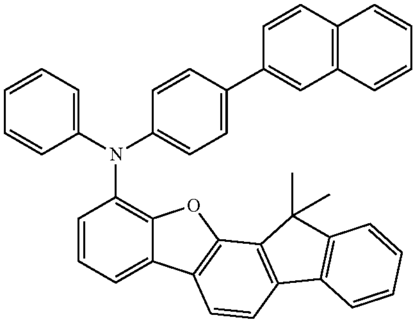
[A-125]
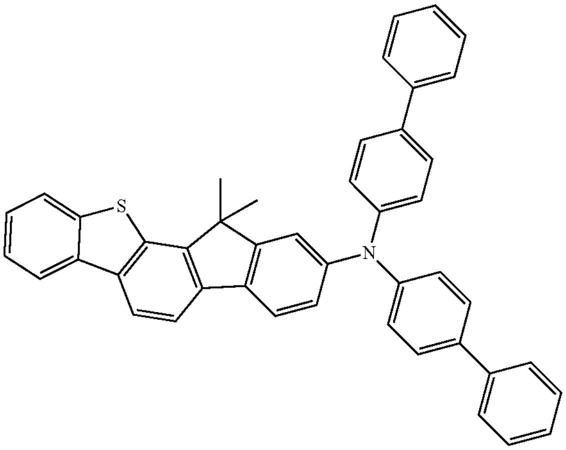
-continued
[A-126]
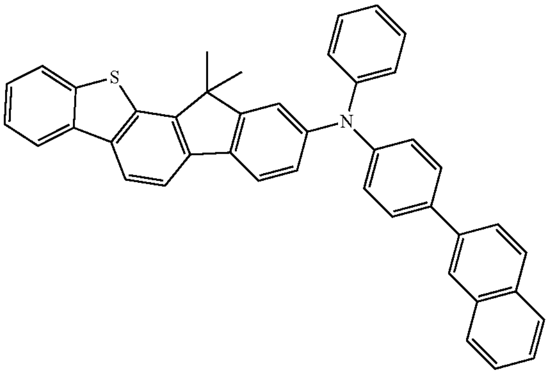
[A-127]
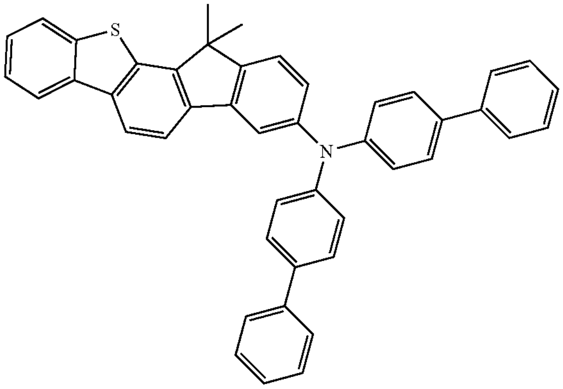
[A-128]
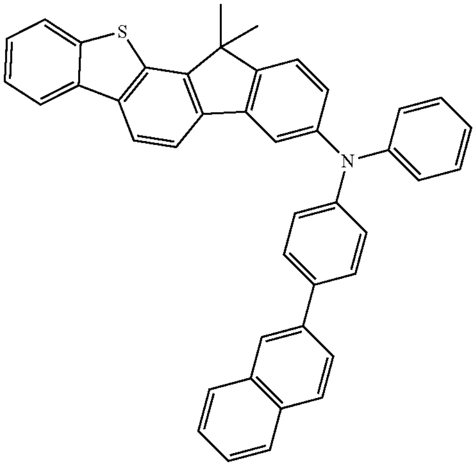
[A-129]
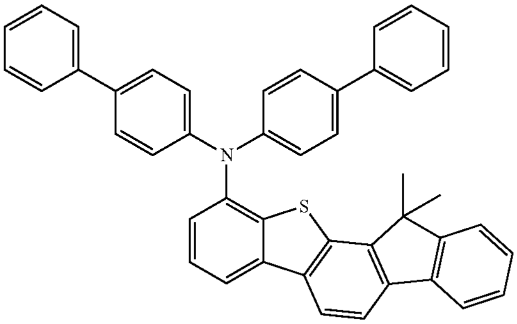

-continued
[A-130]
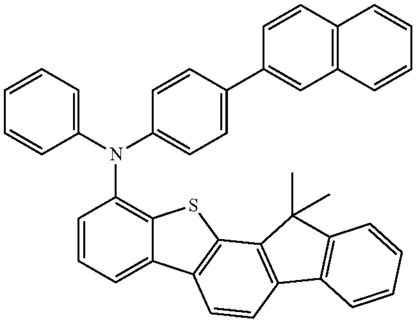
[A-131]
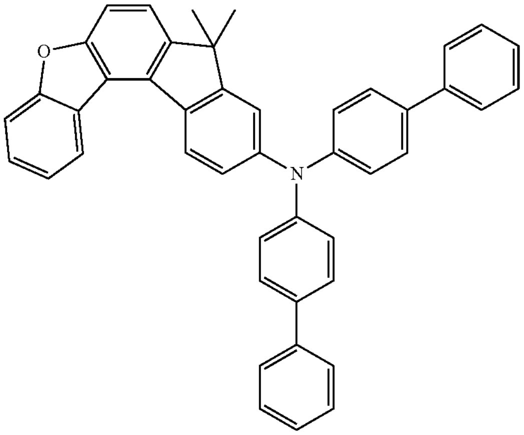
[A-132]
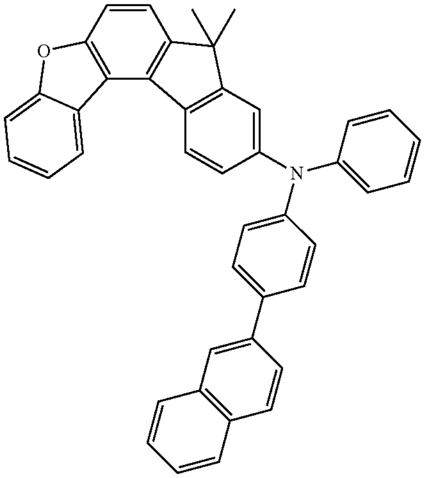
-continued
[A-133]
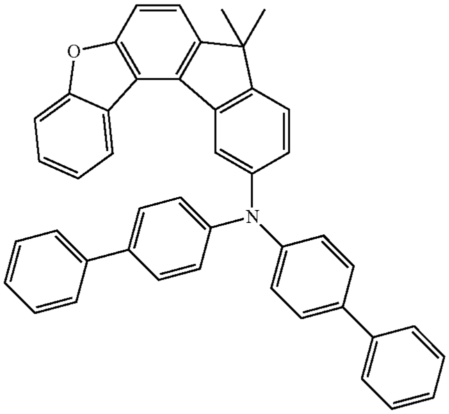
[A-134]
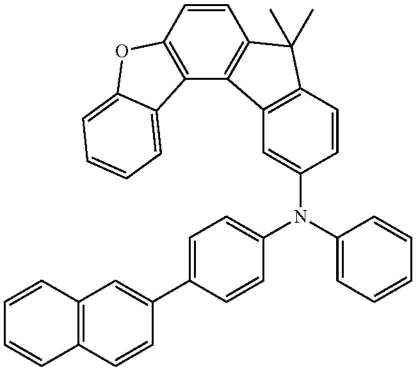
[A-135]
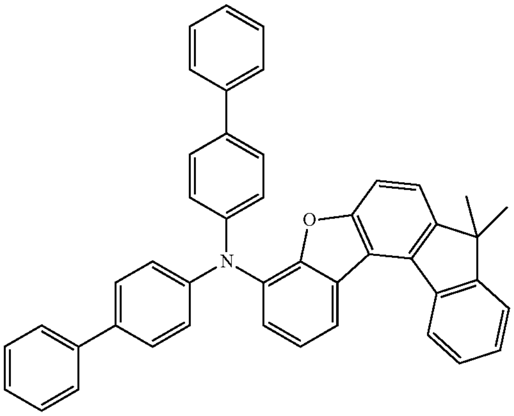

-continued
[A-136]
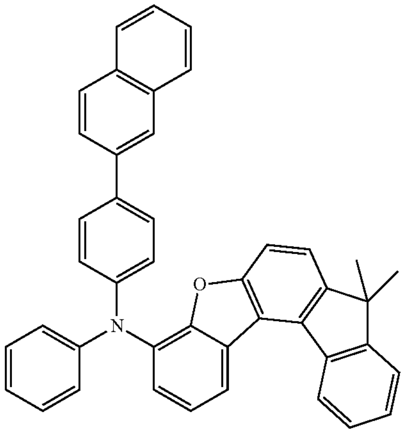
[A-137]
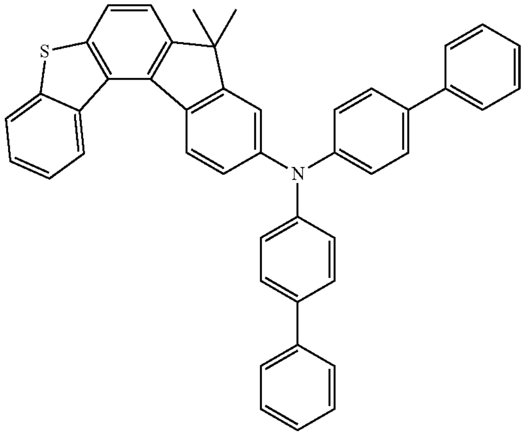
[A-138]
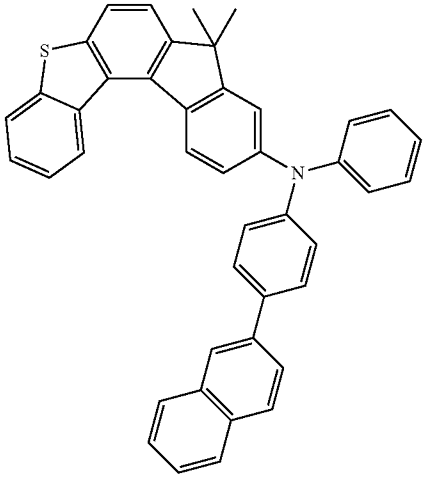
-continued
[A-139]
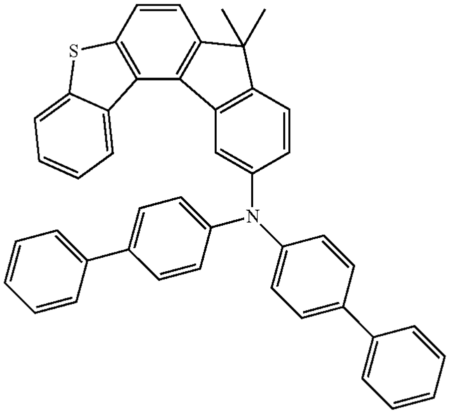
[A-140]
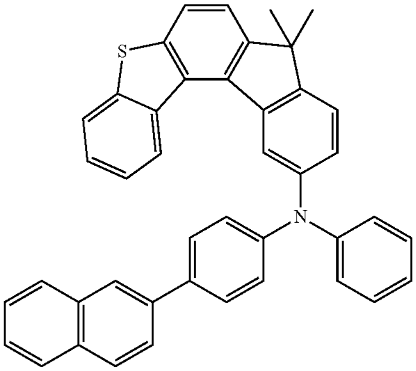
[A-141]
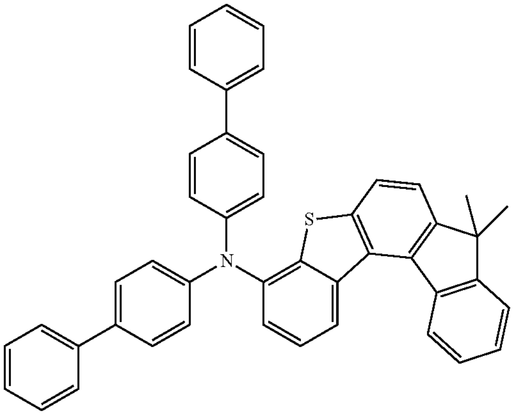

-continued
[A-142]
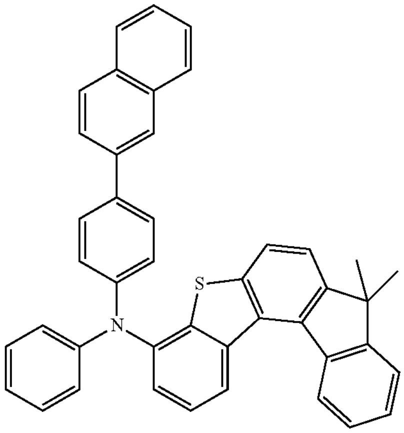
[A-143]
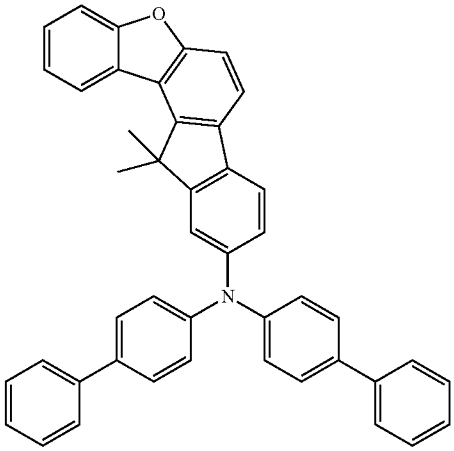
[A-144]
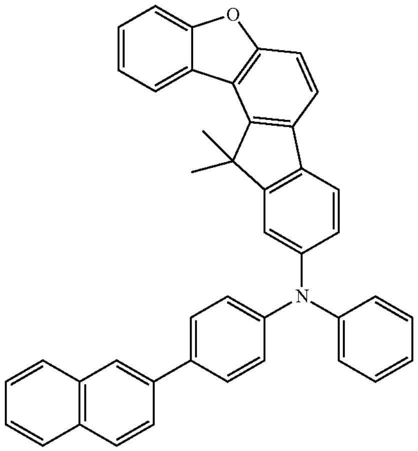
-continued
[A-145]
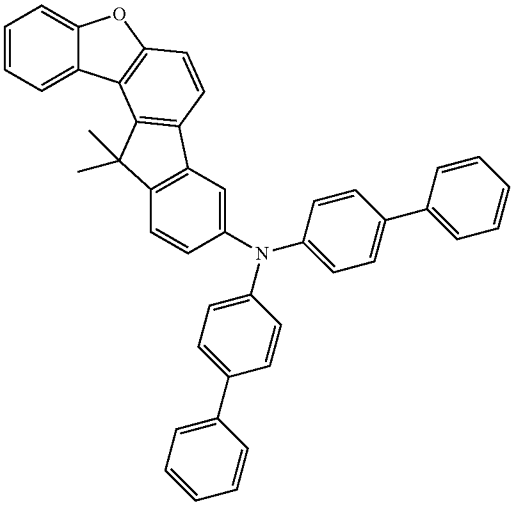
[A-146]
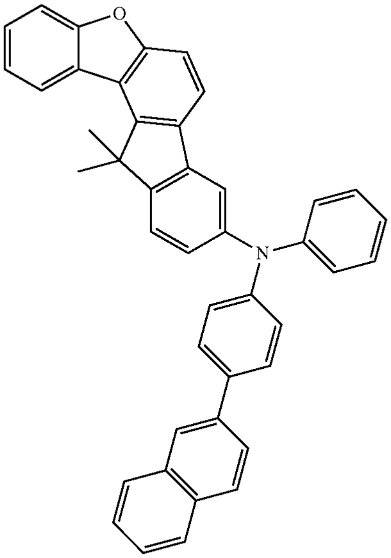
[A-147]
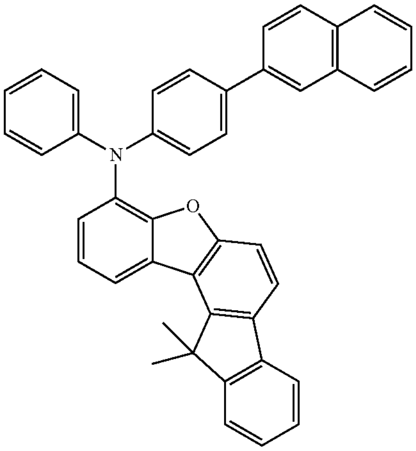

-continued
[A-148]
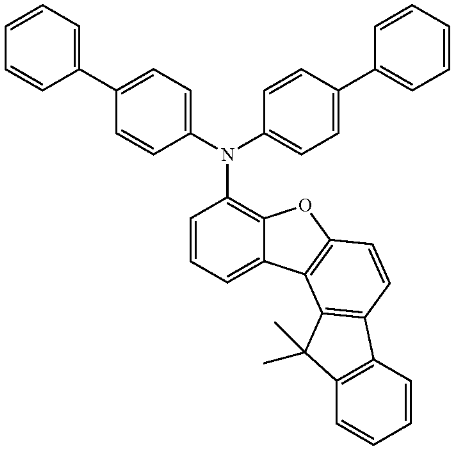
[A-149]
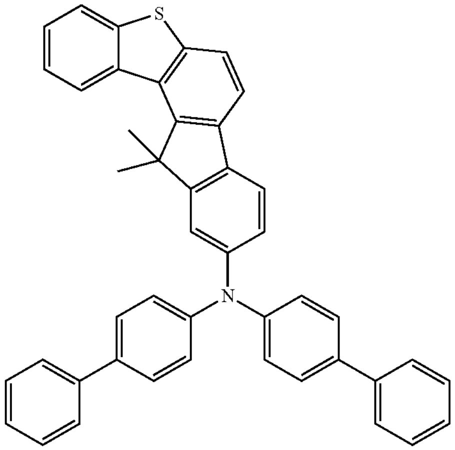
[A-150]
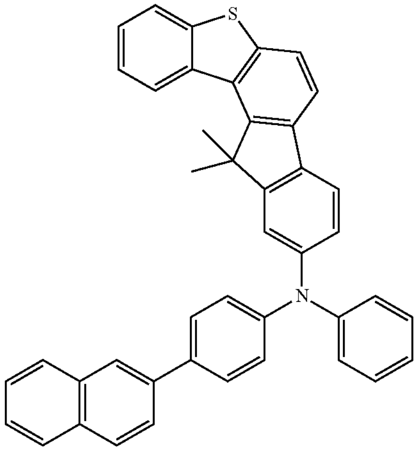
-continued
[A-151]
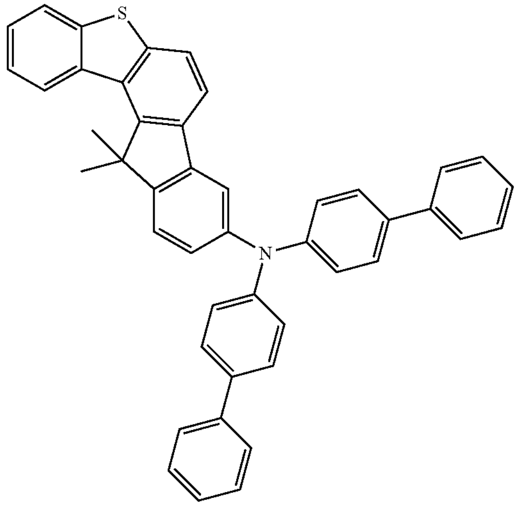
[A-152]
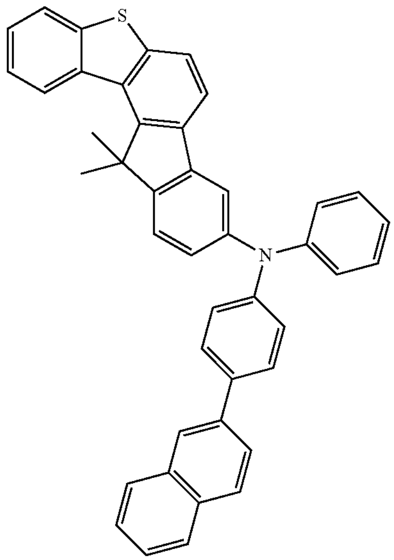
[A-153]
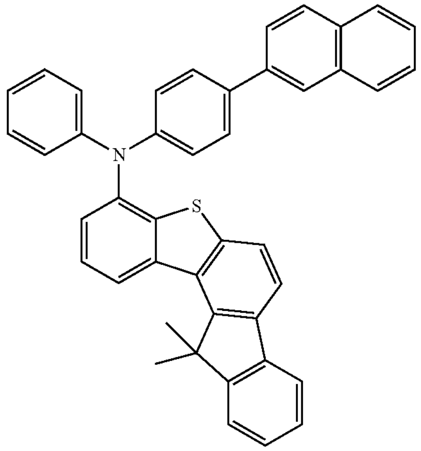

-continued
[A-154]
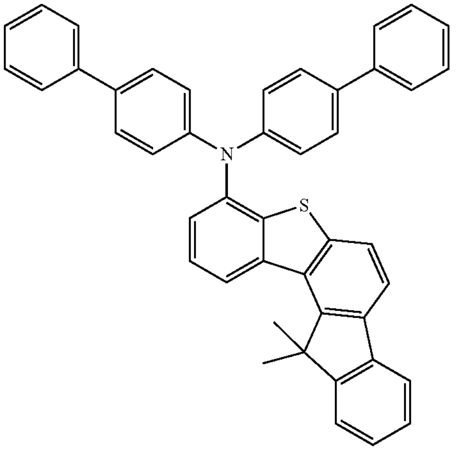
[A-155]
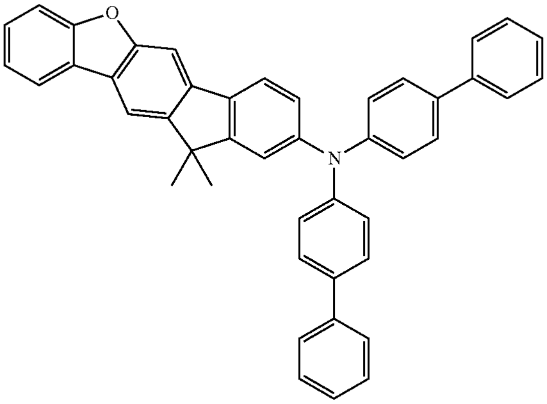
[A-156]
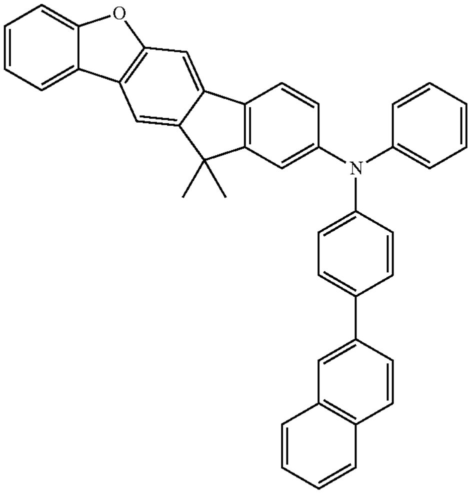
-continued
[A-157]
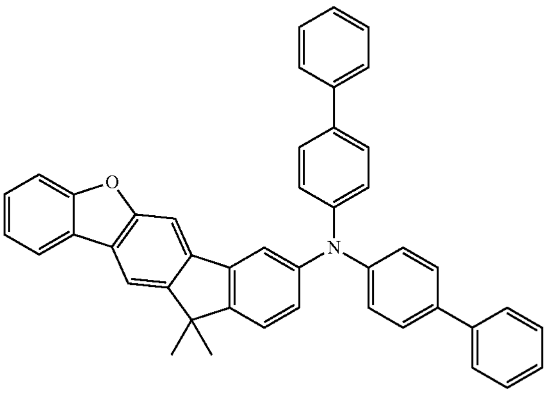
[A-158]
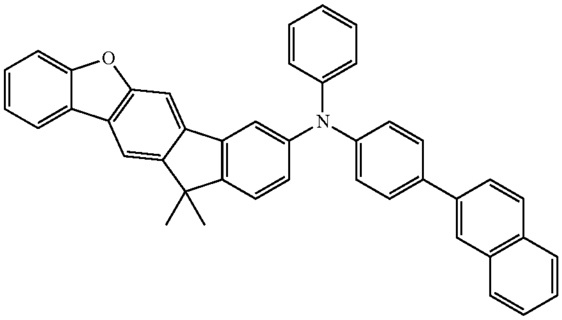
[A-159]
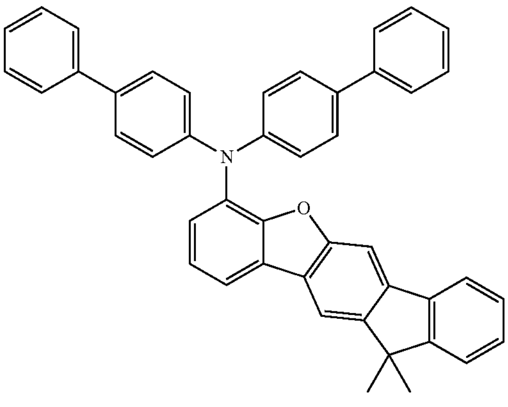
[A-160]
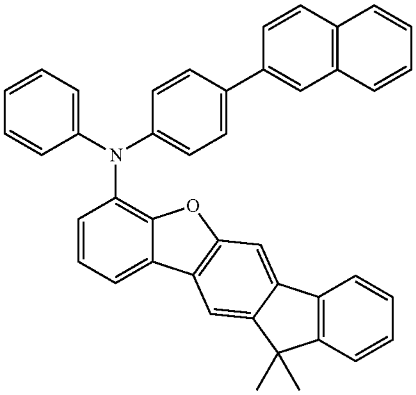

-continued
[A-161]
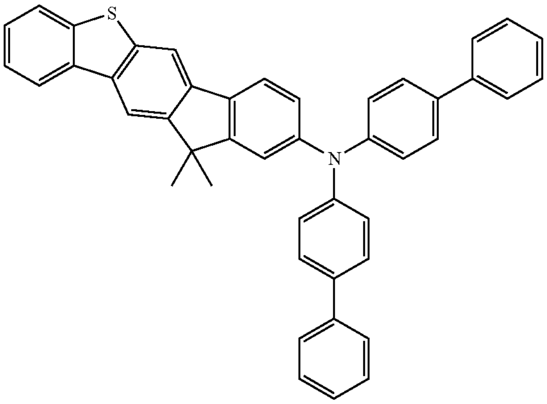
[A-162]
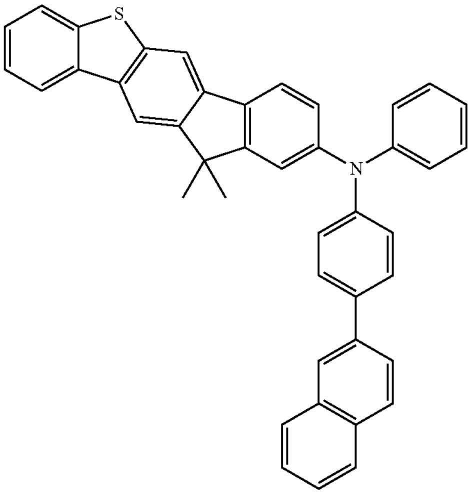
[A-163]
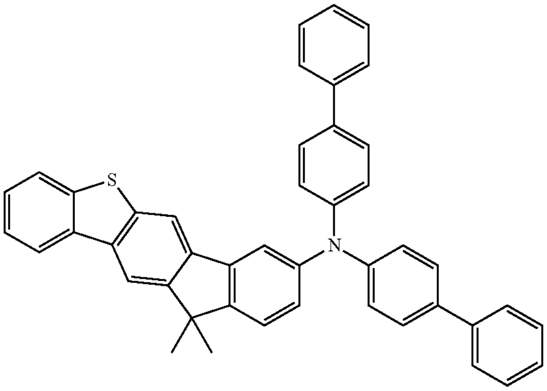
-continued
[A-164]
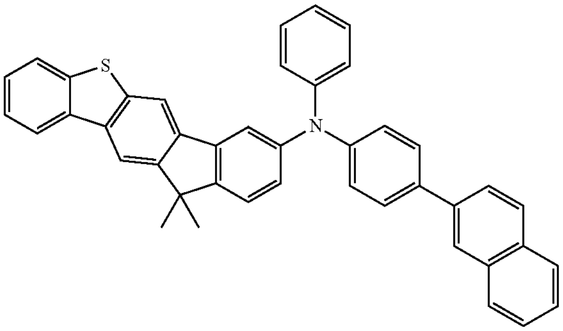
[A-165]
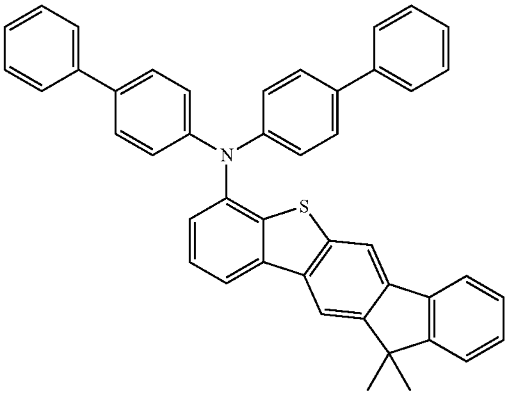
[A-166]
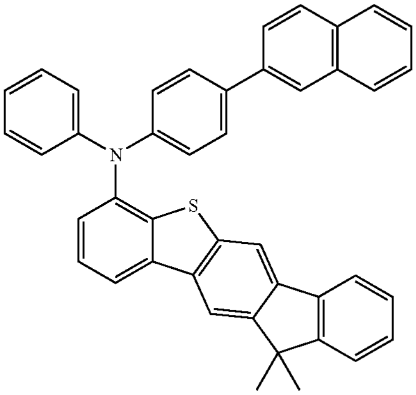
The second compound is a compound having relatively strong electron characteristics and may be represented by Chemical Formula 3.
[Chemical Formula 3]
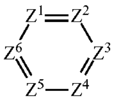
In Chemical Formula 3,
$Z^1$ is N or C-$L^5$-$R^7$,
$Z^2$ is N or C-$L^6$-$R^8$,
$Z^3$ is N or C-$L^7$-$R^9$,
$Z^4$ is N or C-$L^8$-$R^{10}$,
$Z^5$ is N or C-$L^9$-$R^{11}$,
$Z^6$ is N or C-$L^{10}$-$R^{12}$,
at least two of $Z^1$ to $Z^6$ are N, $L^5$ to $L^{10}$ are each independently a single bond, a substituted or unsubstituted C6 to C20 arylene group, a substituted or unsubstituted divalent C2 to C20 heterocyclic group, or a combination thereof, $R^7$ to $R^{12}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, at least one of $R^7$ to $R^{12}$ is a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group, and $R^7$ to $R^{12}$ are each independently present or adjacent groups thereof are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring.

The second compound effectively expands an LUMO energy band by including a nitrogen-containing hexagonal cyclic moiety, which may be included with the aforementioned first compound to greatly improve life-span characteristics of the device using it by increasing a balance of holes and electrons.

In an example embodiment, two of $Z^1$ to $Z^6$ may be nitrogen (N) and the remainders may be CR″.

R″ refers to any substituent selected from $R^7$ to $R^{12}$.

In an example embodiment, $Z^1$ and $Z^3$ may be nitrogen $Z^2$ may be N or C-$L^6$-$R^8$, $Z^4$ may be N or C-$L^8$-$R^{10}$, $Z^5$ may be N or C-$L^9$-$R^{11}$, and $Z^6$ may be N or C-$L^{10}$-$R^{12}$.

In this case, at least one of $R^8$, and $R^{10}$ to $R^{12}$ may be a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group.

In an example embodiment, three of $Z^1$ to $Z^6$ may be nitrogen (N) and the remainders may be CR″.

In an example embodiment, $Z^1$, $Z^3$, and $Z^5$ may be nitrogen, $Z^2$ may be N or C-$L^6$-$R^8$, $Z^4$ may be N or C-$L^8$-$R^{10}$, and $Z^6$ may be N or C-$L^{10}$-$R^{12}$.

In this case, at least one of $R^8$, $R^{10}$, and $R^{12}$ may be a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group.

In an example embodiment, when $R^7$ to $R^{12}$ may be each independently present, the second compound may be represented by Chemical Formula 3-1.

[Chemical Formula 3-1]

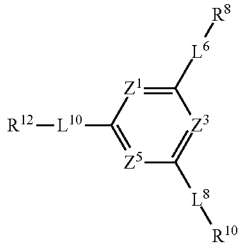

In Chemical Formula 3-1, $Z^1$, $Z^3$, and $Z^5$ may each independently be N or CH, $Z^1$, at least two of $Z^3$ and $Z^5$ may be N, $L^6$, $L^8$, $L^{10}$, $R^8$, $R^{10}$, and $R^{12}$ may be the same as described above, and at least one of $R^8$, $R^{10}$, and $R^{12}$ may be a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group.

In an example embodiment, Chemical Formula 3-1 may be represented by Chemical Formula 3-1a or Chemical Formula 3-1b.

[Chemical Formula 3-1a]

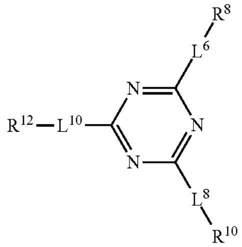

[Chemical Formula 3-1b]

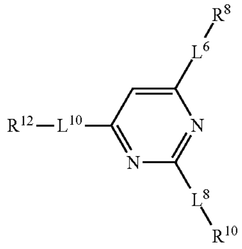

In Chemical Formula 3-1a and Chemical Formula 3-1b, $L^6$, $L^8$, $L^{10}$, $R^8$, $R^{10}$, and $R^{12}$ are the same as described above.

In an example embodiment, adjacent groups of $R^7$ to $R^{12}$ may be linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring, and at least one of $R^7$ to $R^{12}$ that does not form the ring may be a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group.

In the present specification "adjacent groups thereof are linked with each other to form a substituted or unsubstituted aliphatic monocyclic or polycyclic ring, a substituted or unsubstituted aromatic monocyclic or polycyclic ring, or a substituted or unsubstituted heteroaromatic monocyclic or polycyclic ring" means that any two adjacent substituents are fused to form a ring. For example, adjacent $R^7$ and $R^8$, $R^8$ and $R^9$, $R^9$ and $R^{10}$, $R^{10}$ and $R^{11}$, or $R^{11}$ and $R^{12}$ in Chemical Formula 3 may be fused with each other to form a heteroaromatic polycyclic ring together with the nitrogen-containing hexagonal ring moiety substituted therewith. Herein, examples of the formed heteroaromatic polycyclic ring may be a substituted or unsubstituted quinazolinyl group, a substituted or unsubstituted quinoxalinyl group, a substituted or unsubstituted benzofuranpyrimidinyl group, a substituted or unsubstituted benzothiophenepyrimidinyl group, and the like, and for example $R^8$ and $R^9$ of Chemical Formula 3 may be fused with each other to form a heteroaromatic polycyclic ring together with the nitrogen-containing hexagonal ring moiety, thereby providing a compound represented by Chemical Formula 3-2 or Chemical Formula 3-3.

[Chemical Formula 3-2]

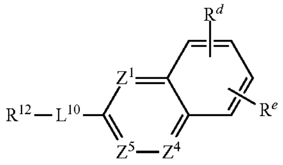

[Chemical Formula 3-3]

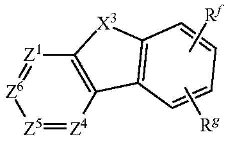

In Chemical Formula 3-2 and Chemical Formula 3-3, $Z^1$, $Z^4$, $Z^5$, $Z^6$, $L^{10}$, and $R^{12}$ are the same as described above, $X^3$ is O or S, $R^d$, $R^e$, $R^f$, and $R^g$ are each independently hydrogen, deuterium, a halogen, a cyano group, a C1 to C20 alkyl group, a C6 to C30 aryl group, a C2 to C30 heteroaryl group, or a combination thereof.

In an example embodiment, $Z^1$ and $Z^5$ of Chemical Formula 3-2 may each independently be N.

In an example embodiment, $Z^1$ and $Z^4$ of Chemical Formula 3-2 may each independently be N.

In an example embodiment, Chemical Formula 3-2 may be represented by Chemical Formula 3-2a or Chemical Formula 3-2b.

[Chemical Formula 3-2a]

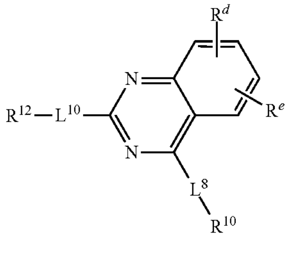

-continued

[Chemical Formula 3-2b]

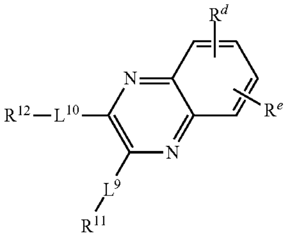

In Chemical Formula 3-2a and Chemical Formula 3-2b, $L^8$ to $L^{10}$, $R^{10}$ to $R^{12}$, $R^d$, and $R^e$ are the same as described above.

In an example embodiment, $Z^1$ and $Z^5$ of Chemical Formula 3-3 may each independently be N.

In an example embodiment, $Z^4$ and $Z^6$ of Chemical Formula 3-3 may each independently be N.

In an example embodiment, Chemical Formula 3-3 may be represented by Chemical Formula 3-3a or Chemical Formula 3-3b.

[Chemical Formula 3-3a]

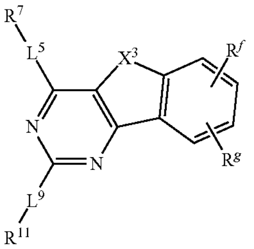

[Chemical Formula 3-3b]

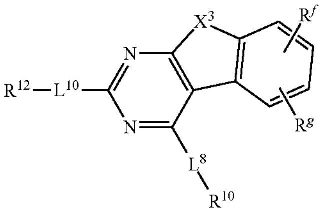

In Chemical Formula 3-3a and Chemical Formula 3-3b, $X^3$, $L^5$, $L^8$, $L^9$, $L^{10}$, $R^7$, $R^{10}$, $R^{11}$, $R^{12}$, $R^f$, and $R^g$ are the same as described above.

In an example embodiment, $R^7$ to $R^{12}$ of Chemical Formula 3 may each independently be hydrogen, a substituted or unsubstituted C6 to C30 aryl group, or a substituted or unsubstituted C2 to C30 heterocyclic group.

In an example embodiment, $R^7$ to $R^{12}$ may each independently be hydrogen, a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, a substituted or unsubstituted pyrimidinyl group, a substituted or unsubstituted triazinyl group, a substituted or unsubstituted benzofuranpyrimidinyl group, or a substituted or unsubstituted benzothiophenepyrimidinyl group, and at least one of $R^7$ to $R^{12}$ may be a substituted or unsubstituted dibenzofuranyl group, a substituted or unsubstituted dibenzothiophenyl group, a substituted or unsubstituted carbazolyl group, a substituted or unsubstituted benzocarbazolyl group, a substituted or unsubstituted dibenzocarbazolyl group, or a substituted or unsubstituted triphenylene group.

Herein "substituted" refers to replacement of at least one hydrogen by at least one of a phenyl group, a biphenyl group, a terphenyl group, a naphthyl group, a dibenzofuranyl group, and a dibenzothiophenyl group.

In an example embodiment, $R^7$ to $R^{12}$ may each independently be selected from substituents of Group I and Group II and at least one of $R^7$ to $R^{12}$ may each independently be selected from substituents of Group II.

[Group I]

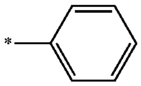

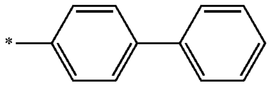

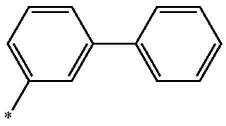

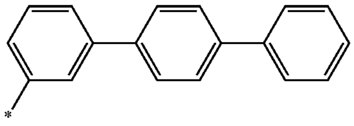

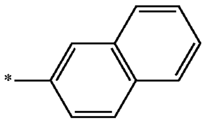

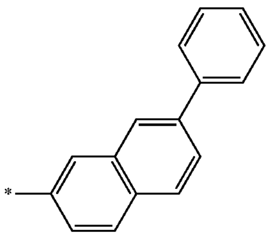

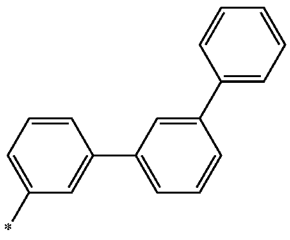

-continued

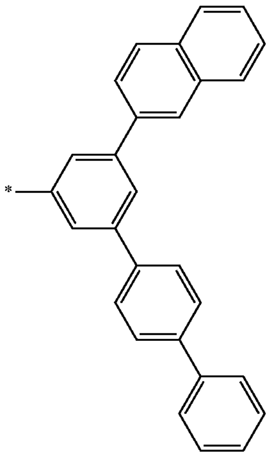

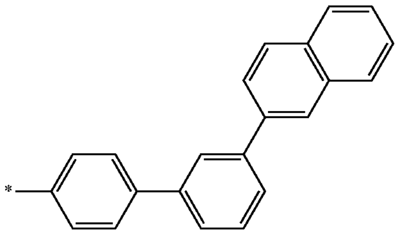

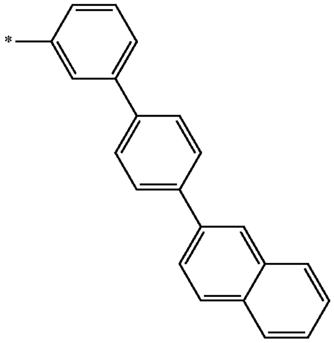

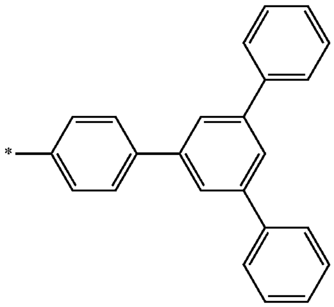

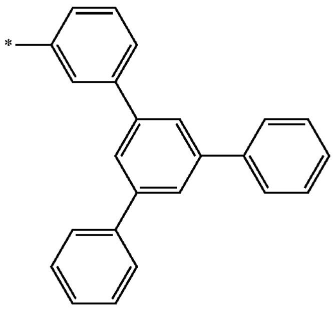

-continued
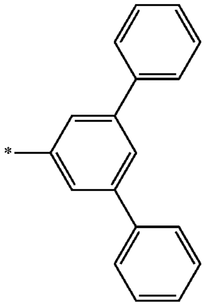
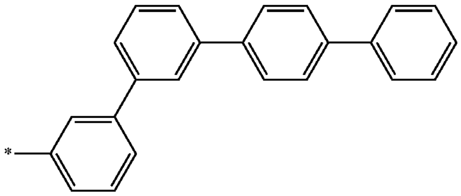
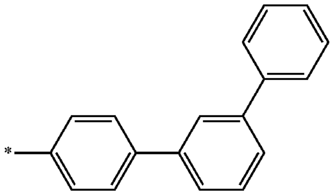
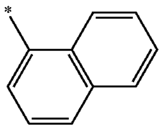
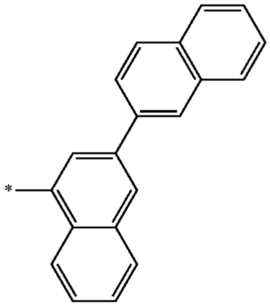
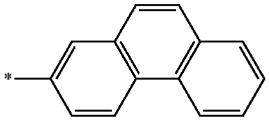
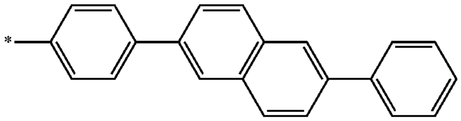
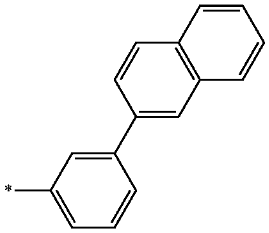
-continued
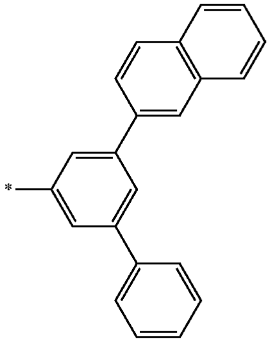
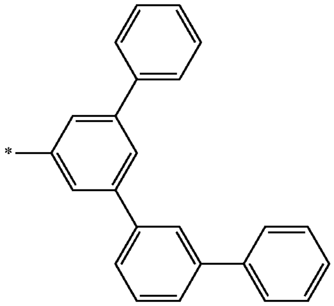
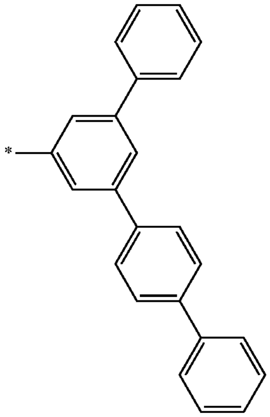
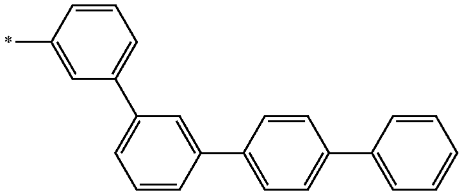
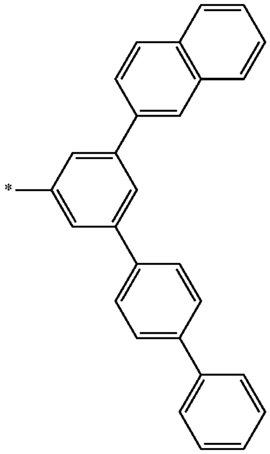

-continued
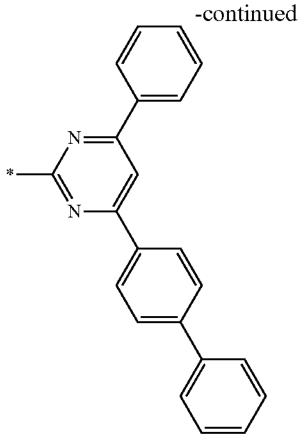
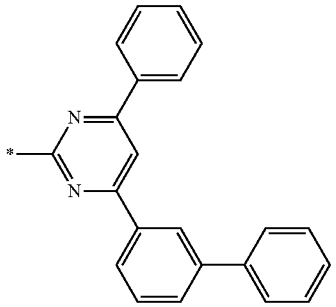
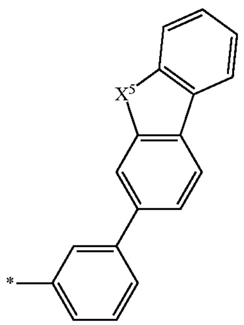
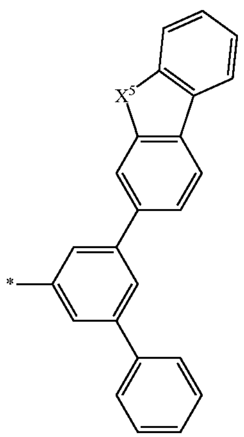
-continued
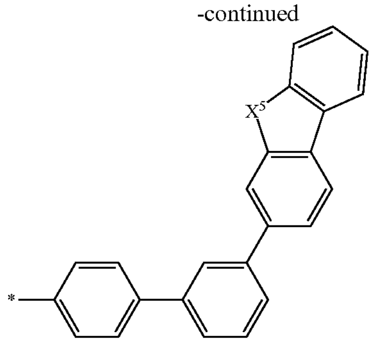
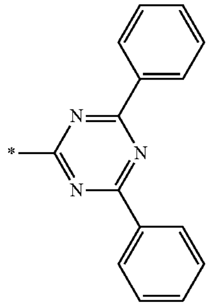
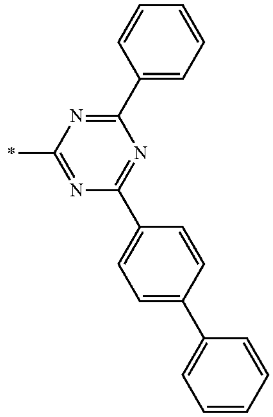
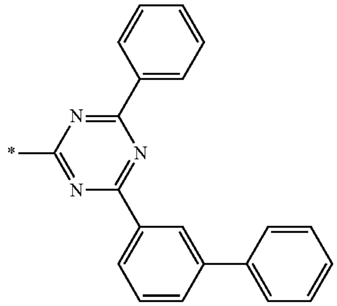
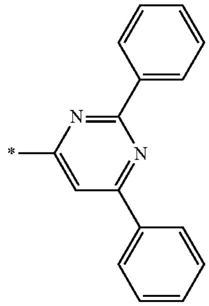

-continued
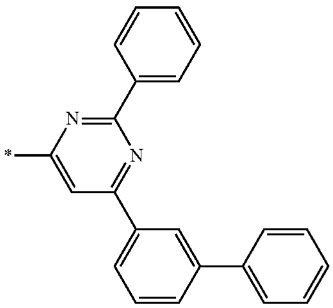
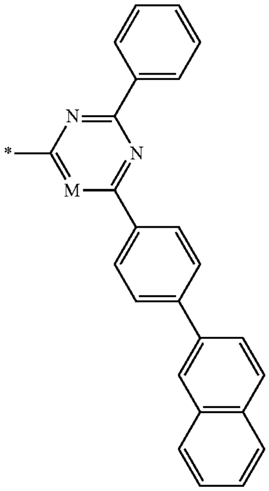
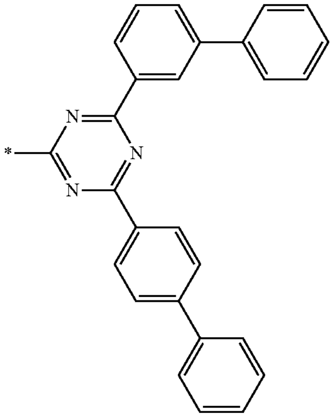
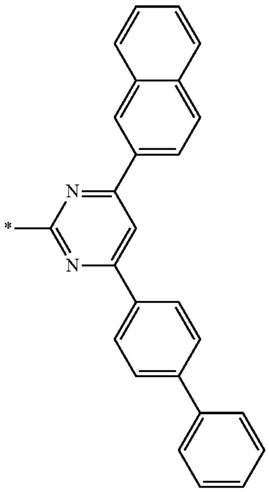
-continued
[Group II]
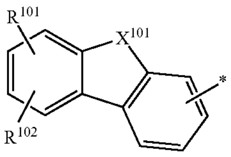
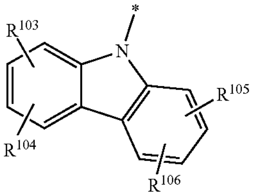
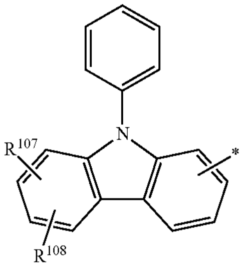
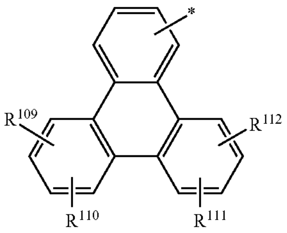
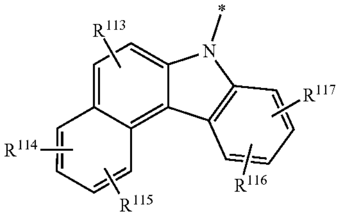
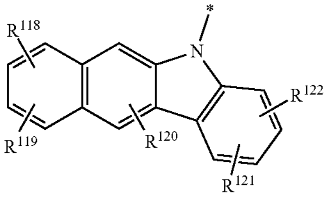
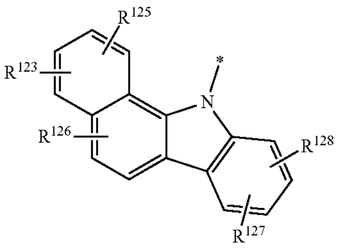
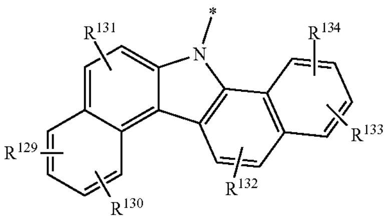

-continued

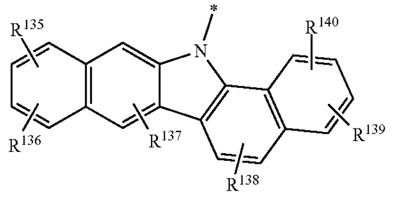

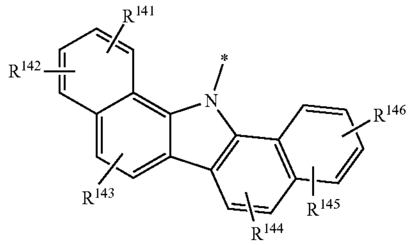

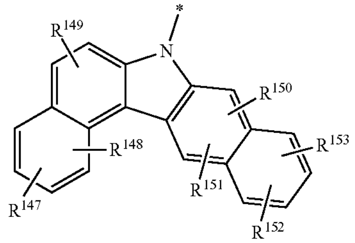

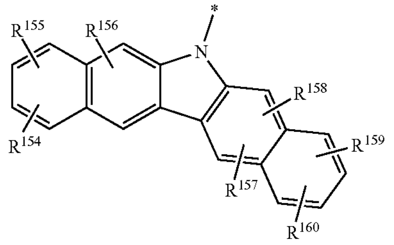

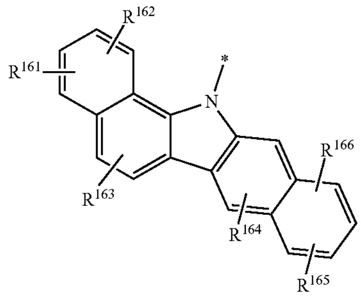

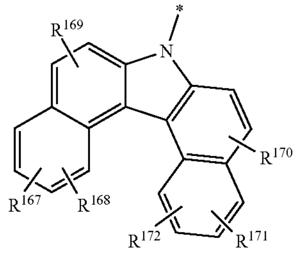

-continued

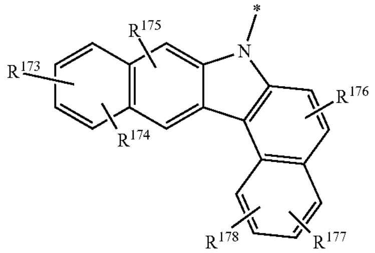

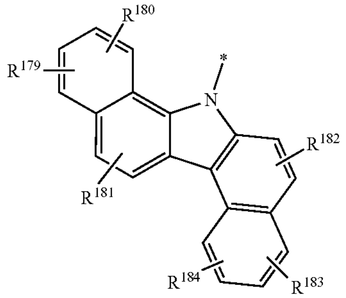

In Group I and Group II, $X^5$ and $X^{101}$ are O or S, $R^{101}$ to $R^{184}$ are each independently hydrogen, deuterium, a halogen, a cyano group, a C1 to C20 alkyl group, a C6 to C30 aryl group, a C2 to C30 heteroaryl group, or a combination thereof, and

* is a linking point.

In an example embodiment, Chemical Formula 3 may be represented by Chemical Formula 3-1a or Chemical Formula 3-3a.

In an example embodiment, in Chemical Formula 3-1a, $L^6$, $L^8$, and $L^{10}$ may each independently be a single bond or a phenylene group, $R^8$, $R^{10}$, and $R^{12}$ may each independently be a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and at least one of $R^8$, $R^{10}$, and $R^{12}$ may be a substituted or unsubstituted triphenylene group, a substituted or unsubstituted carbazolyl group, a substituted or unsubstituted dibenzofuranyl group, or a substituted or unsubstituted dibenzothiophenyl group.

In an example embodiment, in Chemical Formula 3-3a, $L^5$ and $L^9$ may each independently be a single bond or a phenylene group, $R^7$ and $R^{11}$ may each independently be a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and at least one of $R^7$ and $R^{11}$ may be a substituted or unsubstituted carbazolyl group, a substituted or unsubstituted dibenzofuranyl group, or a substituted or unsubstituted dibenzothiophenyl group.

The second compound may be for example one selected from the compounds of Group 2, for example.

[Group 2]
B-1
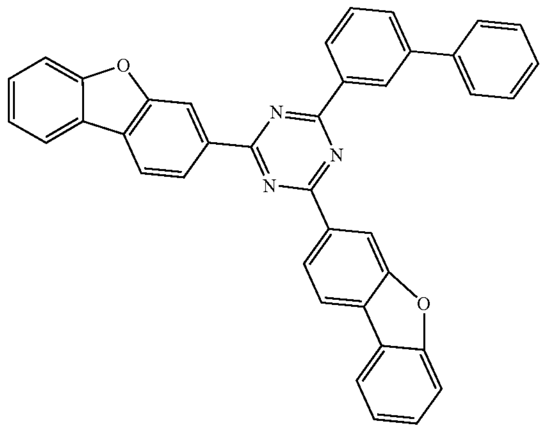
B-2
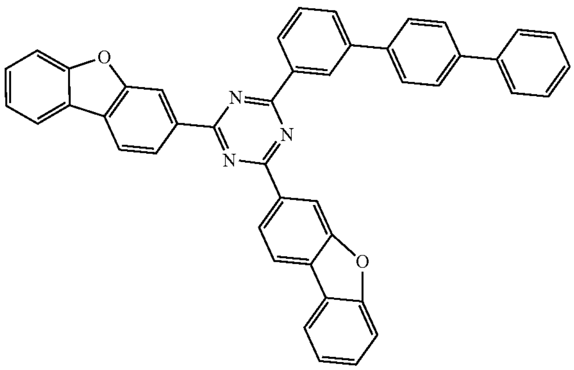
B-3
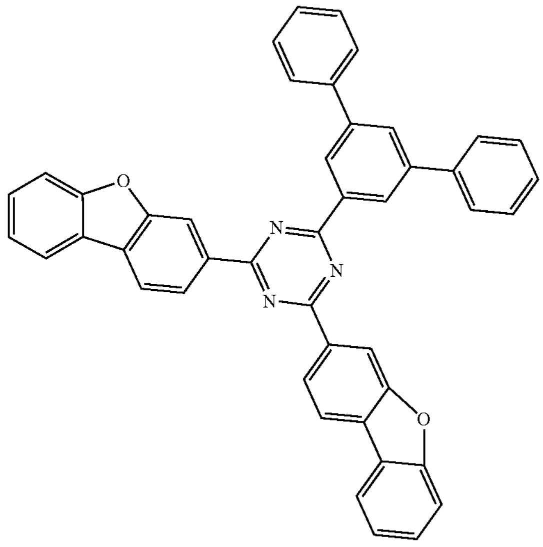
B-4
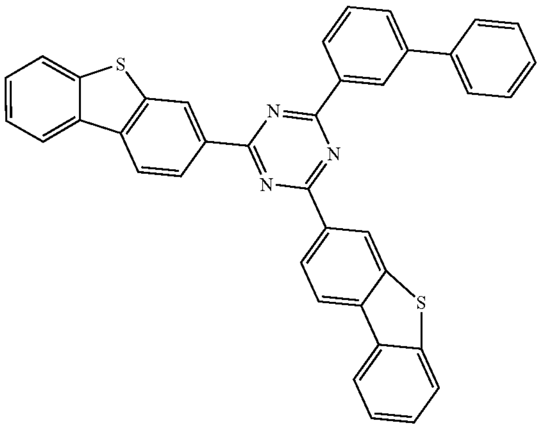
B-5
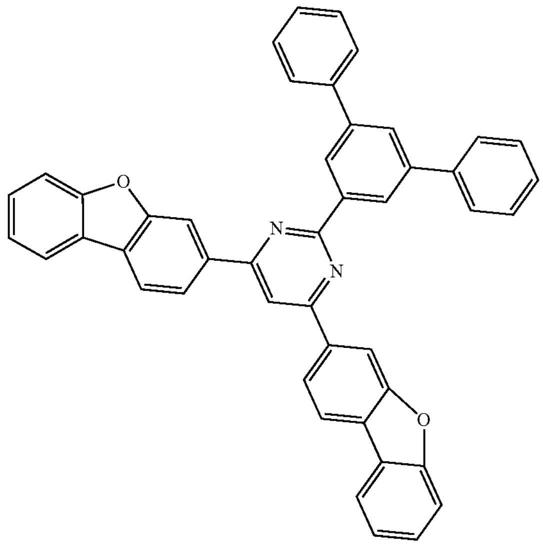
B-6
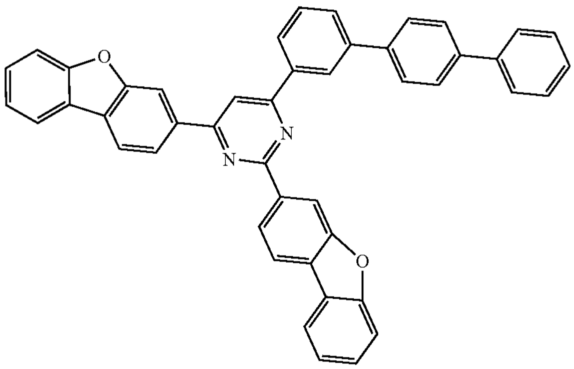

-continued
B-7
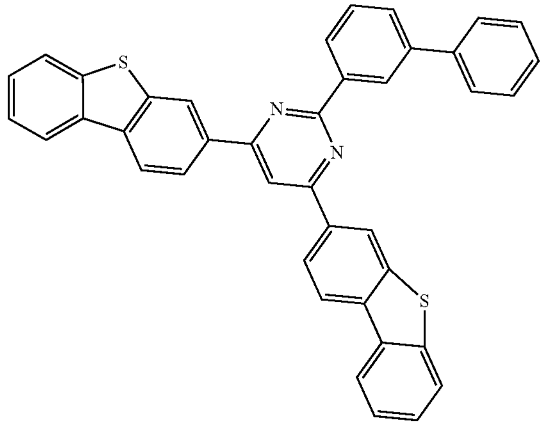
B-8
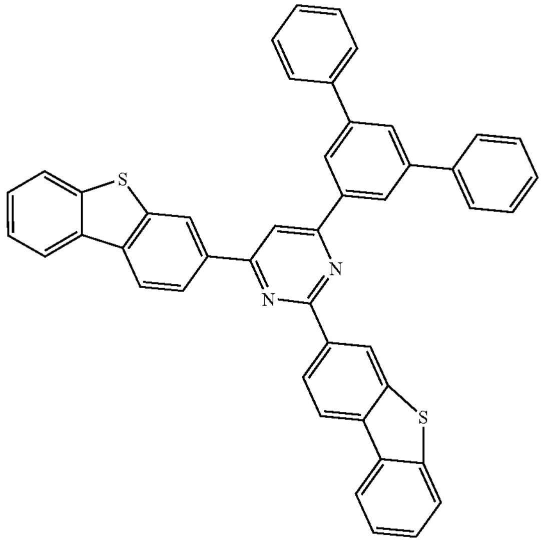
B-9
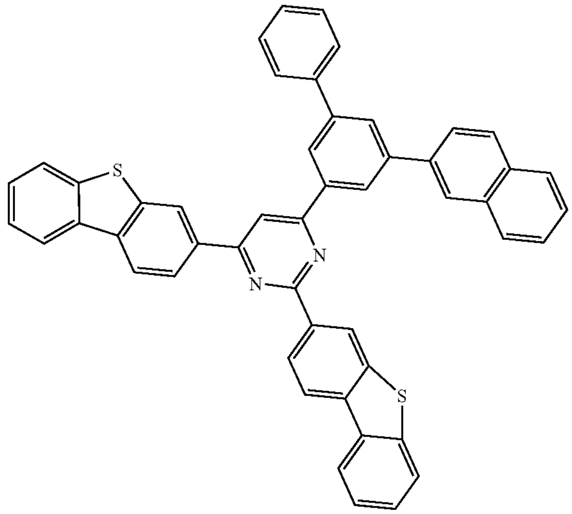
B-10
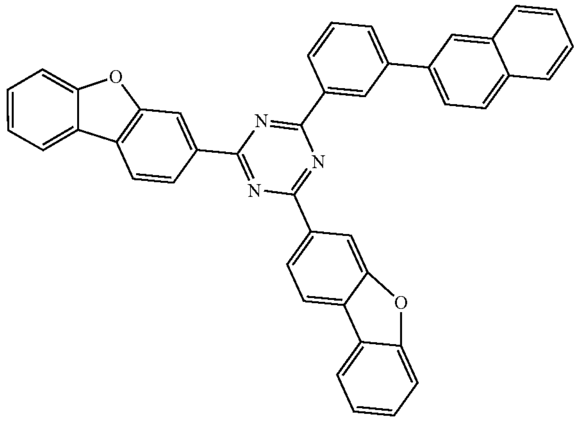
B-11
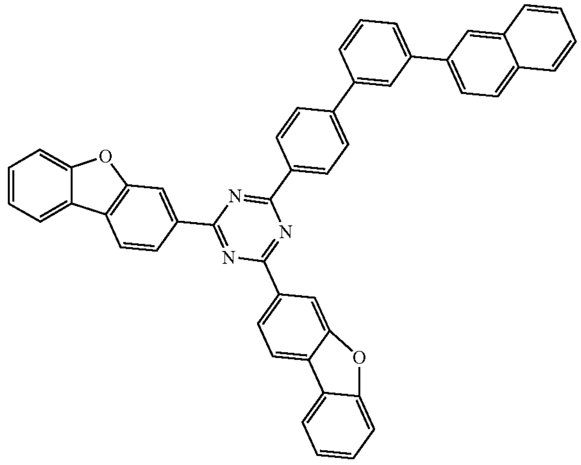
B-12
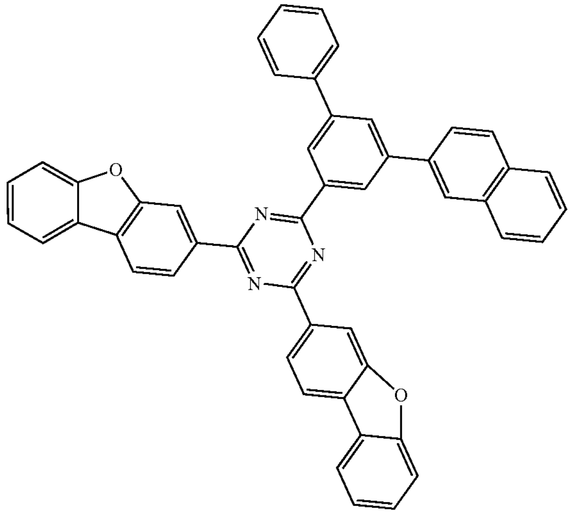

-continued
B-13
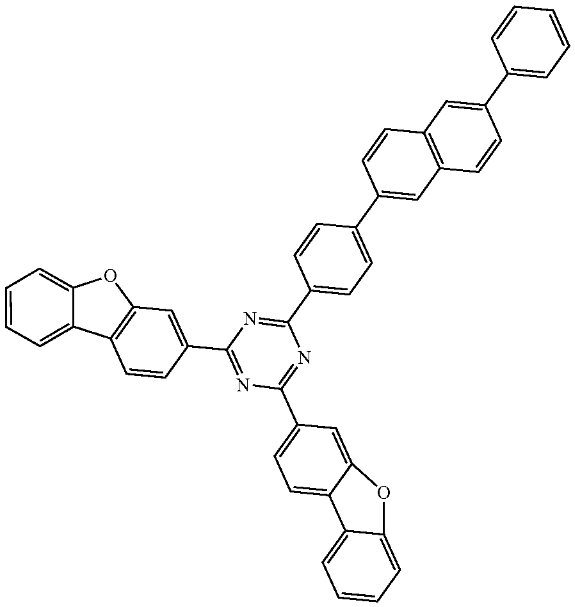
B-14
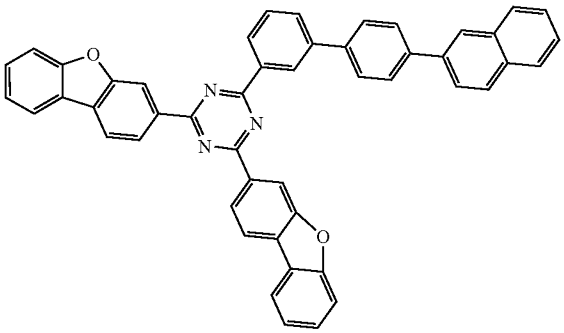
B-15
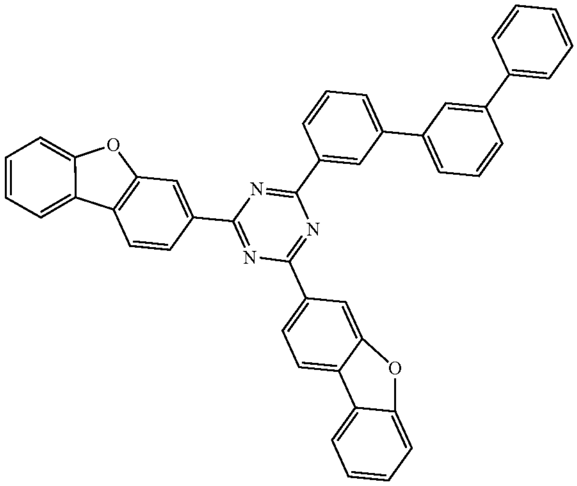
B-16
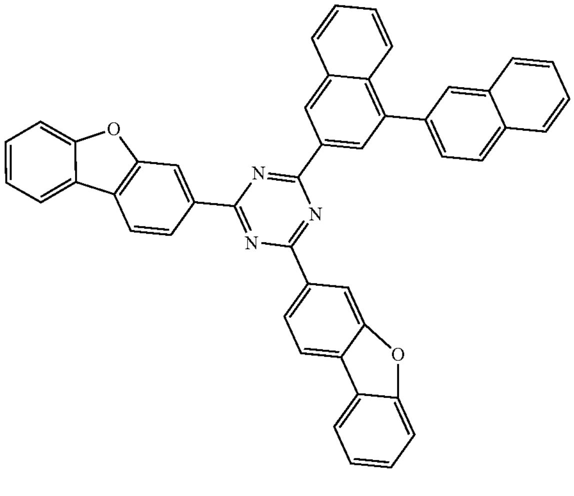
B-17
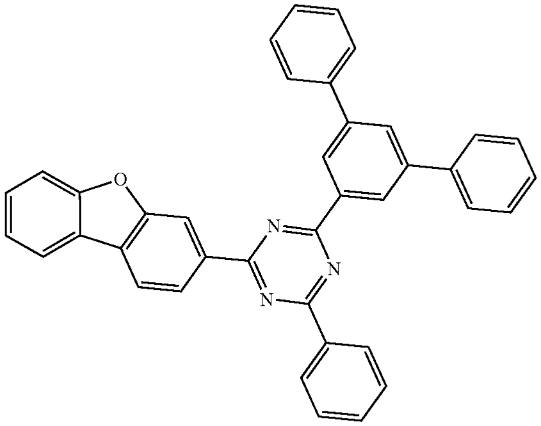
B-18
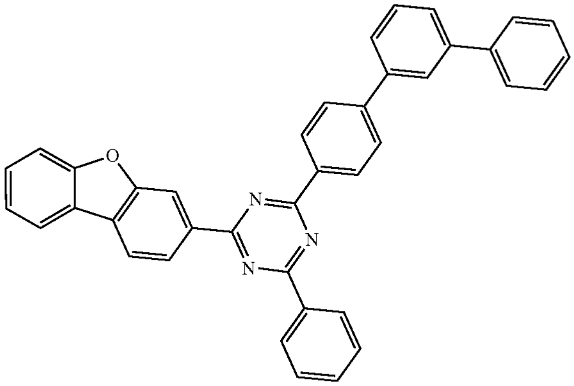

-continued
B-19
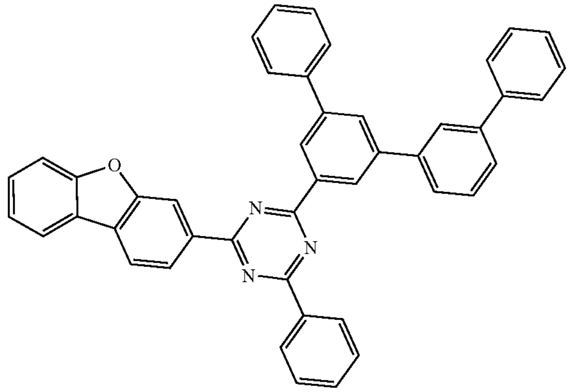
B-20
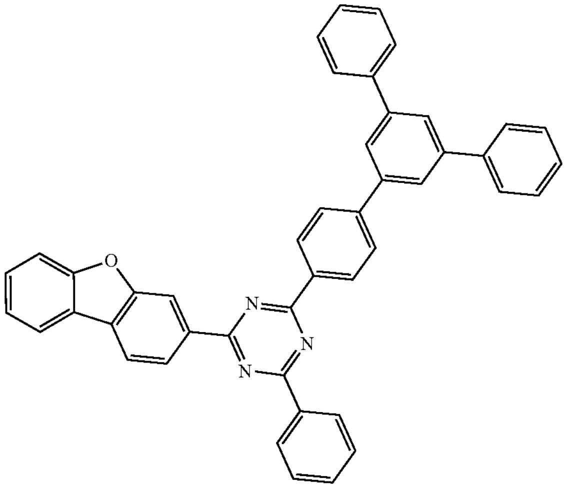
B-21
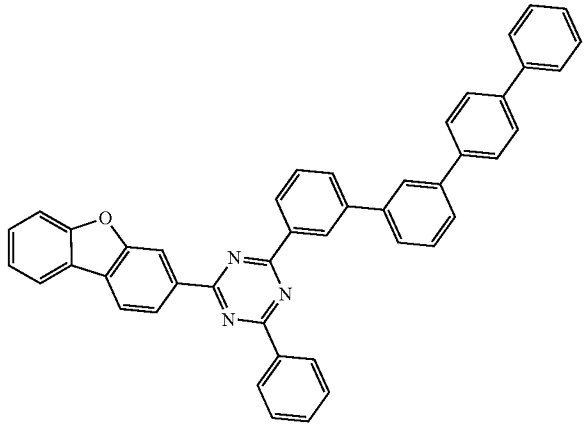
B-22
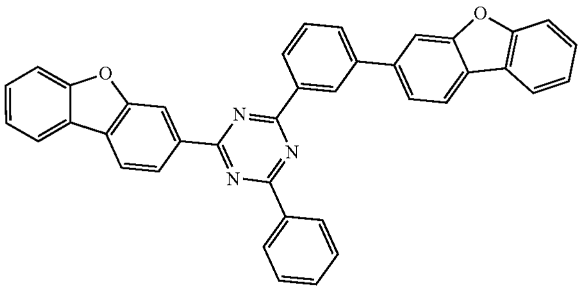
B-23
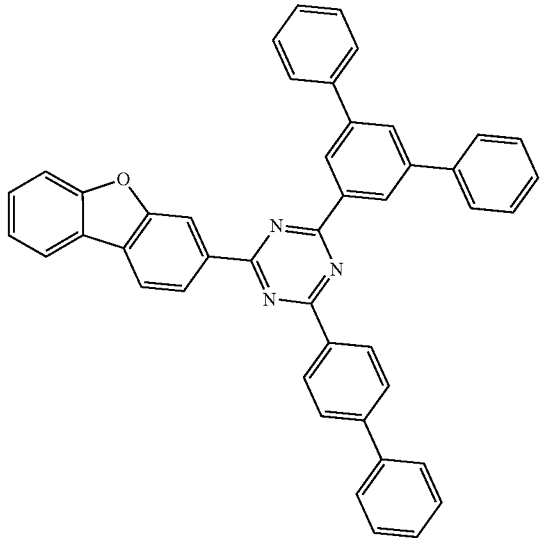
B-24
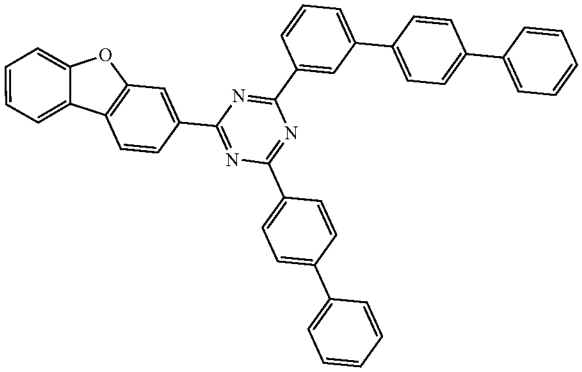

-continued
B-25
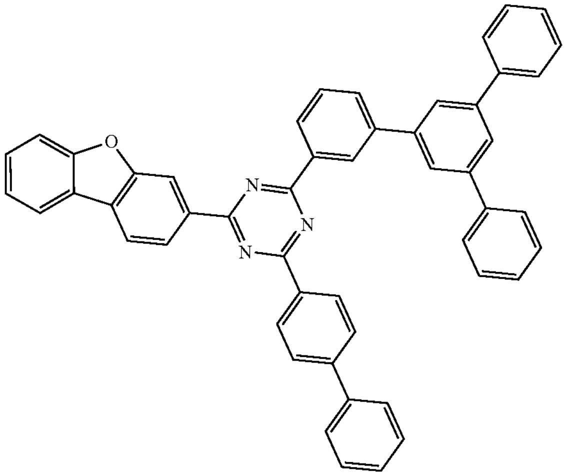
B-26
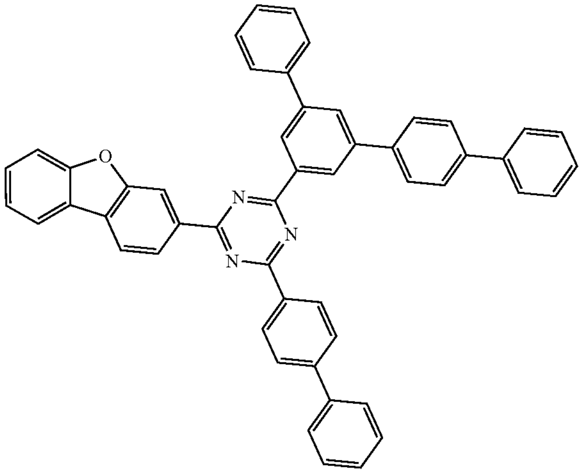
B-27
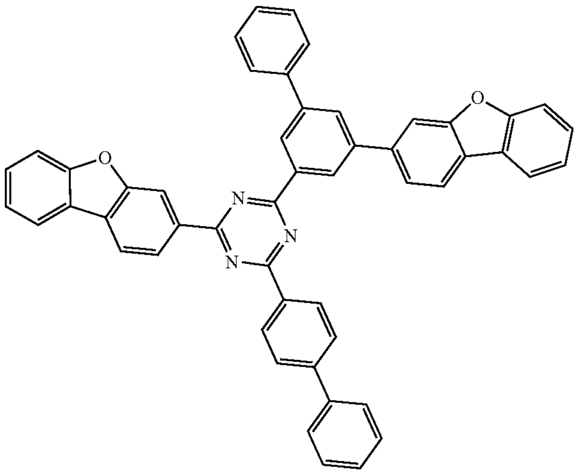
B-28
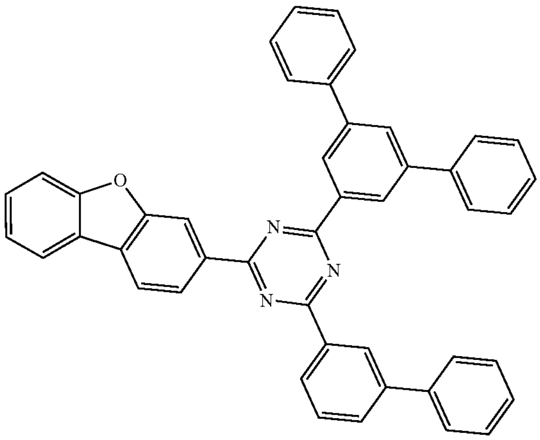
B-29
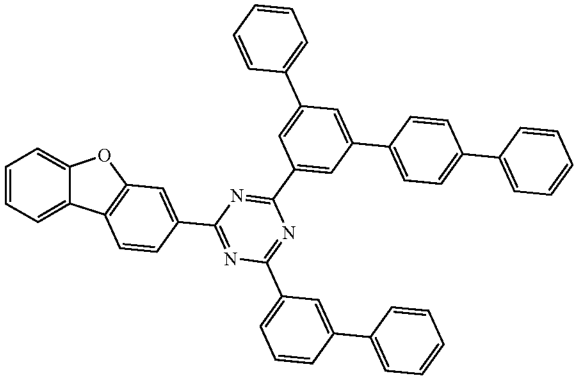
B-30
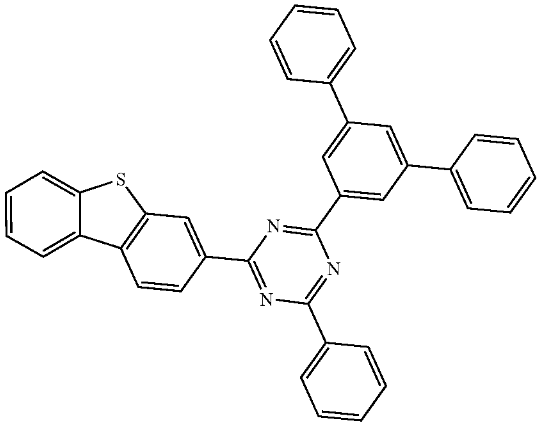

-continued
B-31
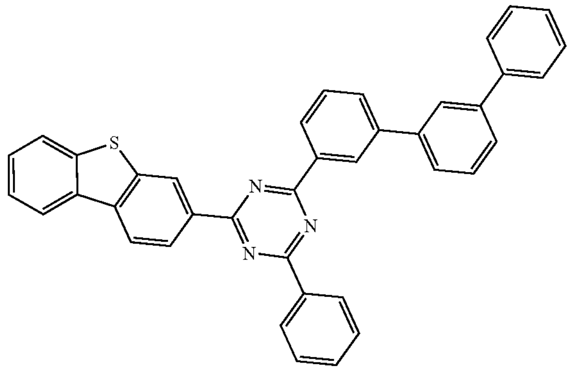
B-32
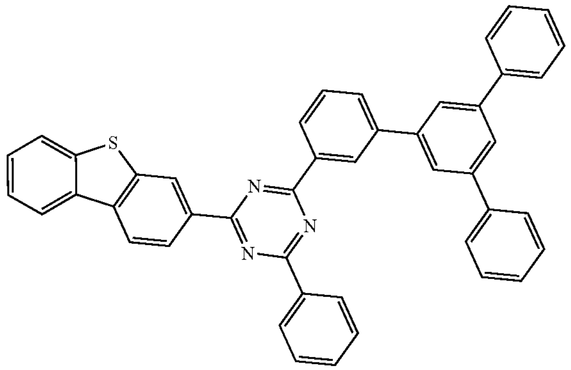
B-33
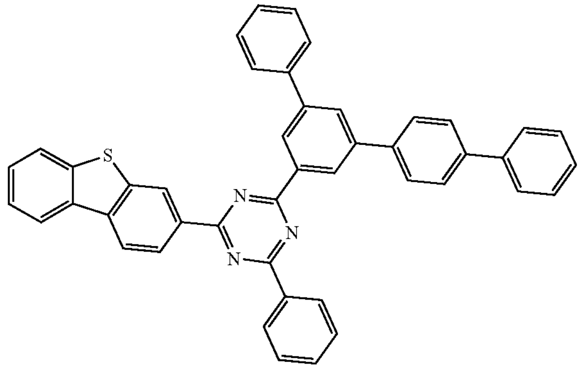
B-34
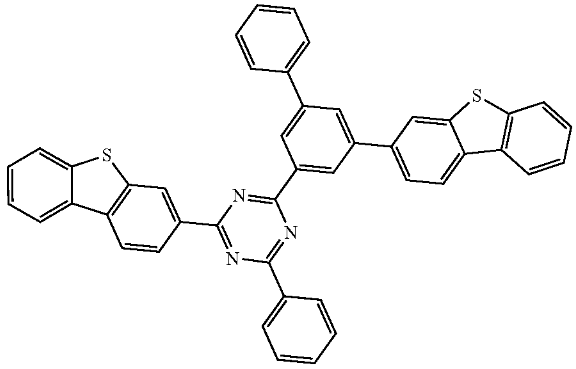
B-35
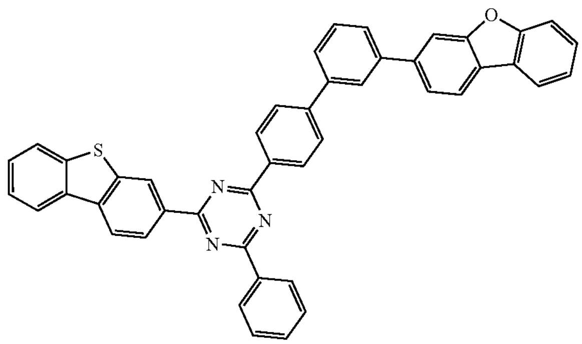
B-36
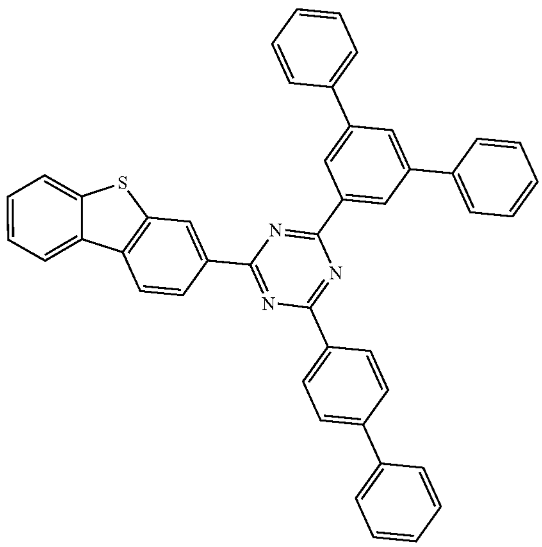

-continued
B-37
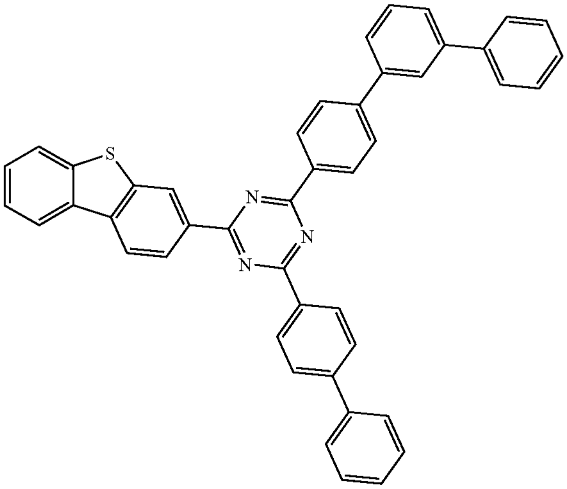
B-38
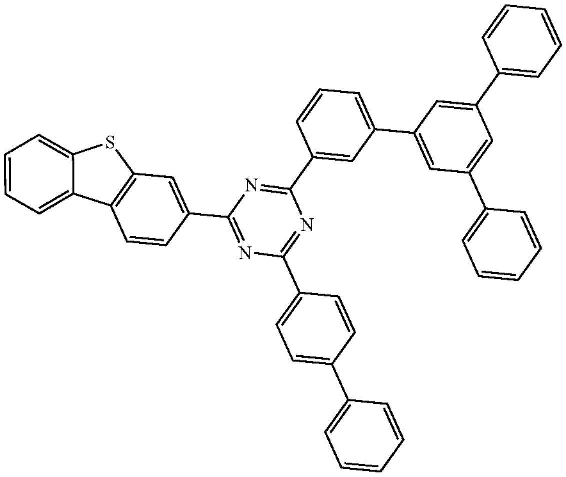
B-39
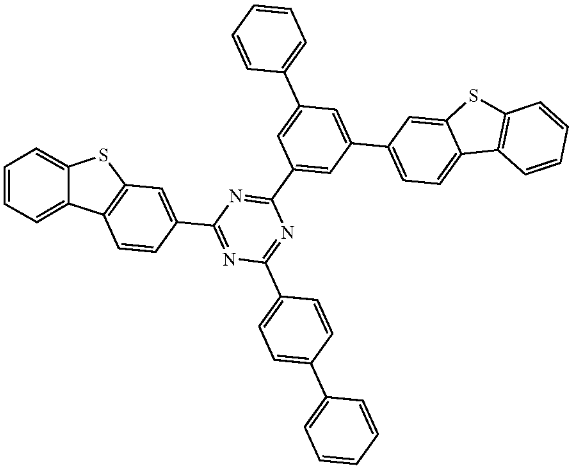
B-40
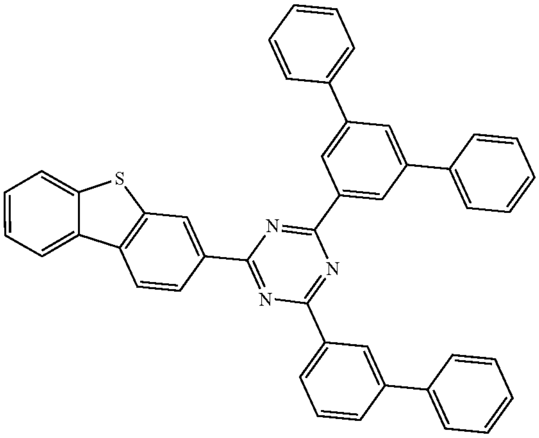
B-41
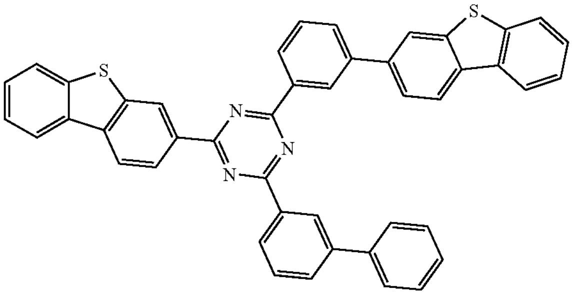
B-42
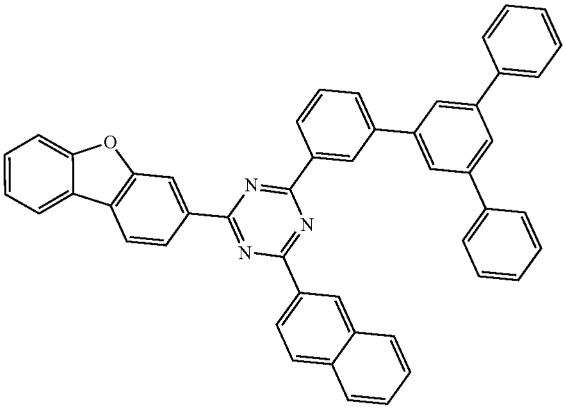

-continued
B-43
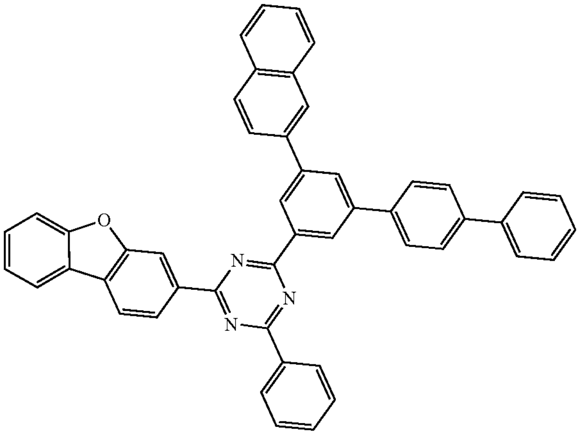
B-44
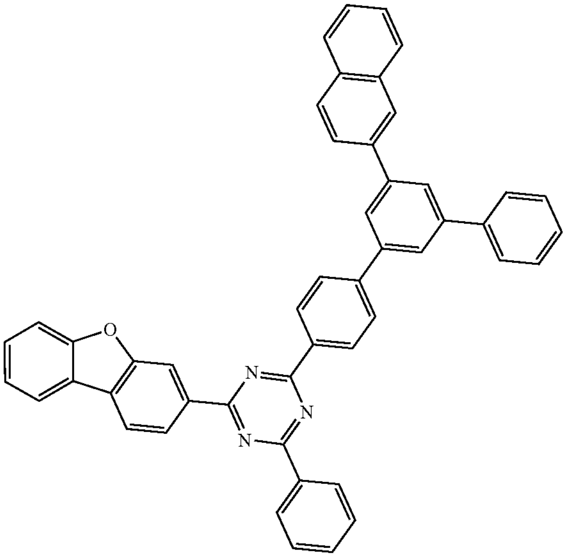
B-45
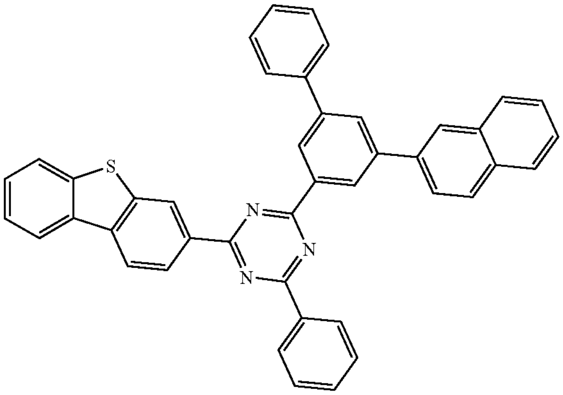
B-46
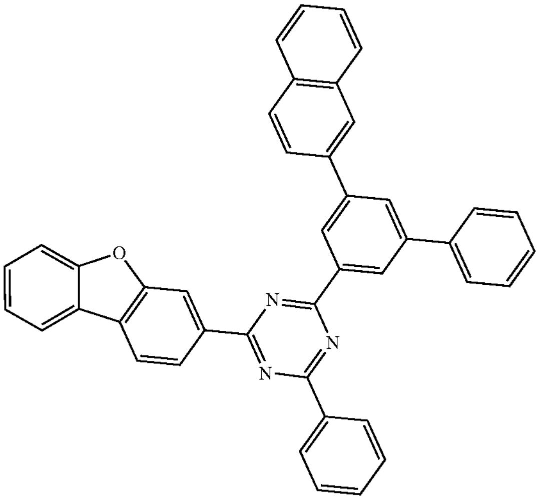
B-47
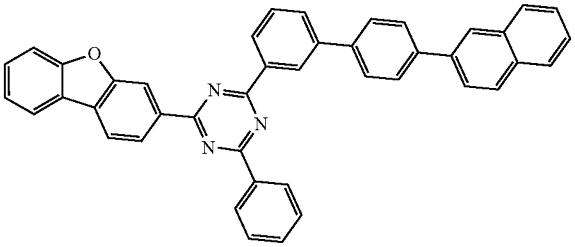
B-48
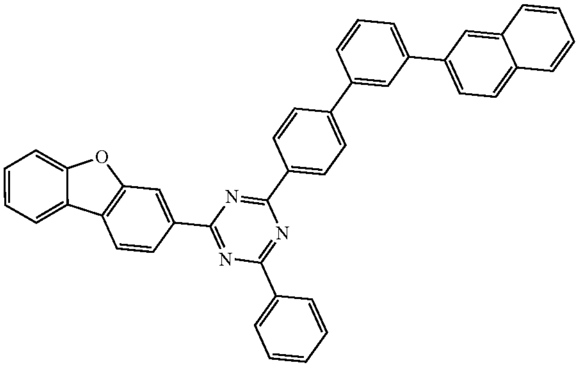

-continued
B-49
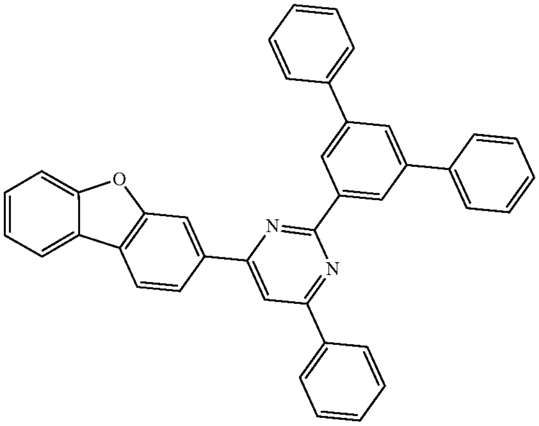
B-50
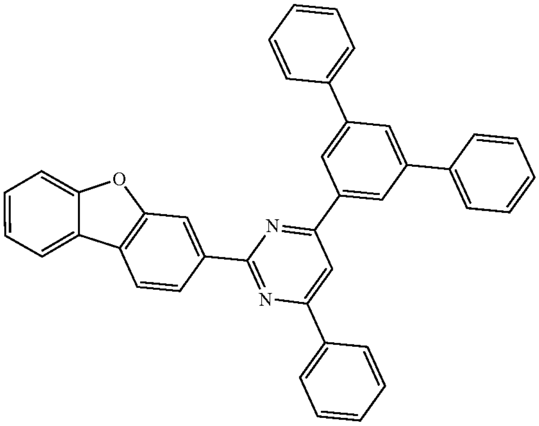
B-51
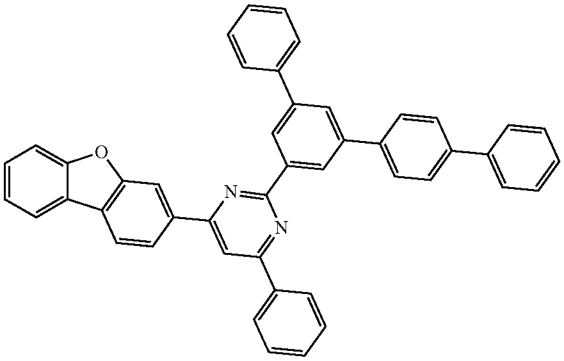
B-52
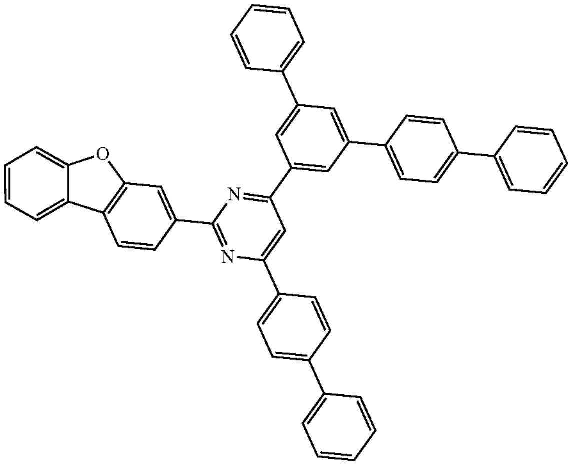
B-53
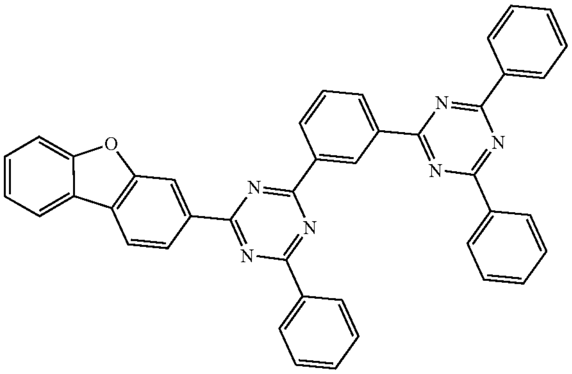
B-54
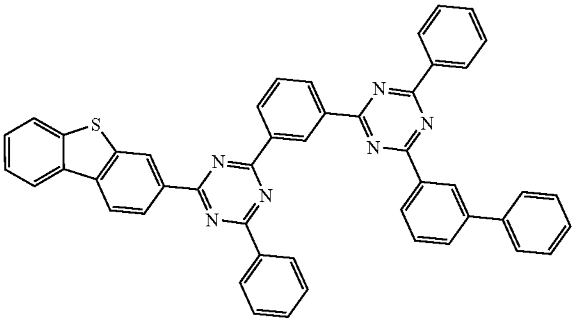

-continued
B-55
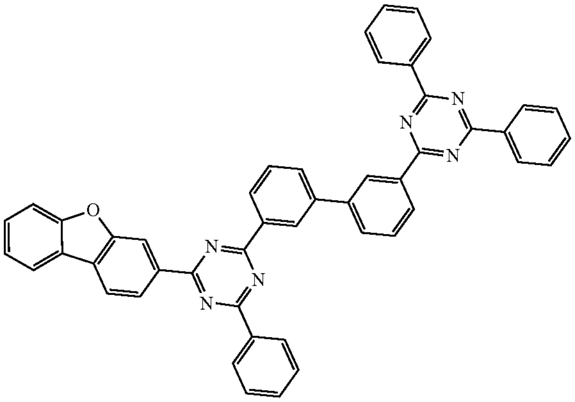
B-56
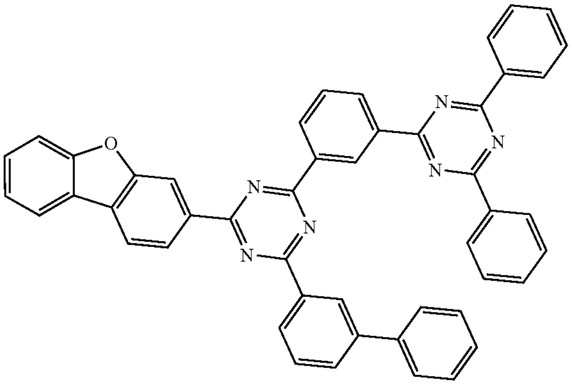
B-57
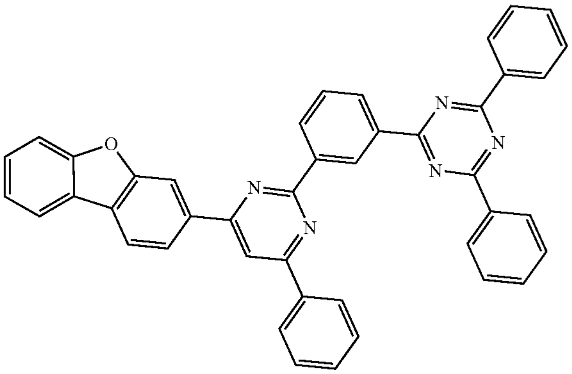
B-58
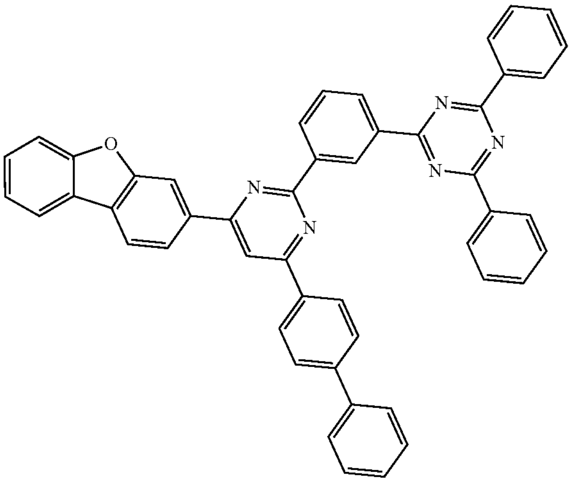
B-59
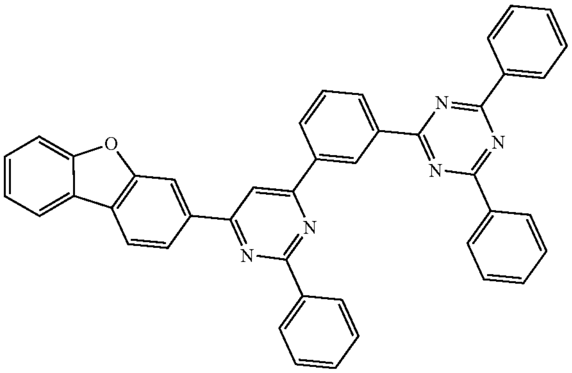
B-60
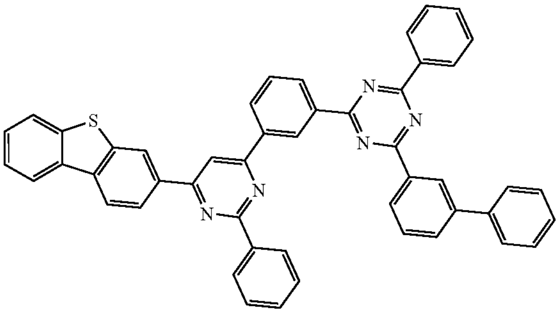

-continued
B-61
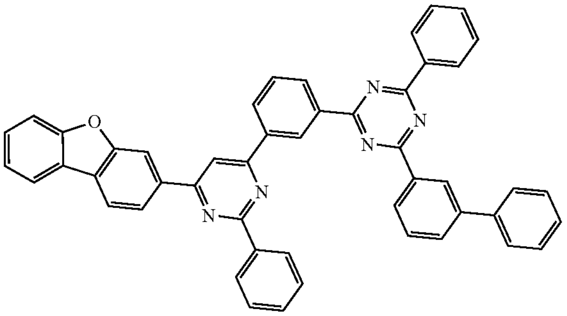
B-62
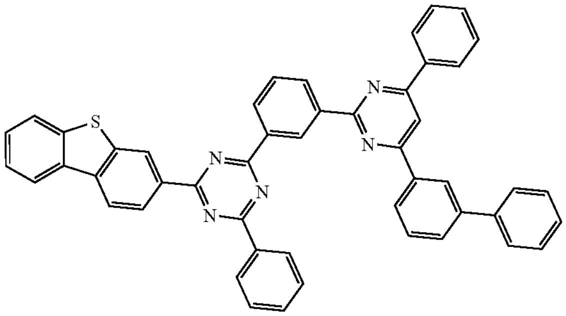
B-63
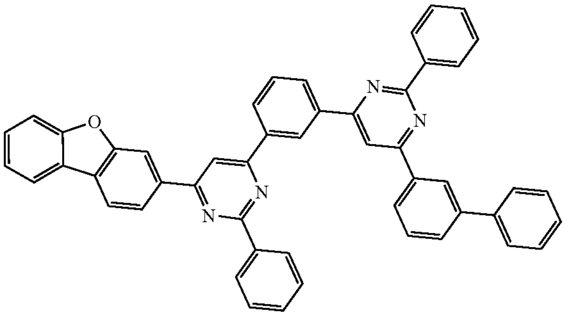
B-64
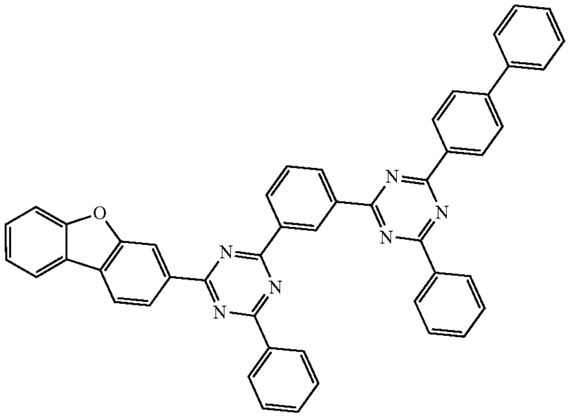
B-65
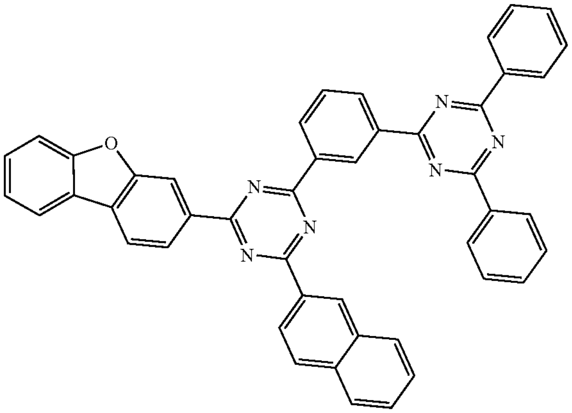
B-66
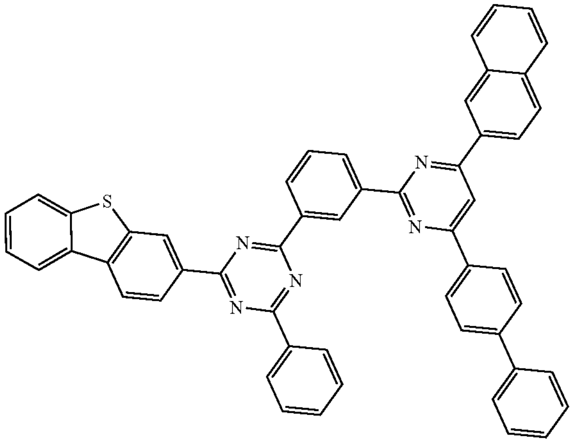

-continued
B-67
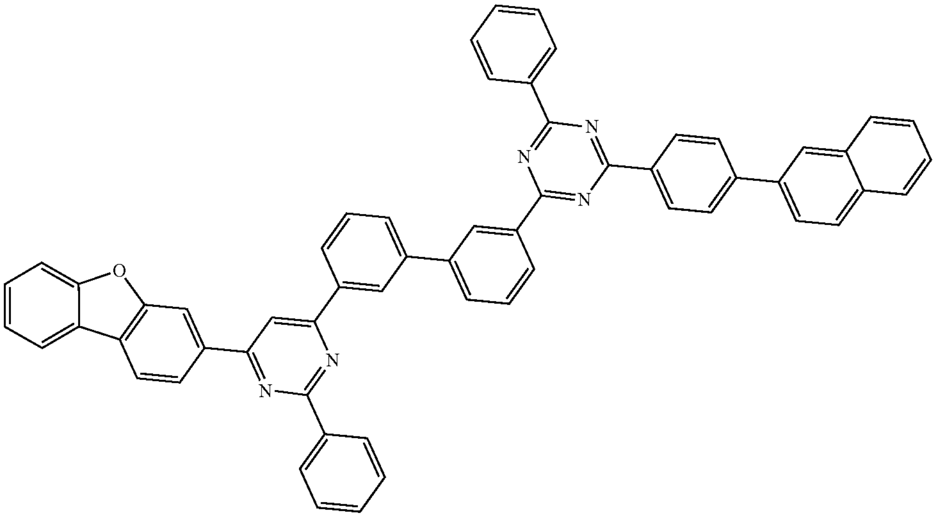
B-68
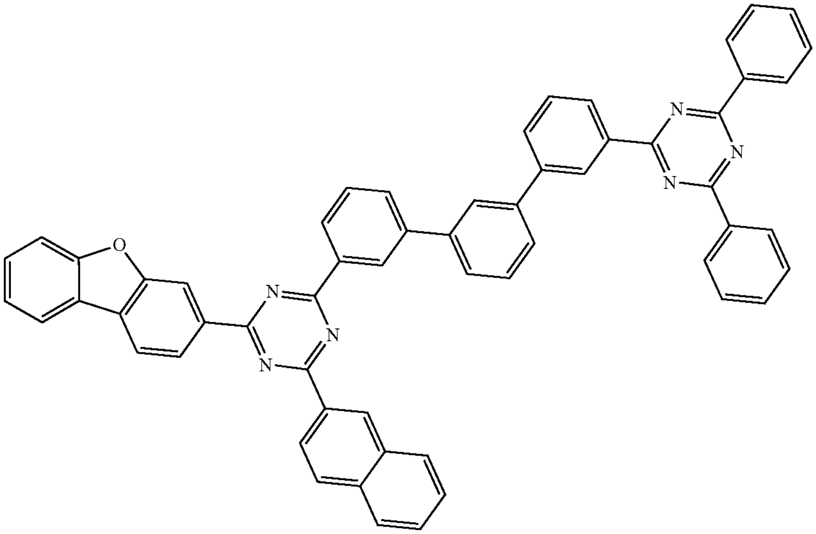
B-69
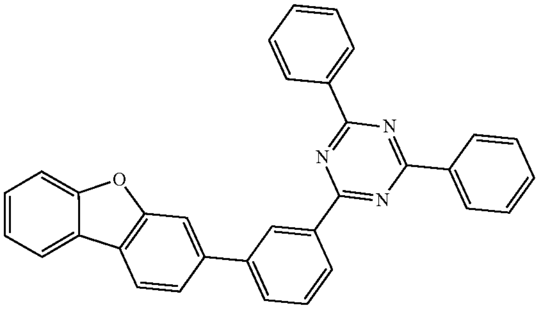
B-70
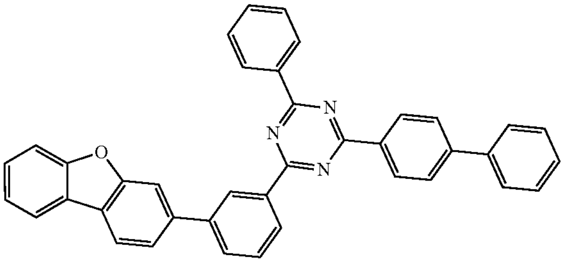

-continued
B-71
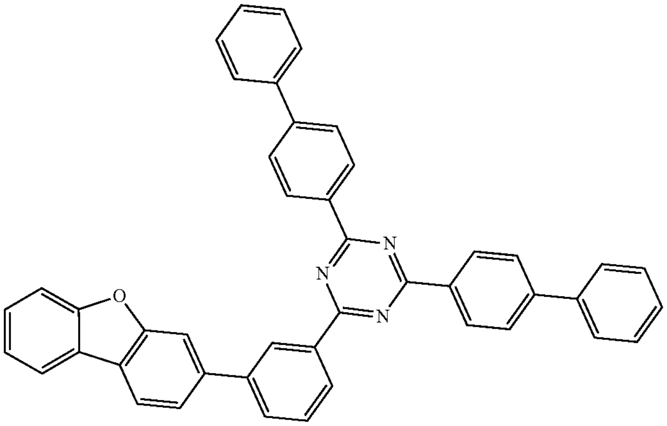
B-72
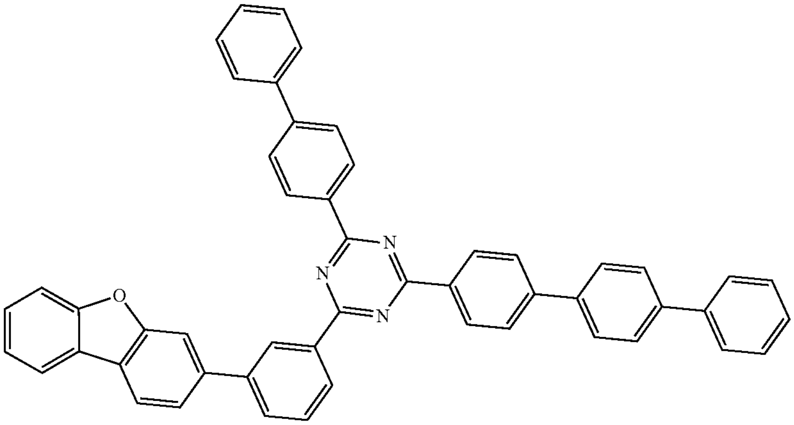
B-73
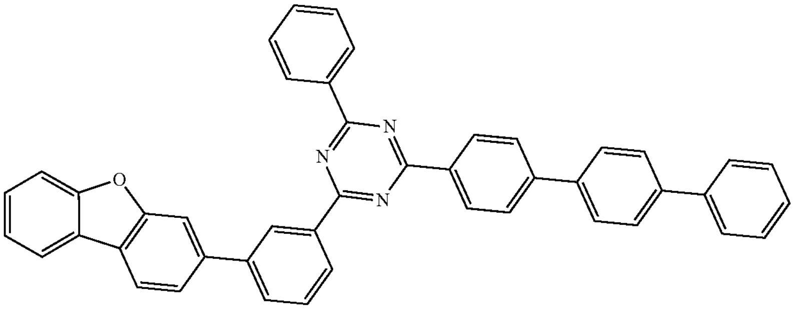
B-74
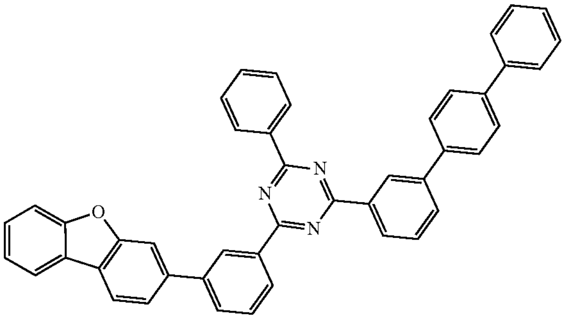
B-75
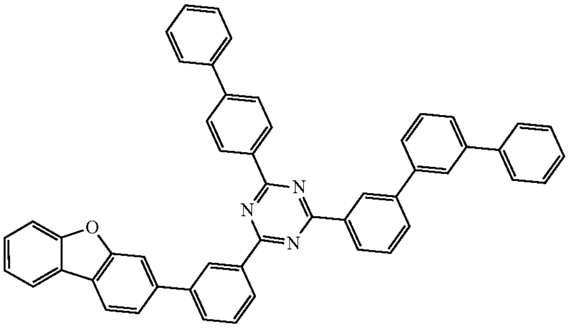

-continued
B-76
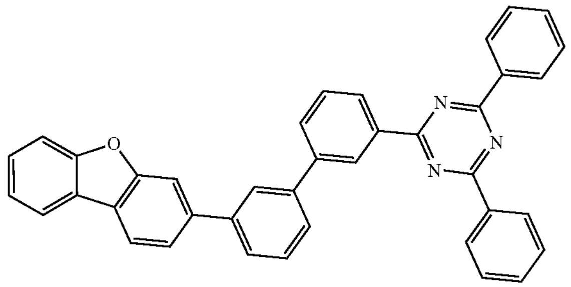
B-77
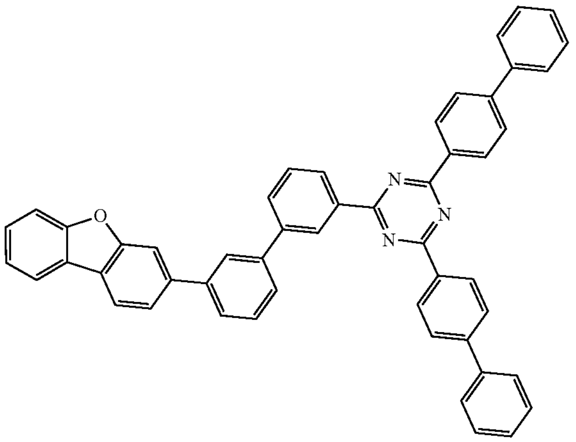
B-78
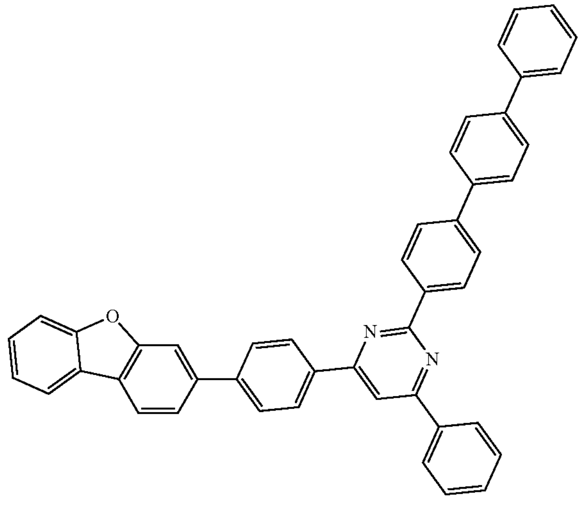
B-79
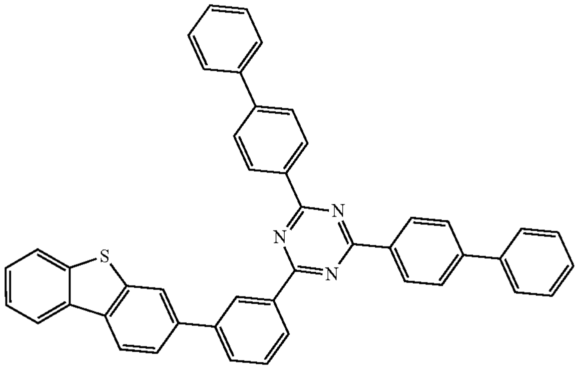
B-80
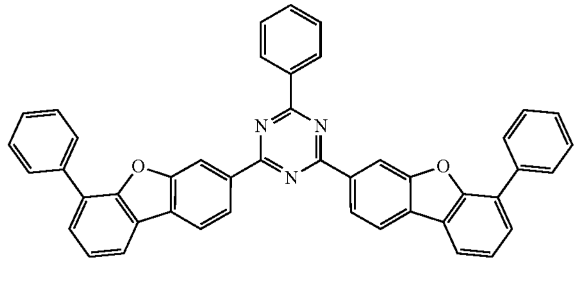
B-81
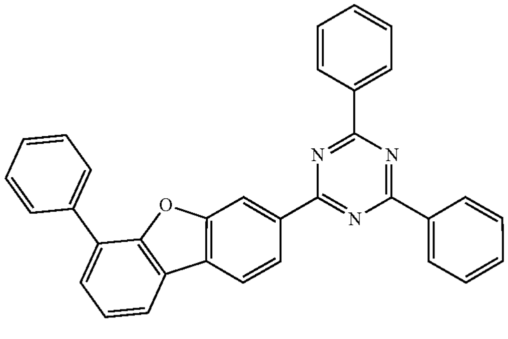

-continued
B-82
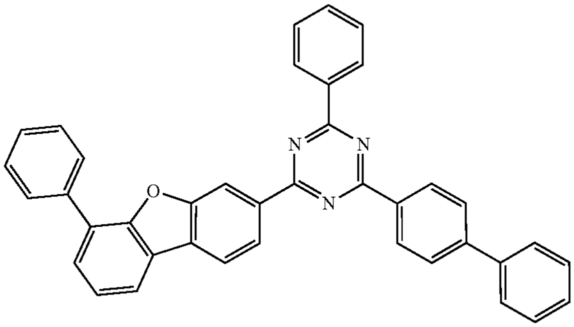
B-83
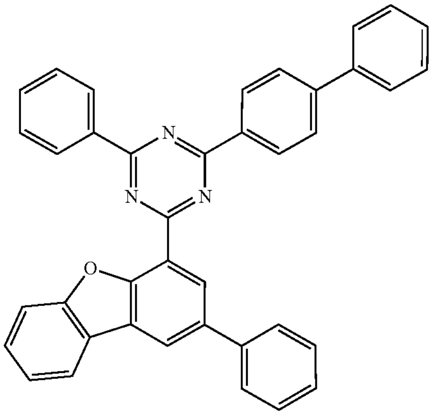
B-84
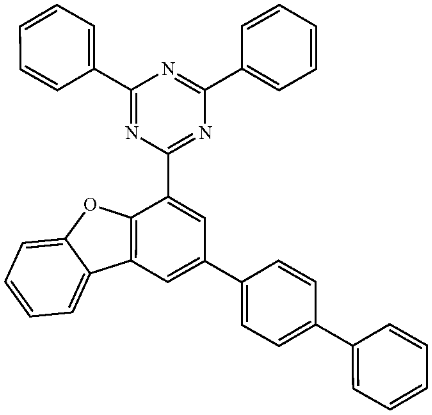
B-85
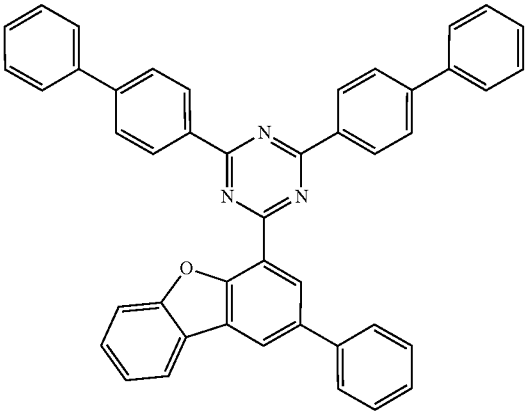
B-86
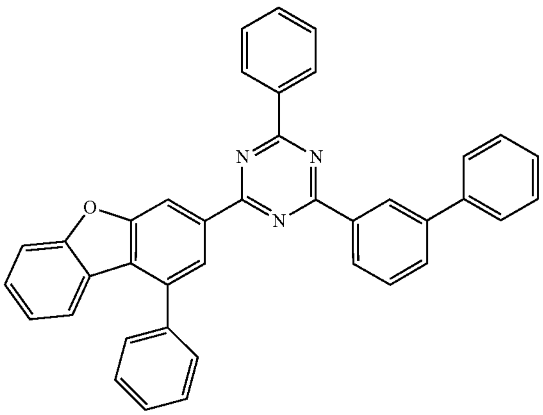
B-87
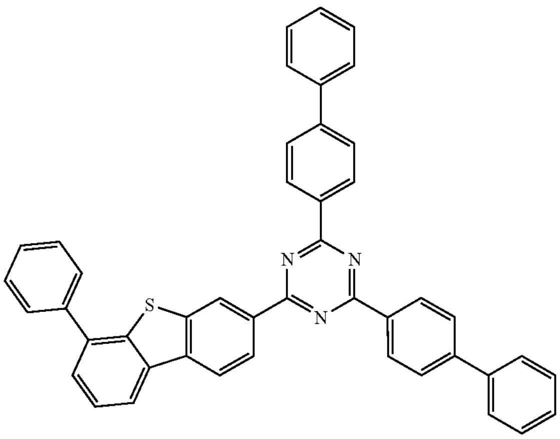

-continued
B-88
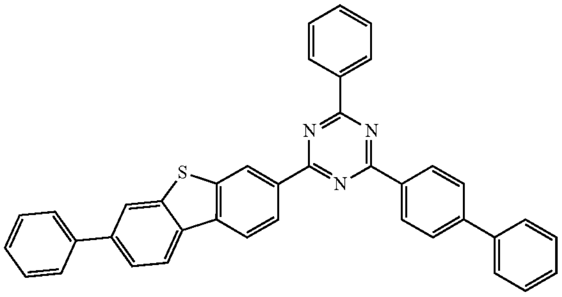
B-89
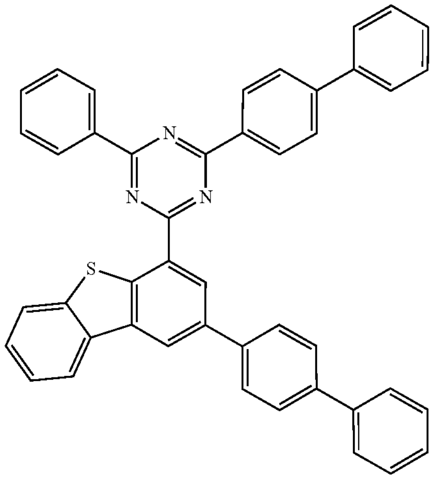
B-90
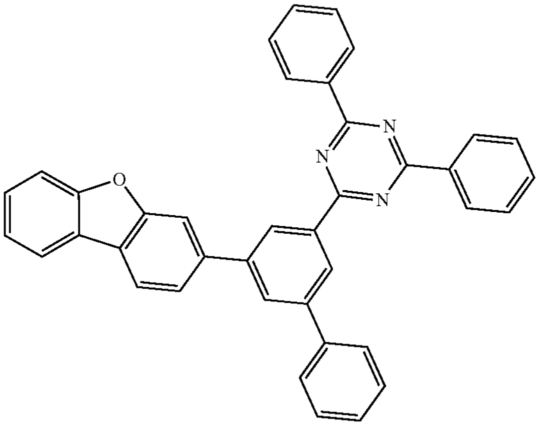
B-91
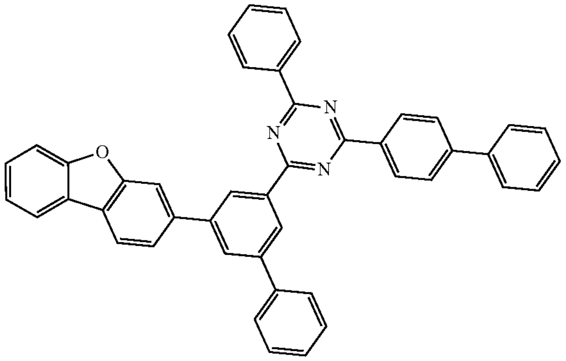
B-92
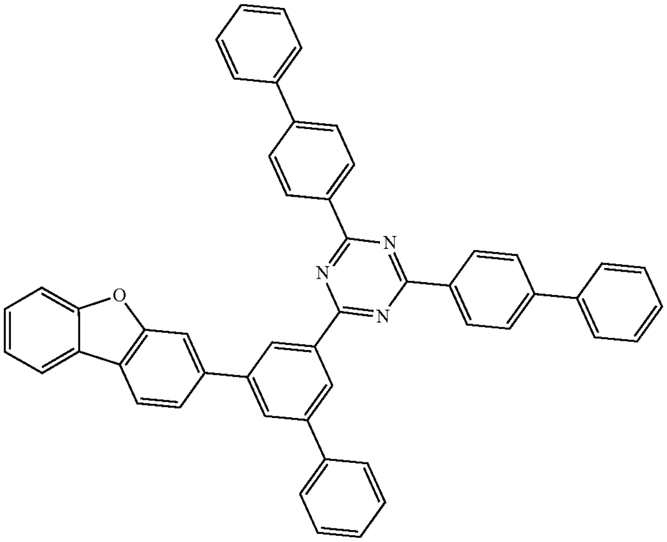

-continued
B-93
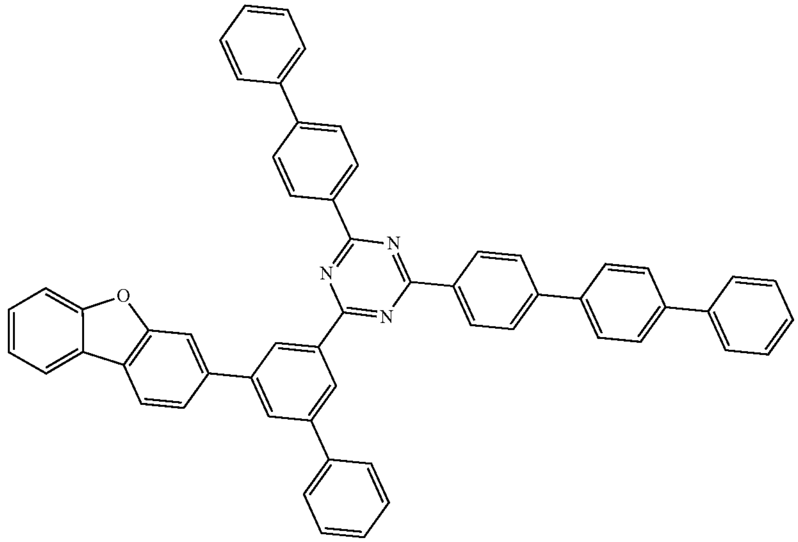
B-94
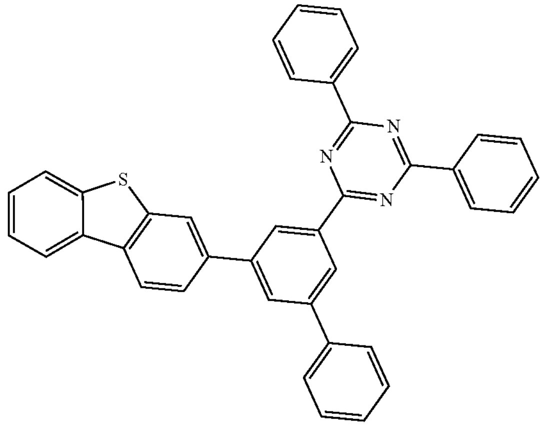
B-95
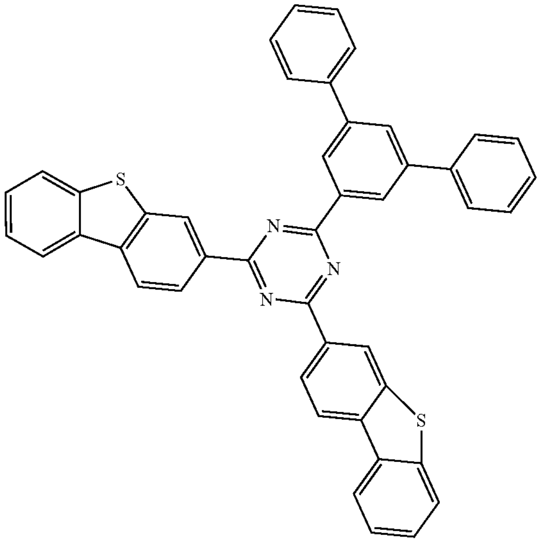
B-96
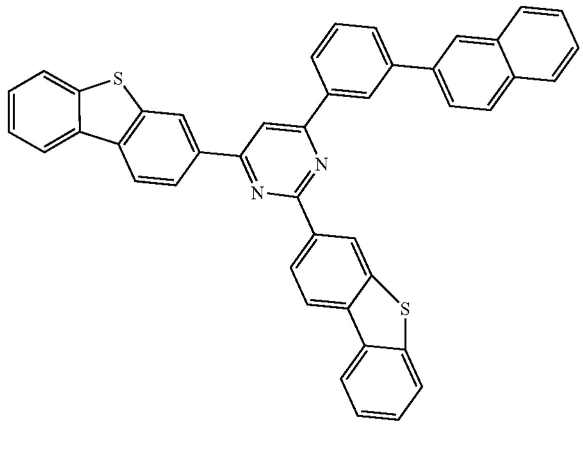
B-97
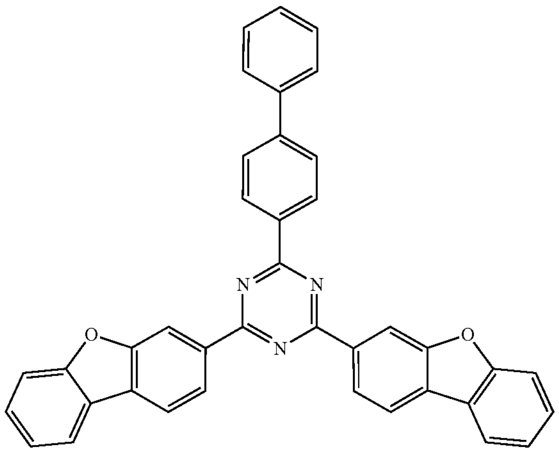

-continued
B-98
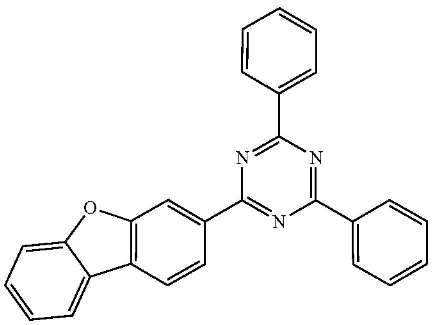
B-99
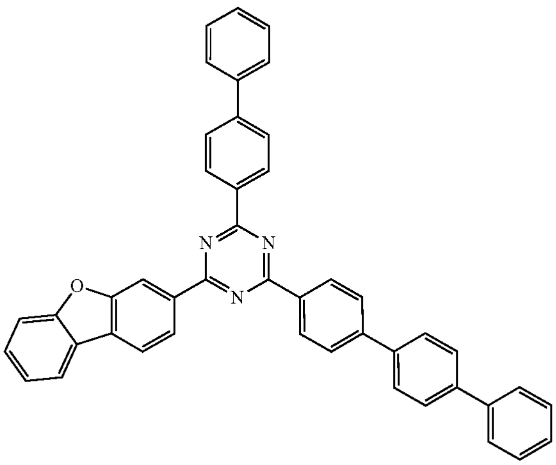
B-100
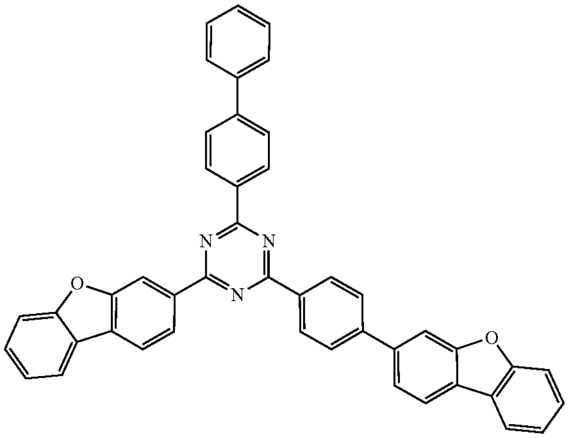
B-101
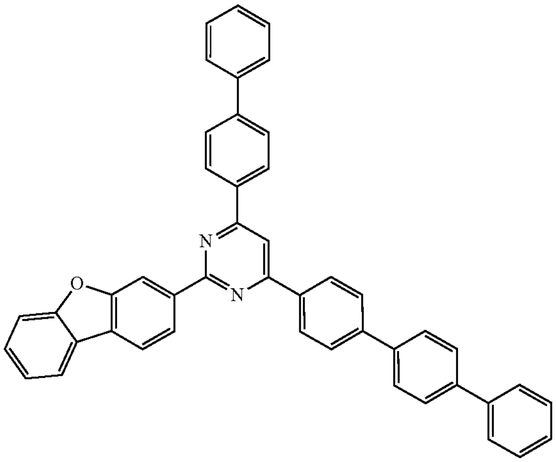
B-102
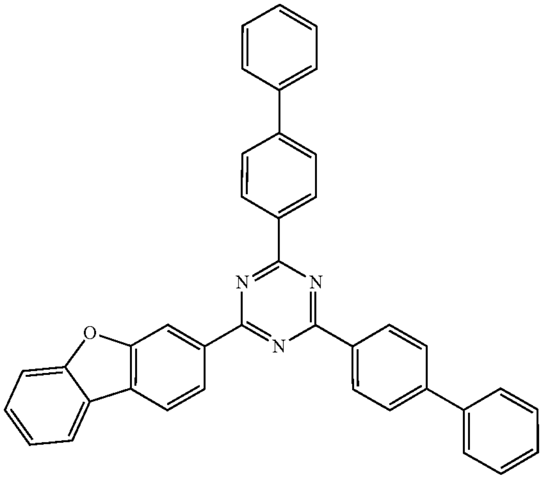
B-103
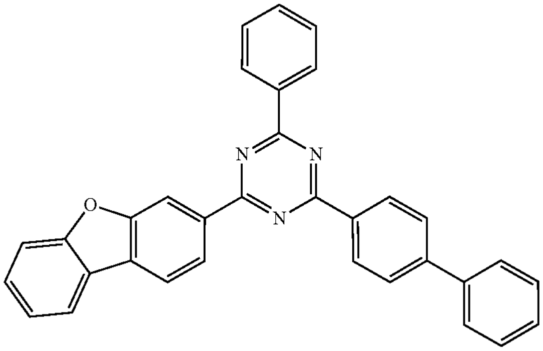

-continued
B-104
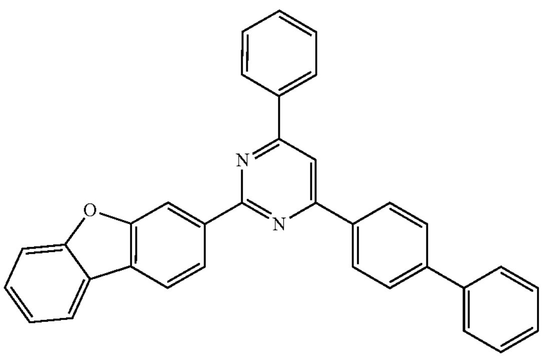
B-105
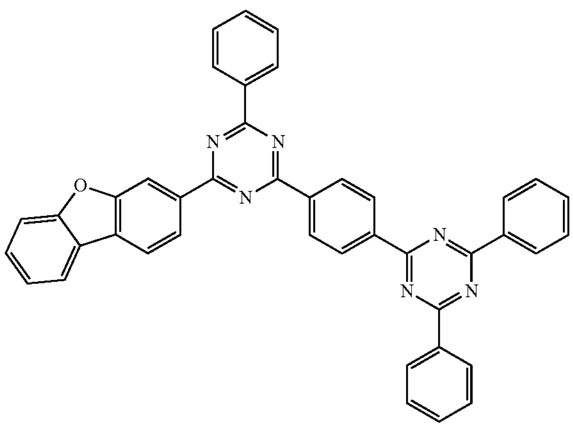
B-106
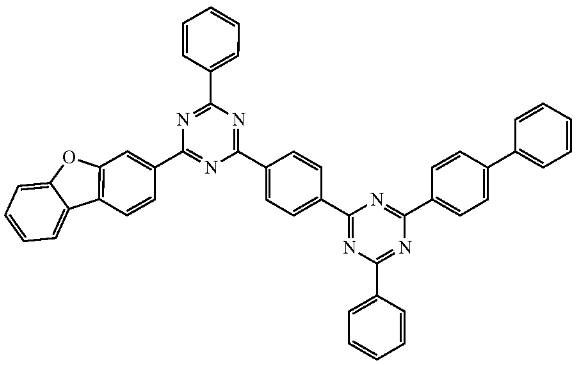
B-107
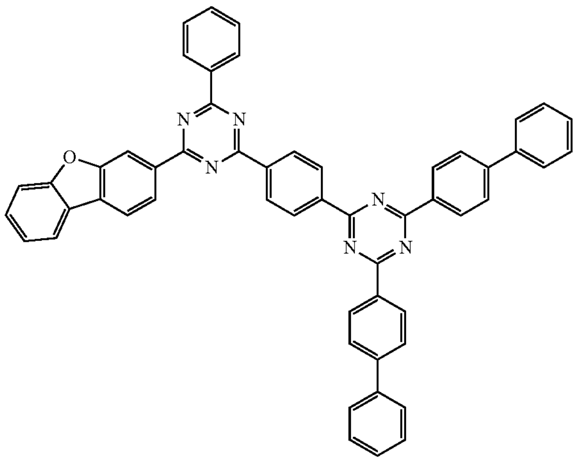
B-108
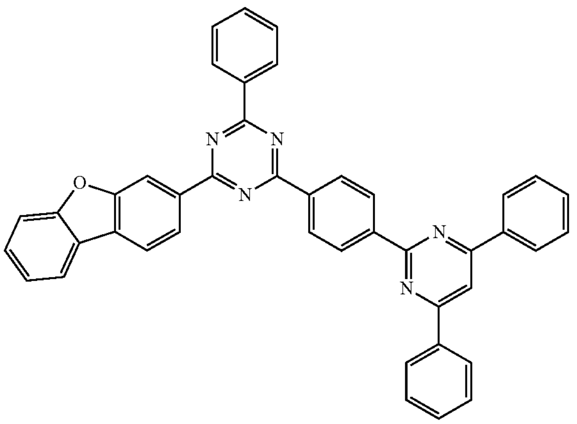
B-109
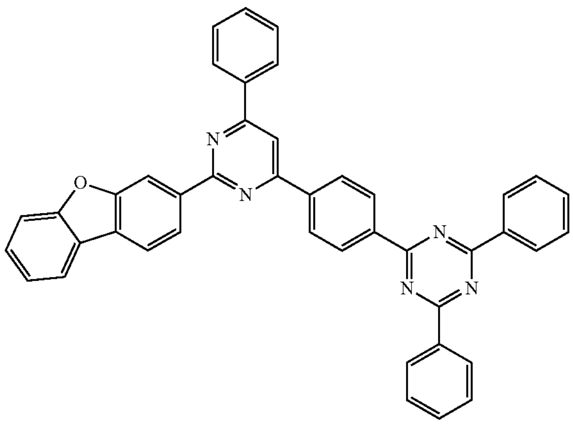

-continued
B-110
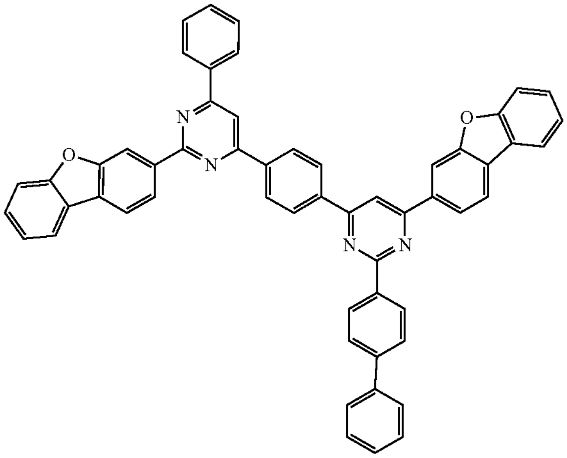
B-111
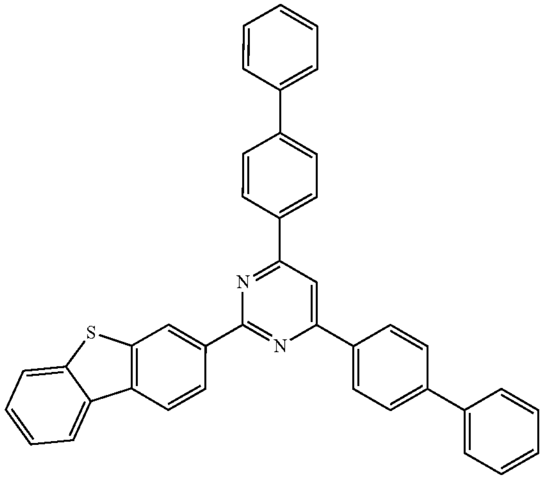
B-112
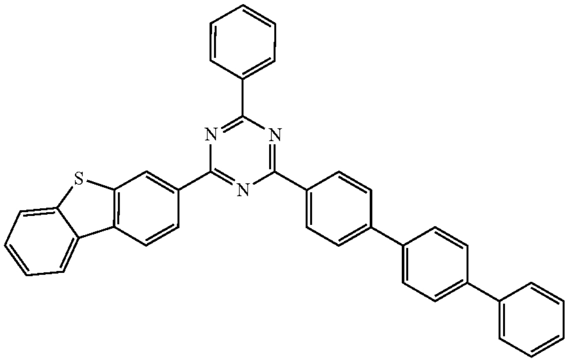
B-113
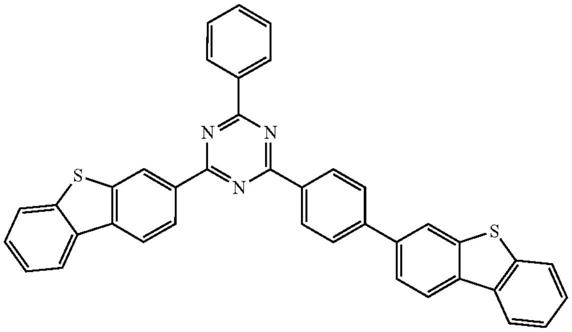
B-114
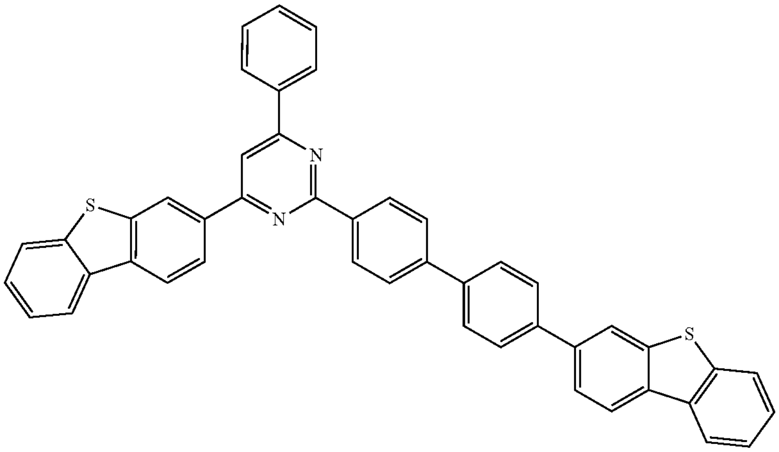

-continued
B-115
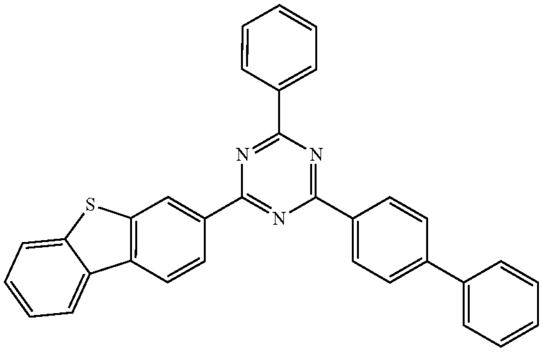
B-116
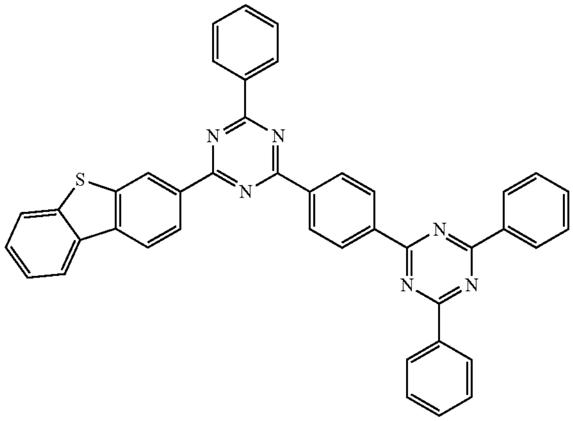
B-117
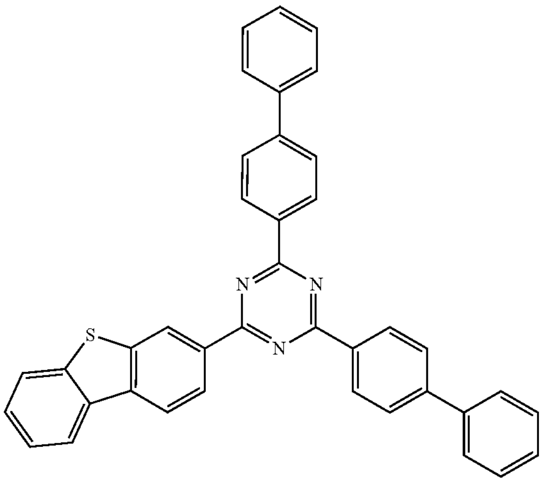
B-118
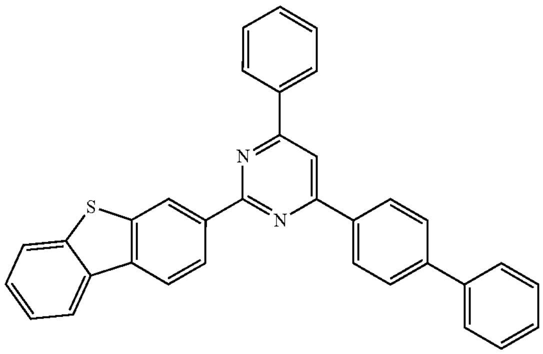
B-119
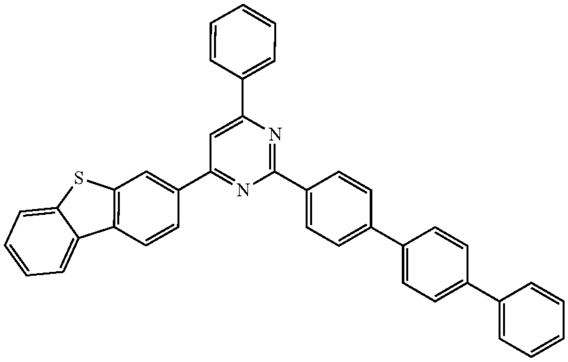
B-120
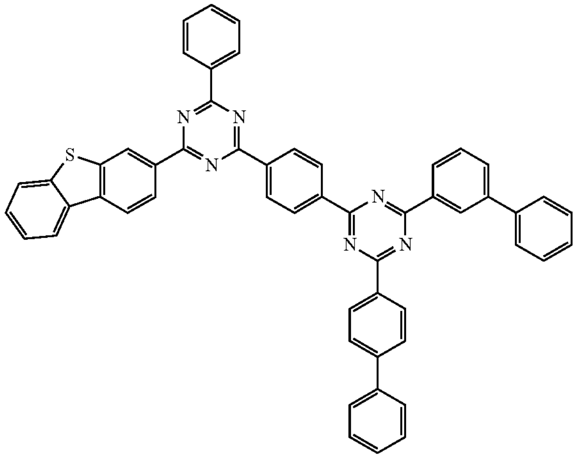

-continued
B-121
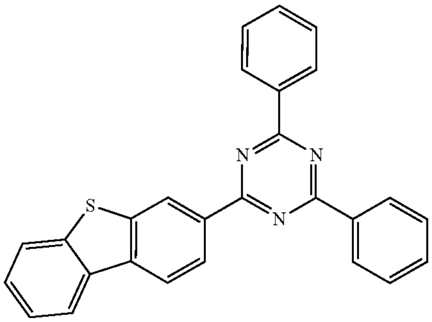
B-122
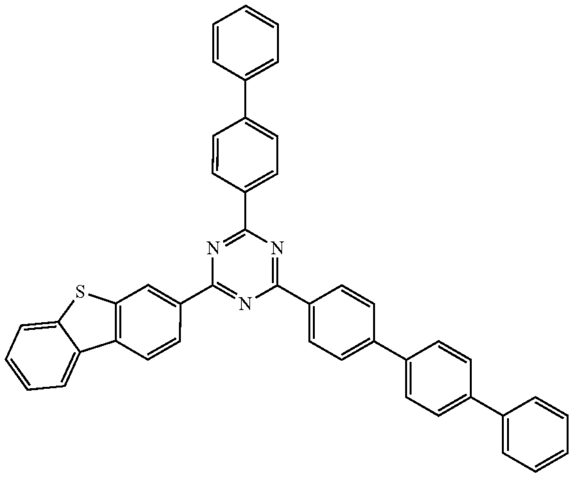
B-123
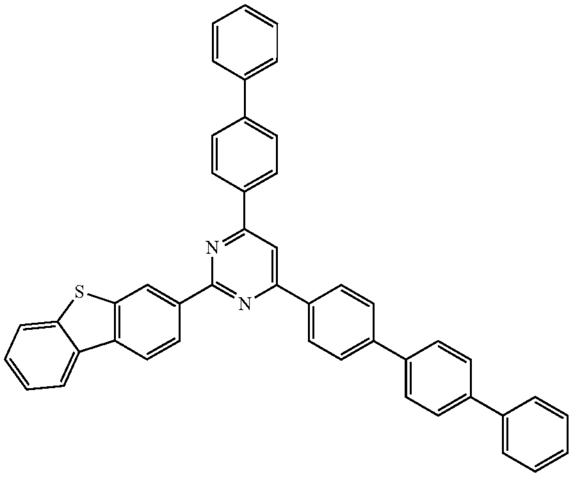
B-124
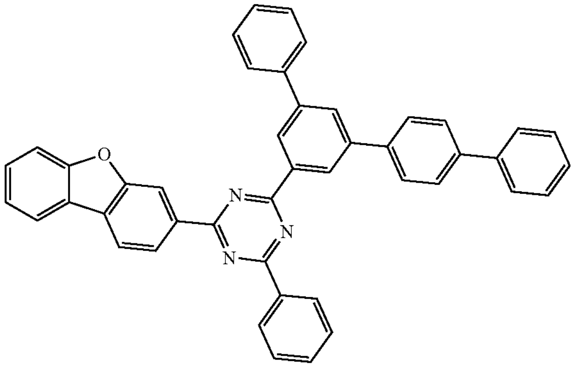
B-125
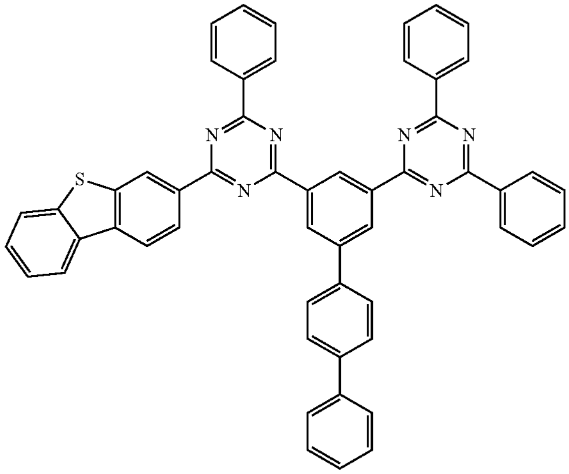
-continued
B-126
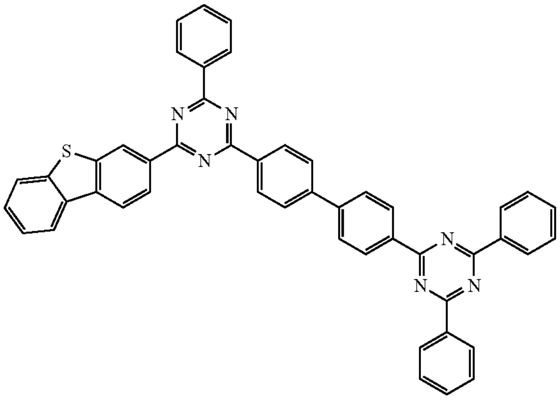

-continued
B-127
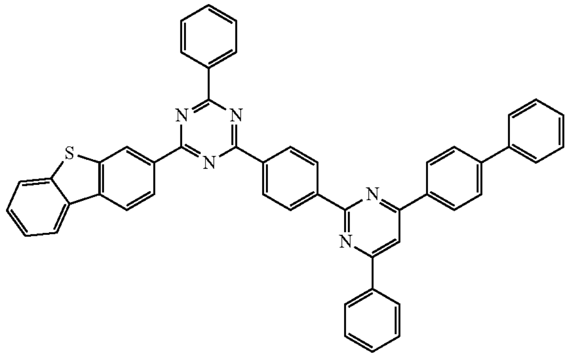
B-128
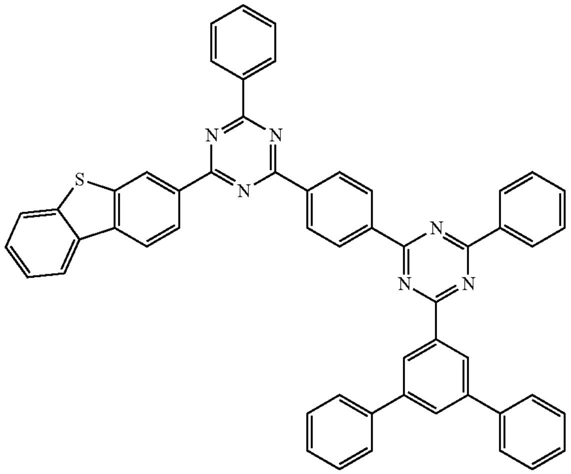
B-129
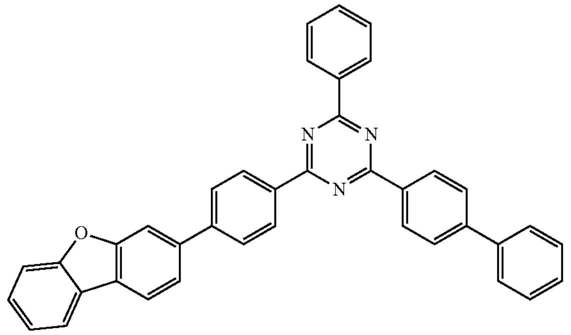
B-130
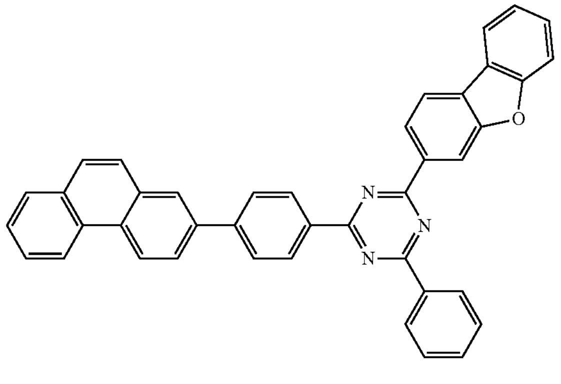
-continued
B-131
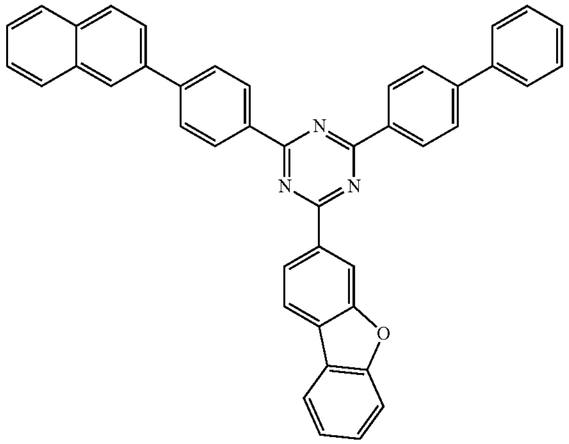
B-132
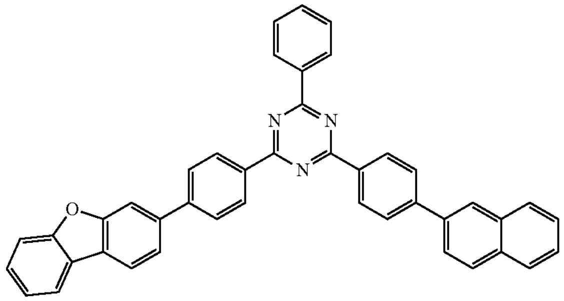
B-133
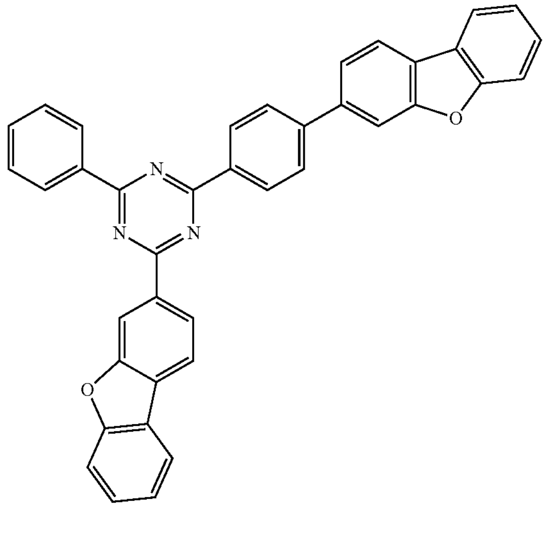

-continued
B-134
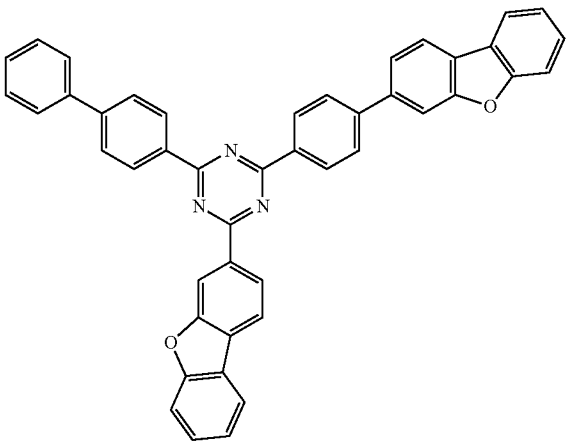
B-135
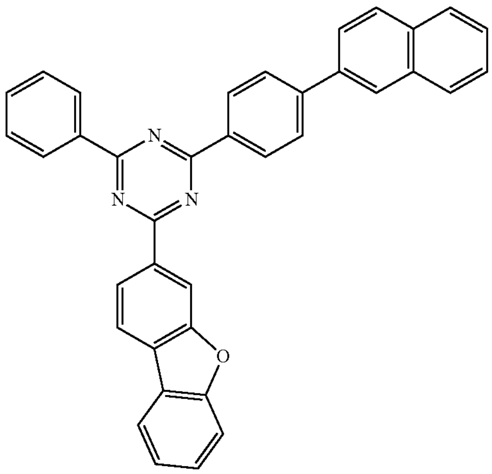
B-136
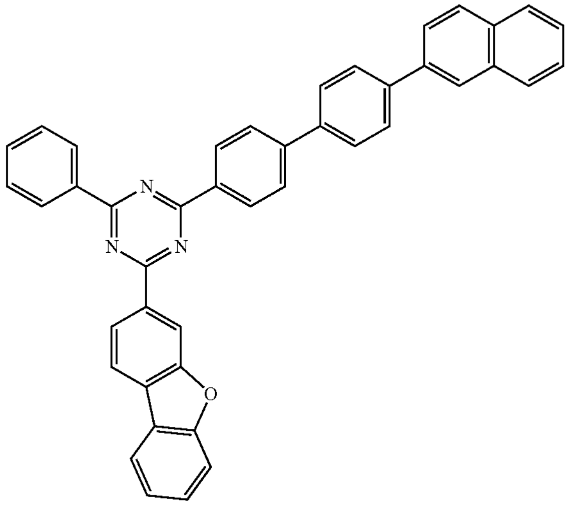
-continued
B-137
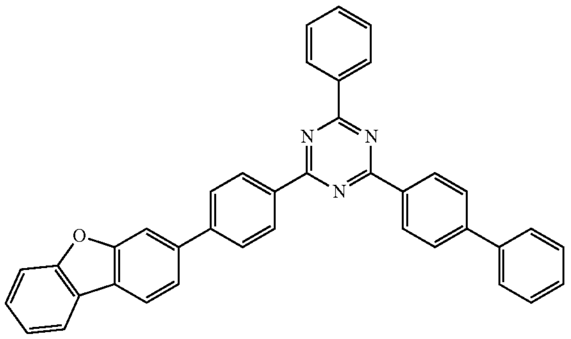
B-138
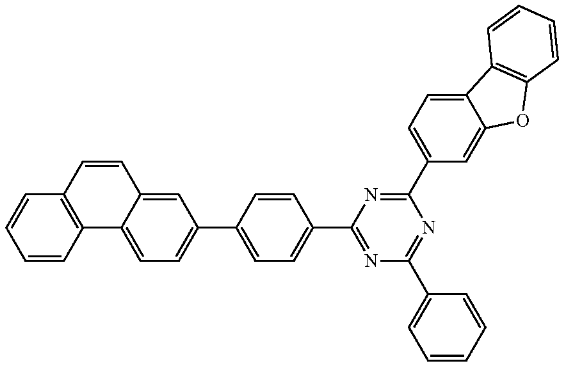
B-139
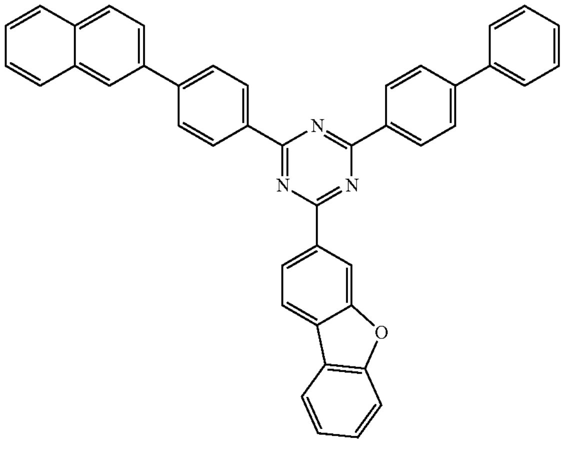
B-140
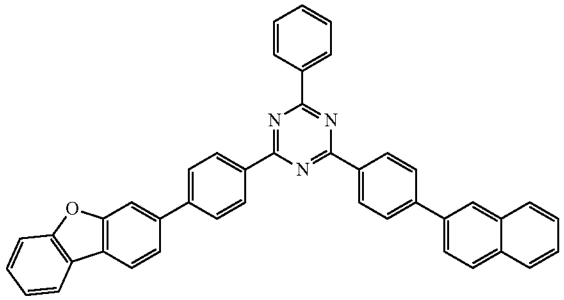

-continued
B-141
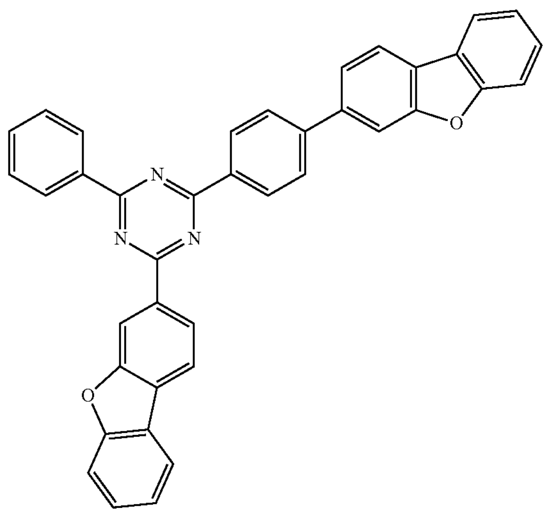
B-142
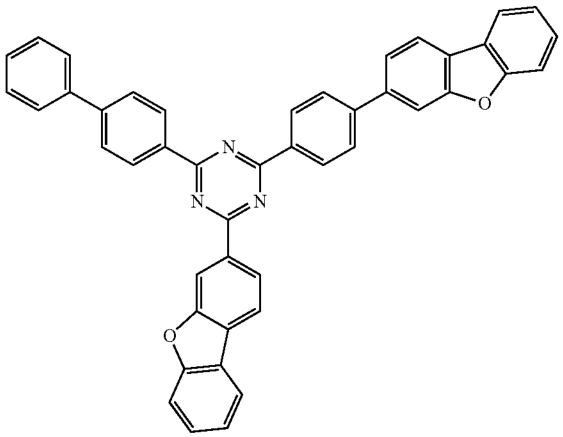
B-143
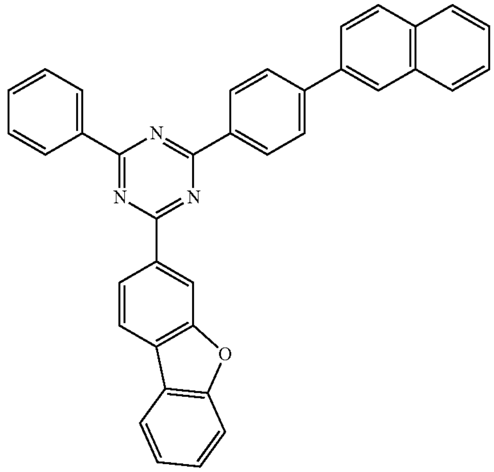
-continued
B-144
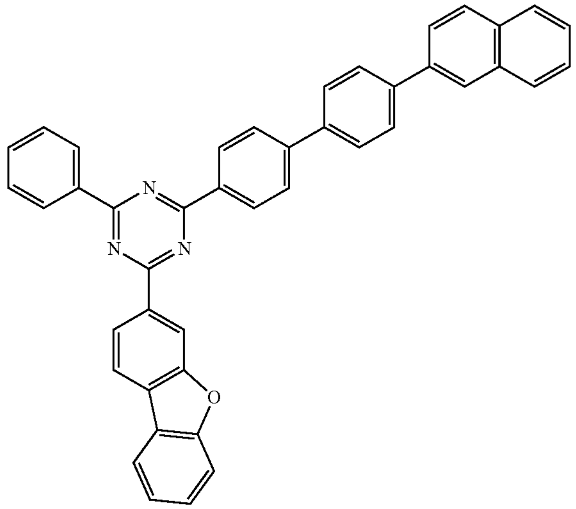
B-145
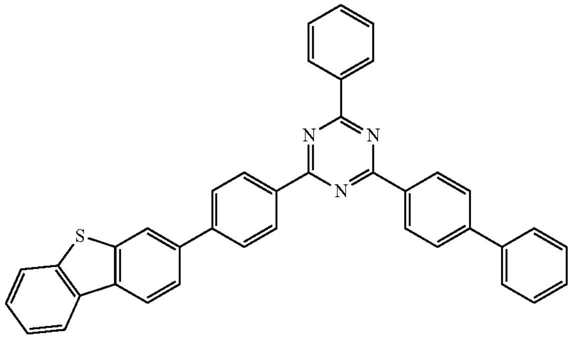
B-146
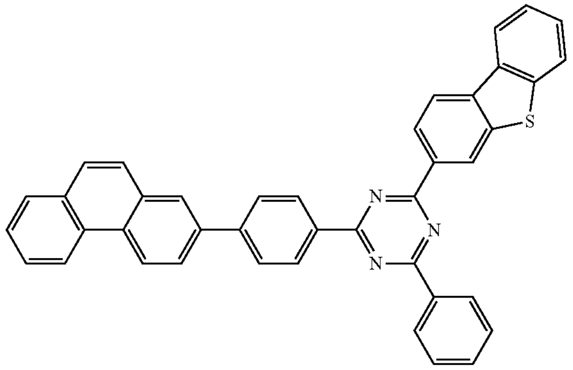

-continued
B-147
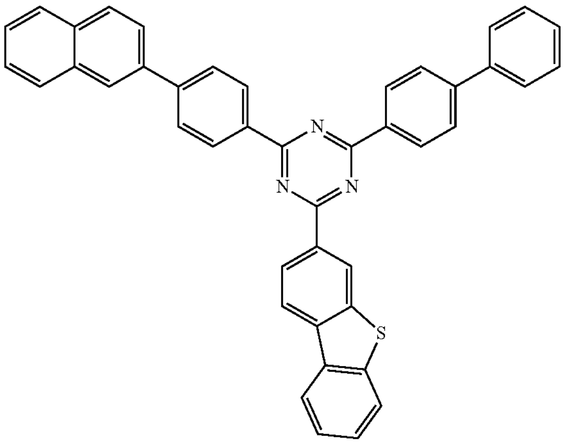
B-148
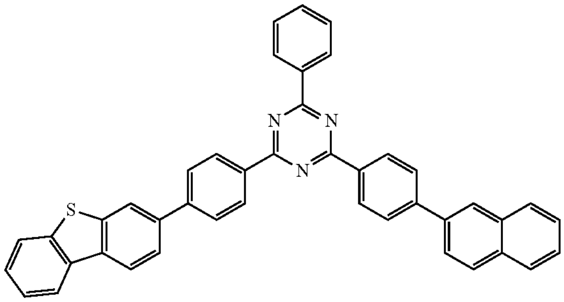
B-149
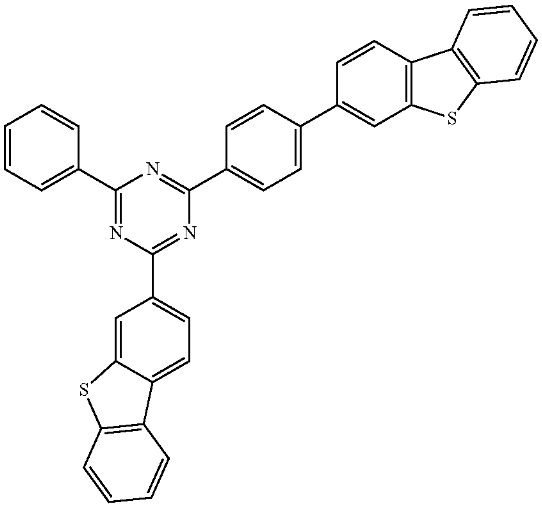
-continued
B-150
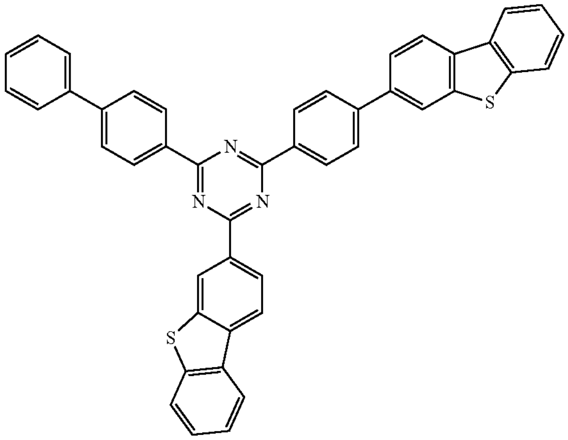
B-151
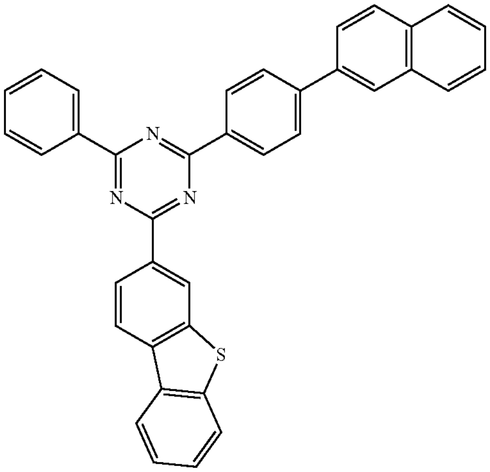
B-152
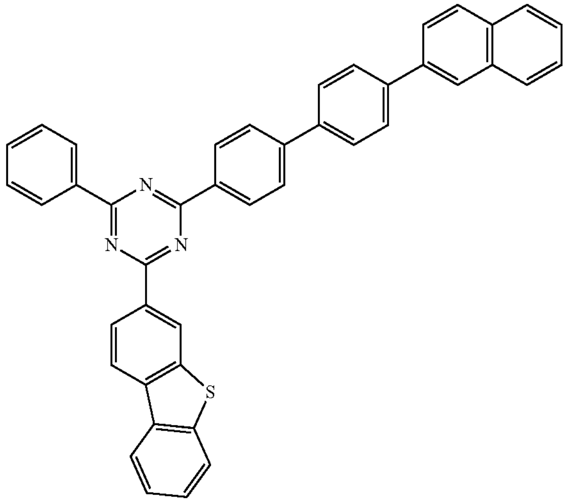

B-153
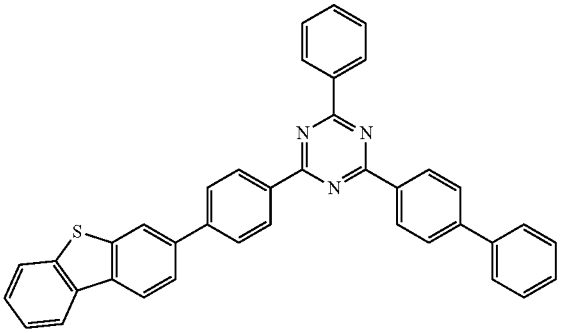
B-154
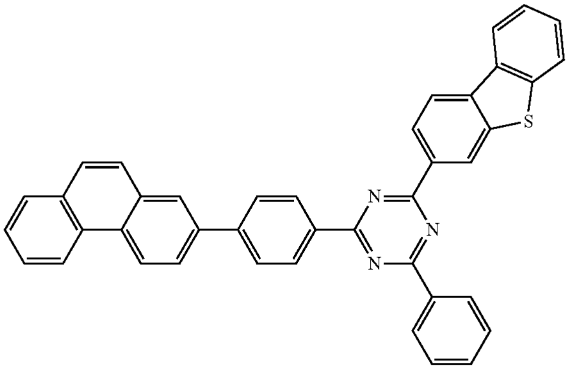
B-155
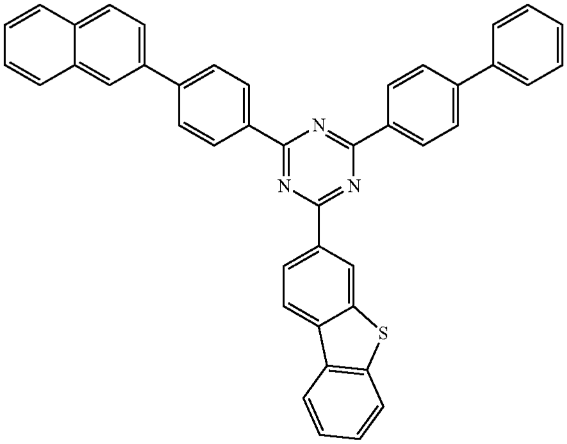
B-156
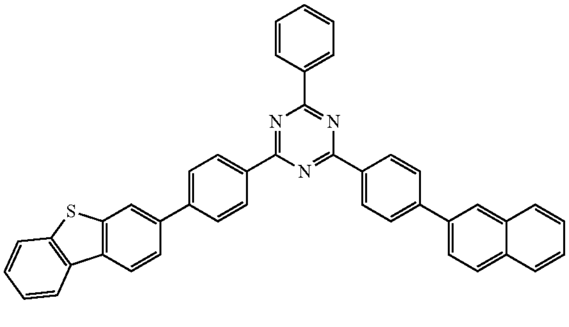
B-157
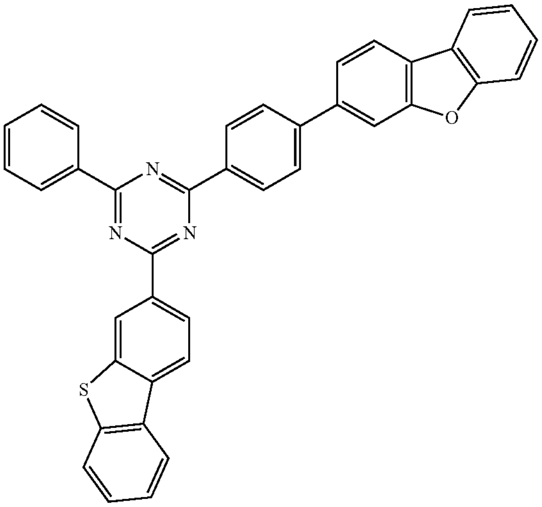
B-158
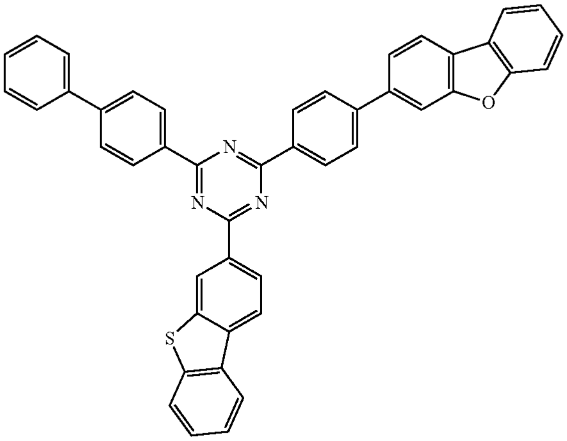
B-159
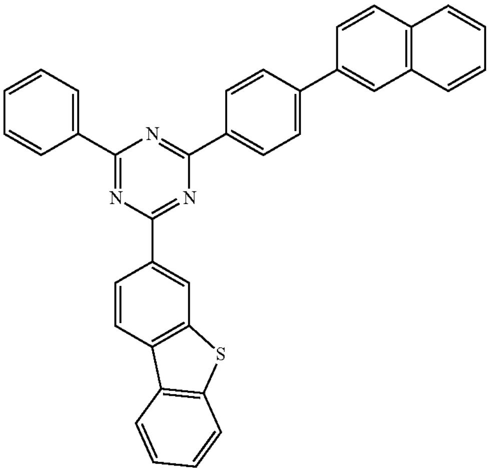

-continued
B-160
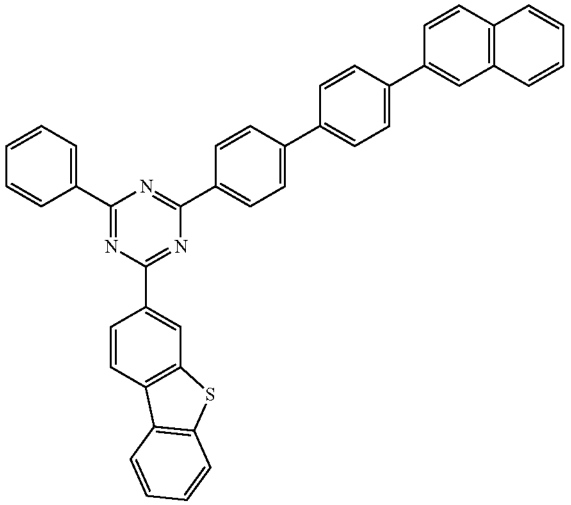
B-161
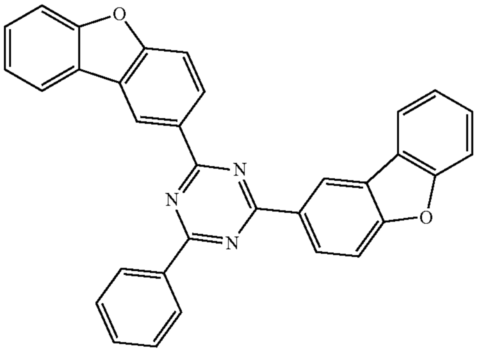
B-162
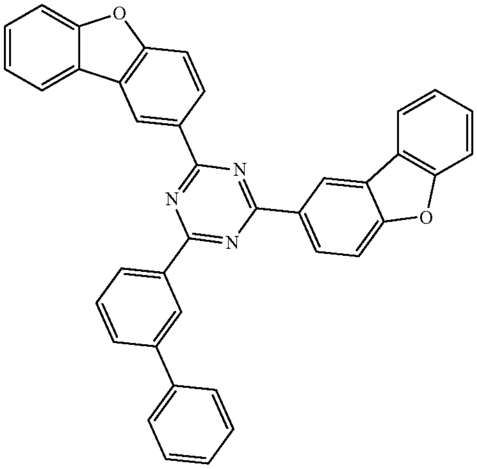
-continued
B-163
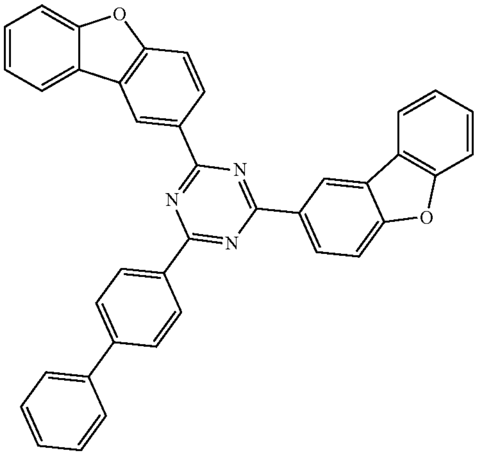
B-164
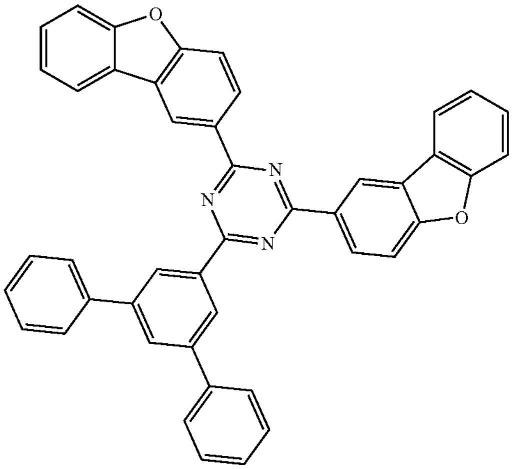
B-165
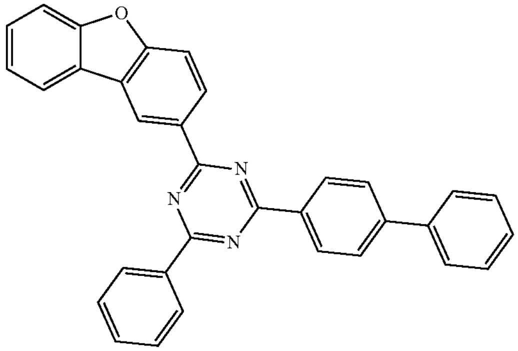

-continued
B-166
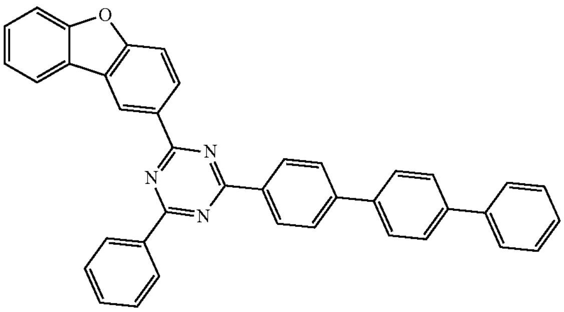
B-167
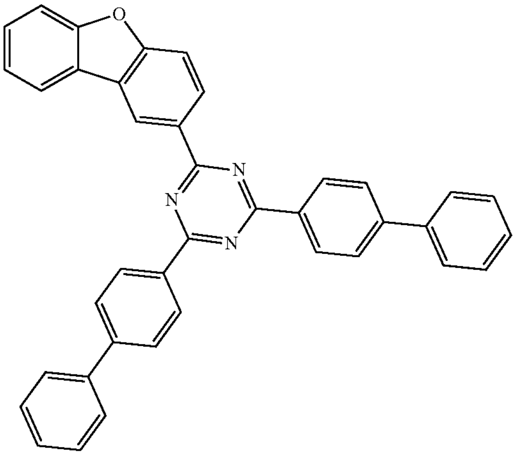
B-168
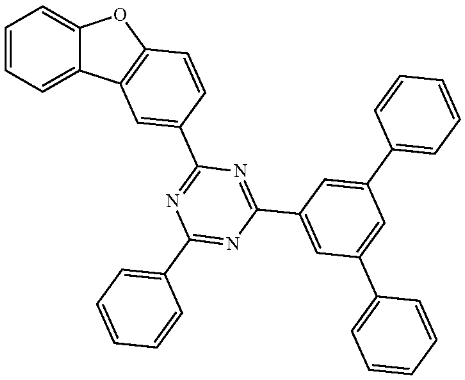
B-169
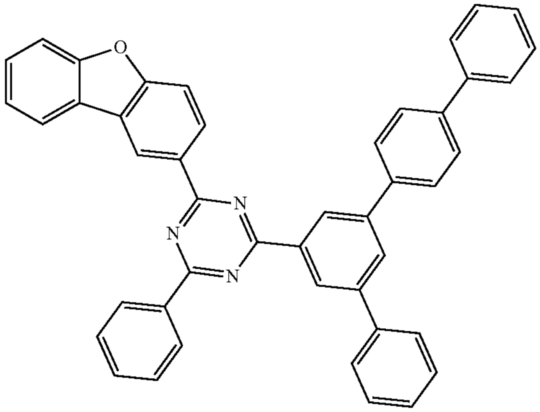
-continued
B-170
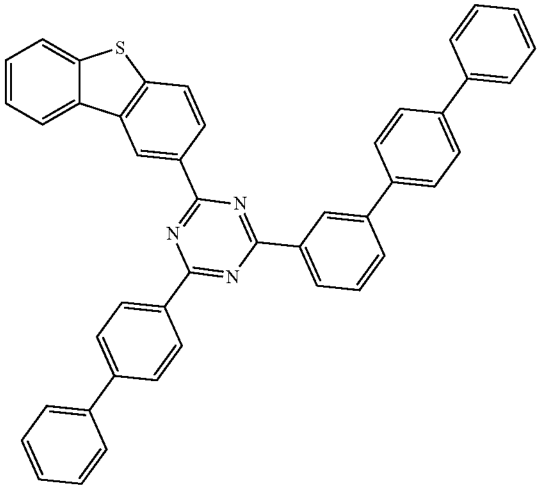
B-171
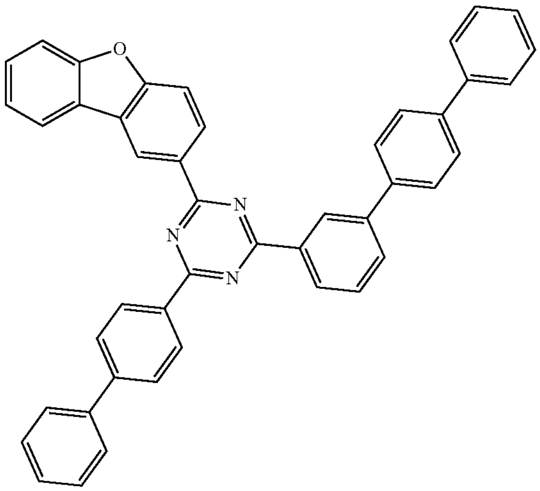
B-172
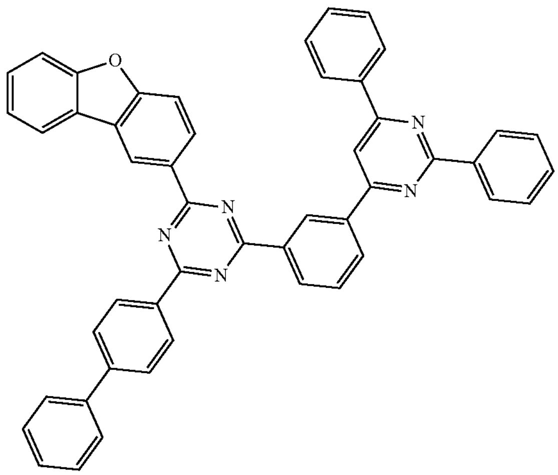

-continued
B-173
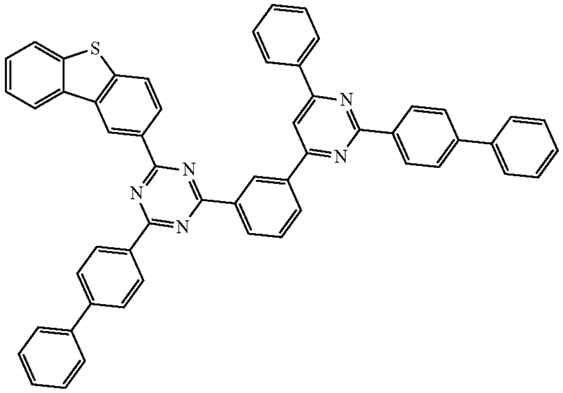
B-174
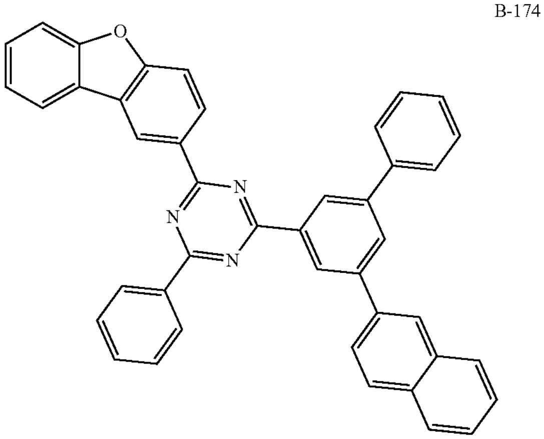
B-175
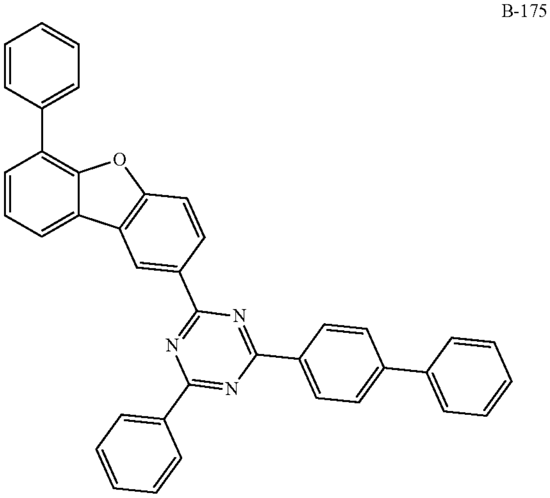
-continued
B-176
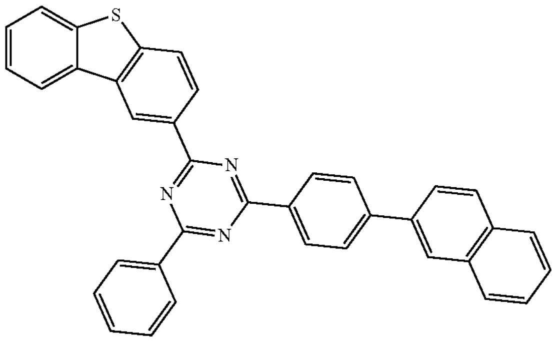
B-177
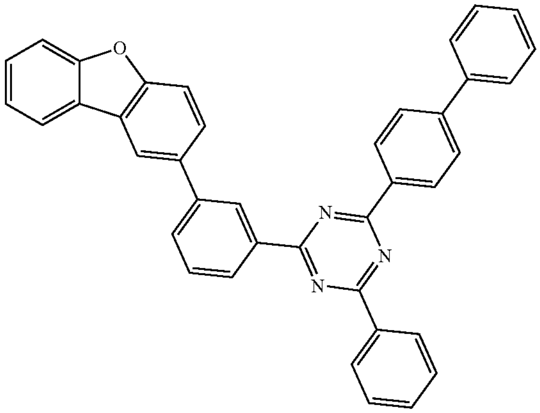
B-178
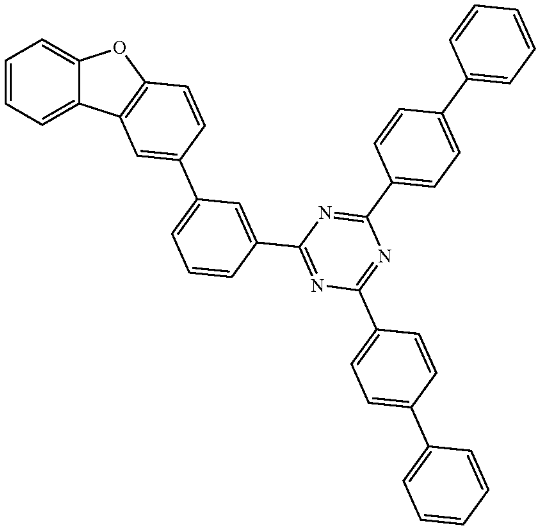

B-179
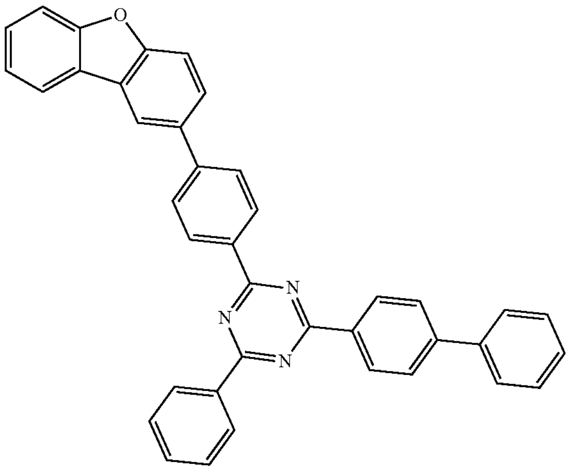
B-180
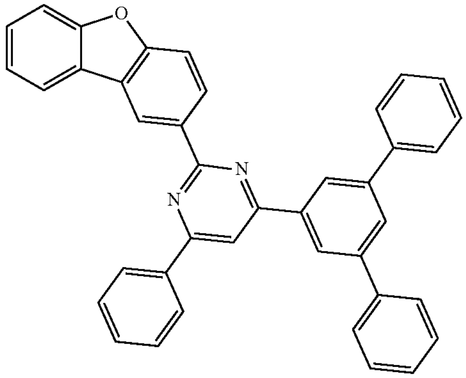
B-181
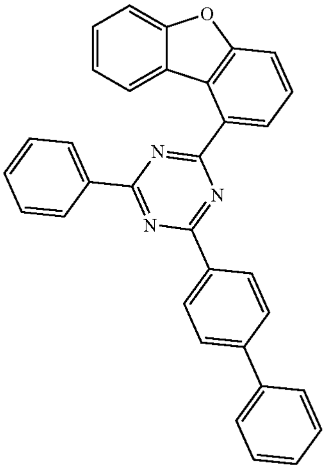
B-182
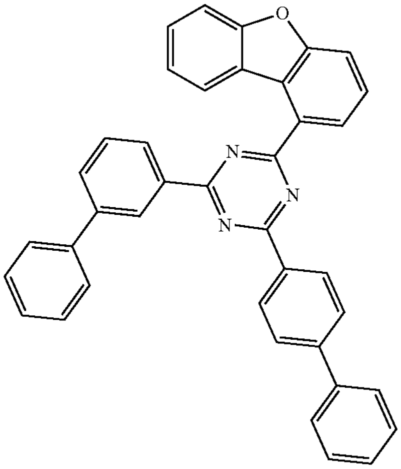
B-183
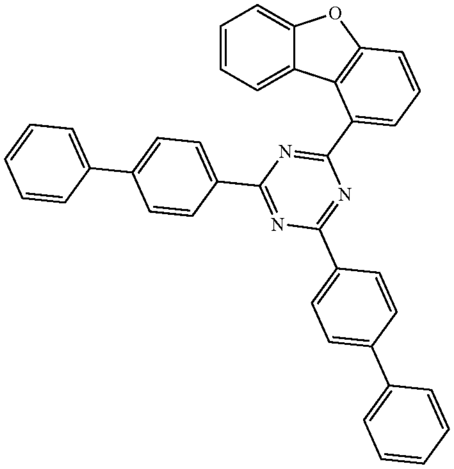
B-184
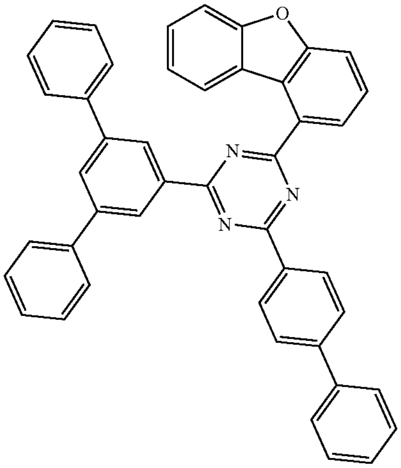

-continued
B-185
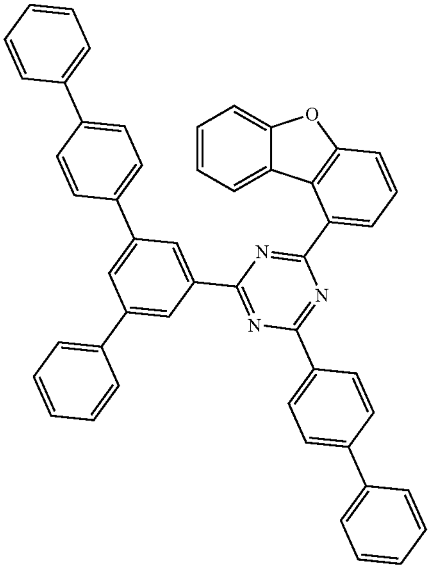
B-186
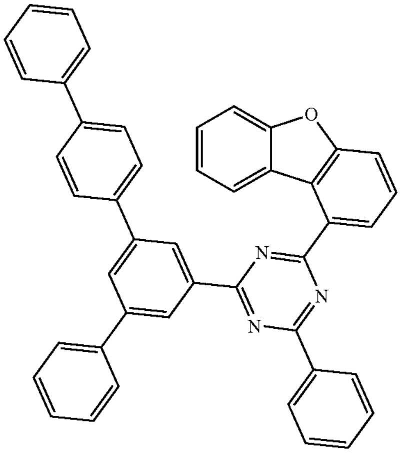
B-187
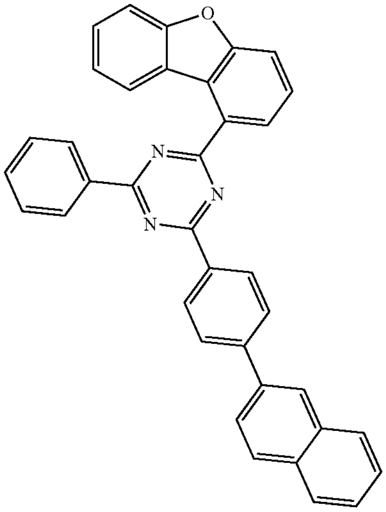
-continued
B-188
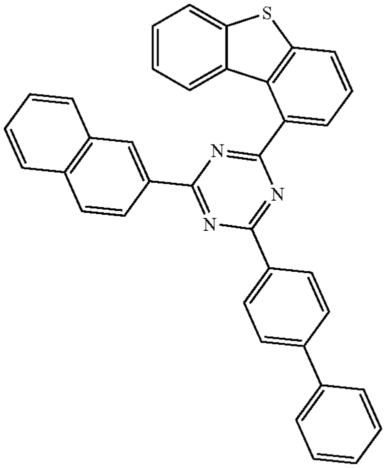
B-189
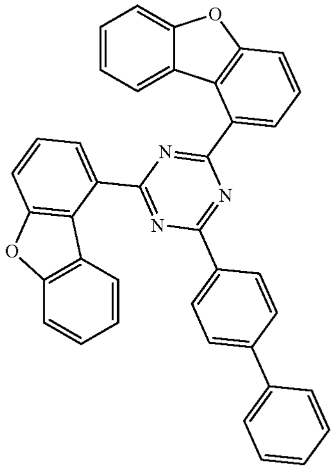
B-190
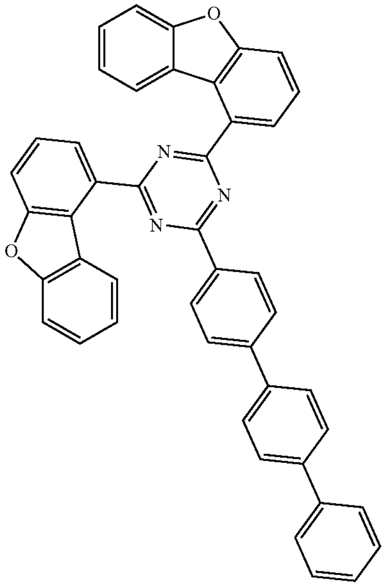

-continued
B-191
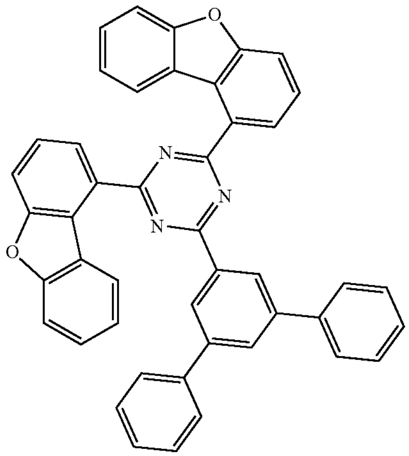
B-192
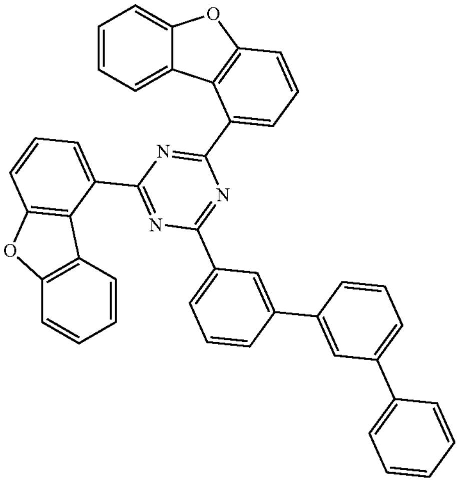
B-193
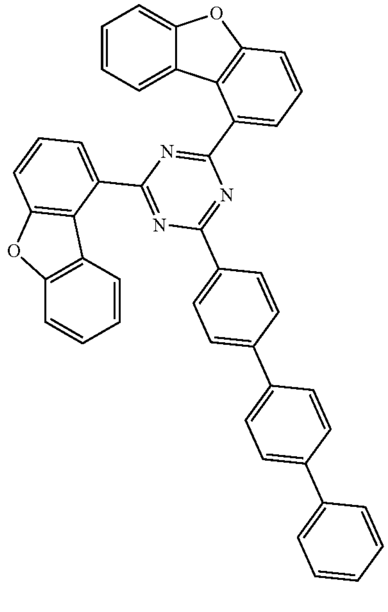
-continued
B-194
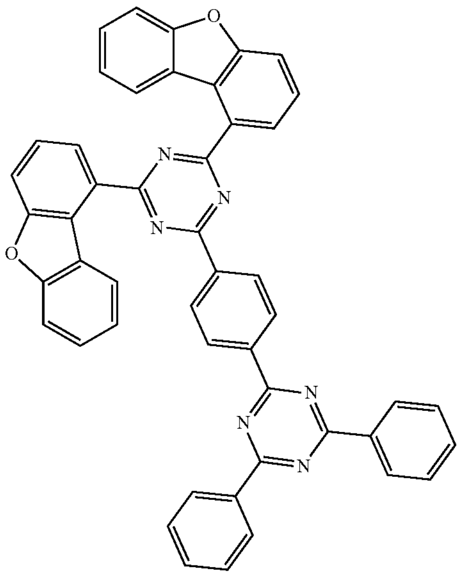
B-195
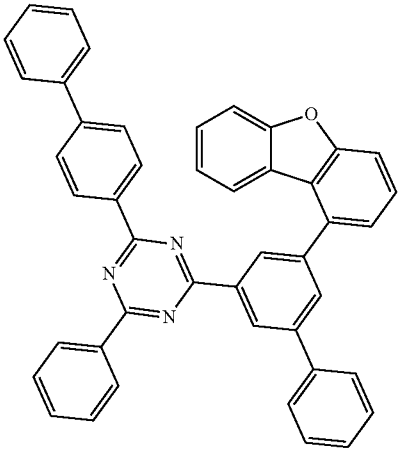
B-196
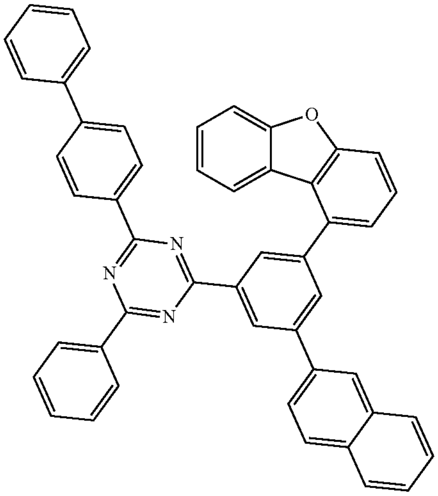

-continued
B-197
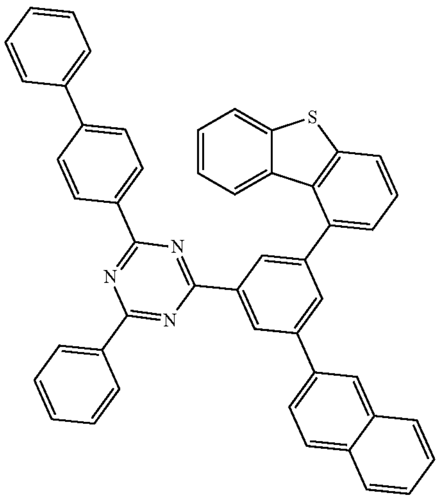
B-198
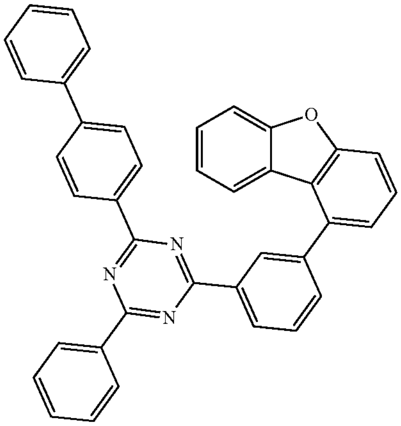
B-199
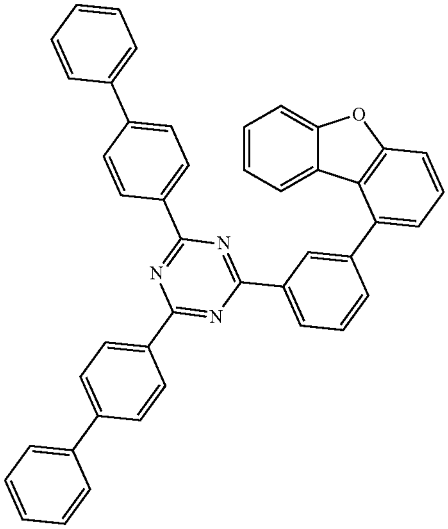
-continued
B-200
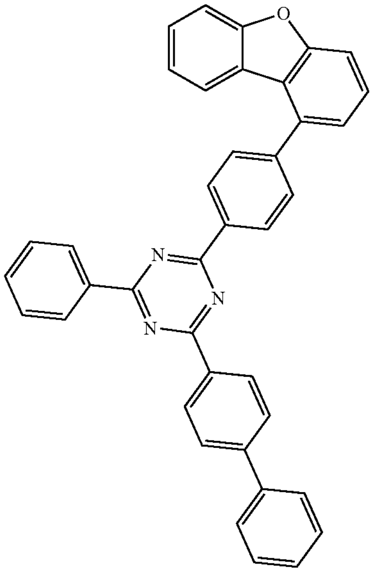
B-201
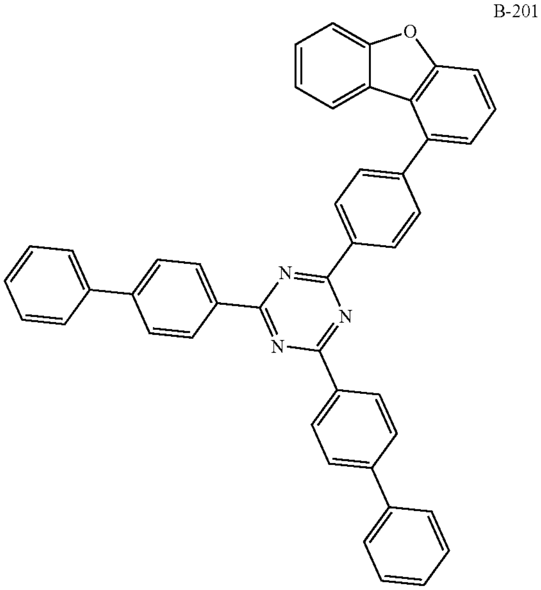
B-202
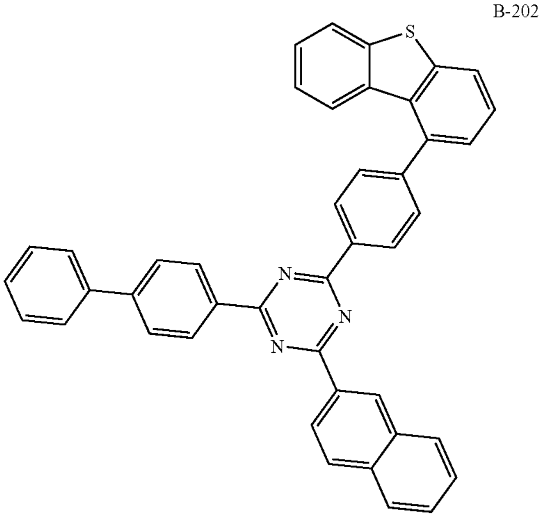

-continued
B-203
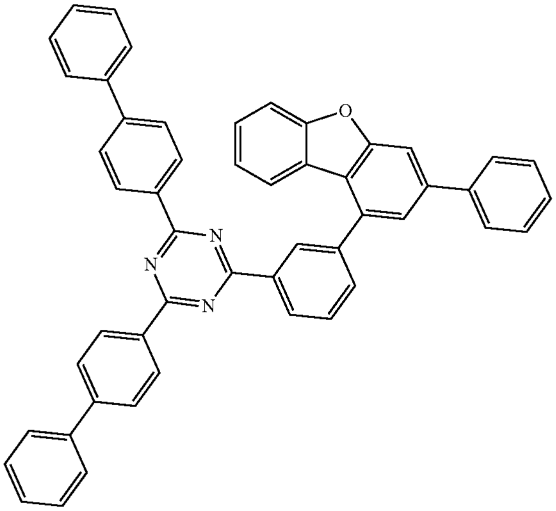
B-204
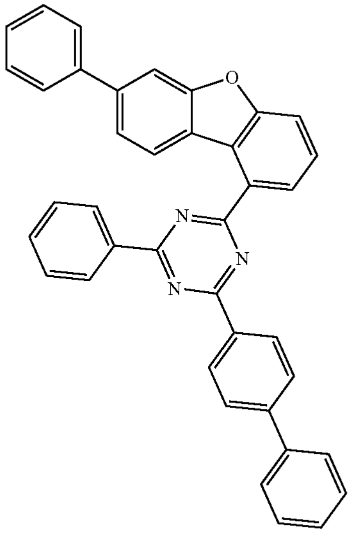
B-205
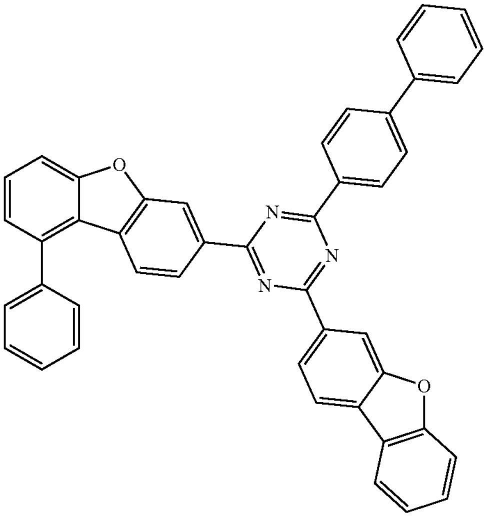
-continued
B-206
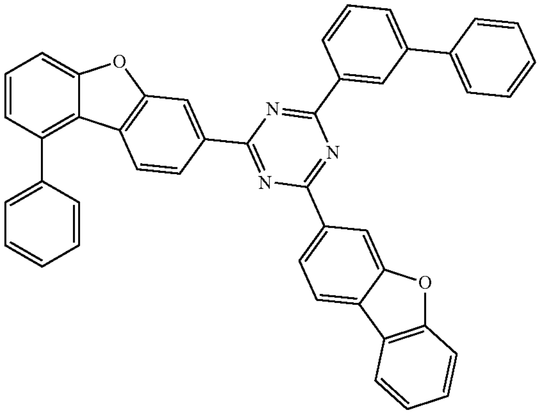
B-207
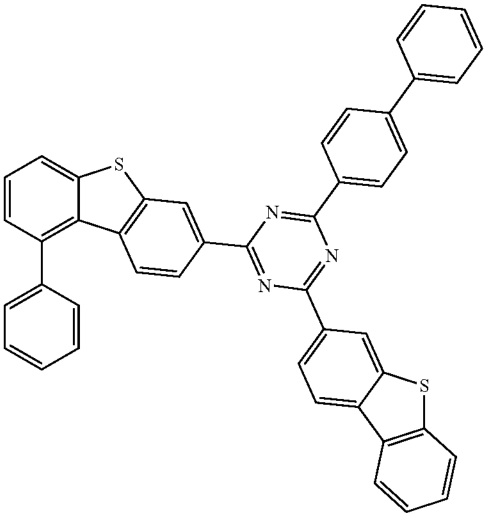
B-208
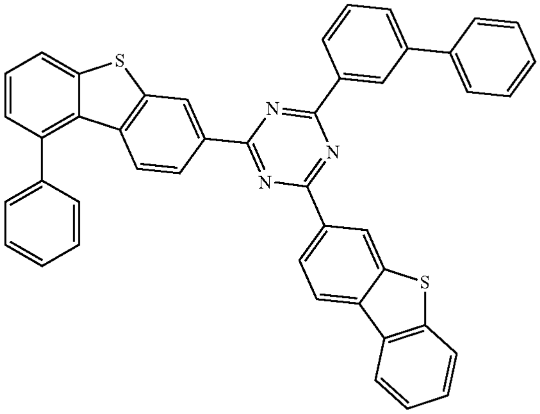

-continued
B-209
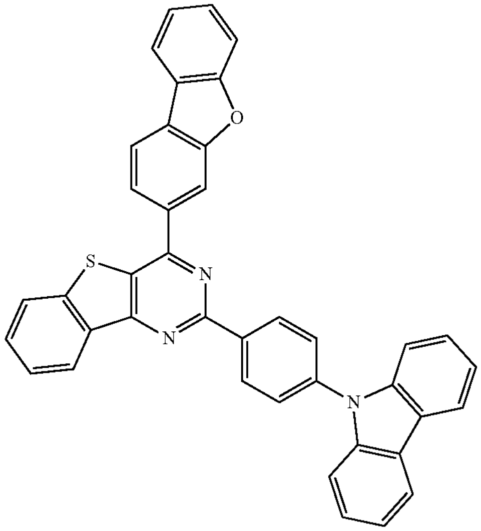
C-1
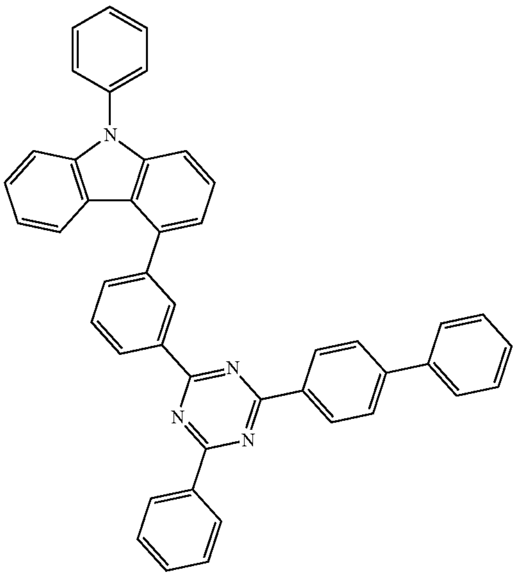
-continued
C-2
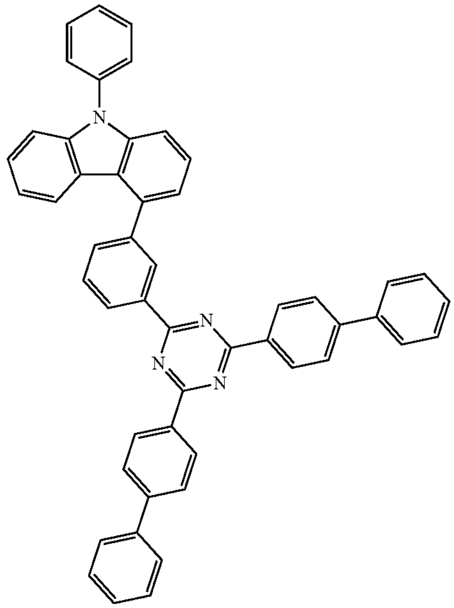
C-3
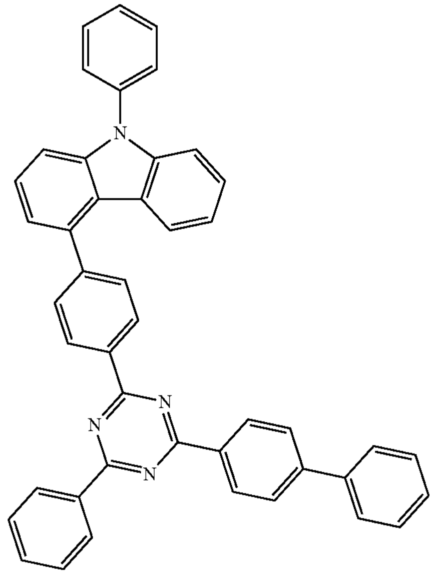

-continued
C-4
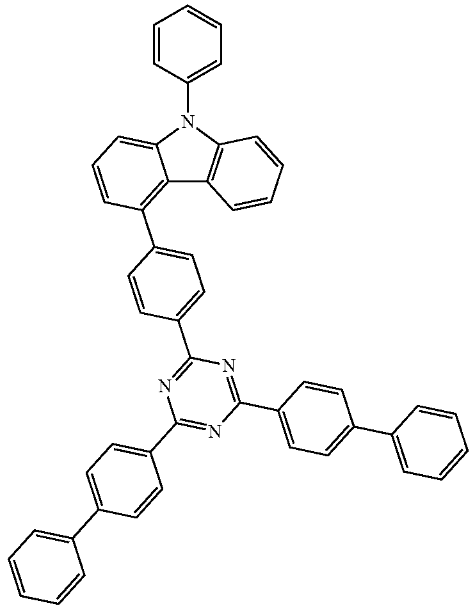
C-5
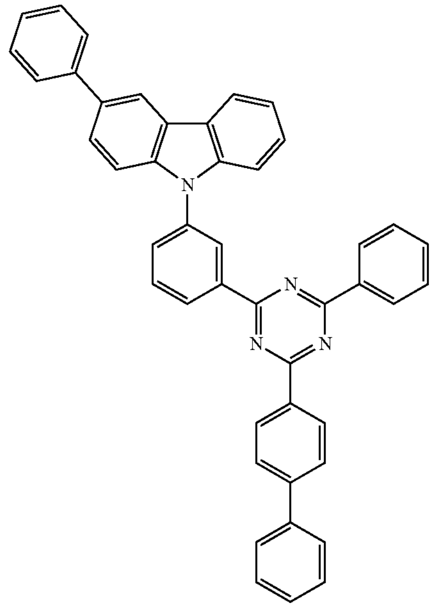
-continued
C-6
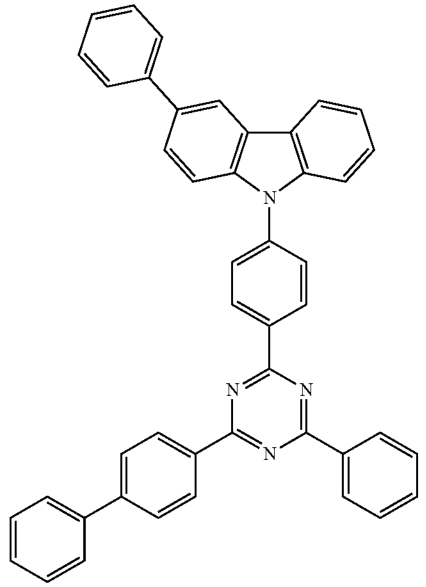
C-7
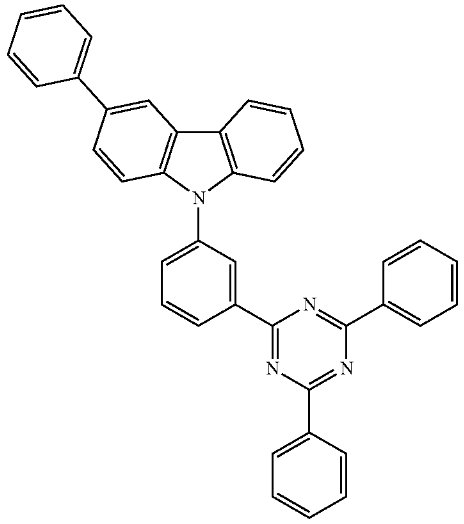
C-8
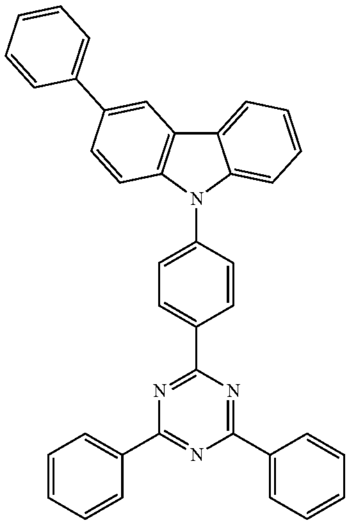

-continued
C-9
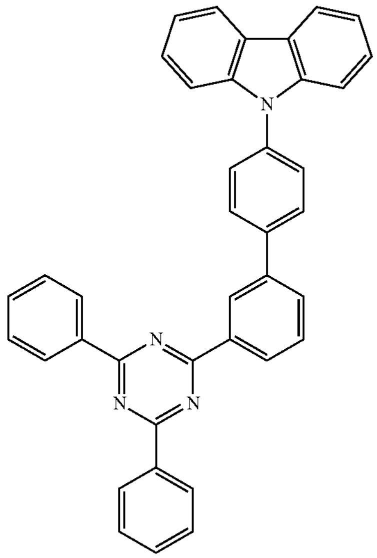
C-10
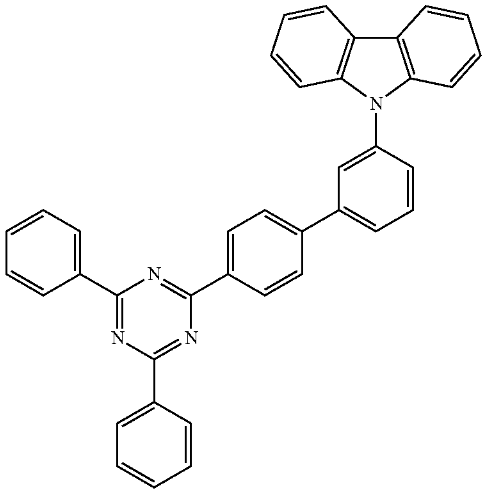
C-11
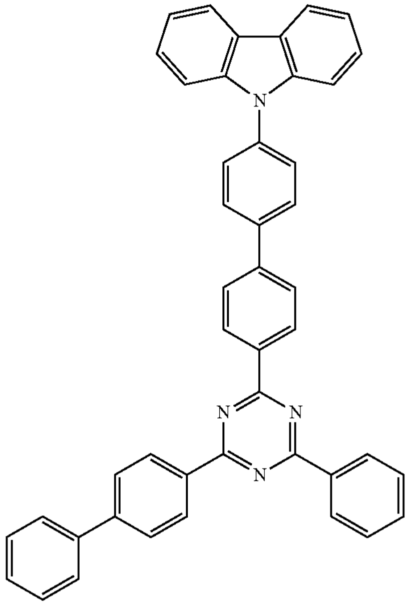
-continued
C-12
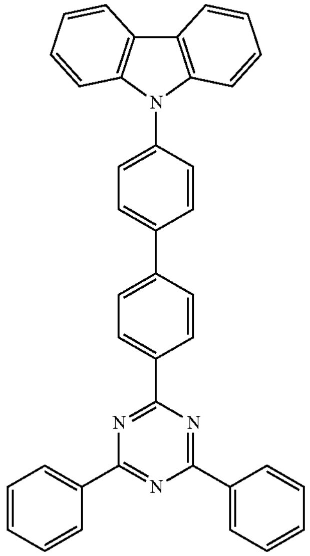
C-13
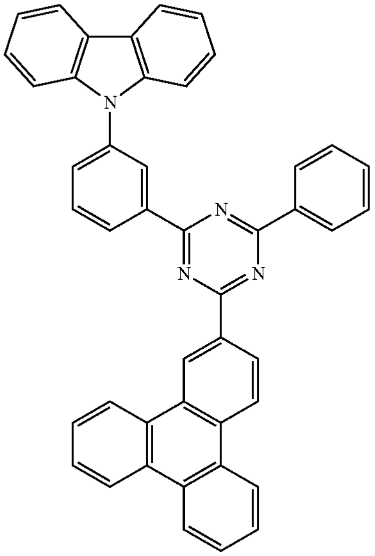
C-14
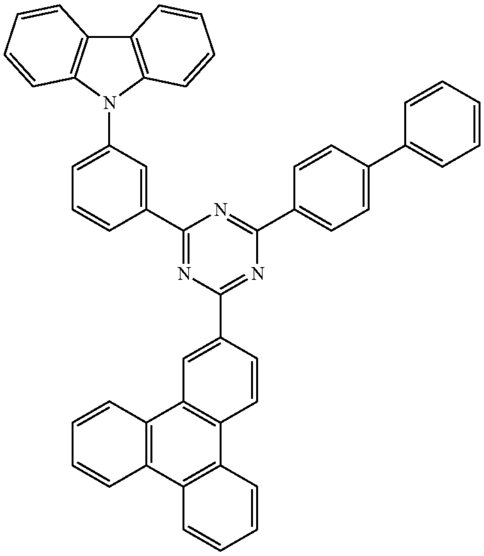

-continued
C-15
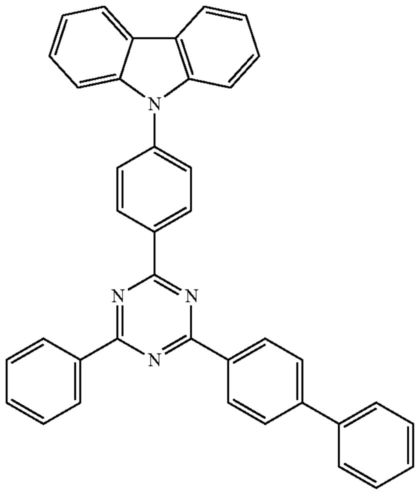
C-16
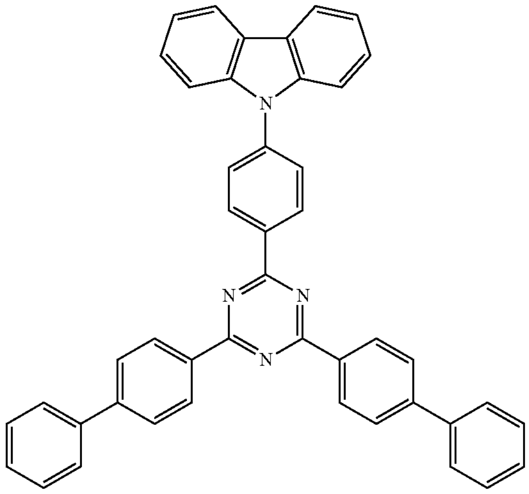
C-17
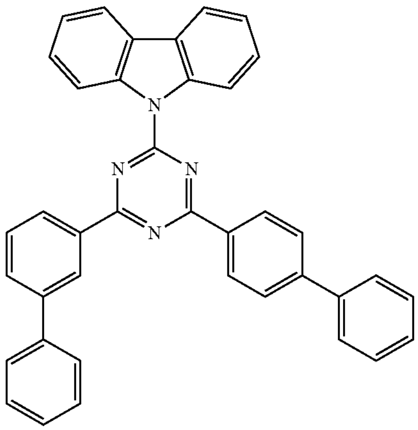
-continued
C-18
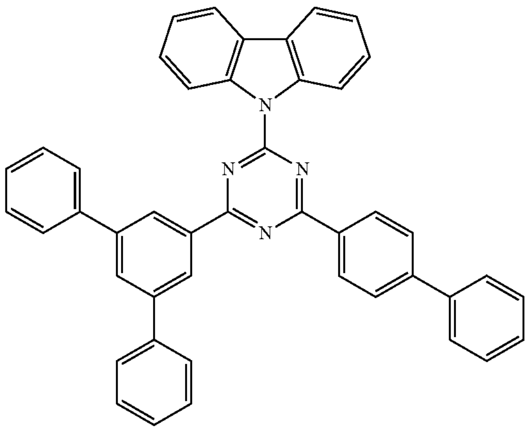
C-19
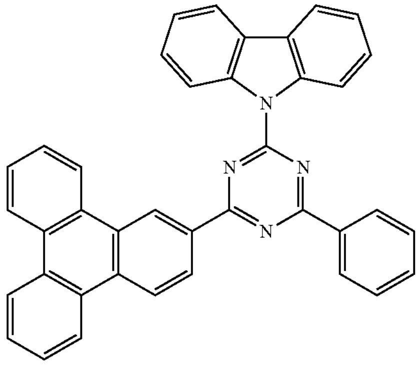
C-20
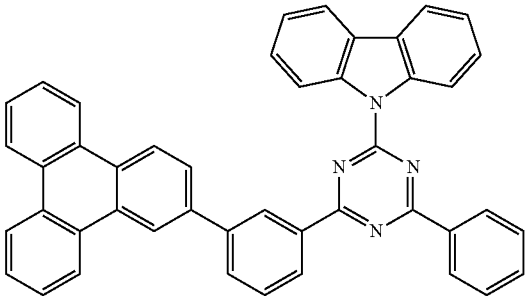

-continued
C-21
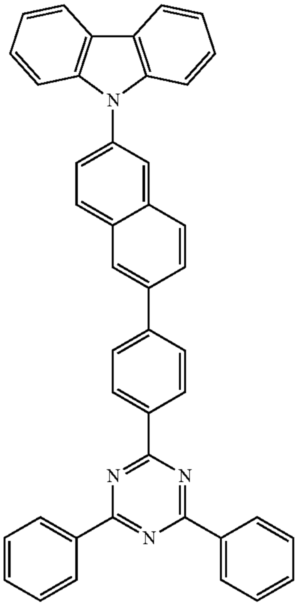
C-22
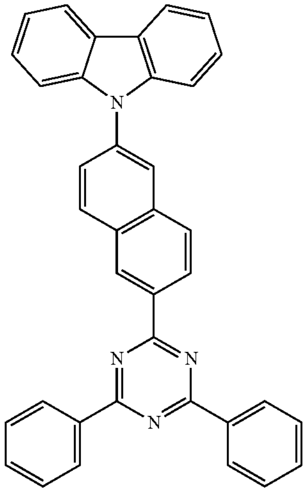
C-23
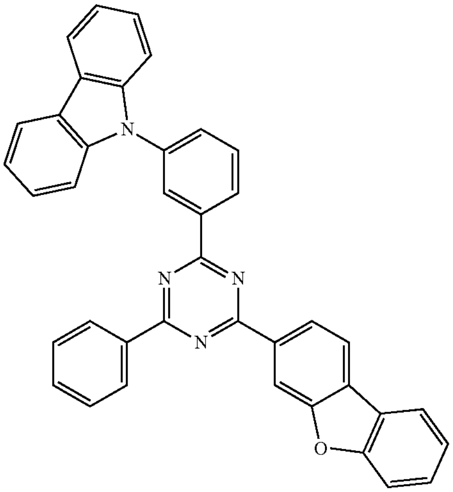
-continued
C-24
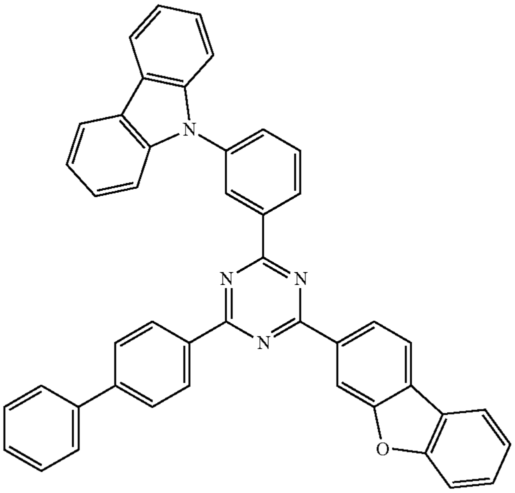
C-25
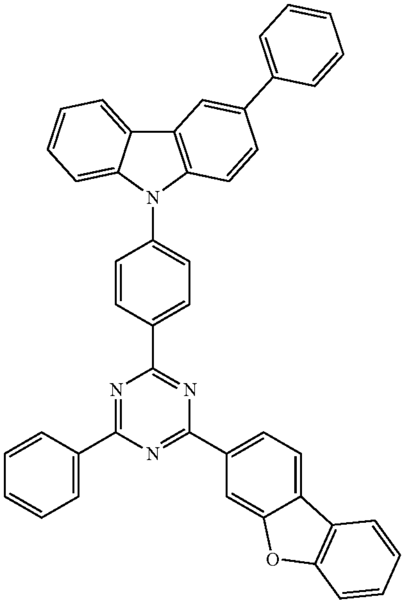

-continued
C-26
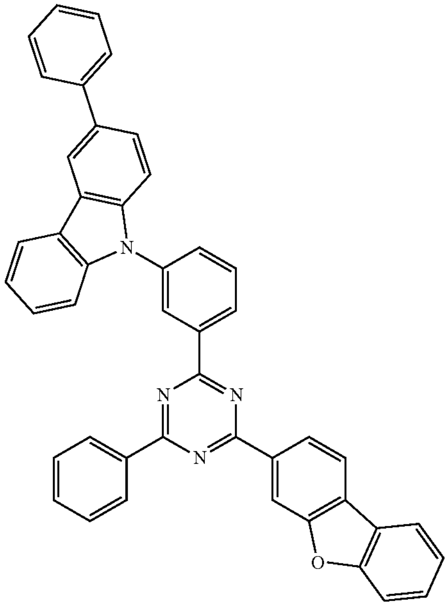
C-27
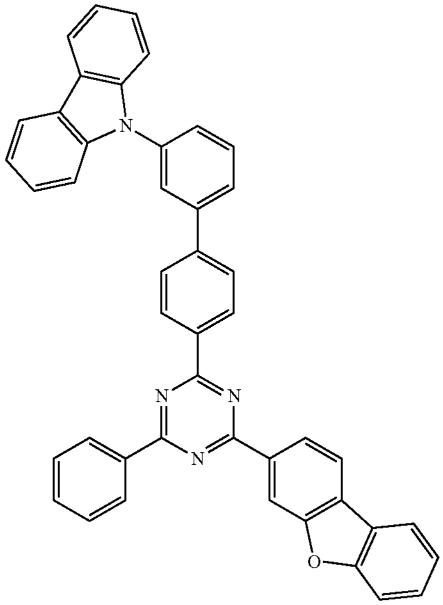
-continued
C-28
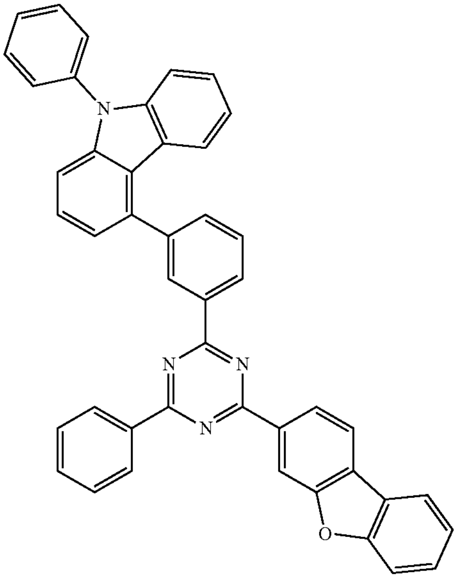
C-29
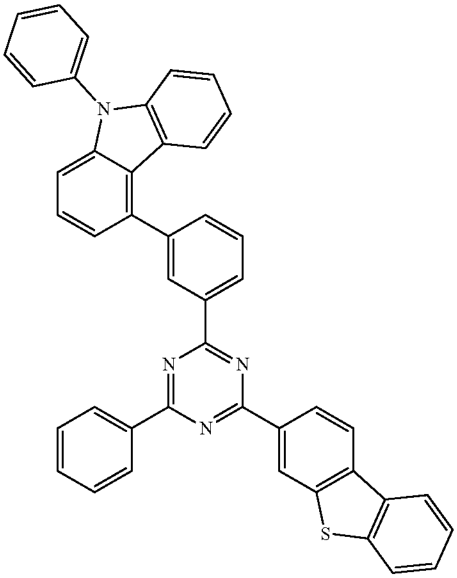
C-30
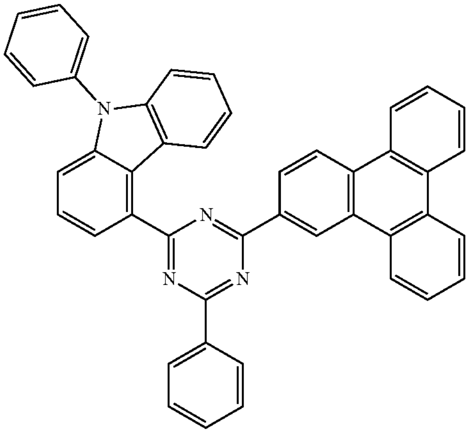

-continued
C-31
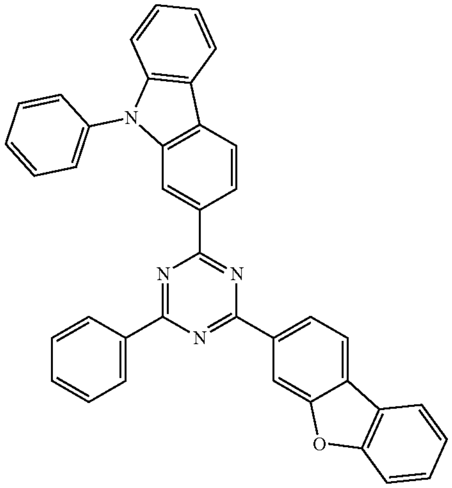
C-32
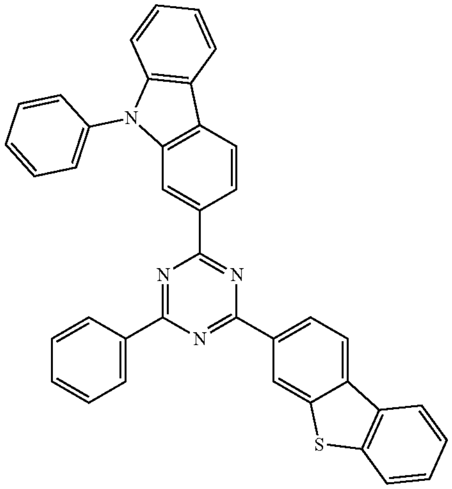
C-33
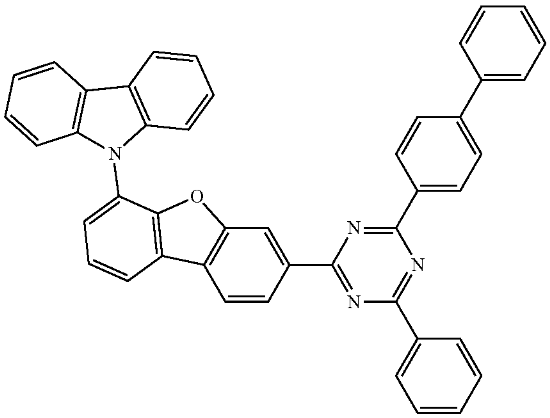
-continued
C-34
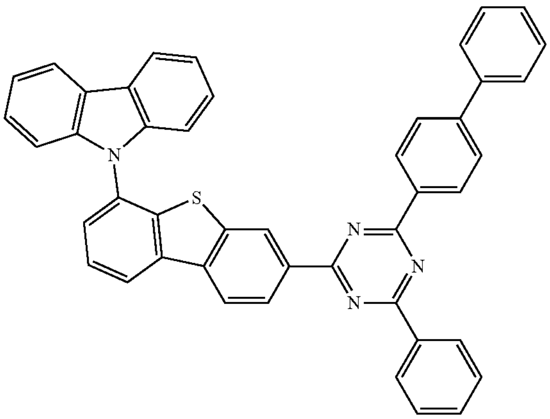
C-35
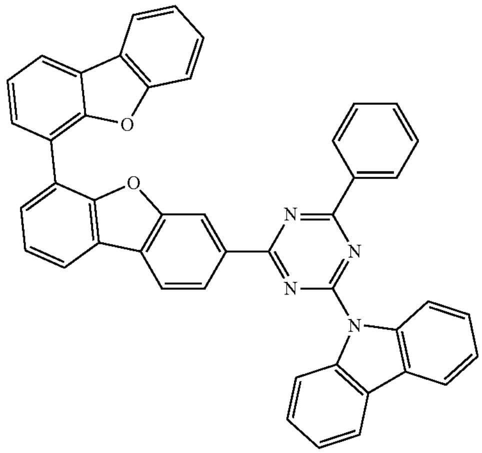
C-36
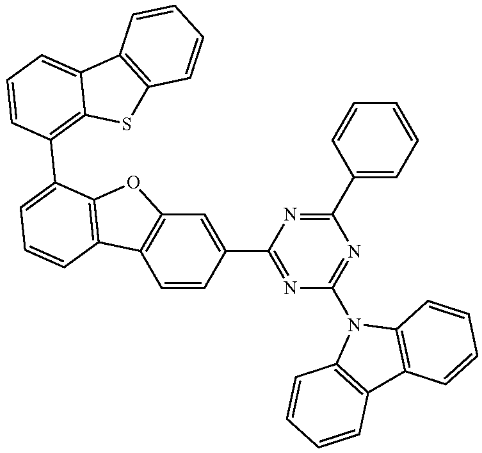

-continued
C-37
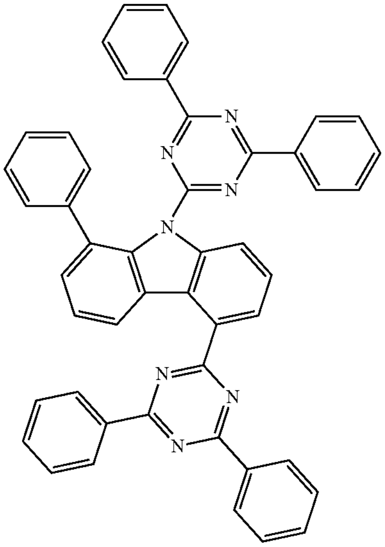
C-38
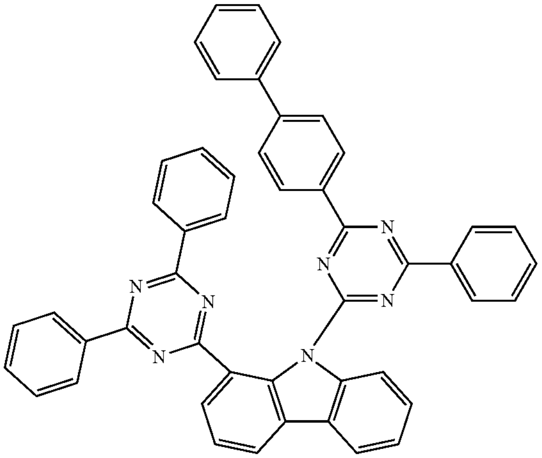
C-39
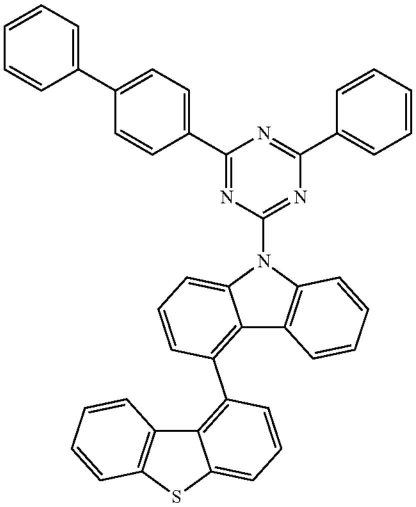
-continued
C-40
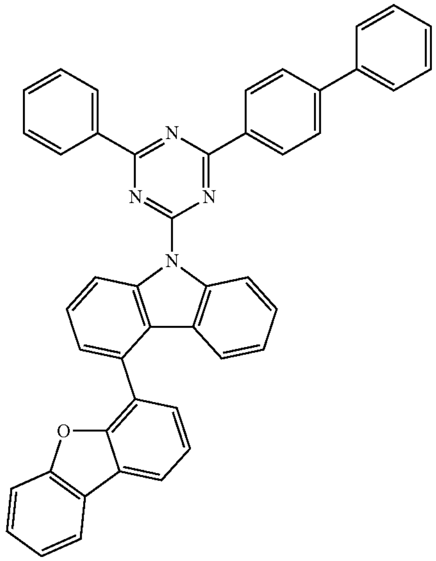
C-41
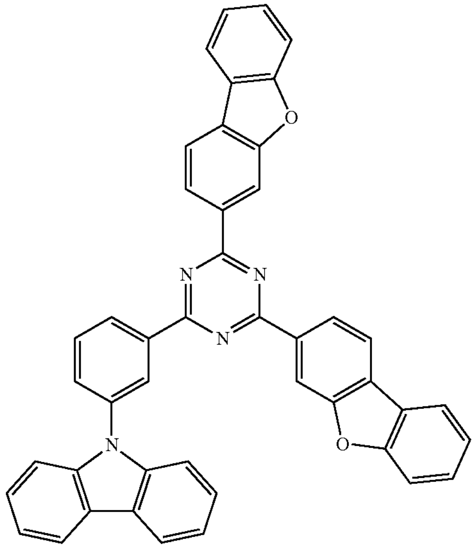
C-42
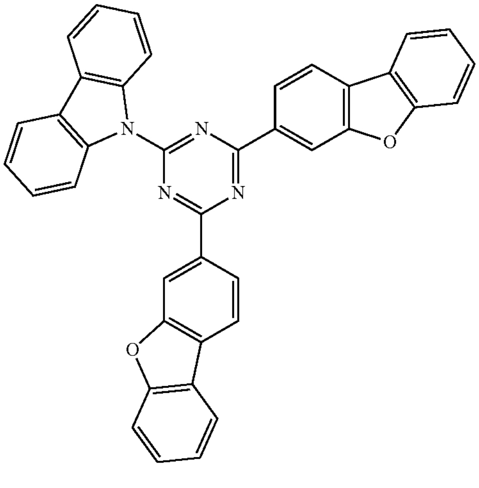

-continued
C-43
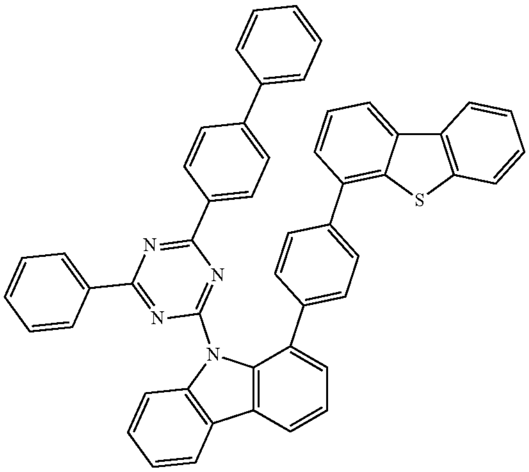
C-44
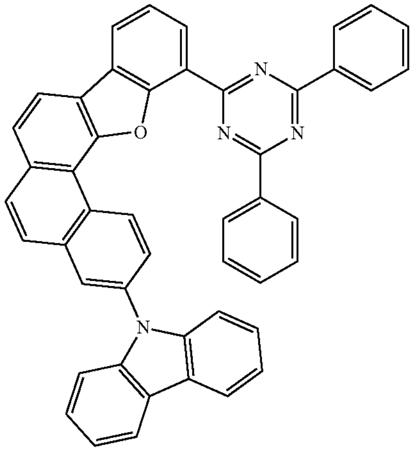
C-45
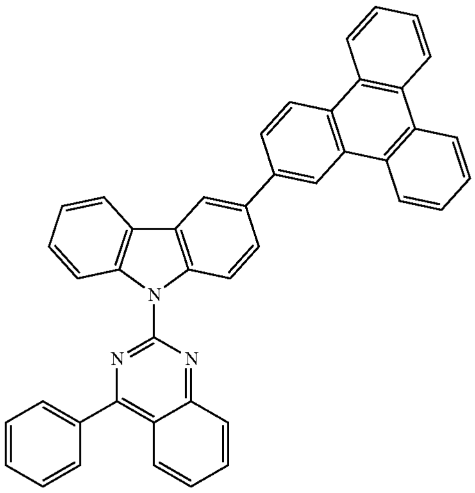
-continued
C-46
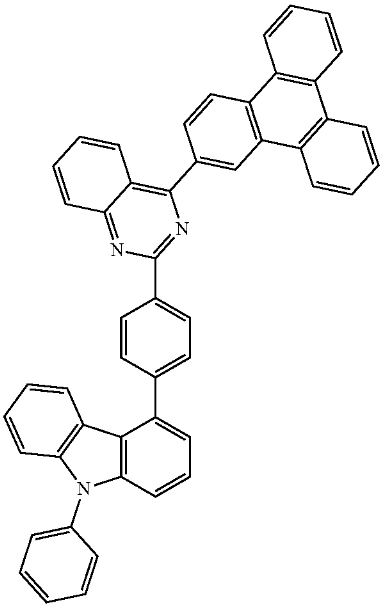
C-47
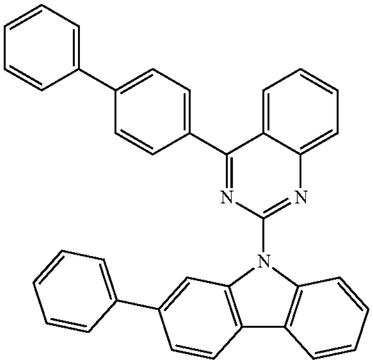
C-48
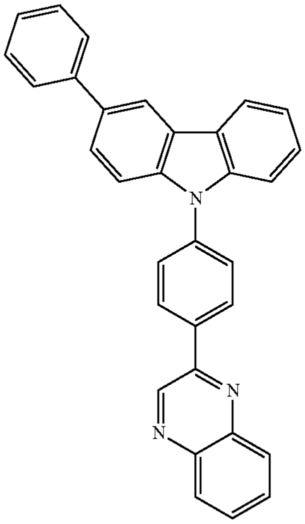

-continued
C-49
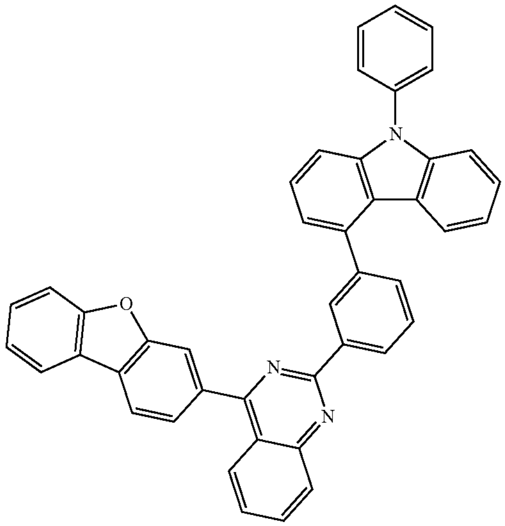
C-50
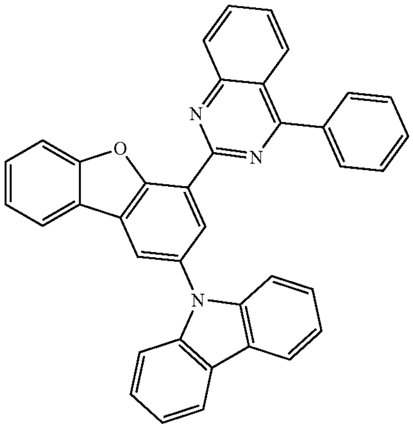
C-51
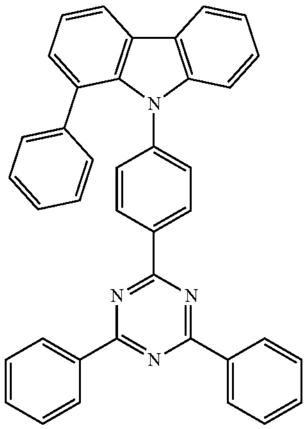
-continued
C-52
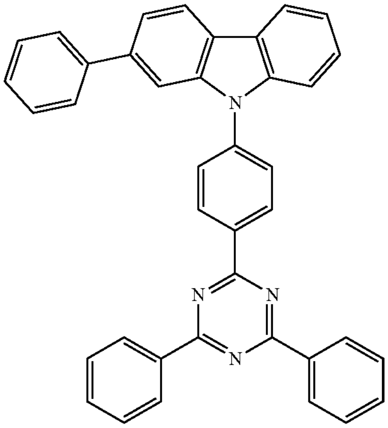
C-53
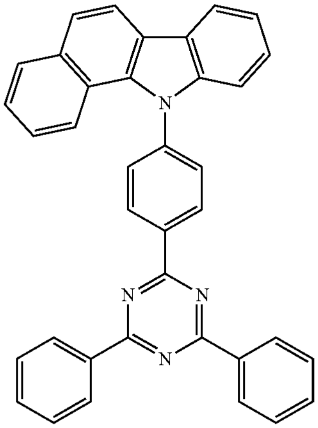
C-54
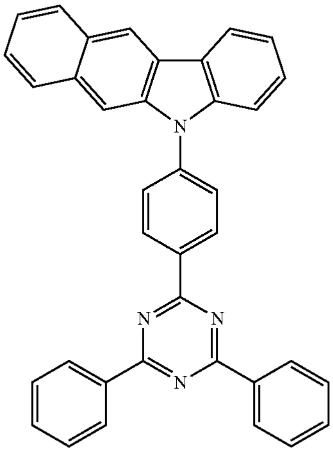

-continued
C-55
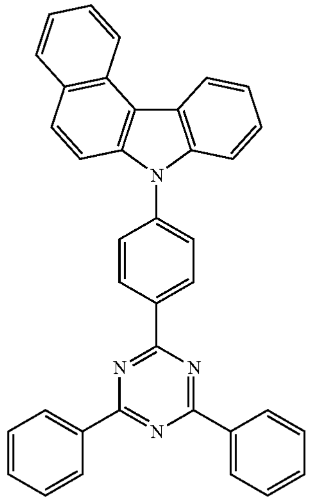
C-56
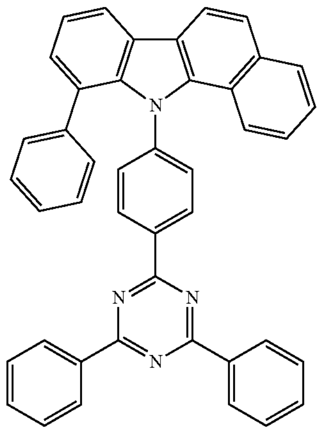
C-57
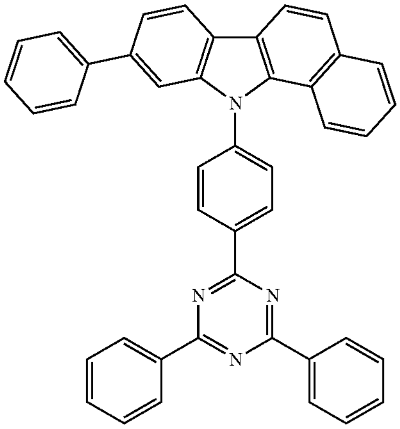
-continued
C-58
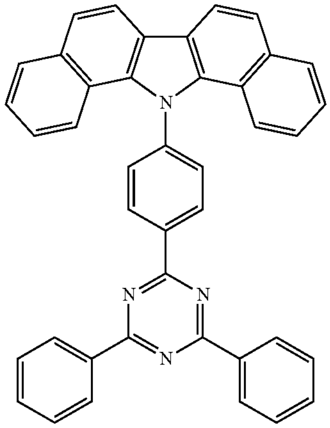
C-59
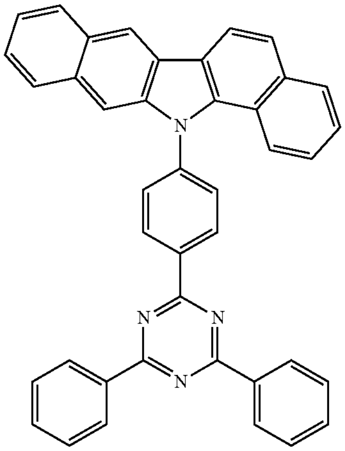
C-60
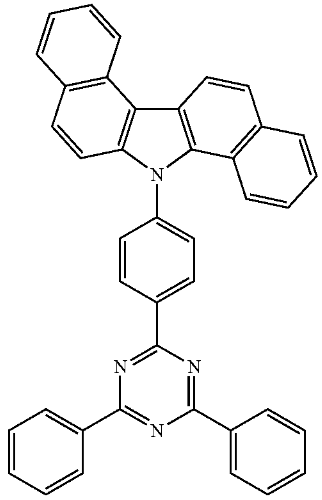

-continued
C-61
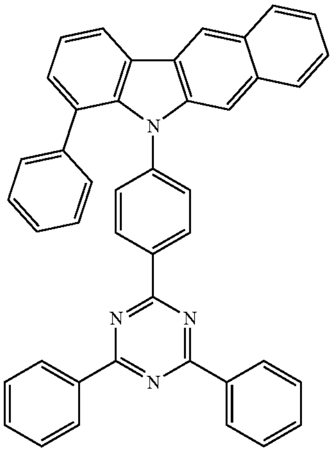
C-62
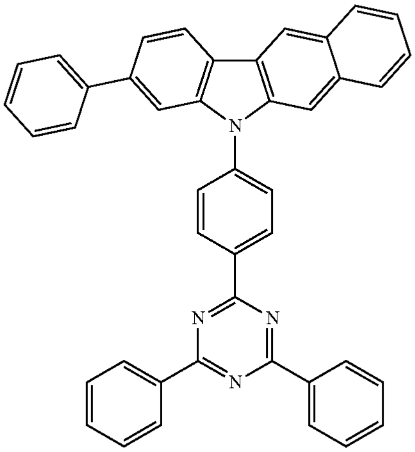
C-63
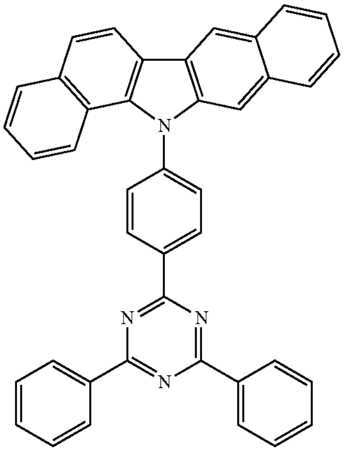
-continued
C-64
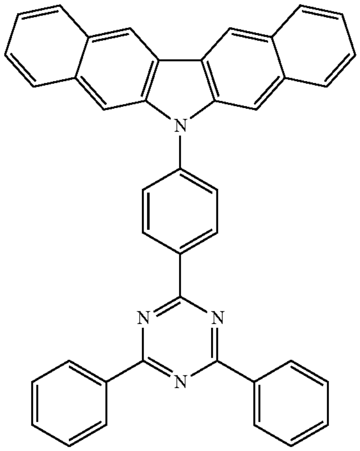
C-65
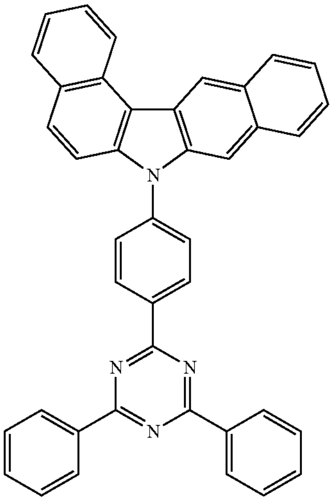
C-66
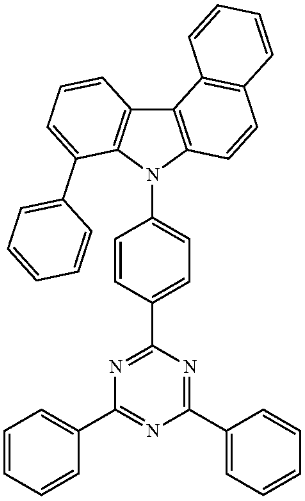

-continued
C-67
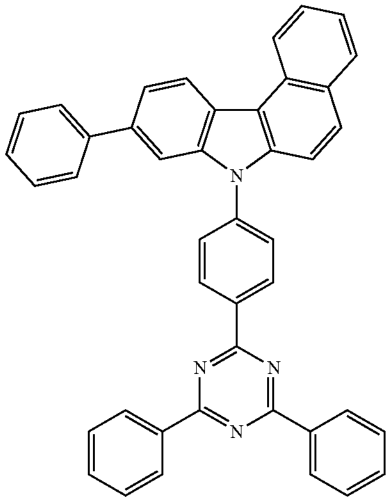
C-68
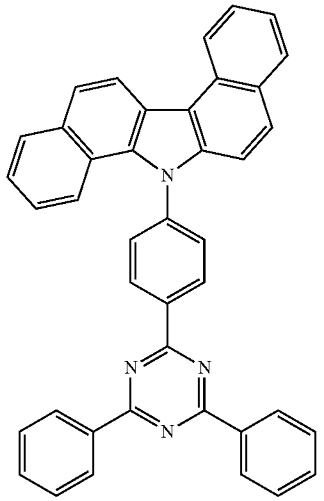
C-69
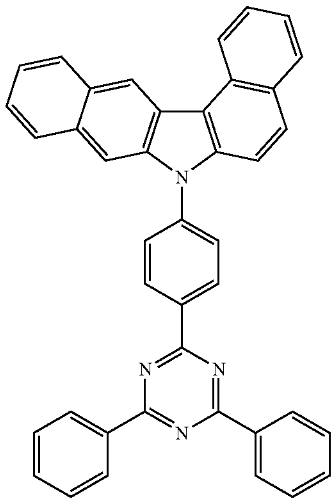
-continued
C-70
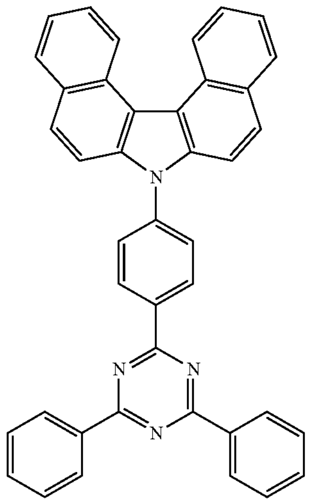
C-71
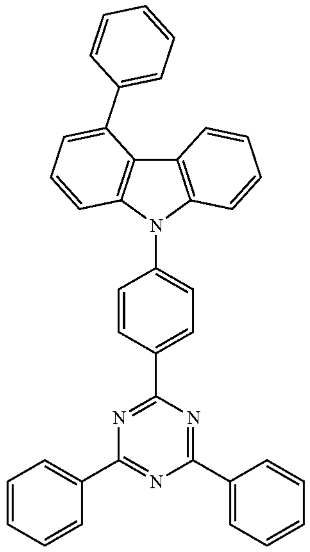
C-72
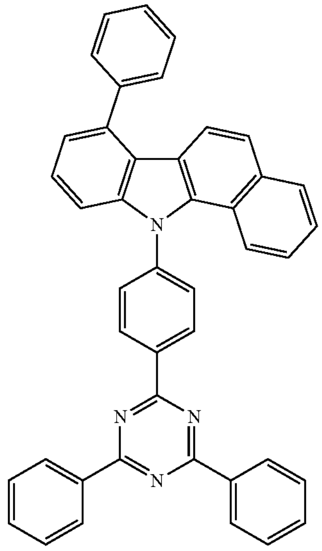

C-73
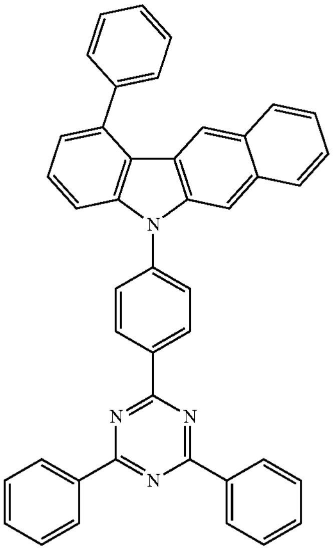
C-74
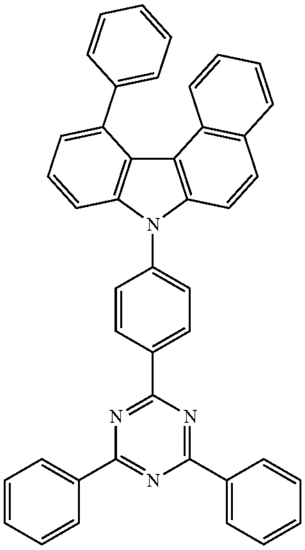
C-75
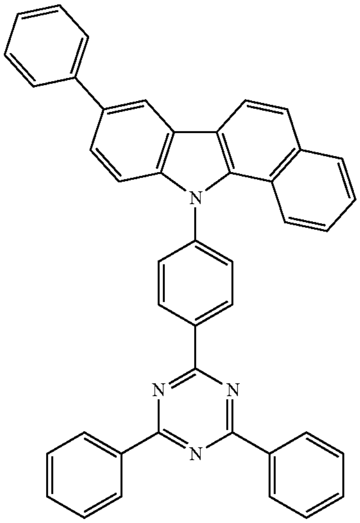
C-76
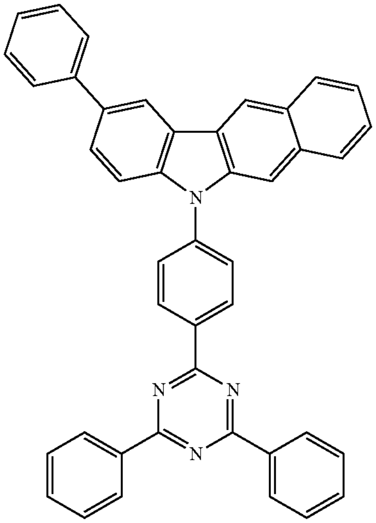
C-77
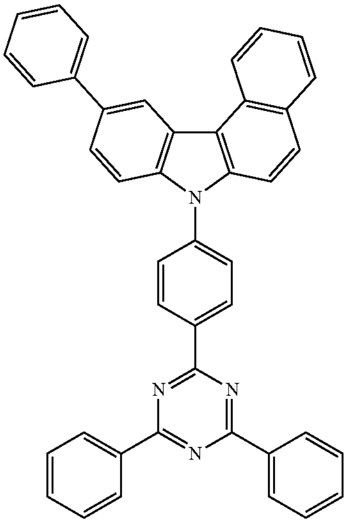
C-78
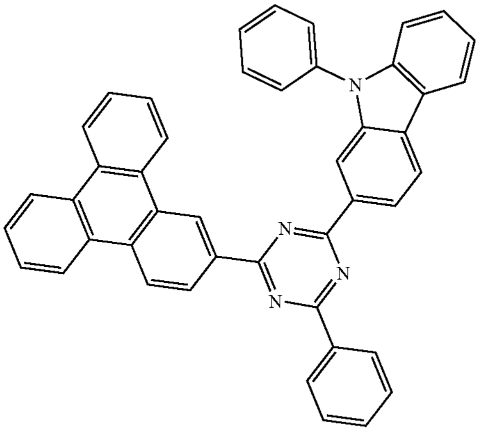

-continued
D-1
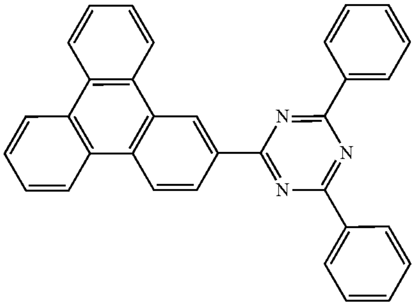
D-2
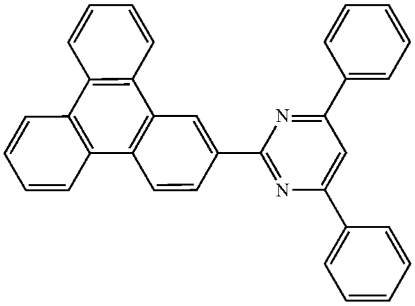
D-3
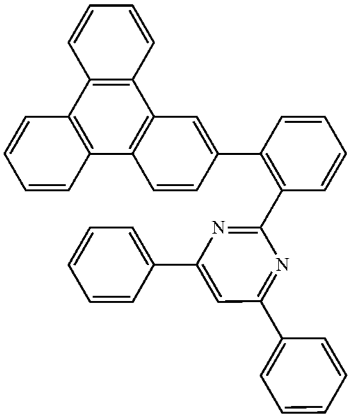
D-4
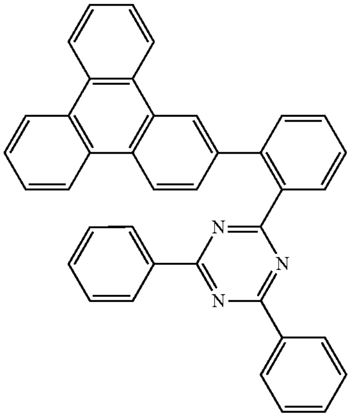
-continued
D-5
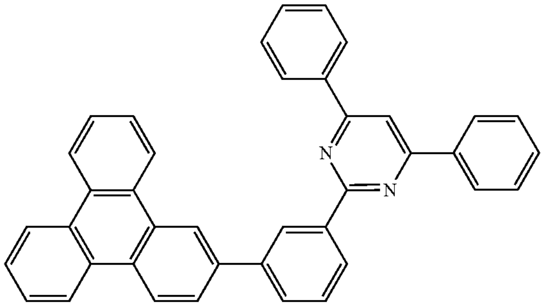
D-6
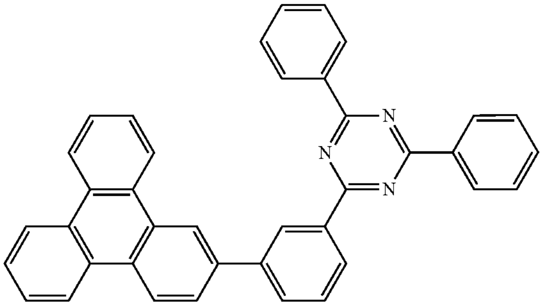
D-7
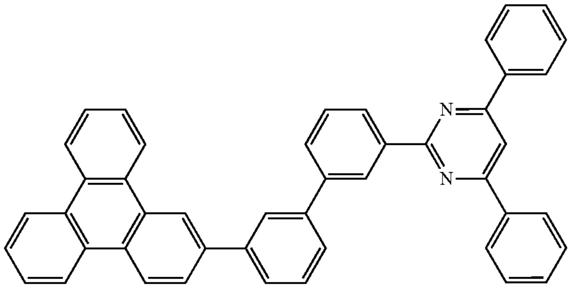
D-8
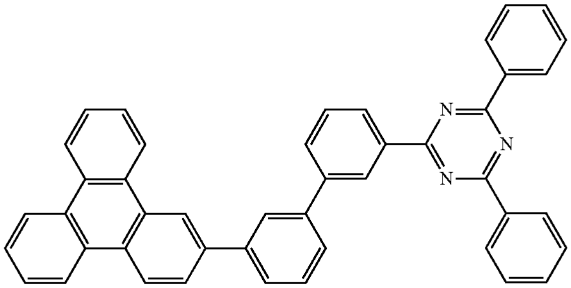

-continued
D-9
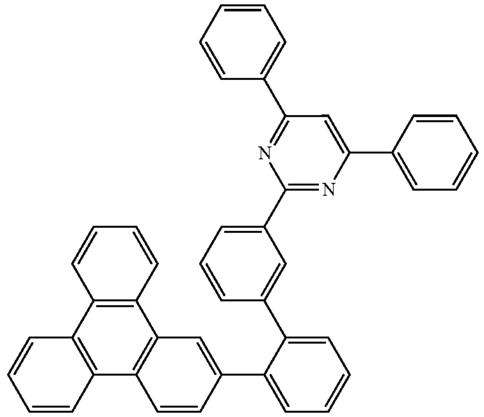
D-10
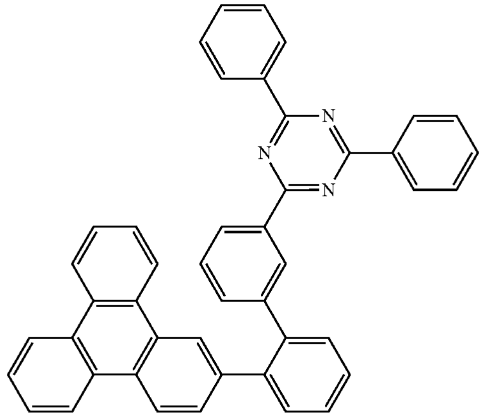
D-11
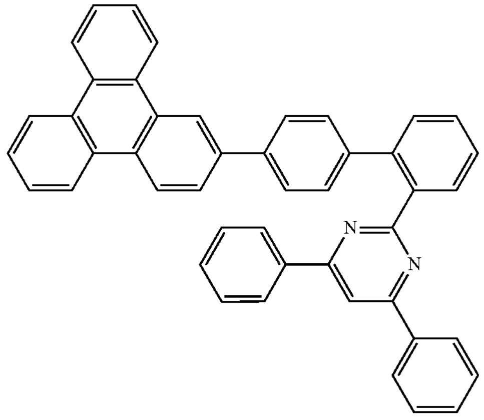
-continued
D-12
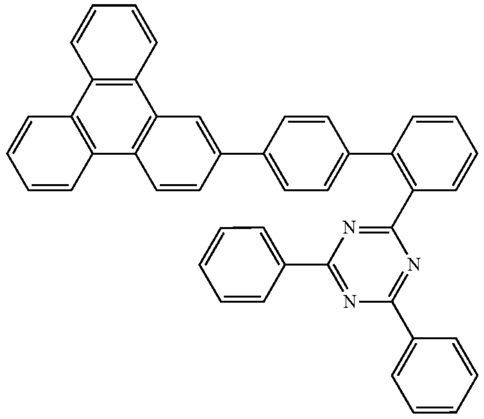
D-13
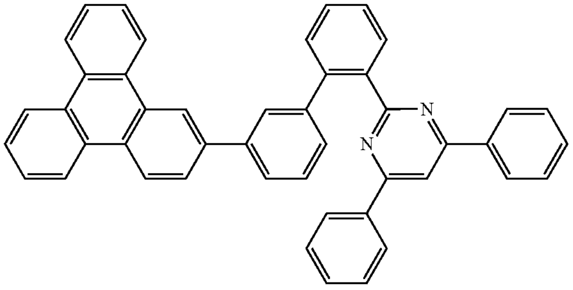
D-14
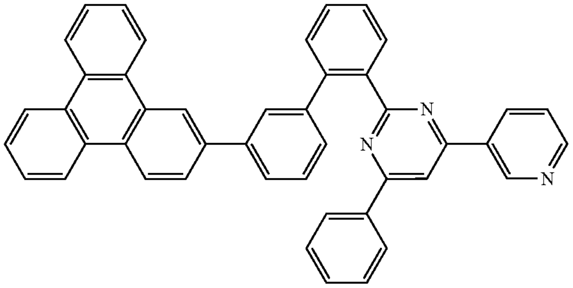
D-15
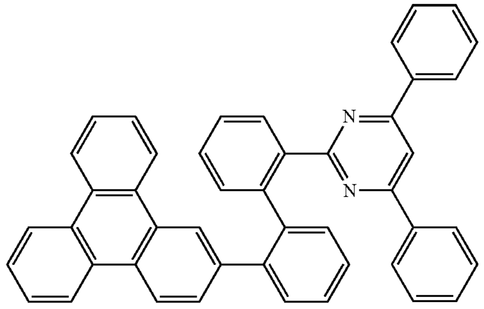

-continued
D-16
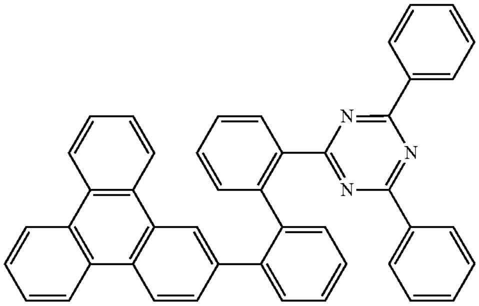
D-17
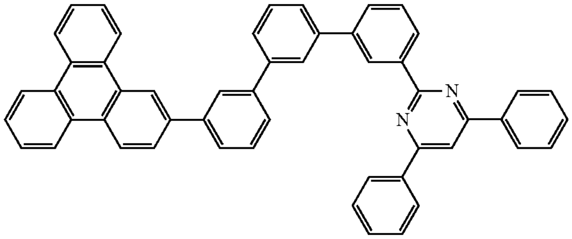
D-18
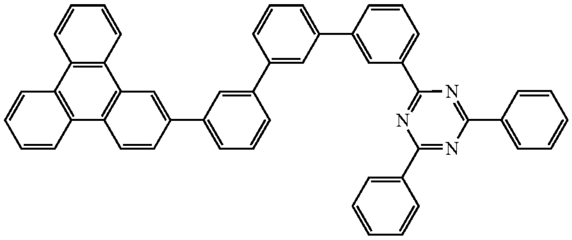
D-19
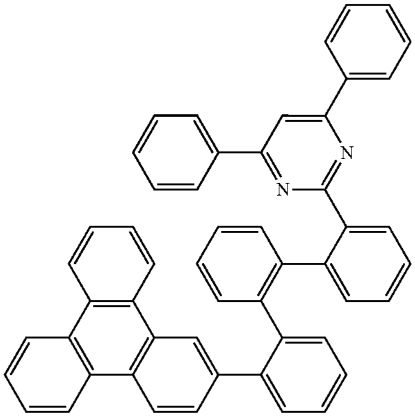
-continued
D-20
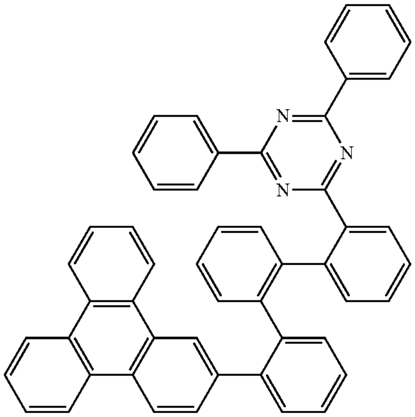
D-21
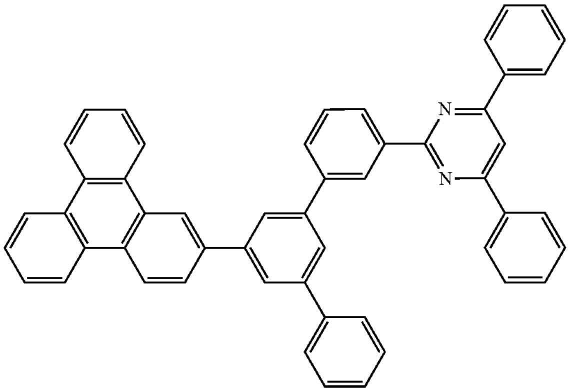
D-22
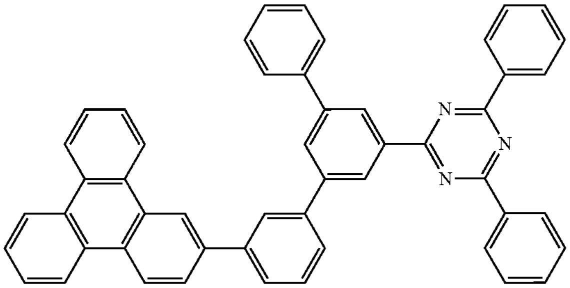
D-23
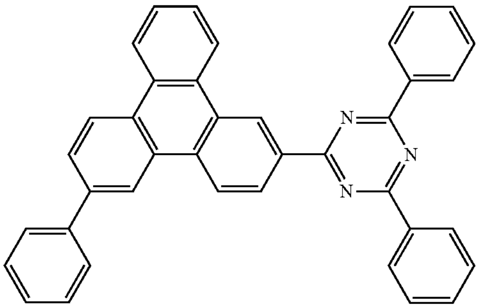

-continued
D-24
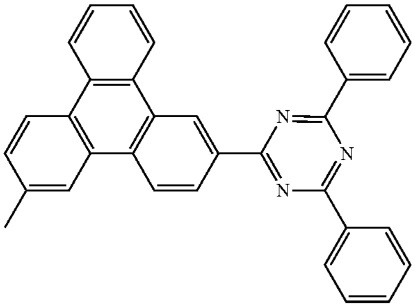
D-25
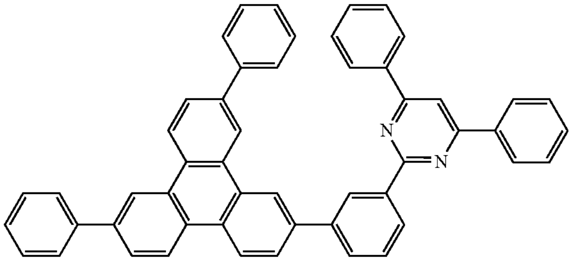
D-26
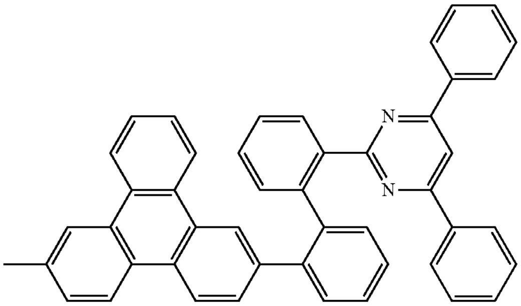
D-27
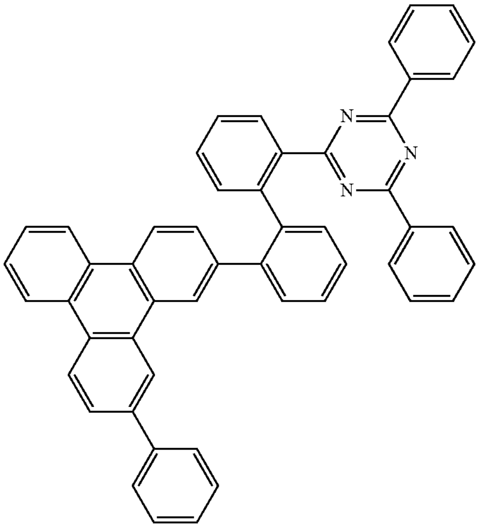
-continued
D-28
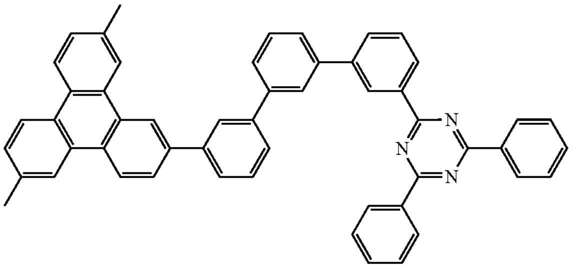
D-29
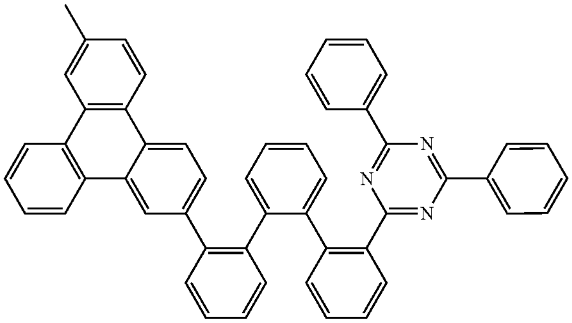
D-30
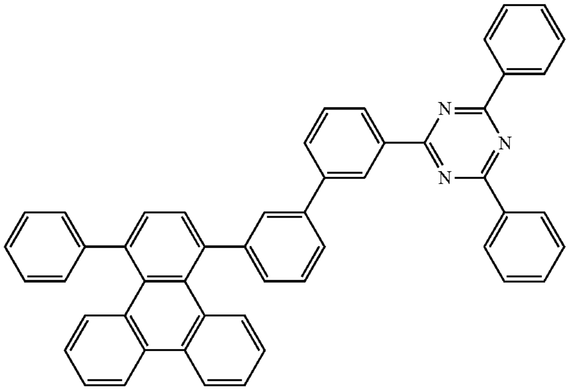
D-31
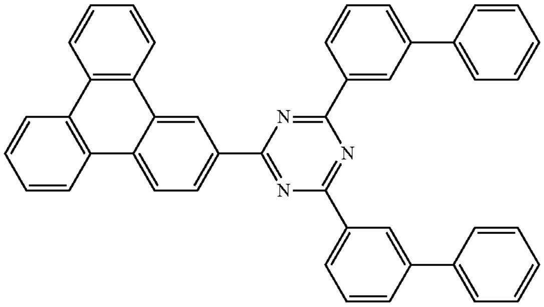

-continued
D-32
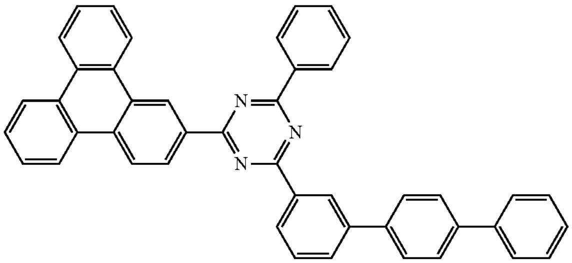
D-33
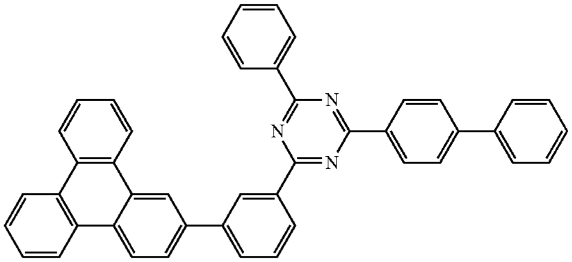
D-34
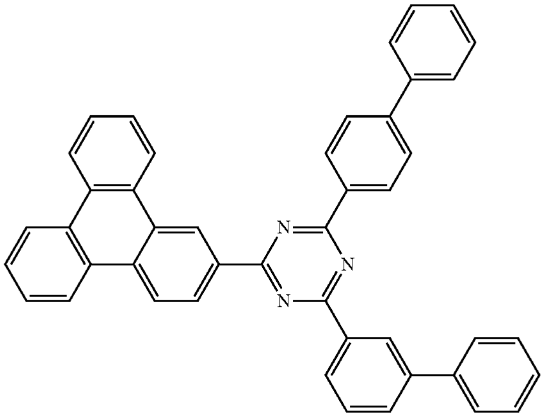
D-35
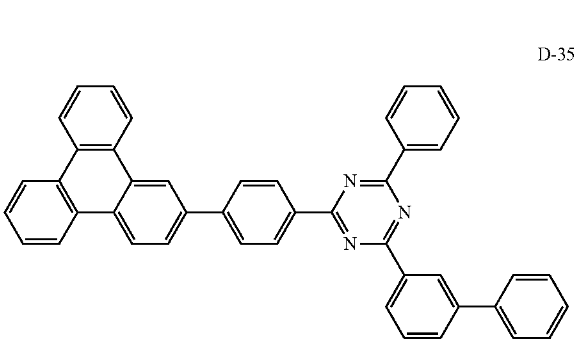
-continued
D-36
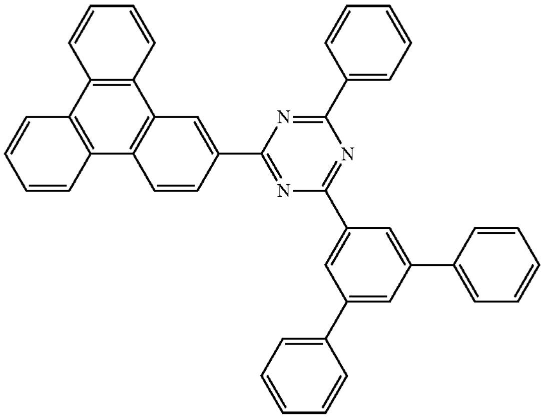
D-37
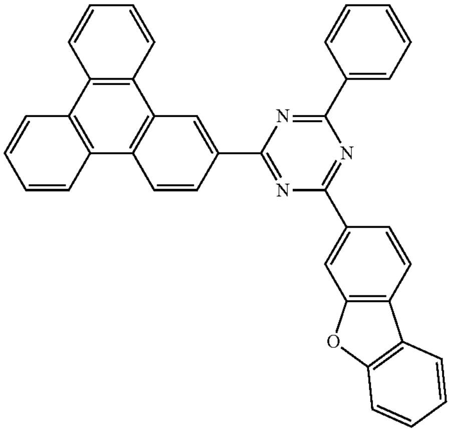
D-38
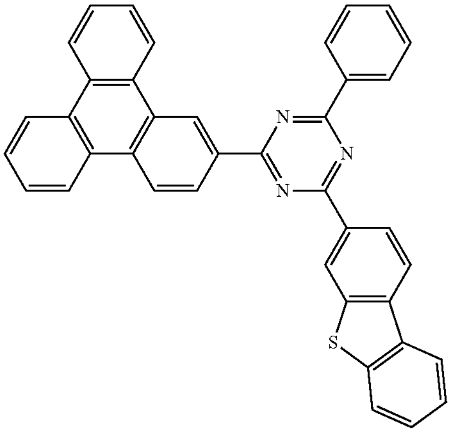

-continued
D-39
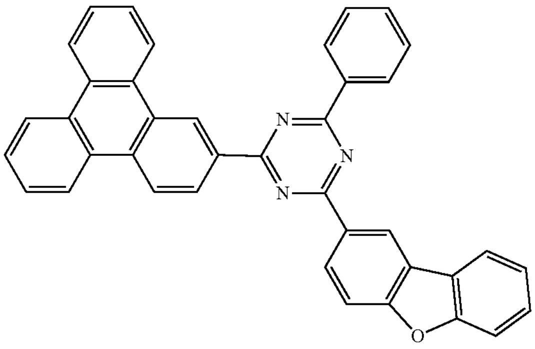
D-40
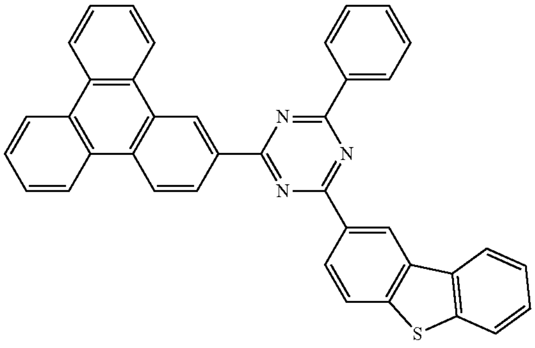
D-41
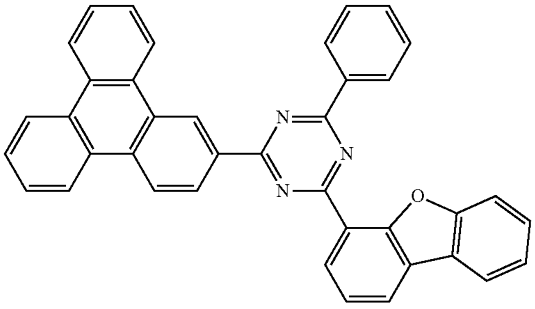
D-42
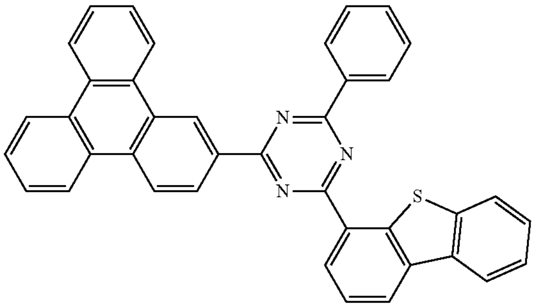
-continued
D-43
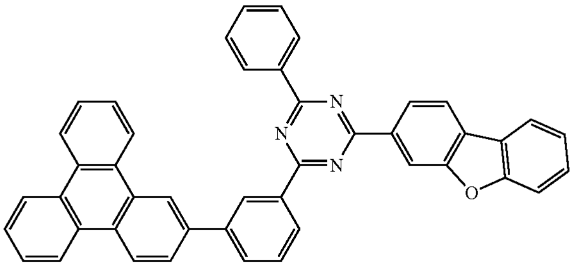
D-44
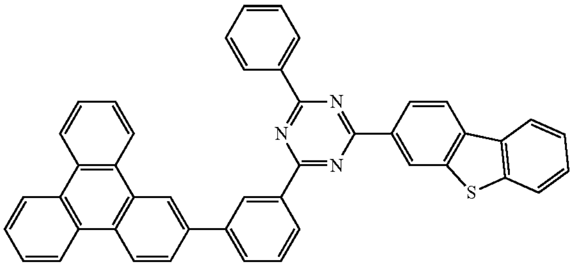
D-45
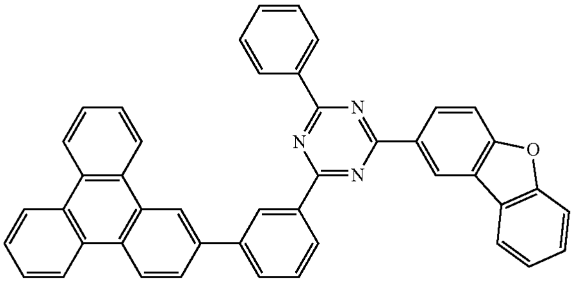
D-46
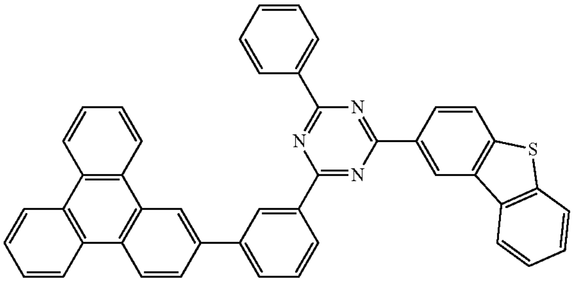
D-47
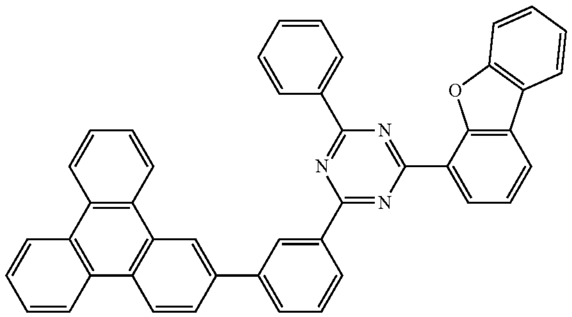

-continued
D-48
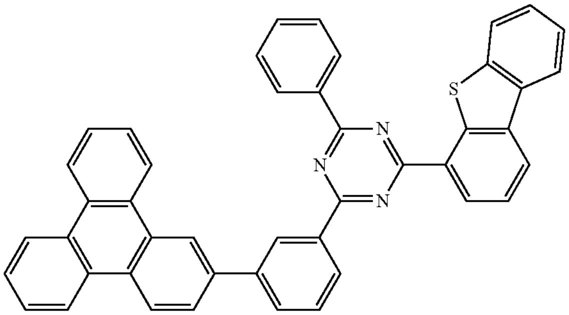
D-49
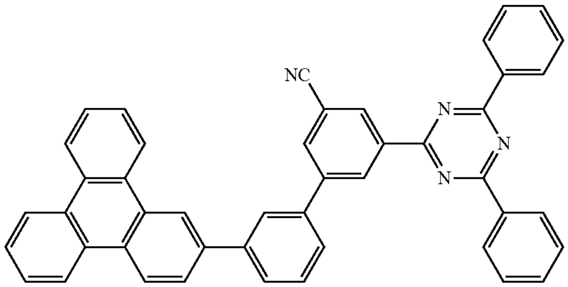
D-50
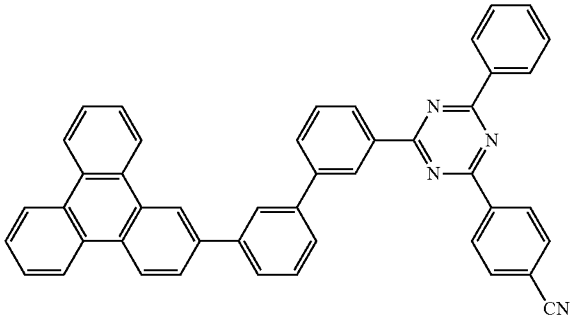
D-51
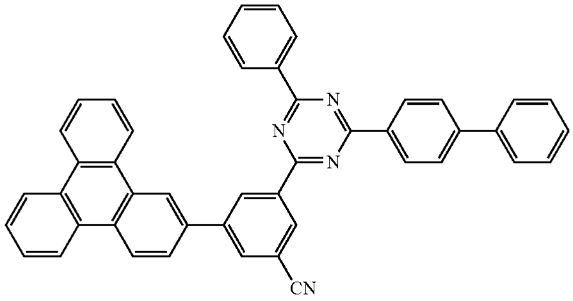
D-52
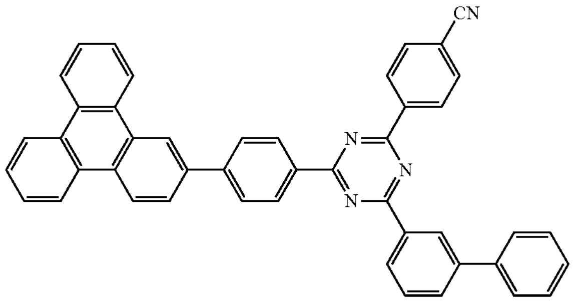
-continued
D-53
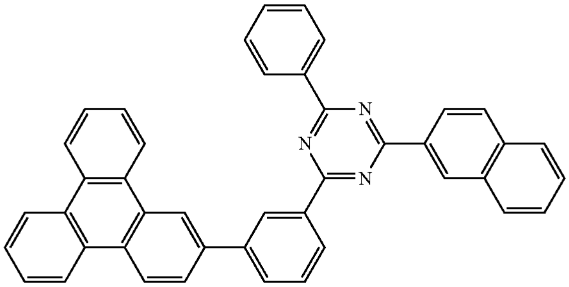
D-54
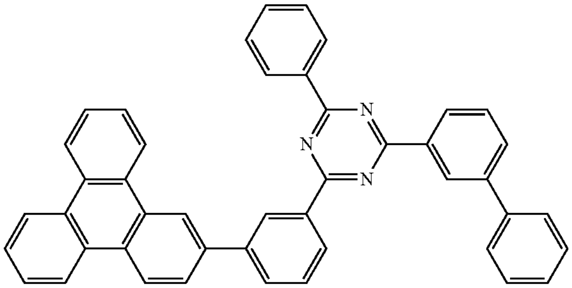
D-55
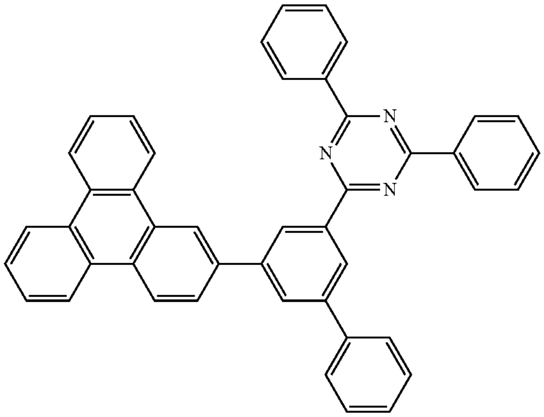
D-56
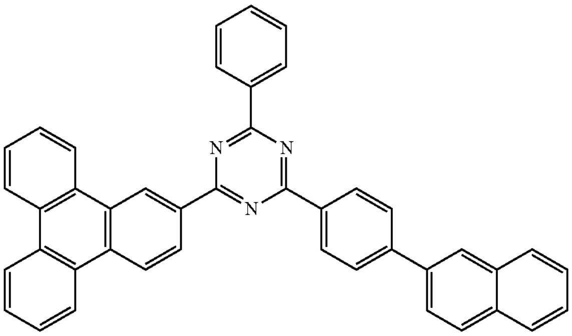

-continued

D-57

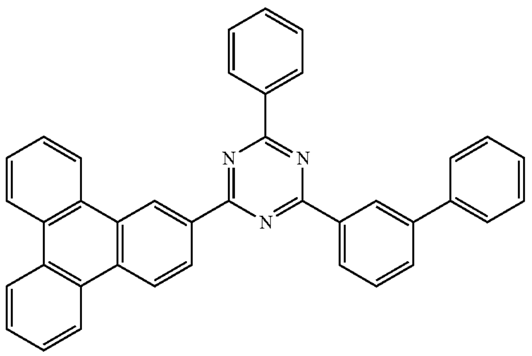

In an example embodiment, the first compound may be represented by Chemical Formula 1E-2-2 and the second compound may be represented by Chemical Formula 3-1a or Chemical Formula 3-3a.

In an example embodiment, $L^a$, $L^1$, $L^2$, and $L^4$ of Chemical Formula 1E-2-2 may each independently be a single bond, $R^a$, $R^1$, $R^2$, and $R^4$ may each independently be hydrogen, deuterium, a cyano group, a substituted or unsubstituted C1 to C5 alkyl group, or a substituted or unsubstituted C6 to C12 aryl group, $L^b$ and $L^c$ may each independently be a single bond or a substituted or unsubstituted phenylene group, $R^b$ and $R^c$ may each independently be a substituted or unsubstituted phenyl group, a substituted or unsubstituted biphenyl group, a substituted or unsubstituted naphthyl group, or a substituted or unsubstituted fluorenyl group, and $R^5$ and $R^6$ may each independently be a substituted or unsubstituted C1 to C4 alkyl group or a substituted or unsubstituted C6 to C12 aryl group.

In an example embodiment, $L^6$, $L^8$, and $L^{10}$ of Chemical Formula 3-1a may each independently be a single bond or a phenylene group, $R^8$, $R^{10}$, and $R^{12}$ may each independently be a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and at least one of $R^8$, $R^{10}$, and $R^{12}$ may each independently be a substituted or unsubstituted triphenylene group, a substituted or unsubstituted carbazolyl group, a substituted or unsubstituted dibenzofuranyl group, or a substituted or unsubstituted dibenzothiophenyl group, and $X^3$ of Chemical Formula 3-3a may be O or S, $L^5$ and $L^9$ may each independently be a single bond or phenylene group, $R^7$ and $R^{11}$ may each independently be a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and at least one of $R^7$ and $R^{11}$ may each independently be a substituted or unsubstituted carbazolyl group, a substituted or unsubstituted dibenzofuranyl group, or a substituted or unsubstituted dibenzothiophenyl group.

The first compound and the second compound may be, for example, included in a weight ratio of about 1:99 to about 99:1. Within the range, a desirable weight ratio may be adjusted using a hole transport capability of the first compound and an electron transport capability of the second compound to realize bipolar characteristics and thus to improve efficiency and life-span. Within the range, they may be, for example, included in a weight ratio of about 10:90 to about 90:10, about 20:80 to about 80:20, about 30:70 to about 70:30, about 40:60 to about 60:40, or about 50:50. For example, they may be included in a weight ratio of about 50:50 to about 60:40, for example, about 60:40.

In an example embodiment, the first compound and the second compound may be included as a host, for example a phosphorescent host of the light emitting layer, respectively.

The light emitting layer may further include at least one compound in addition to the aforementioned host.

The light emitting layer may further include a dopant. The dopant may be, for example, a phosphorescent dopant, for example a red, green, or blue phosphorescent dopant, for example a red phosphorescent dopant.

The dopant is mixed with the aforementioned host in a small amount to cause light emission, and may be generally a material such as a metal complex that emits light by multiple excitation into a triplet or more. The dopant may be, for example an inorganic, organic, or organic/inorganic compound, and one or more types thereof may be used.

Examples of the dopant may be a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. The phosphorescent dopant may be, for example, a compound represented by Chemical Formula Z.

$$L^{17}MX^4$$ [Chemical Formula Z]

In Chemical Formula Z, M is a metal, and $L^{17}$ and $X^4$ are the same or different, and are a ligand to form a complex compound with M.

The M may be, for example Ir, Pt, Os, Ti, Zr, Hf, Eu, Tb, Tm, Fe, Co, Ni, Ru, Rh, Pd, or a combination thereof and $L^8$ and $X^4$ may be, for example a bidentate ligand.

The hole transport auxiliary layer 142 may be disposed between light emitting layer 130 and the hole transport layer 141 that will be described below, particularly contacting the light emitting layer 130. The hole transport auxiliary layer 142 is disposed to contact the light emitting layer 130 and thus may minutely control mobility of holes on the interface of the light emitting layer 130 and the hole transport layer 141. The hole transport auxiliary layer 142 may include more than one layer.

The hole transport auxiliary layer 142 may include, for example, a third compound represented by Chemical Formula 4.

[Chemical Formula 4]

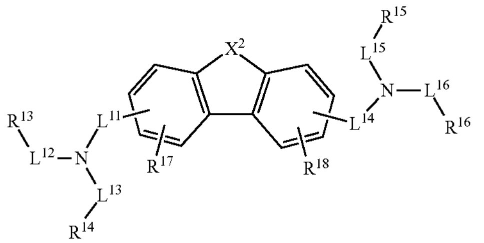

In Chemical Formula 4, $X^2$ is O or S, $L^{11}$ to $L^{16}$ are each independently a single bond, a substituted or unsubstituted C6 to C20 arylene group, a substituted or unsubstituted divalent C2 to C20 heterocyclic group, or a combination thereof, $R^{13}$ to $R^{16}$ are each independently a substituted or unsubstituted C6 to C30 aryl group, a substituted or unsubstituted C2 to C30 heterocyclic group, or a combination thereof, and $R^{17}$ and $R^{18}$ are each independently hydrogen, deuterium, a cyano group, or a substituted or unsubstituted C1 to C10 alkyl group.

The third compound may be a compound having a high HOMO energy level and may have good hole injection characteristics. Accordingly, the third compound is applied to the hole transport auxiliary layer 142 and effectively improves hole mobility in the interface between the light emitting layer 130 and the hole transport layer 141 to lower a driving voltage of an organic optoelectric device.

In an example embodiment, the third compound may be represented by one of Chemical Formula 4-1 to Chemical Formula 4-4 according to a specific substitution position of the amine group.

[Chemical Formula 4-1]

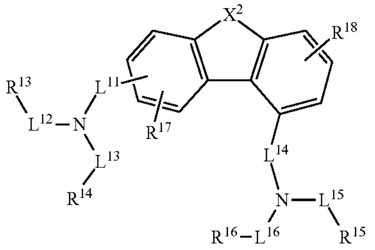

[Chemical Formula 4-2]

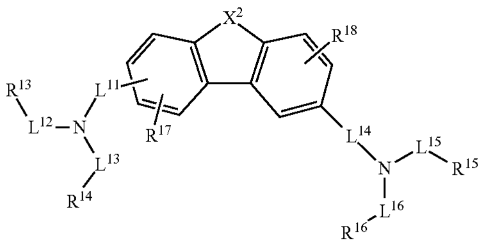

[Chemical Formula 4-3]

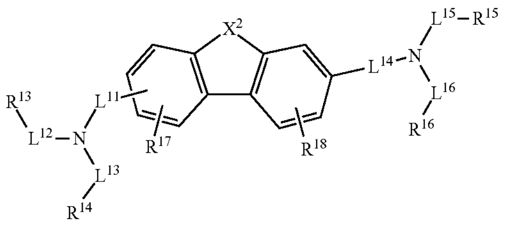

-continued

[Chemical Formula 4-4]

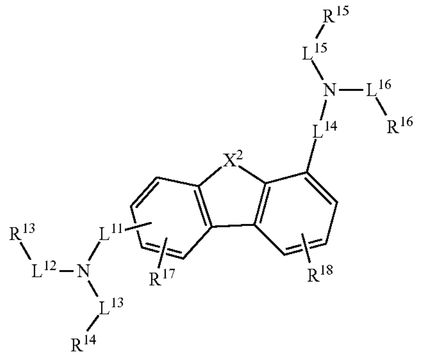

In Chemical Formula 4-1 to Chemical Formula 4-4, $X^2$, $L^{11}$ to $L^{16}$, and $R^{13}$ to $R^{18}$ are the same as described above.

In an example embodiment, the third compound may be represented by Chemical Formula 4-2 or Chemical Formula 4-3.

Chemical Formula 4-2 may be, for example, represented by one of Chemical Formula 4-2a, Chemical Formula 4-2b, Chemical Formula 4-2c, and Chemical Formula 4-2d.

[Chemical Formula 4-2a]

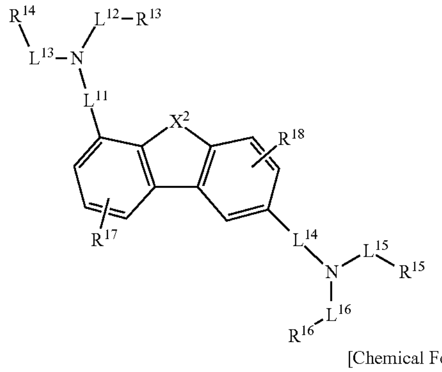

[Chemical Formula 4-2b]

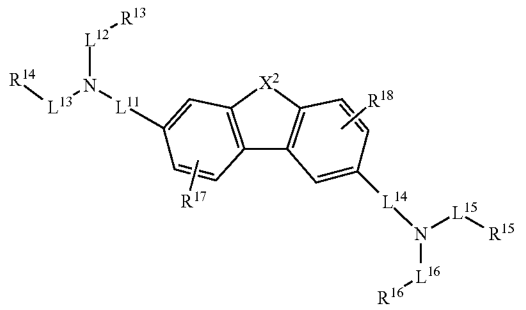

[Chemical Formula 4-2c]

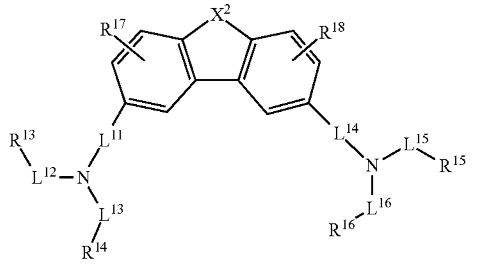

-continued

[Chemical Formula 4-2d]

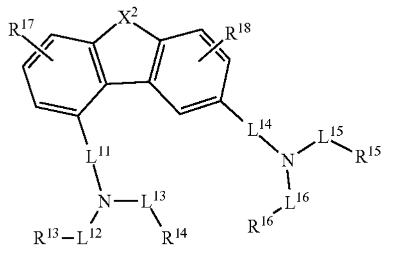

Chemical Formula 4-3 may be, for example, represented by one of Chemical Formula 4-3a, Chemical Formula 4-3b, Chemical Formula 4-3c, and Chemical Formula 4-3d.

[Chemical Formula 4-3a]

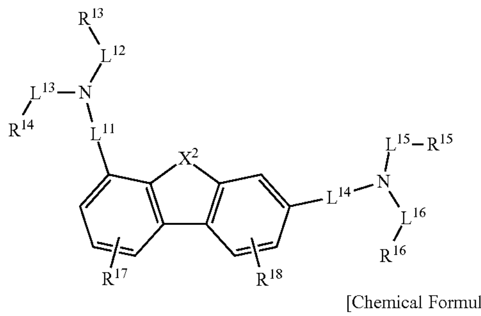

[Chemical Formula 4-3b]

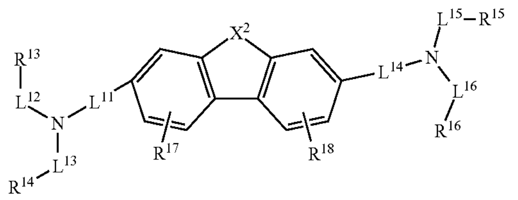

[Chemical Formula 4-3c]

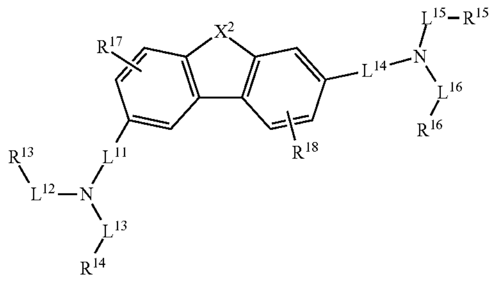

[Chemical Formula 4-3d]

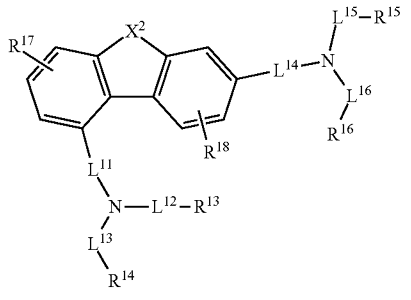

In Chemical Formula 4-3a to Chemical Formula 4-3d, $X^2$, $L^{11}$ to $L^{16}$, and $R^{13}$ to $R^{18}$ are the same as described above.

In an example embodiment, the third compound may be represented by Chemical Formula 4-2b or Chemical Formula 4-3c.

In an example embodiment, $L^{11}$ and $L^{14}$ may each independently be a single bond and $L^{12}$, $L^{13}$, $L^{15}$, and $L^{16}$ may each independently be a single bond or a substituted or unsubstituted phenylene group.

In an example embodiment, $R^{13}$ to $R^{16}$ may each independently be a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted fluorenyl group, a substituted or unsubstituted dibenzofuranyl group, a substituted or unsubstituted dibenzothiophenyl group, a substituted or unsubstituted fused dibenzofuranyl group, or a substituted or unsubstituted fused dibenzothiophenyl group.

In an example embodiment, $R^{13}$ to $R^{16}$ may each independently be a substituted or unsubstituted phenyl group, a substituted or unsubstituted naphthyl group, a substituted or unsubstituted dibenzofuranyl group, or a substituted or unsubstituted dibenzothiophenyl group.

In an example embodiment, at least one of $R^{13}$ to $R^{16}$ may be a substituted or unsubstituted dibenzofuranyl group or a substituted or unsubstituted dibenzothiophenyl group.

In an example embodiment, $R^{17}$ and $R^{18}$ may each independently be hydrogen or a C1 to C5 alkyl group.

In an example embodiment, $R^{17}$ and $R^{18}$ may each independently be hydrogen.

In a specific embodiment, the first compound may be represented by Chemical Formula 1E-2-2, the second compound may be represented by Chemical Formula 3-1a or Chemical Formula 3-3a, and the third compound may be represented by Chemical Formula 4-2b or Chemical Formula 4-3c.

The third compound may be for example one of compounds of Group 3, for example.

[Group 3]

E-1

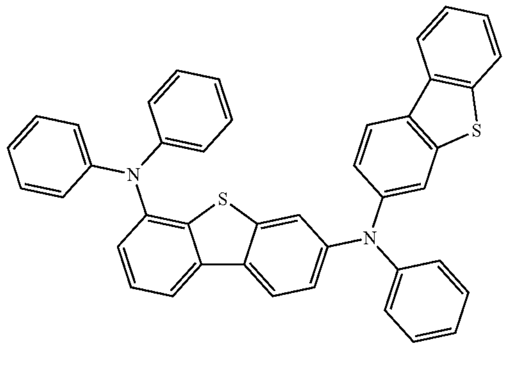

-continued
E-2
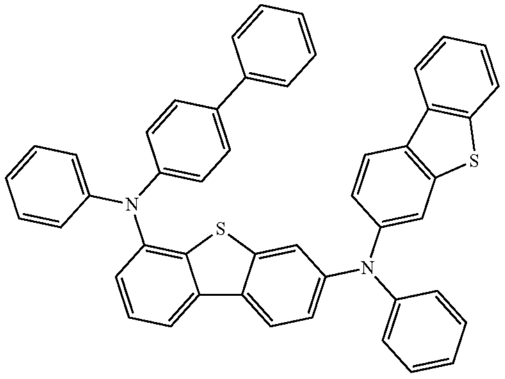
E-3
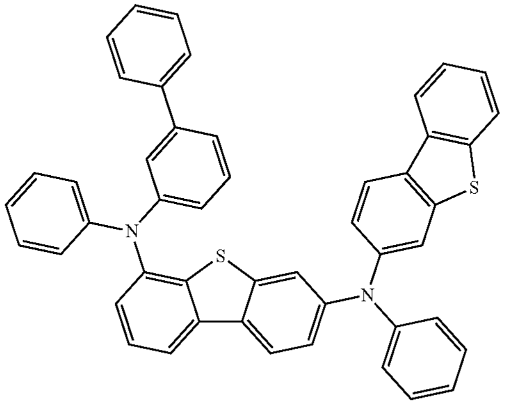
E-4
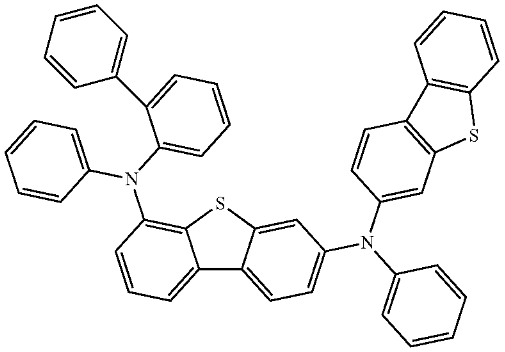
-continued
E-5
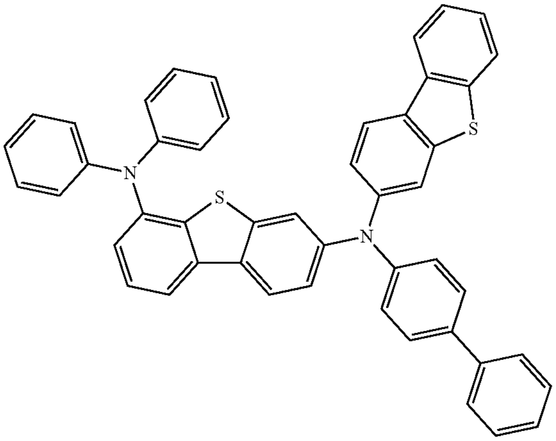
E-6
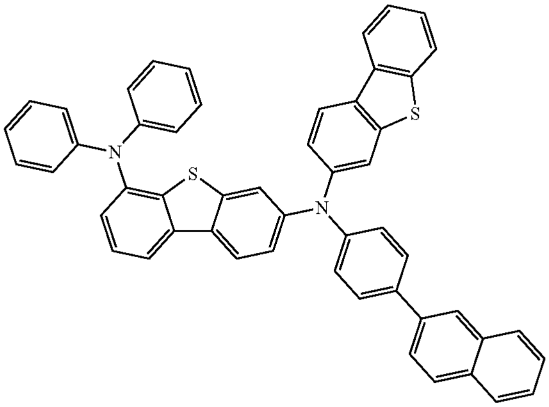
E-7
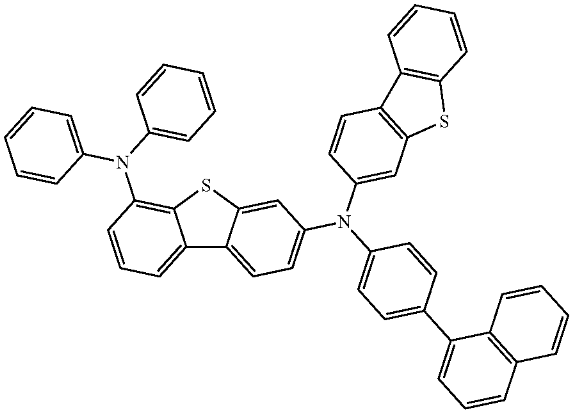

-continued
E-8
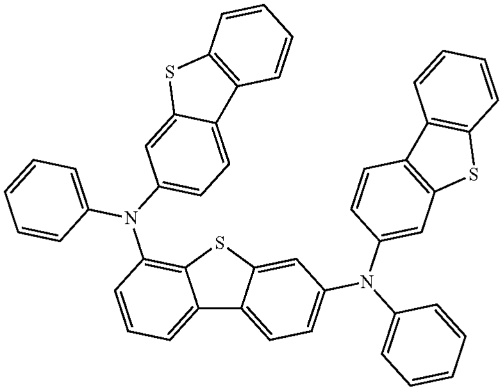
E-9
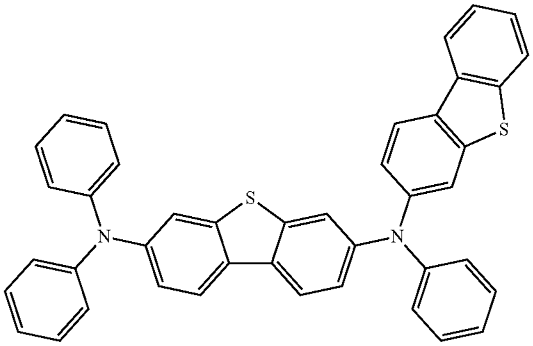
E-10
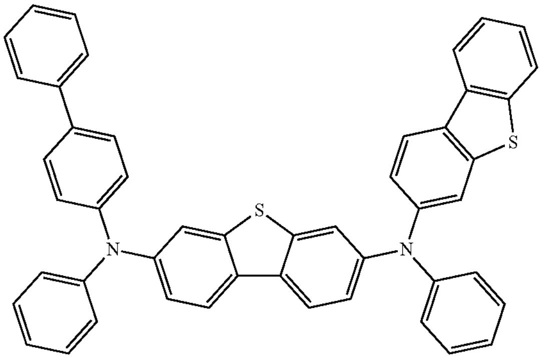
E-11
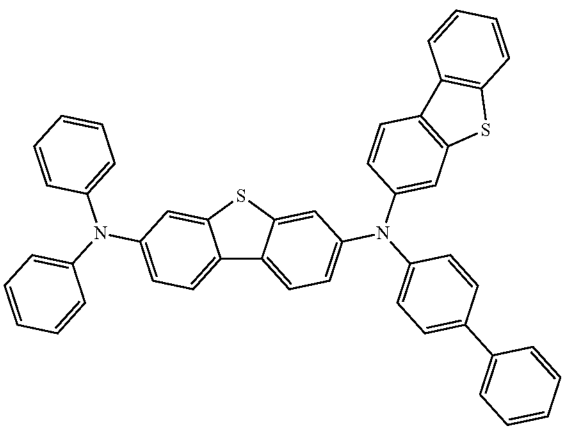
-continued
E-12
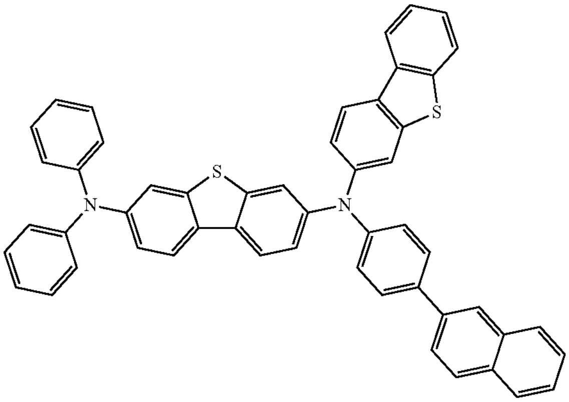
E-13
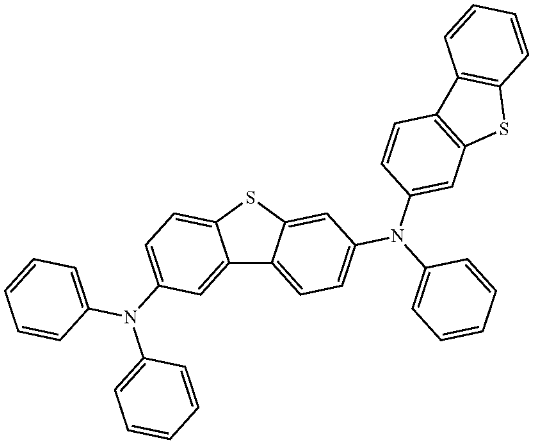
E-14
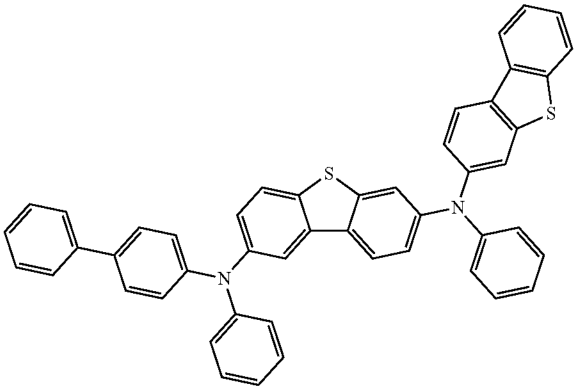

-continued
E-15
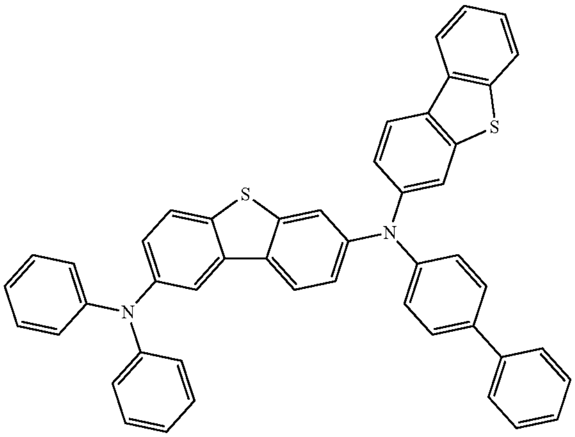
E-16
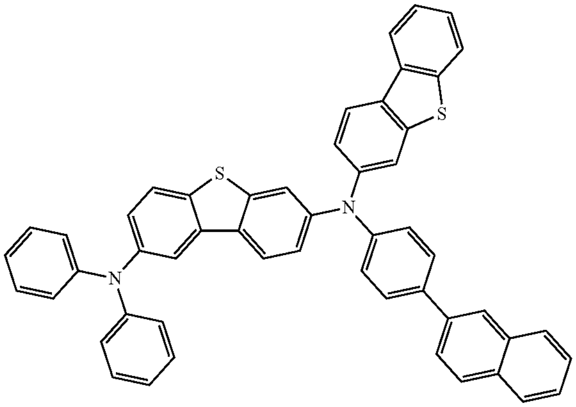
E-17
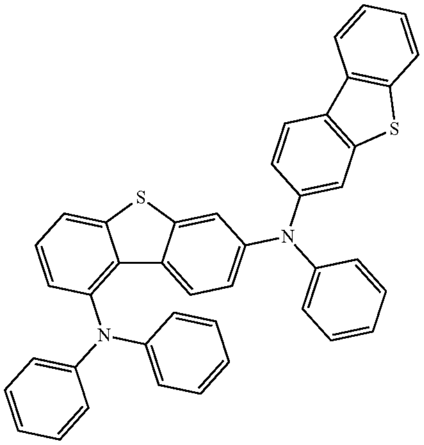
-continued
E-18
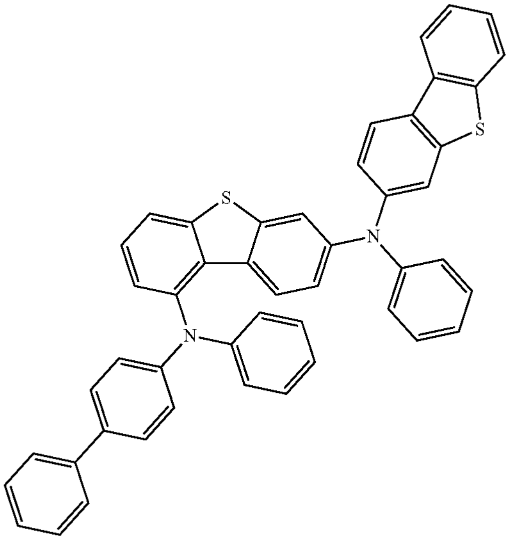
E-19
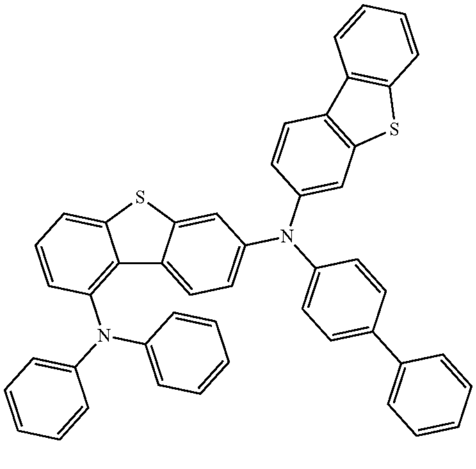
E-20
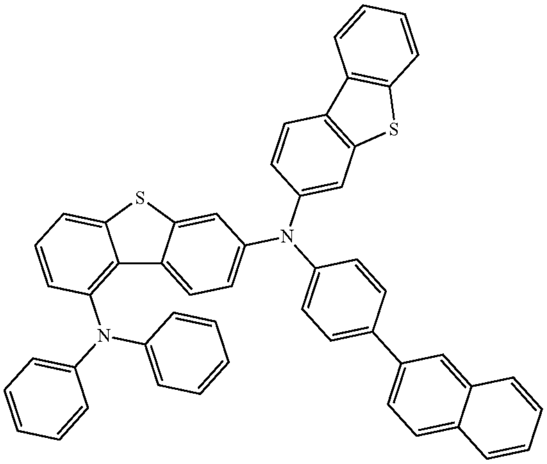

-continued
E-21
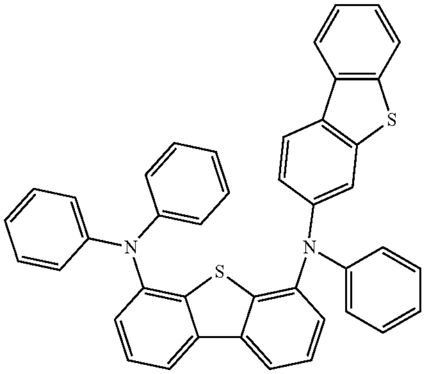
E-22
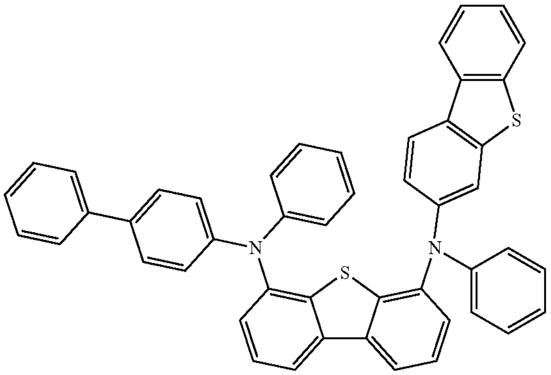
E-23
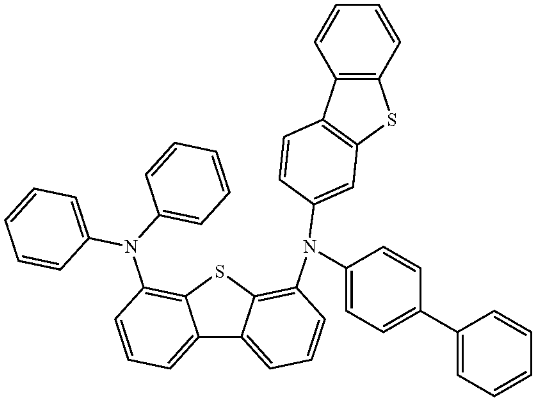
E-24
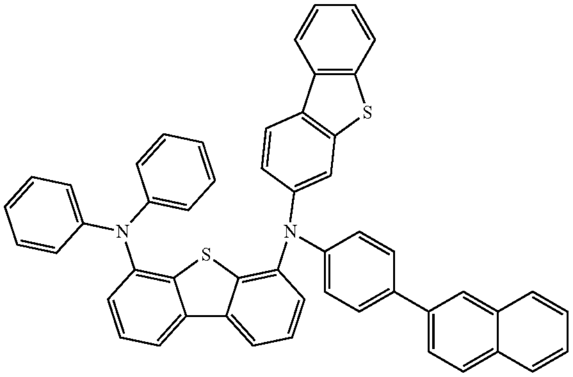
-continued
E-25
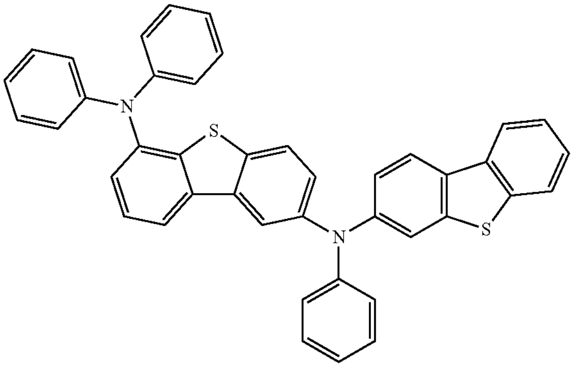
E-26
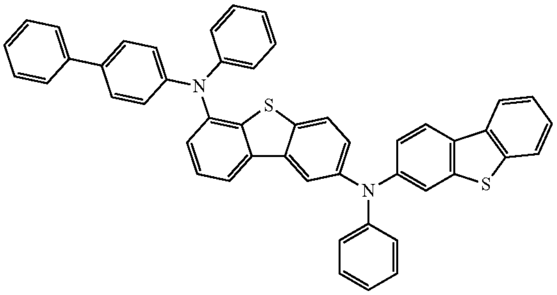
E-27
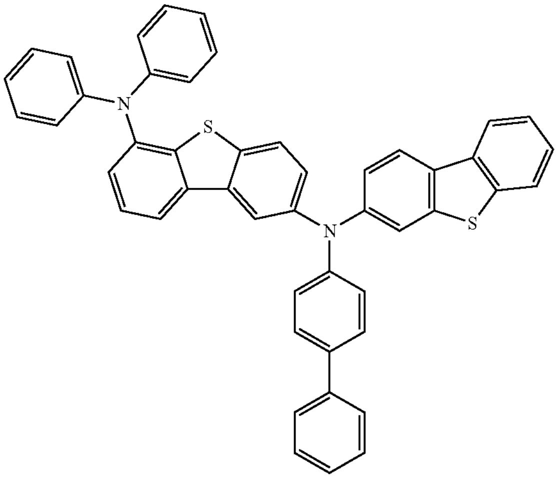

-continued
E-28
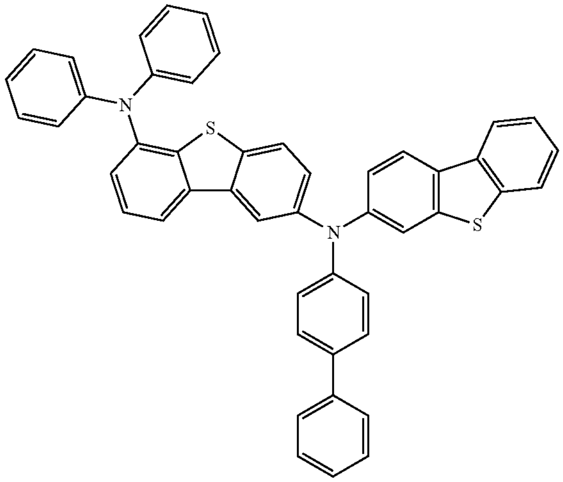
E-29
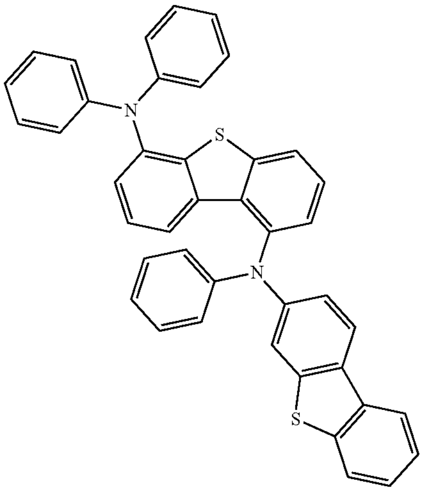
E-30
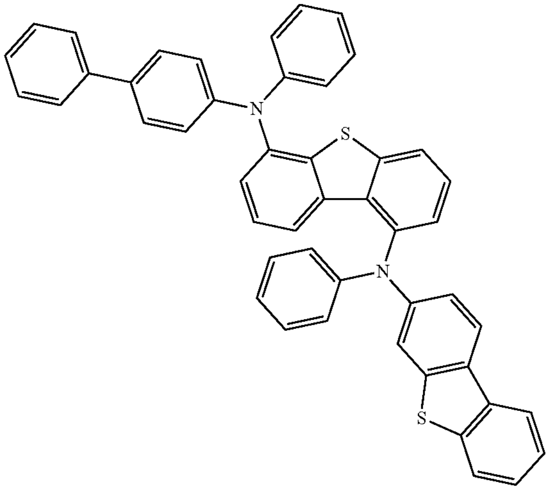
-continued
E-31
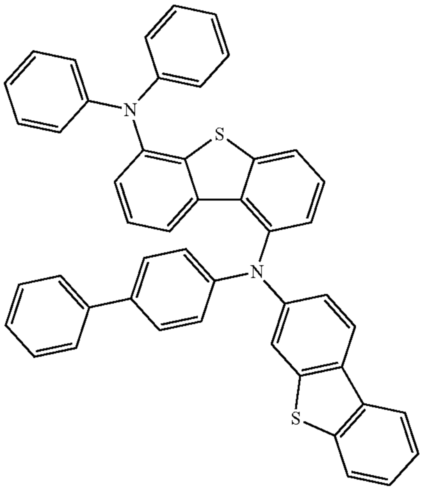
E-32
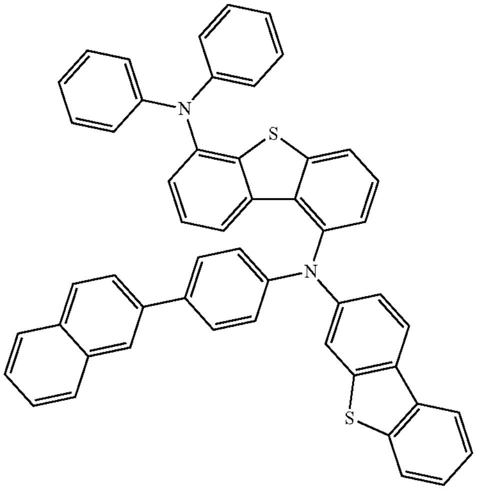
E-33
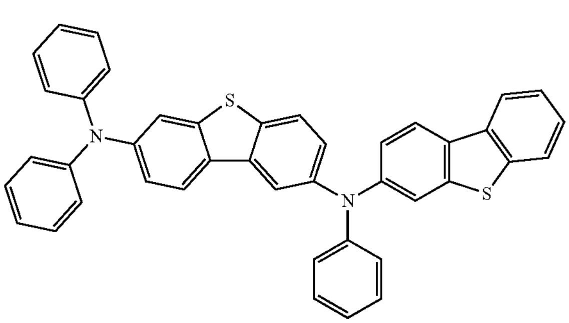

-continued
E-34
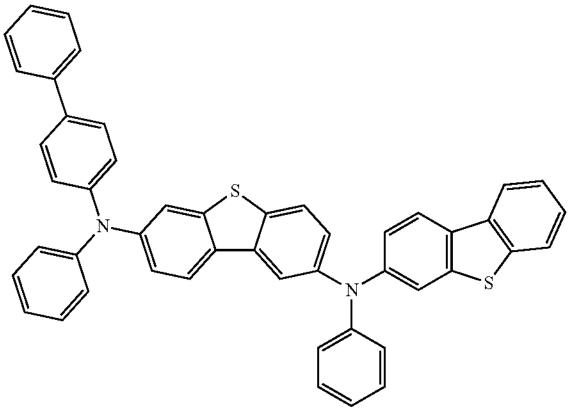
E-35
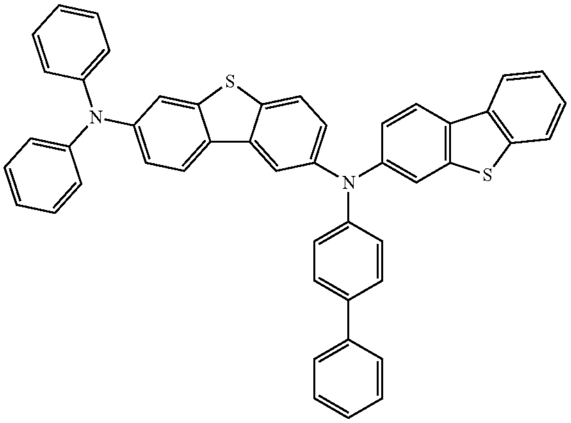
E-36
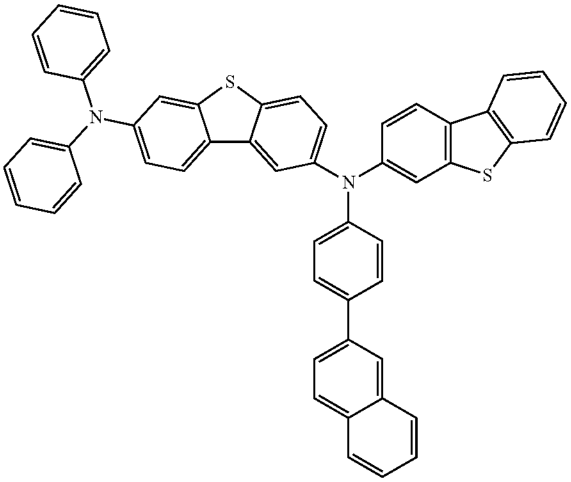
-continued
E-37
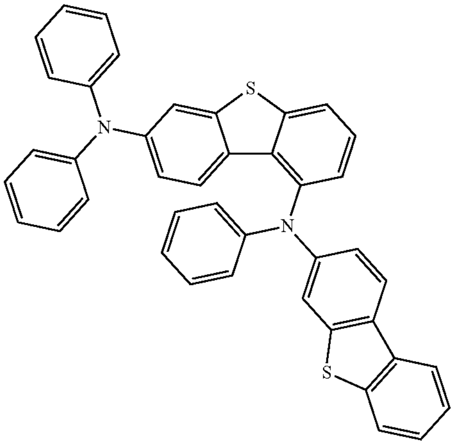
E-38
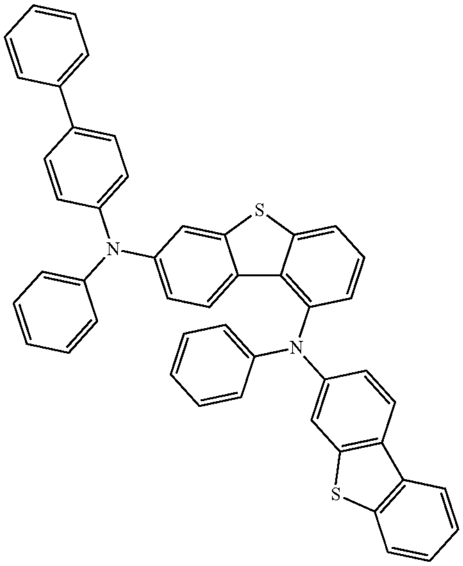
E-39
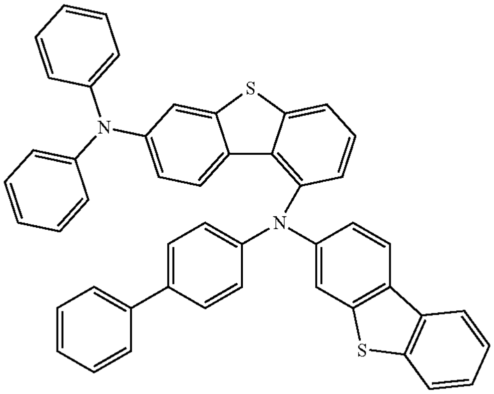

-continued
E-40
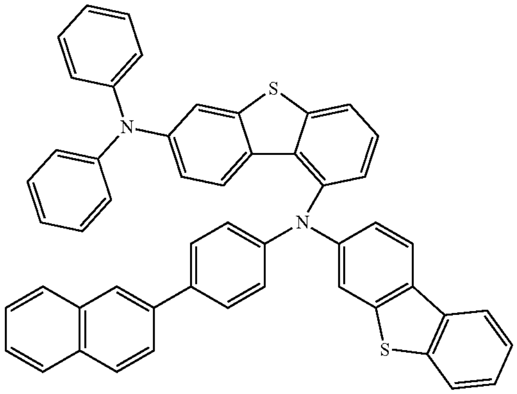
E-41
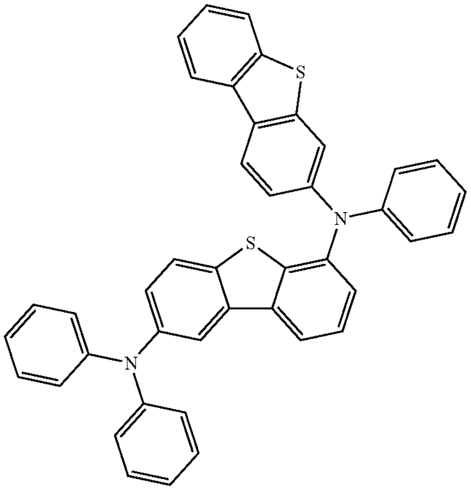
E-42
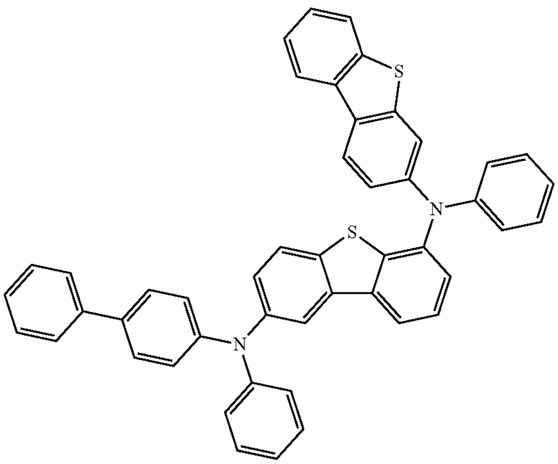
-continued
E-43
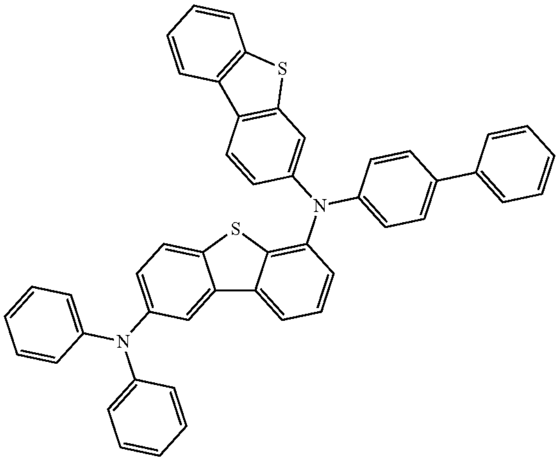
E-44
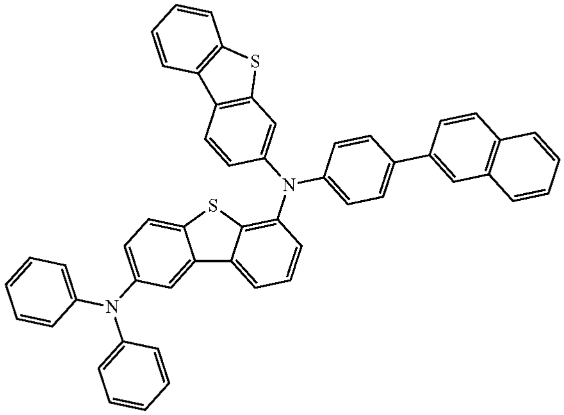
E-45
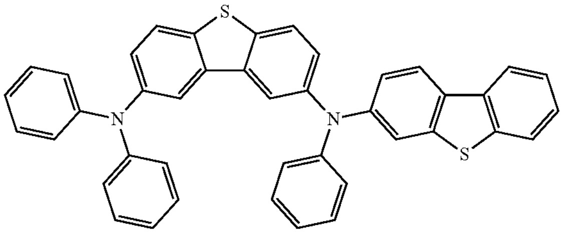
E-46
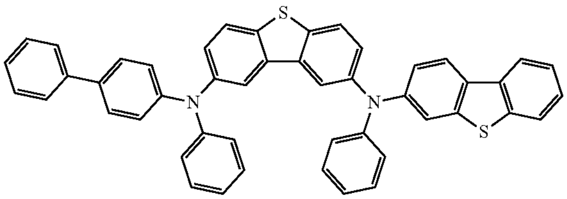

-continued
E-47
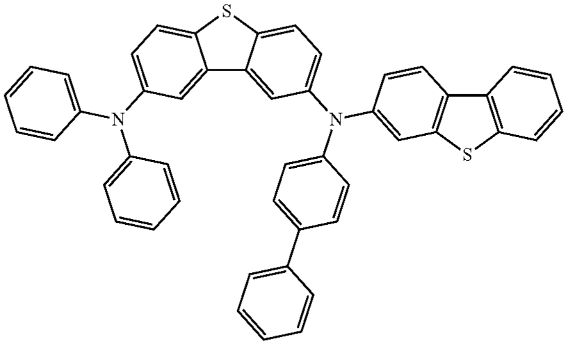
E-48
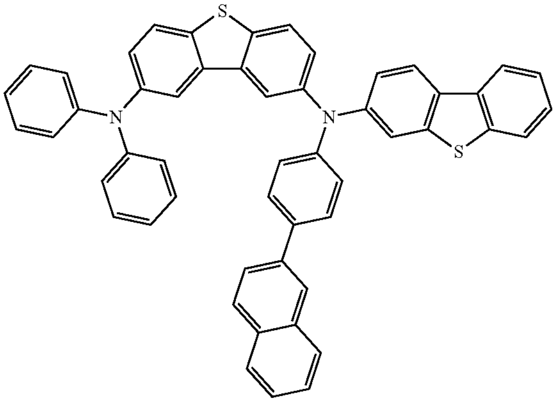
E-49
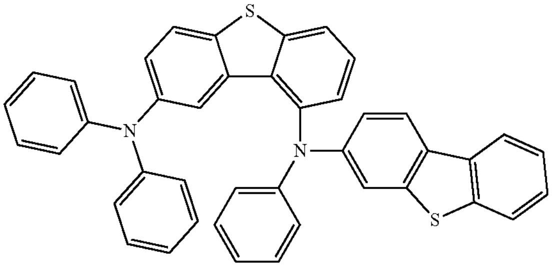
E-50
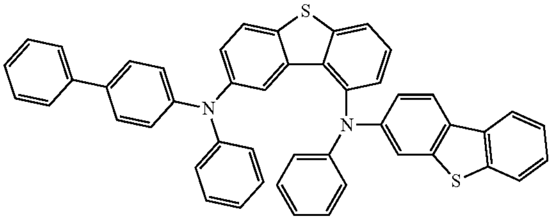
-continued
E-51
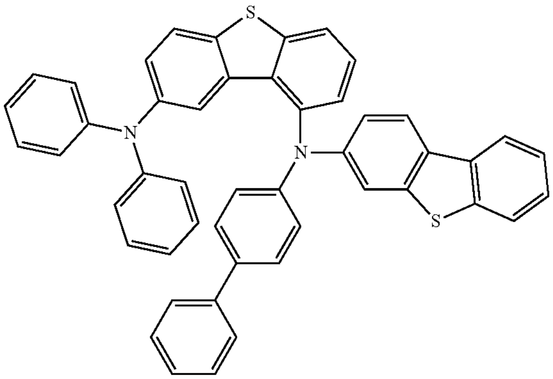
E-52
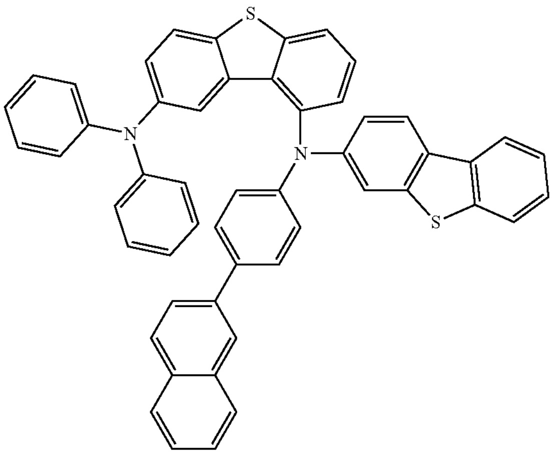
E-53
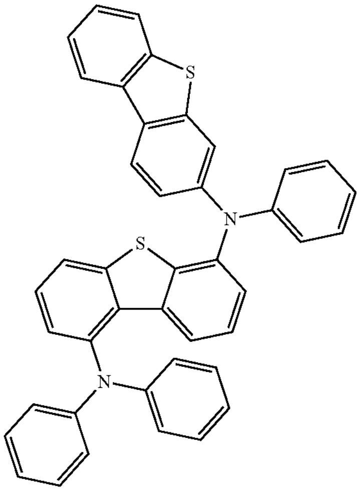

-continued
E-54
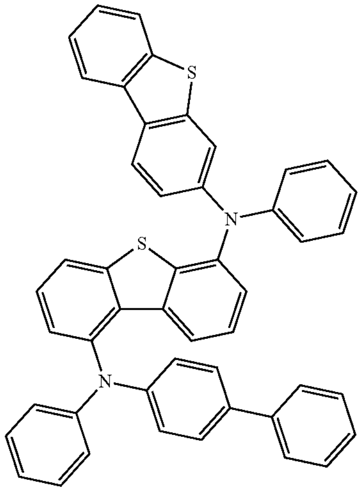
E-55
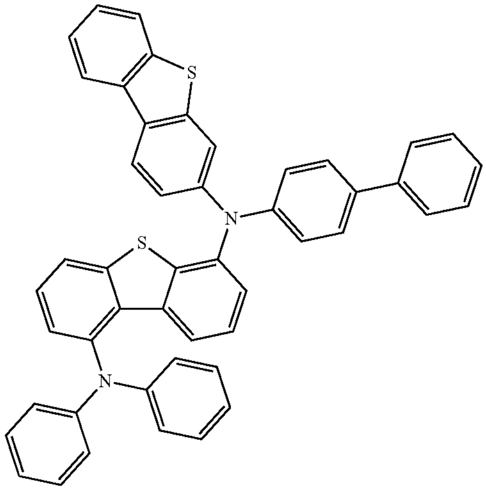
E-56
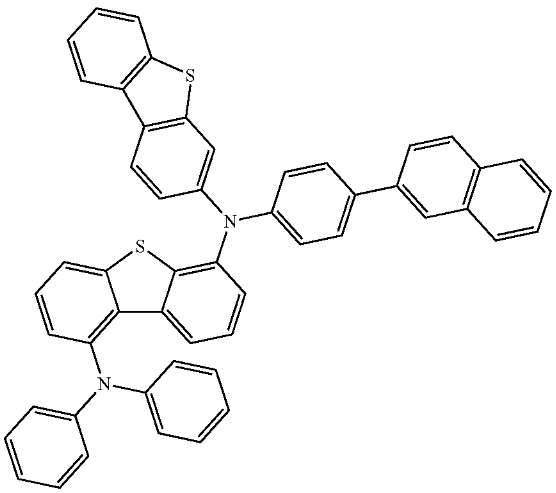
-continued
E-57
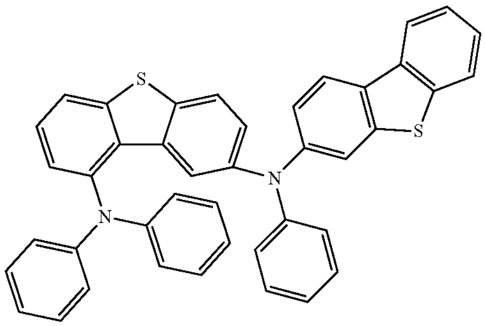
E-58
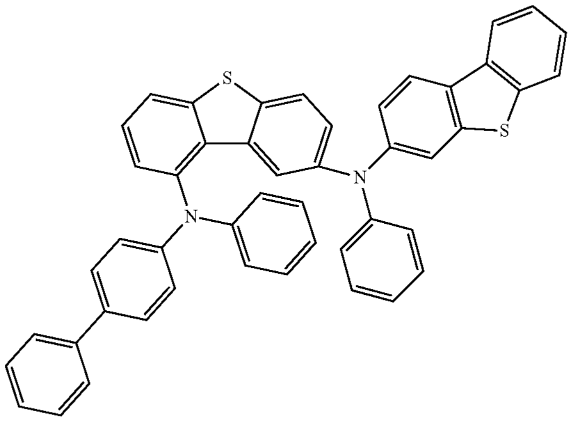
E-59
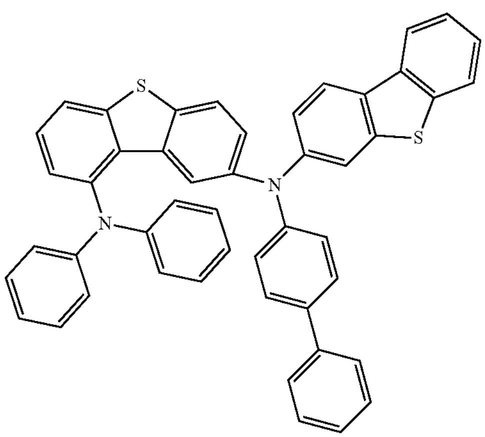

-continued
E-60
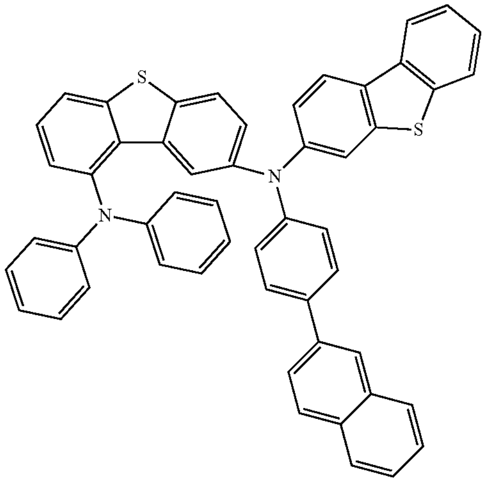
E-61
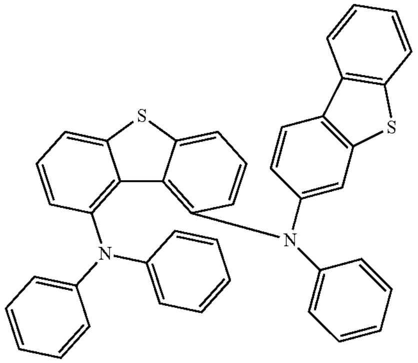
E-62
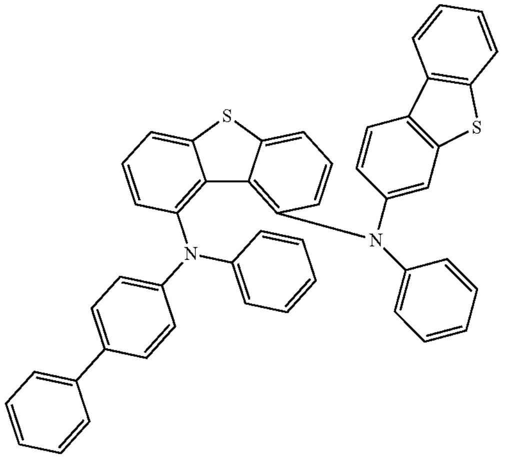
-continued
E-63
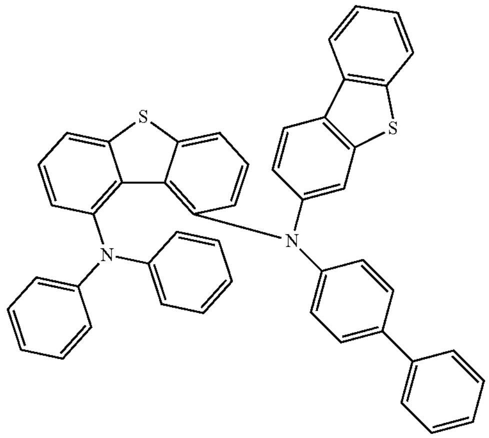
E-64
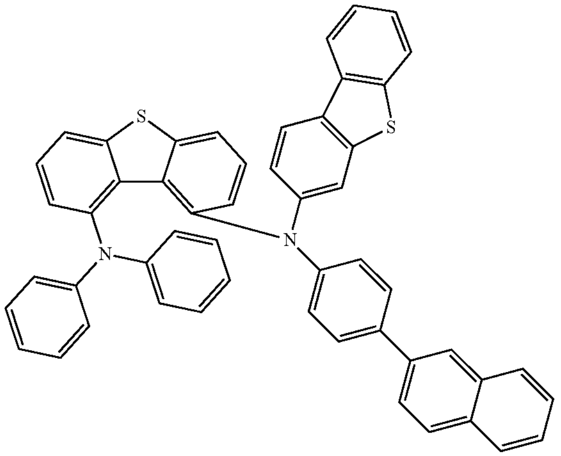
E-65
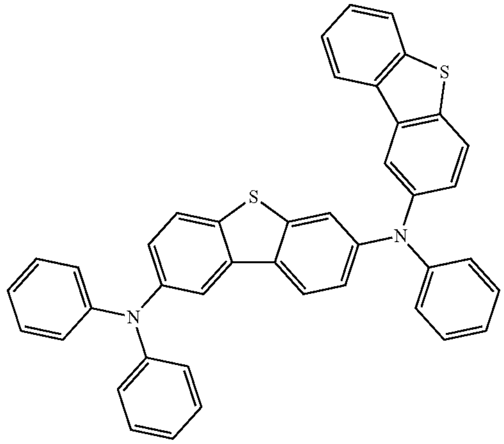

-continued
E-66
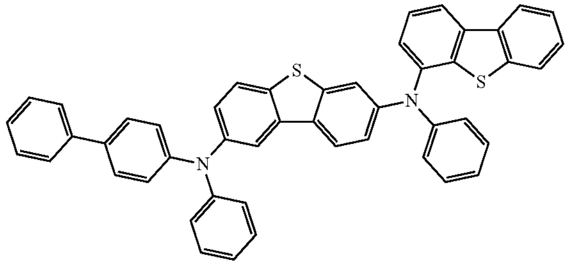
E-67
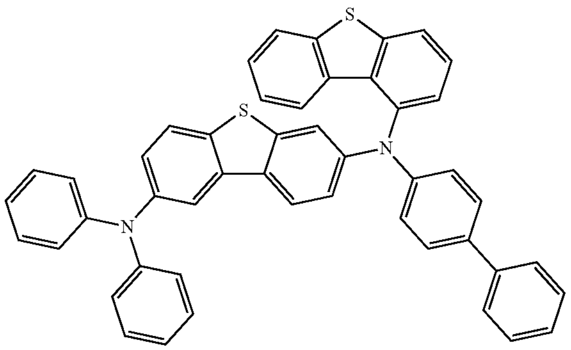
E-68
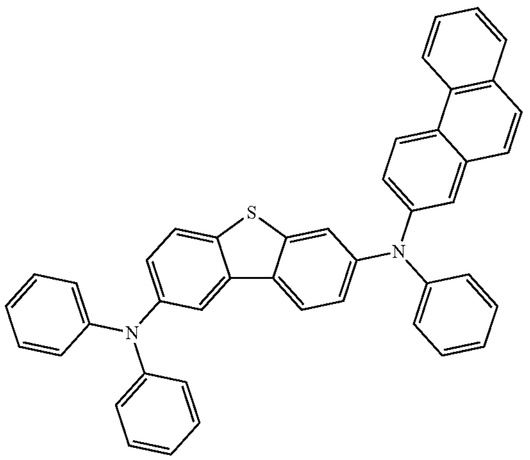
E-69
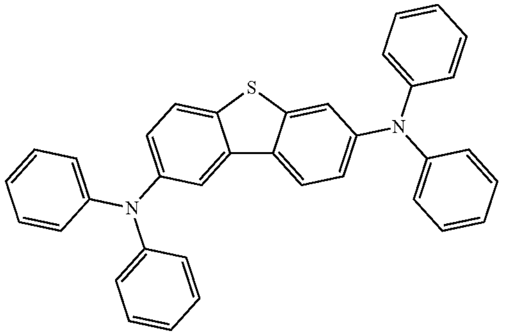
-continued
E-70
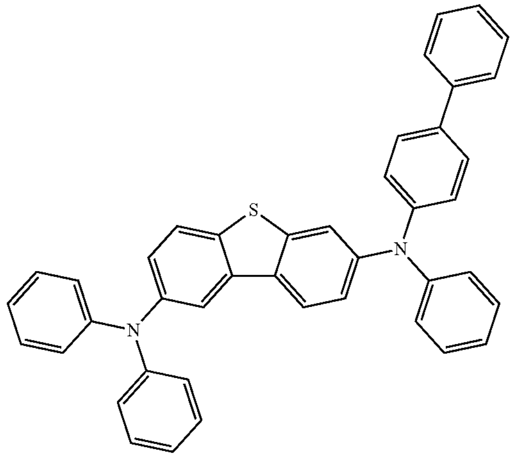
E-71
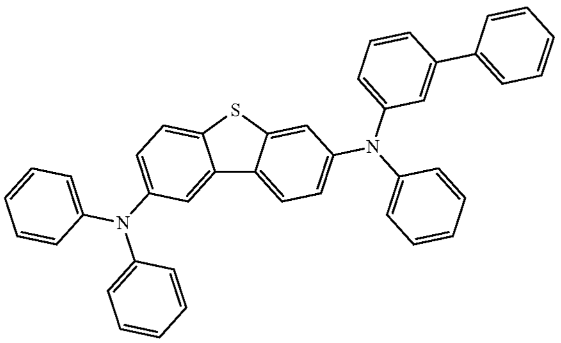
E-72
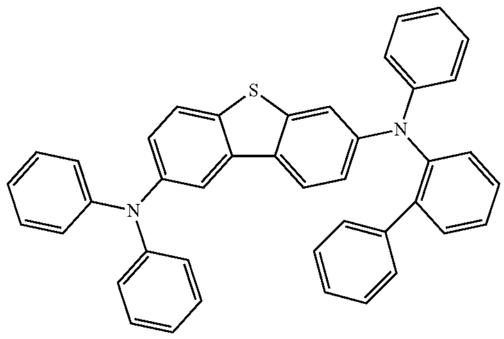
E-73
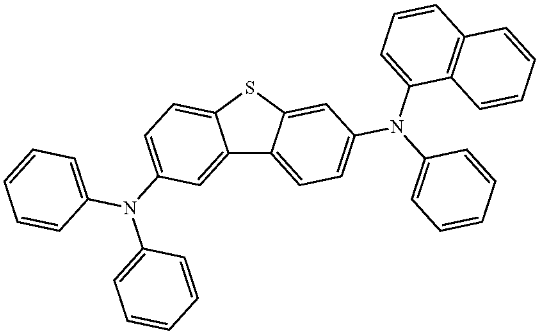

-continued
E-74
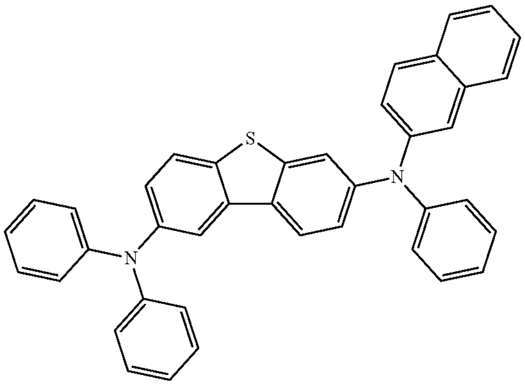
E-75
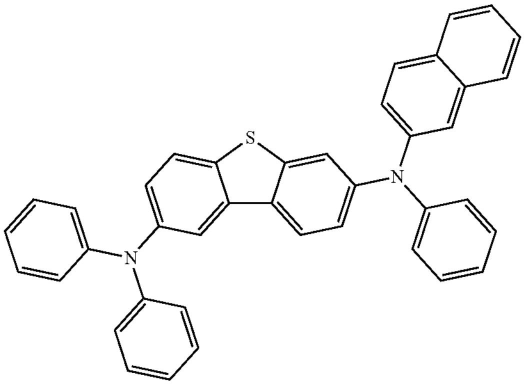
E-76
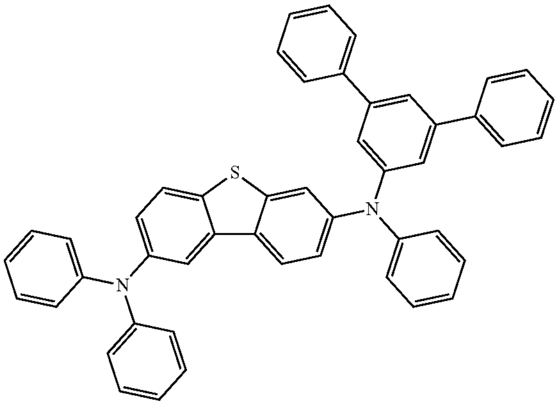
-continued
E-77
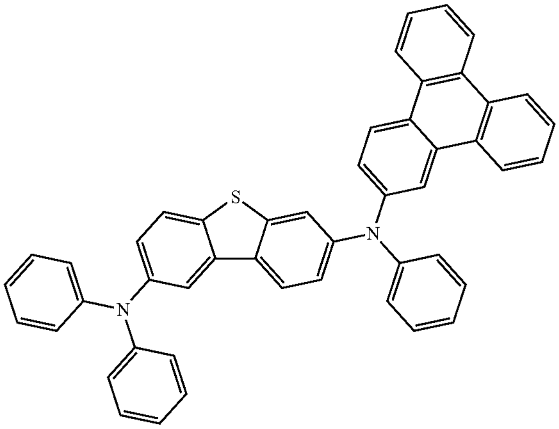
E-78
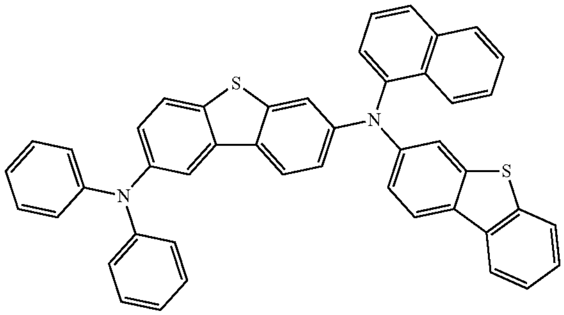
E-79
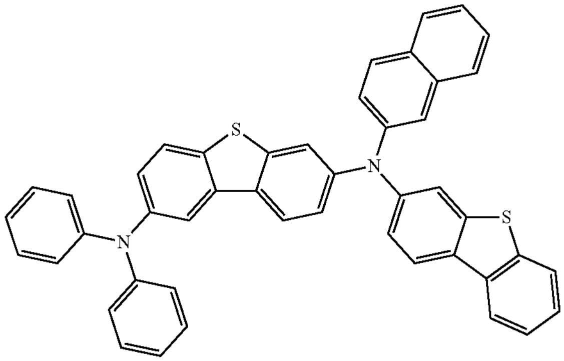
E-80
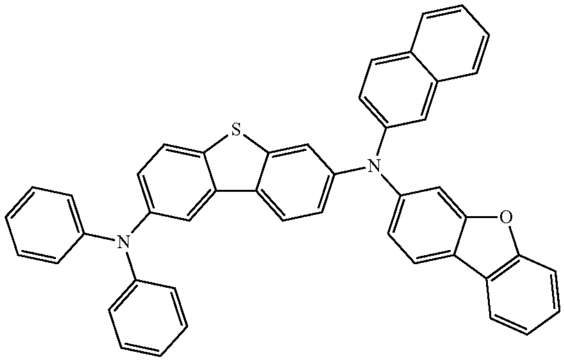

-continued
E-81
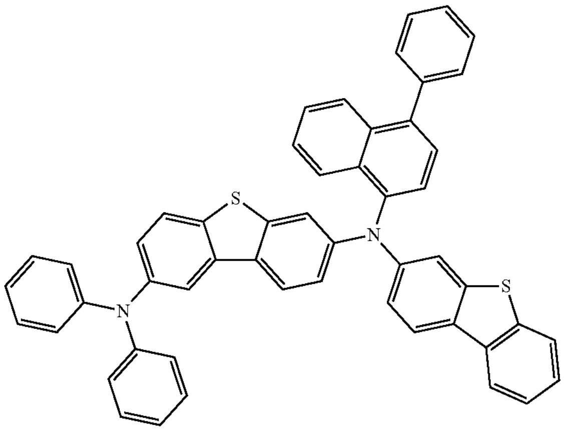
E-82
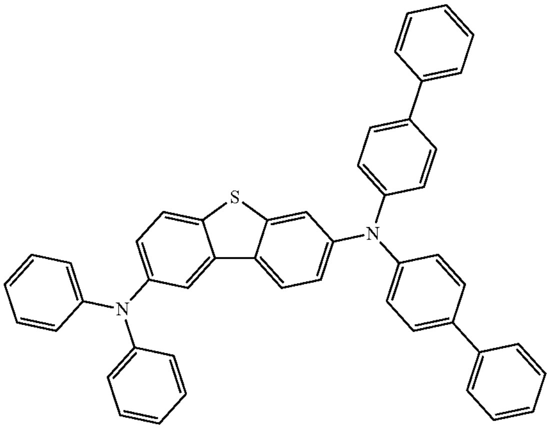
E-83
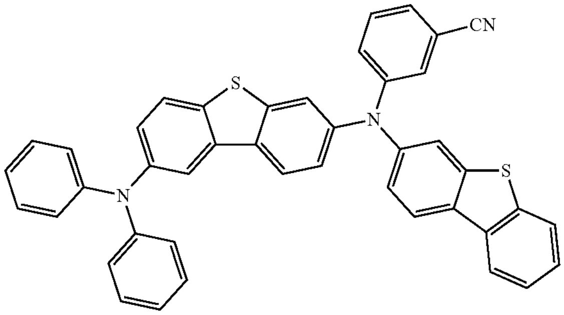
E-84
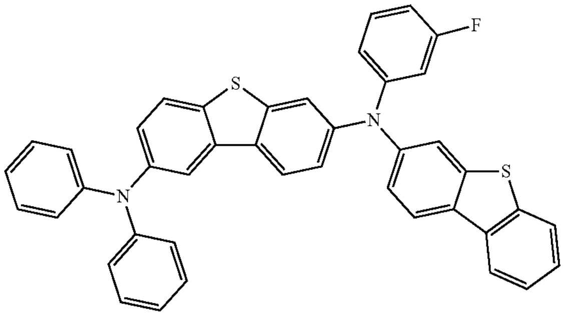
-continued
E-85
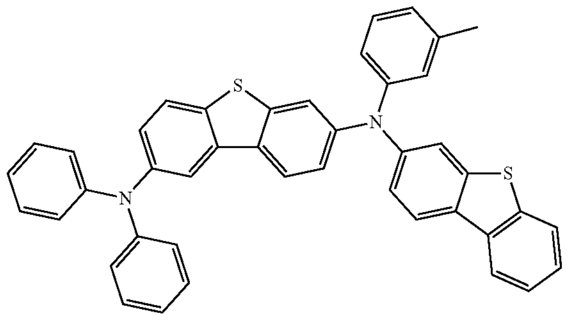
E-86
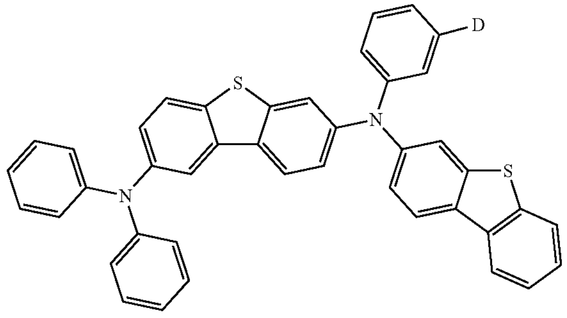
E-87
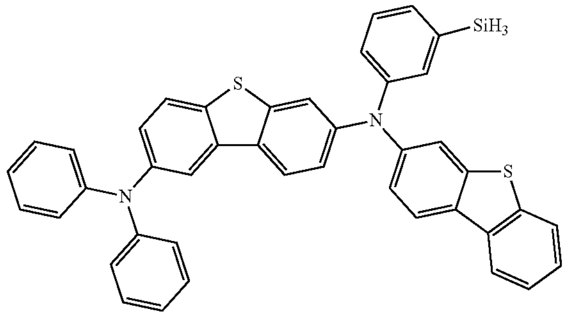
E-88
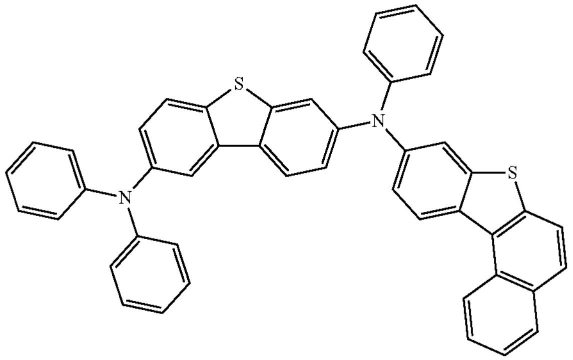

-continued
E-89
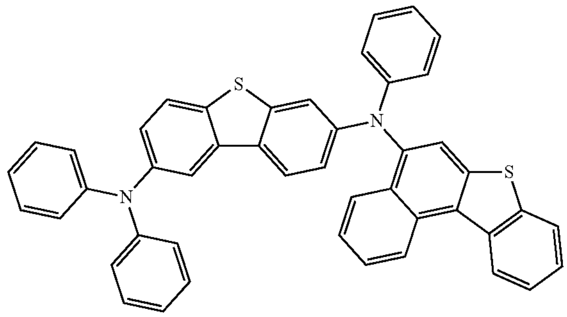
E-90
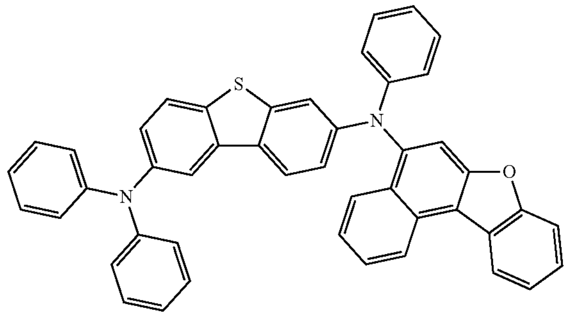
E-91
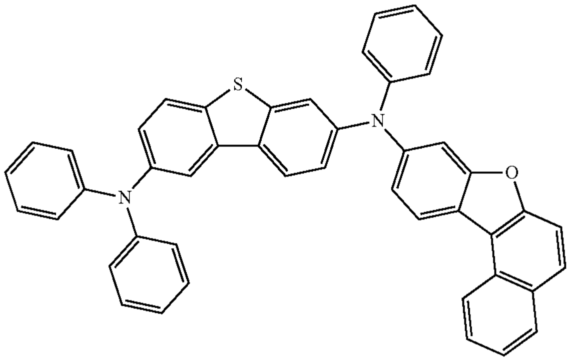
E-92
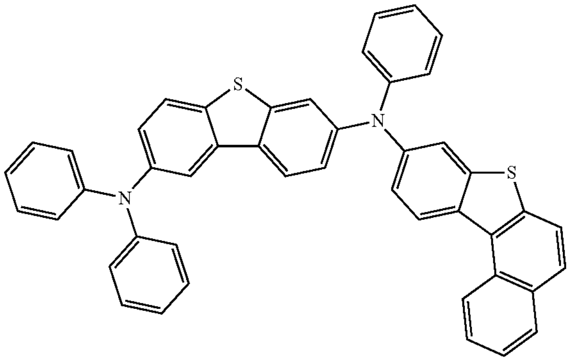
-continued
E-93
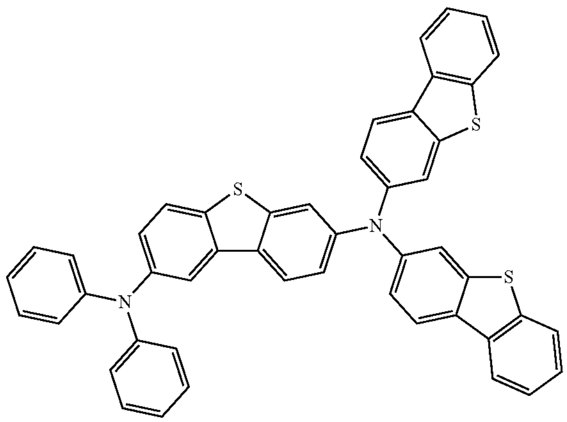
E-94
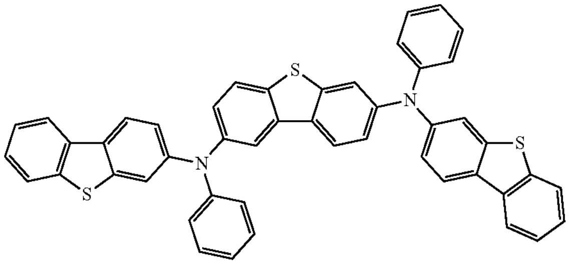
E-95
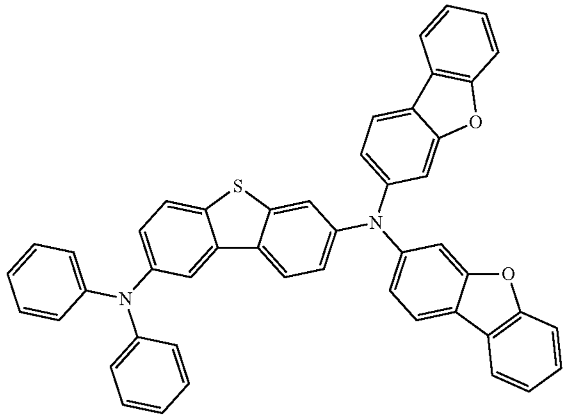
E-96
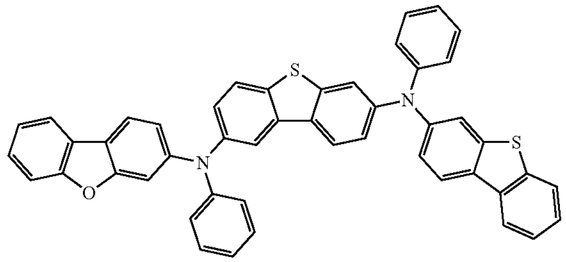

-continued
F-1
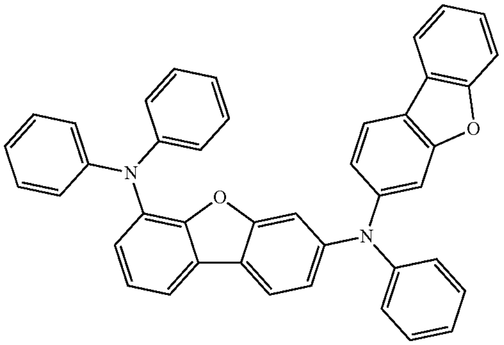
F-2
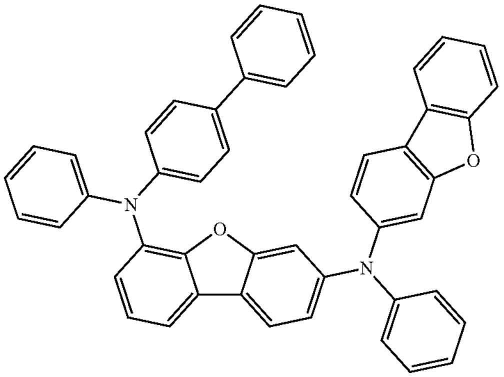
F-3
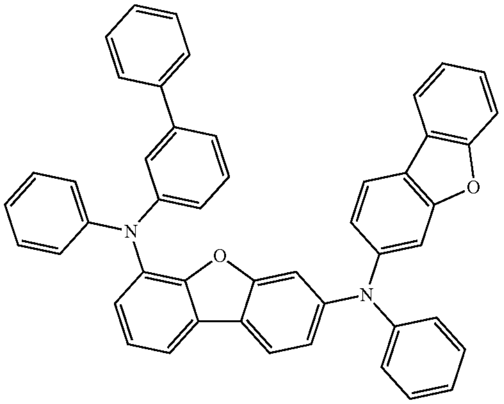
F-4
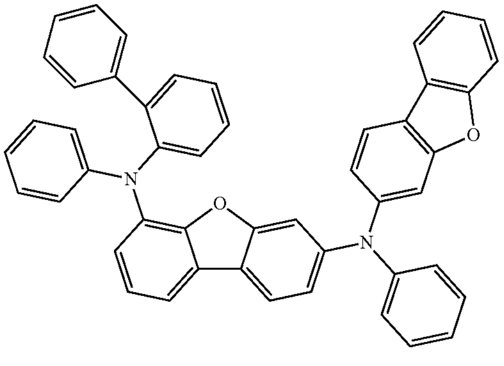
-continued
F-5
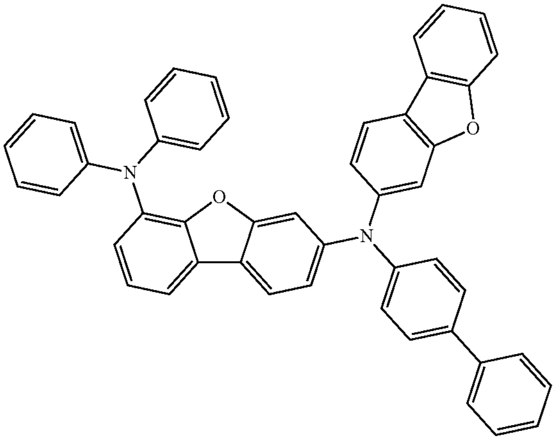
F-6
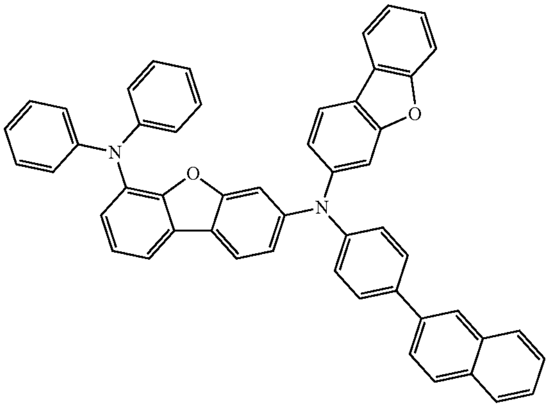
F-7
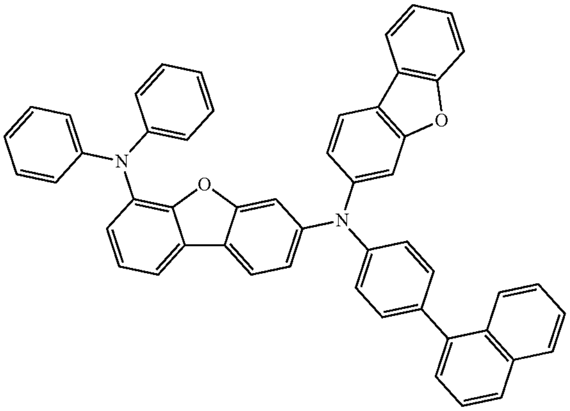

-continued
F-8
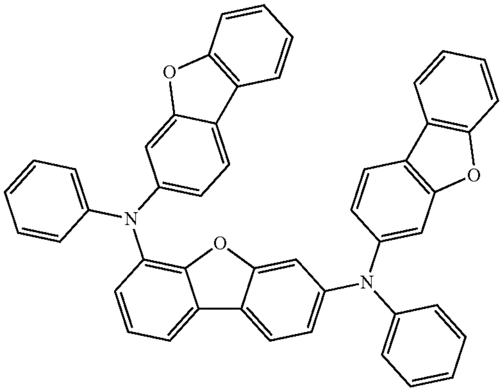
F-9
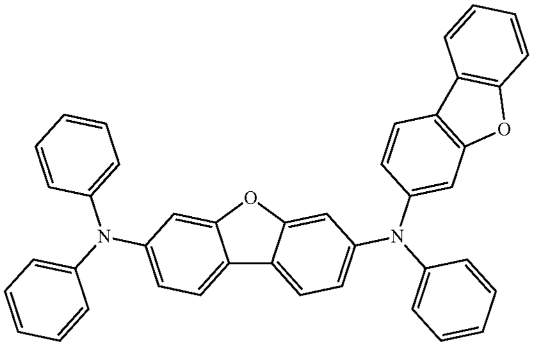
F-10
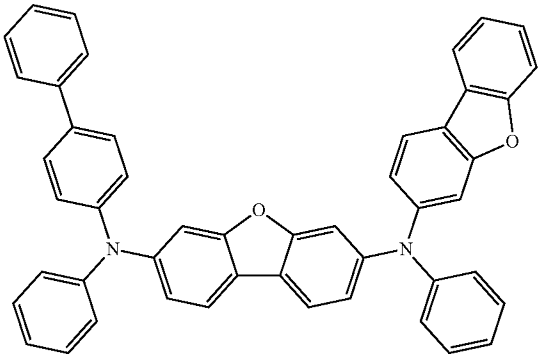
F-11
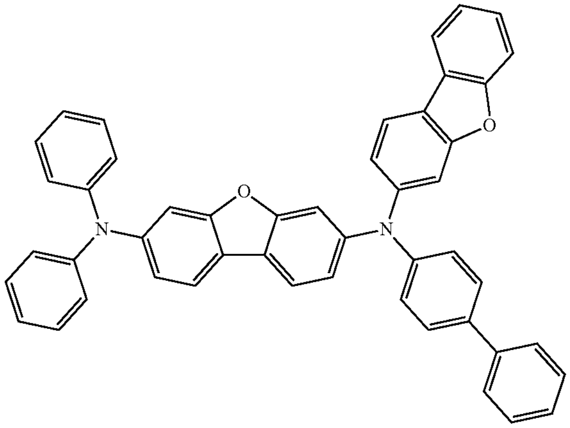
-continued
F-12
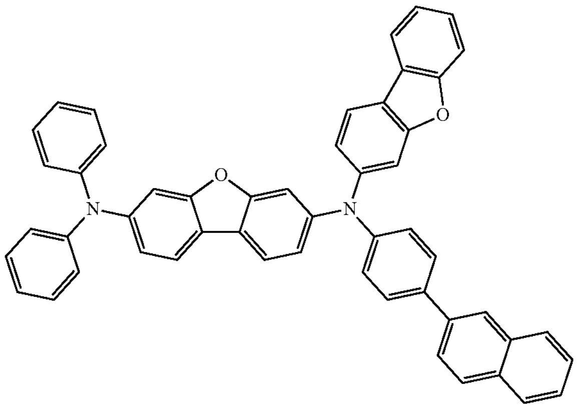
F-13
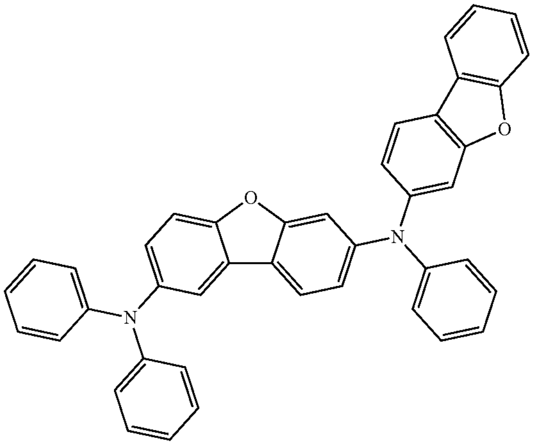
F-14
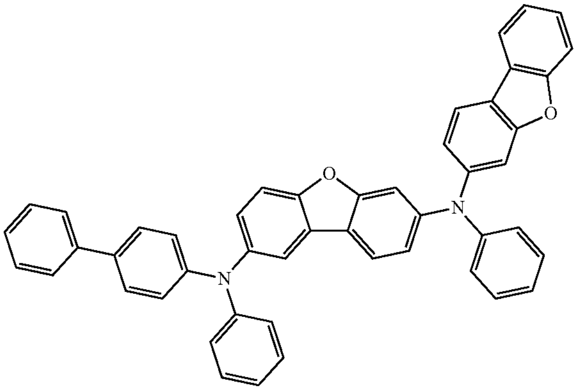

-continued
F-15
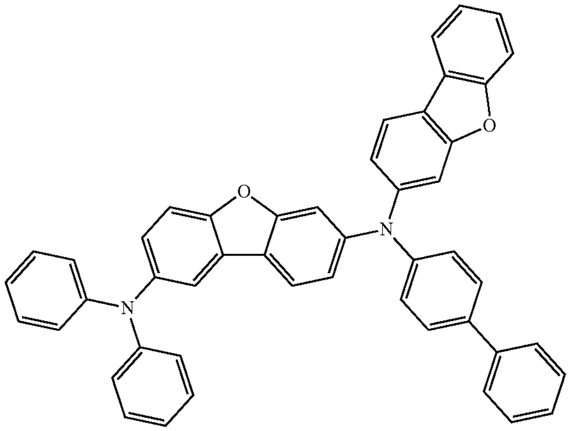
F-16
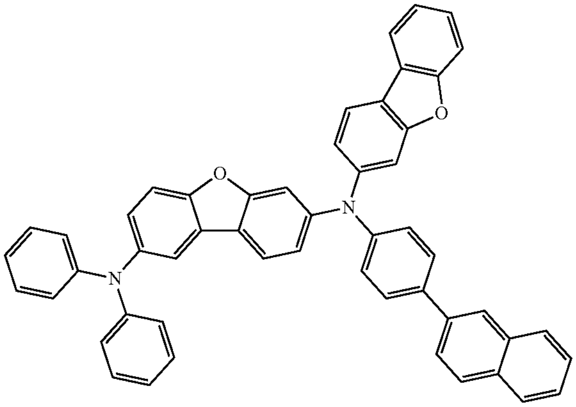
F-17
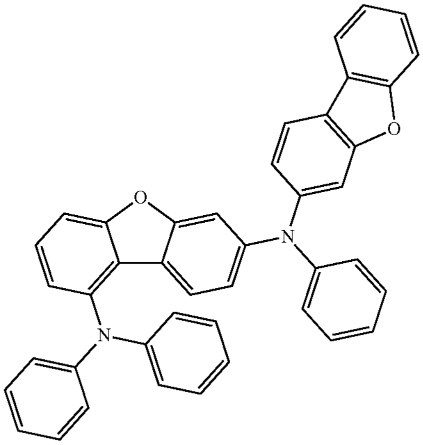
-continued
F-18
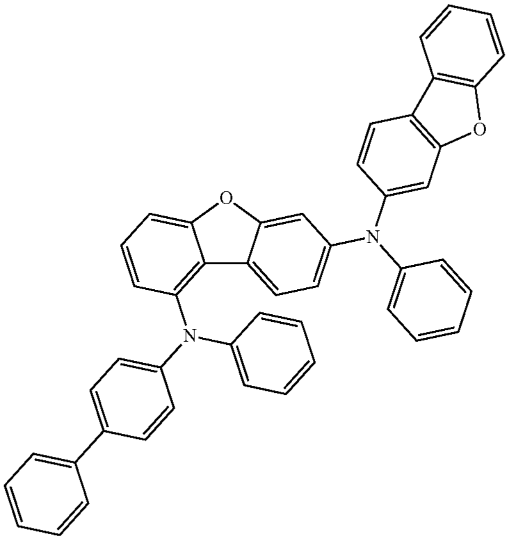
F-19
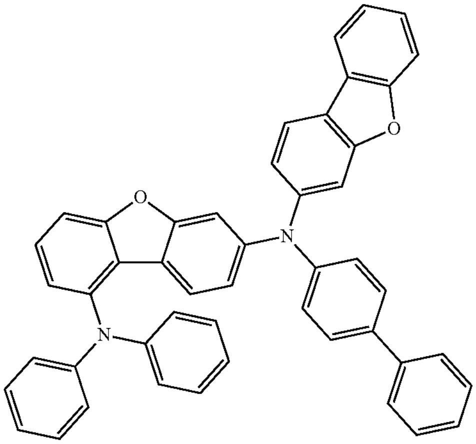
F-20
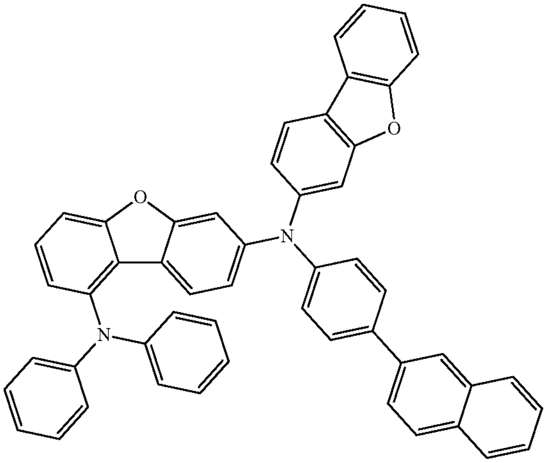

-continued
F-21
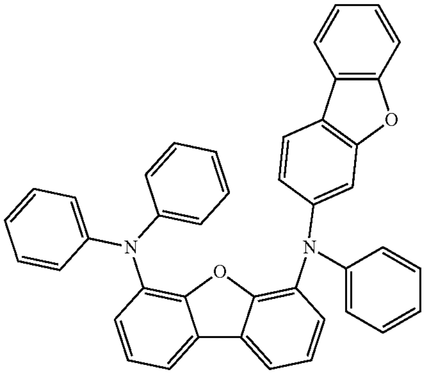
F-22
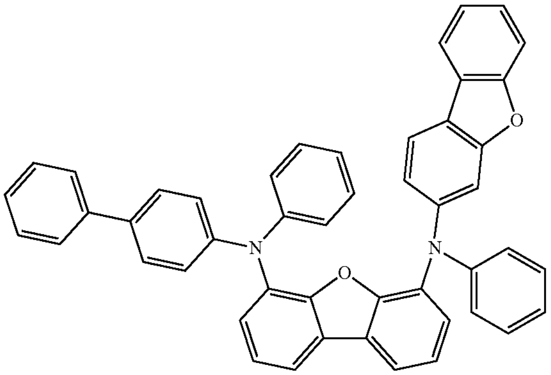
F-23
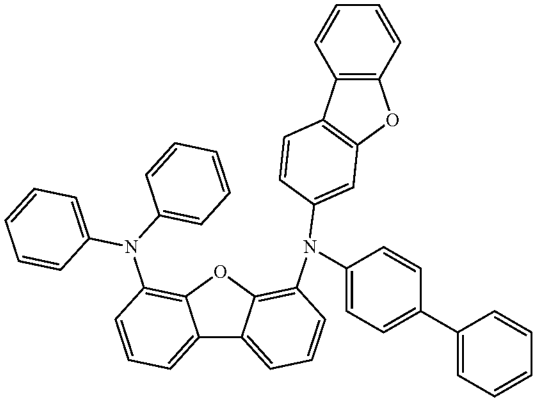
F-24
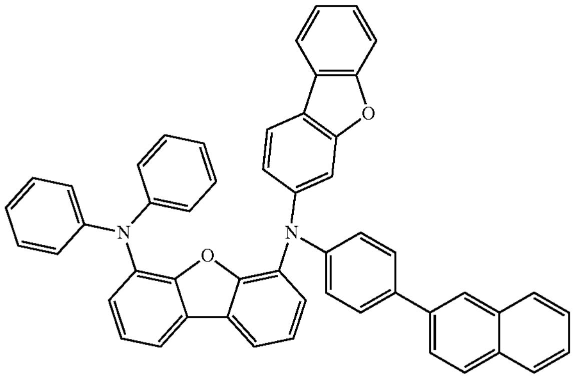
-continued
F-25
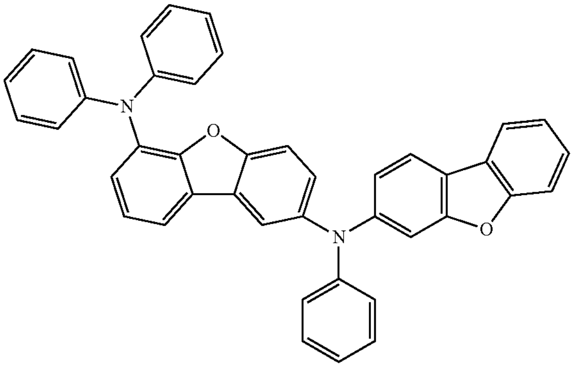
F-26
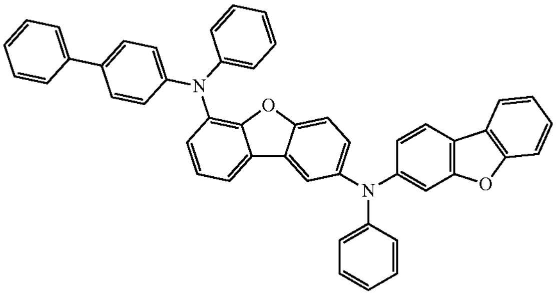
F-27
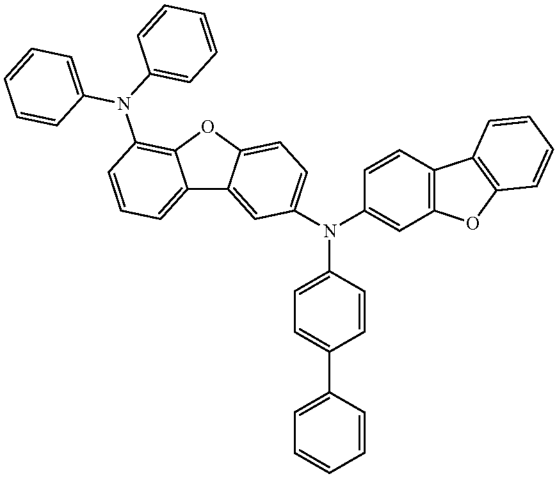

-continued
F-28
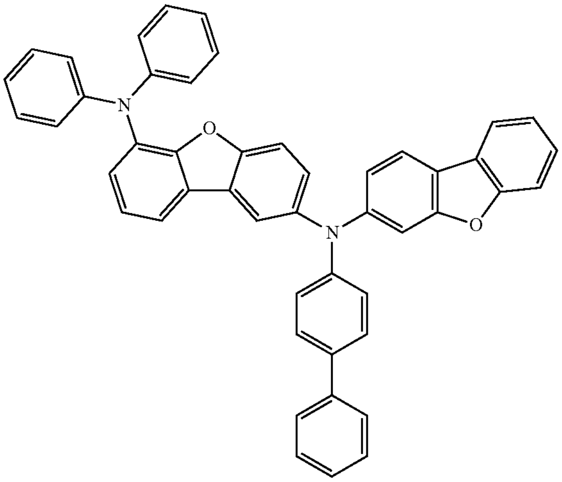
F-29
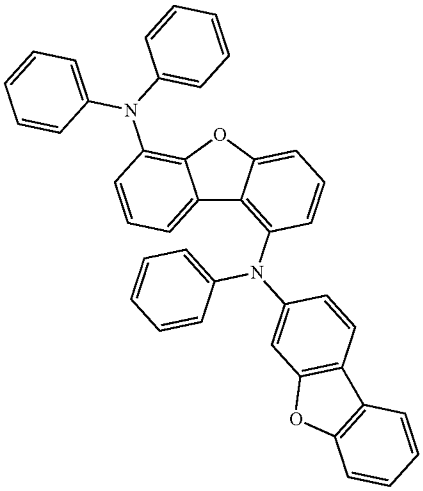
F-30
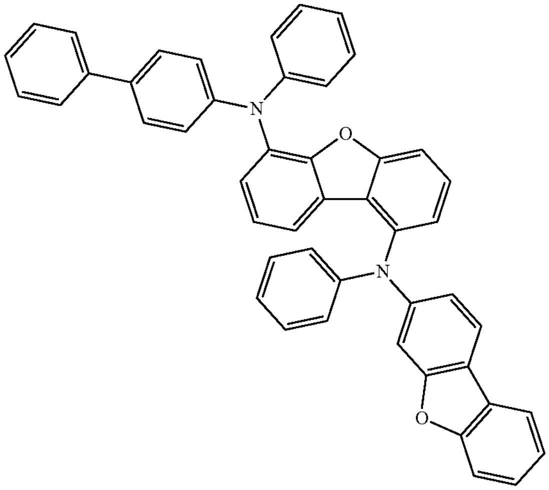
-continued
F-31
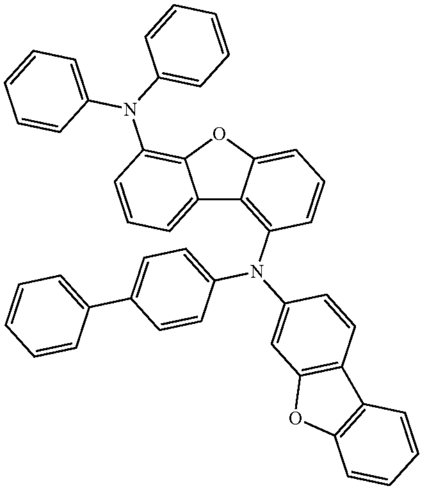
F-32
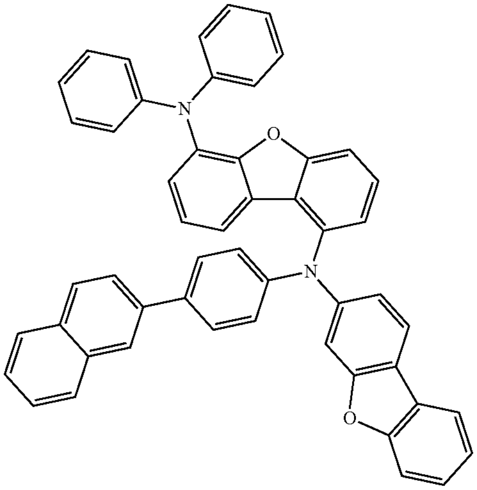
F-33
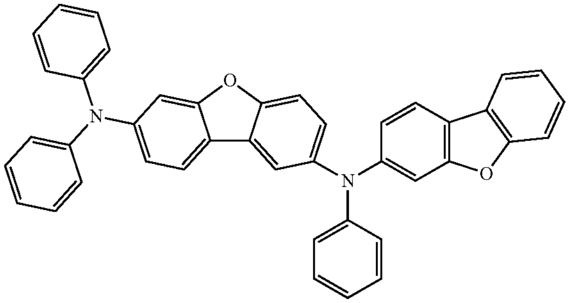

-continued
F-34
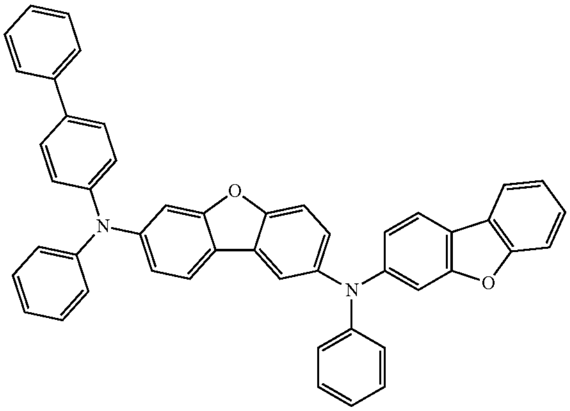
F-35
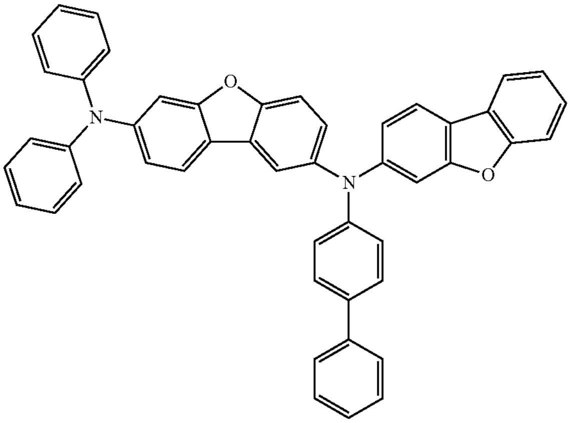
F-36
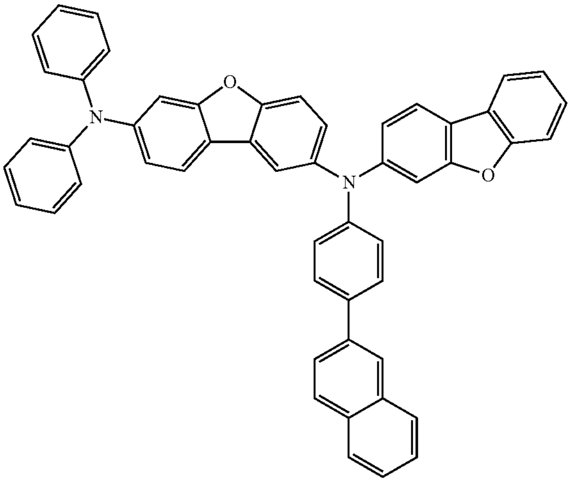
-continued
F-37
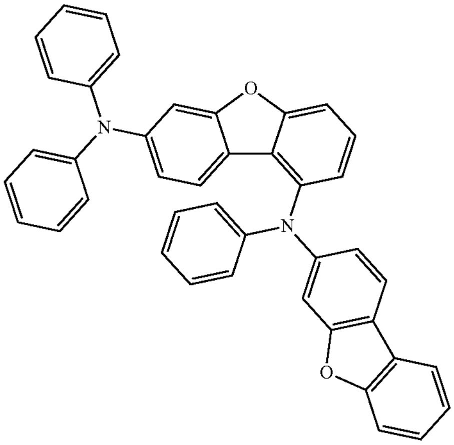
F-38
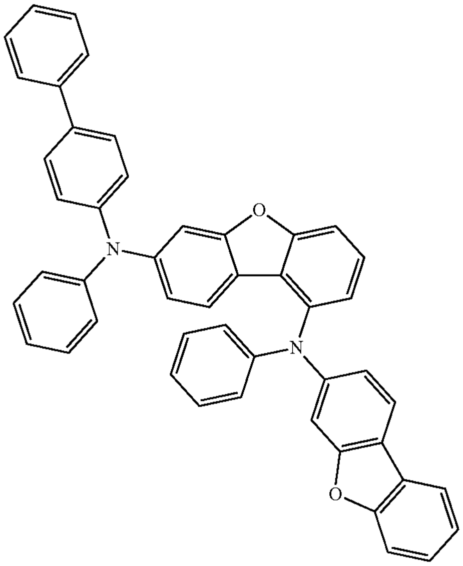
F-39
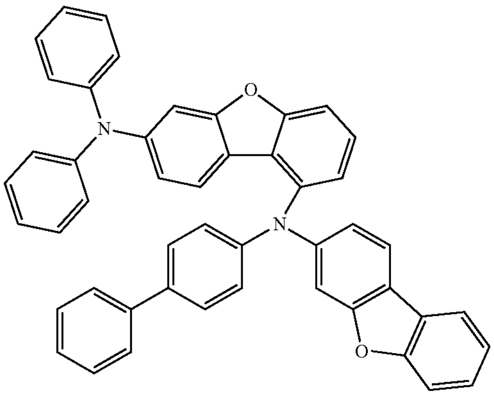

-continued
F-40
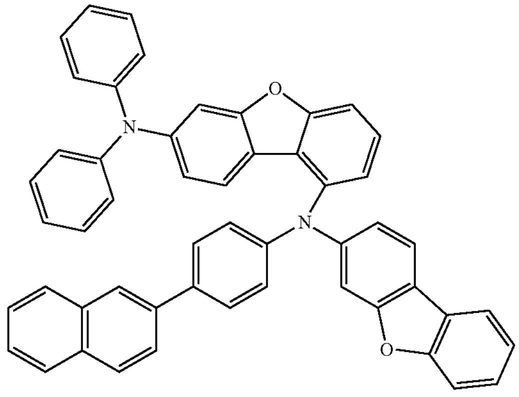
F-41
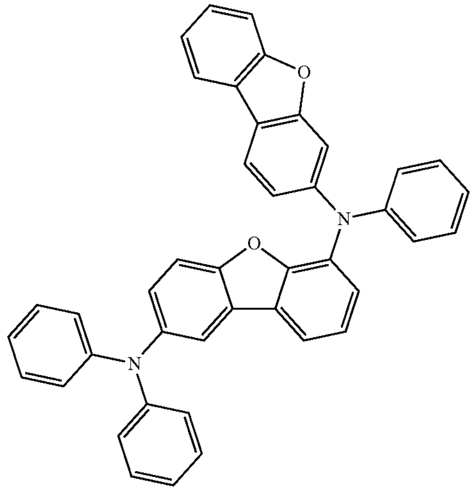
F-42
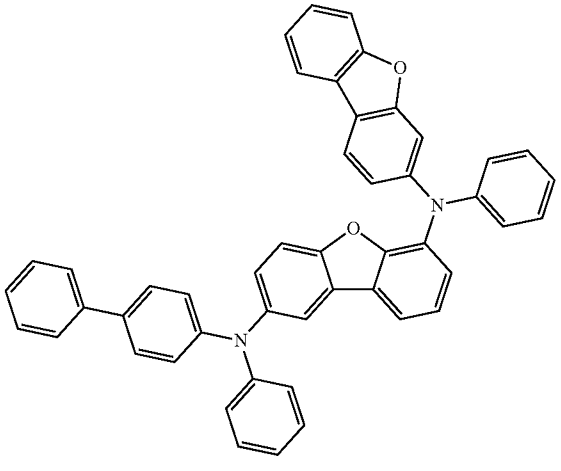
-continued
F-43
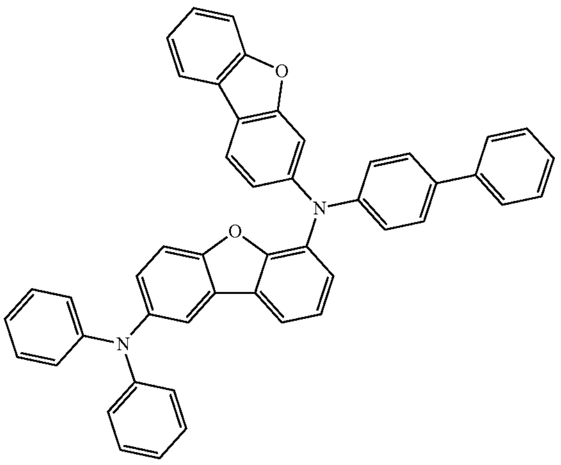
F-44
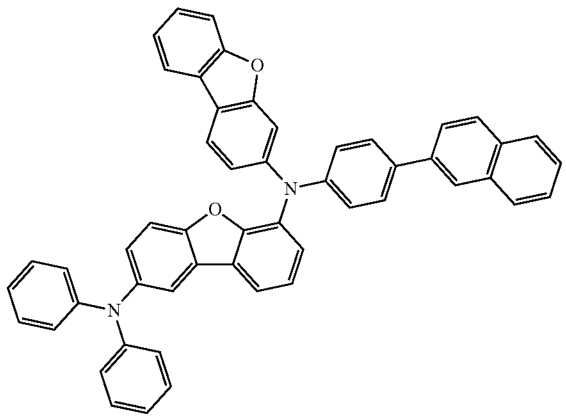
F-45
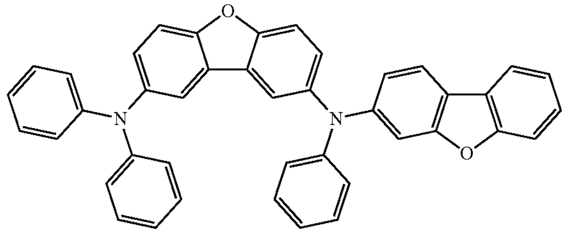
F-46
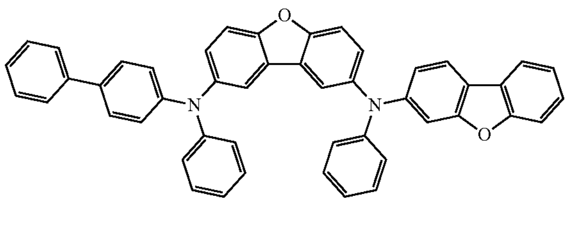

-continued
F-47
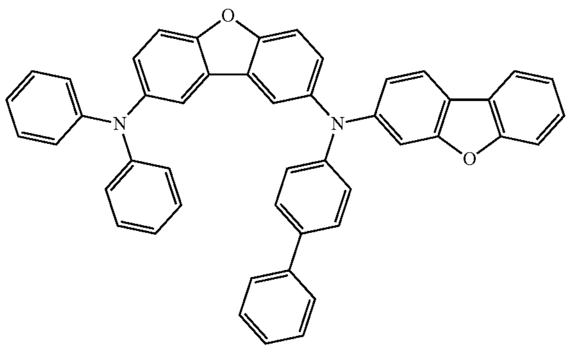
F-48
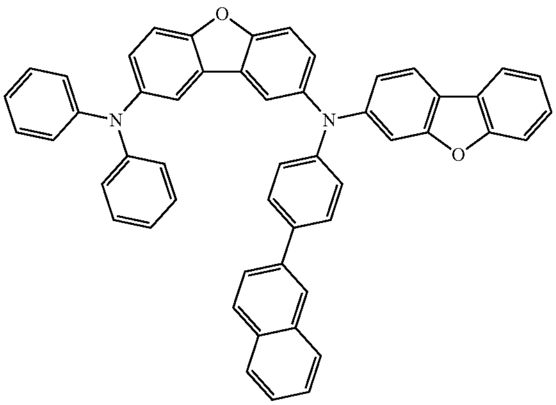
F-49
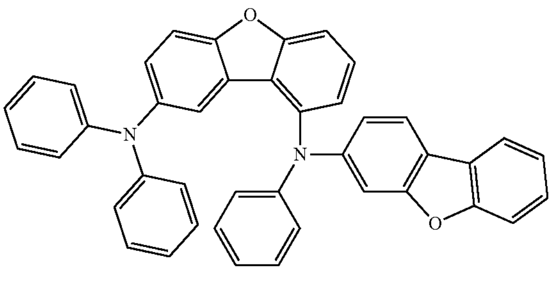
F-50
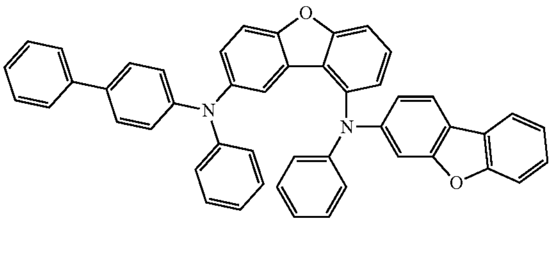
-continued
F-51
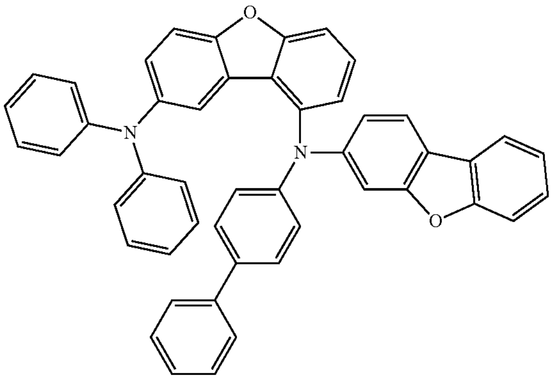
F-52
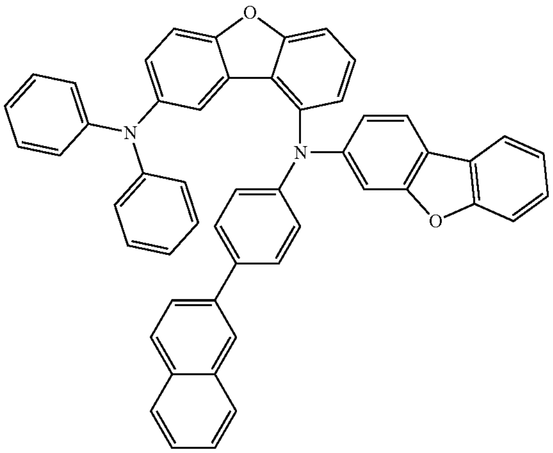
F-53
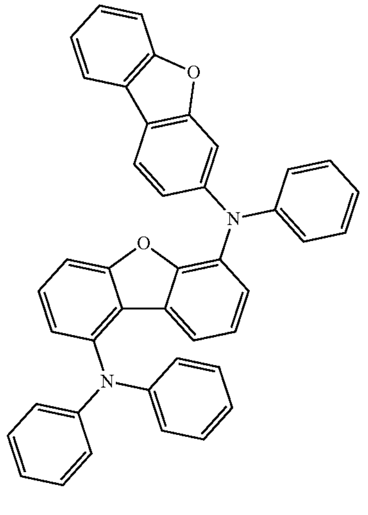

F-54
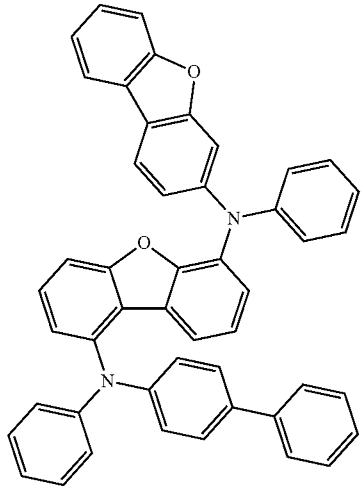
F-55
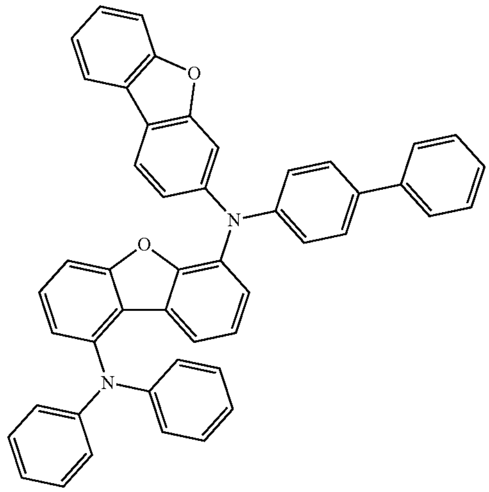
F-56
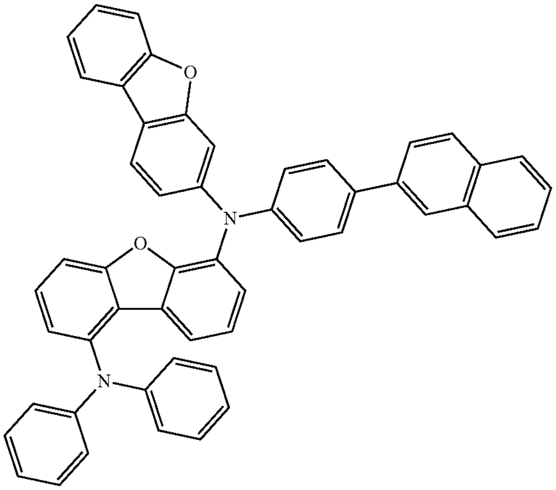
F-57
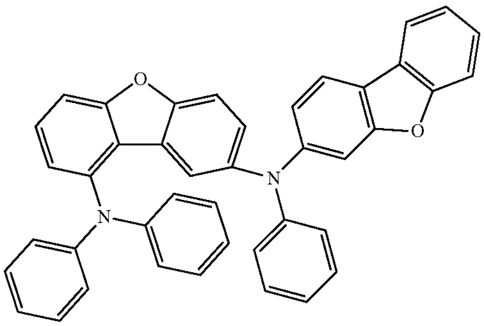
F-58
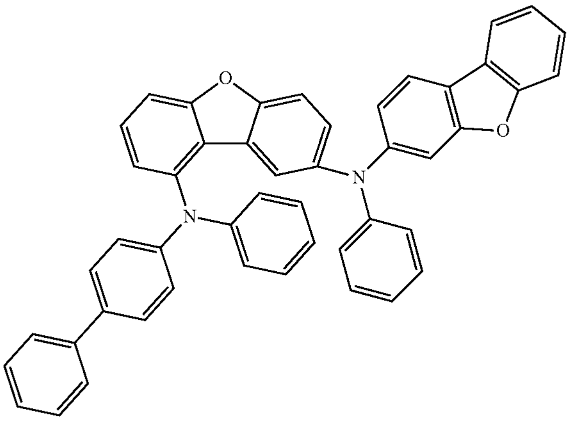
F-59
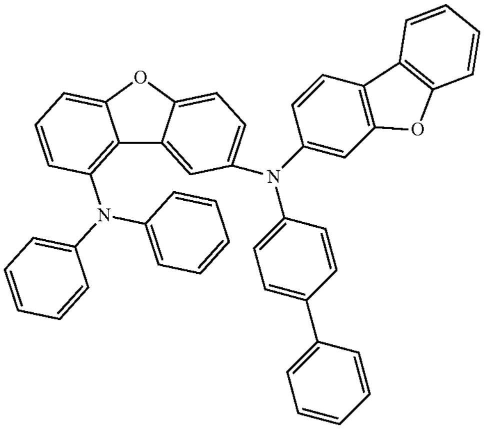

-continued
F-60
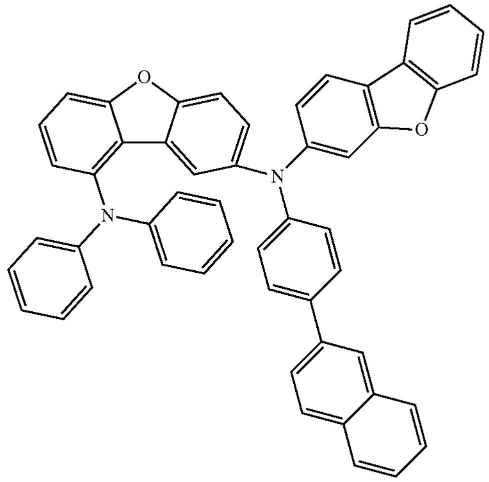
F-61
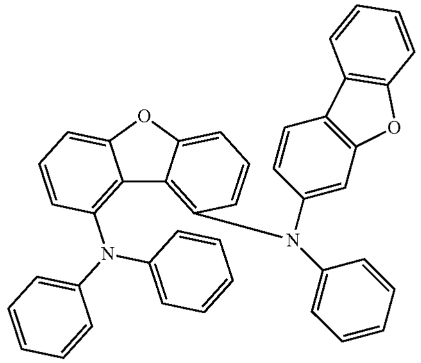
F-62
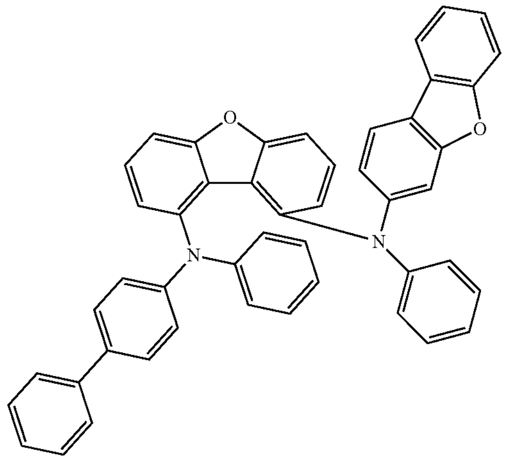
-continued
F-63
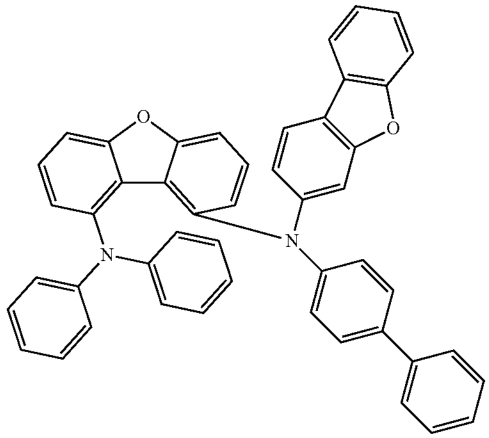
F-64
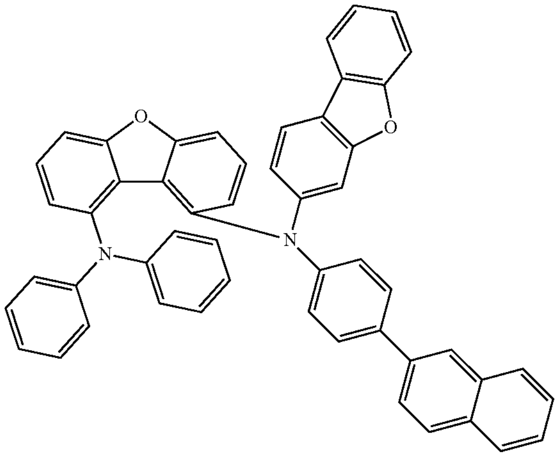
F-65
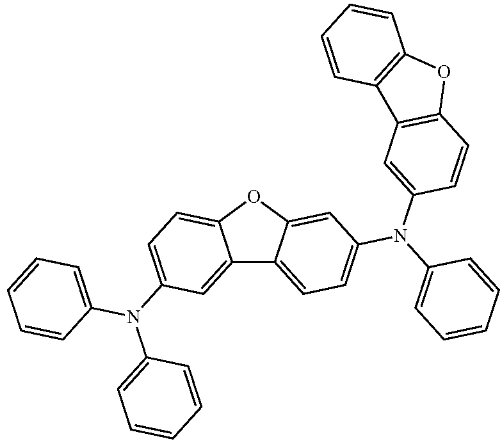

-continued
F-66
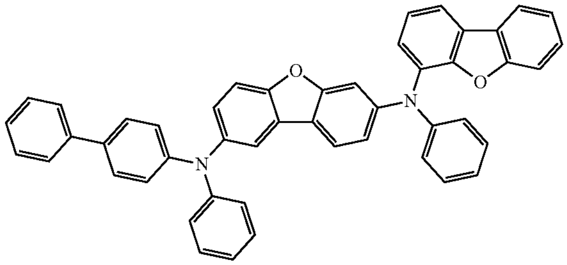
F-67
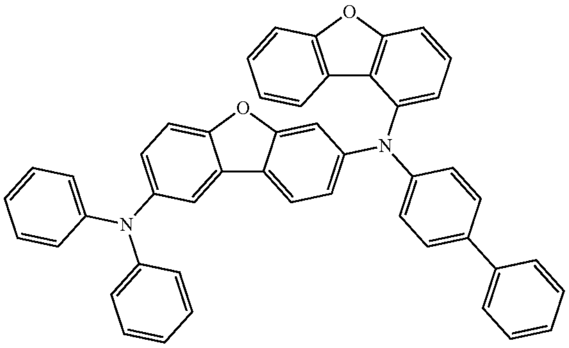
F-68
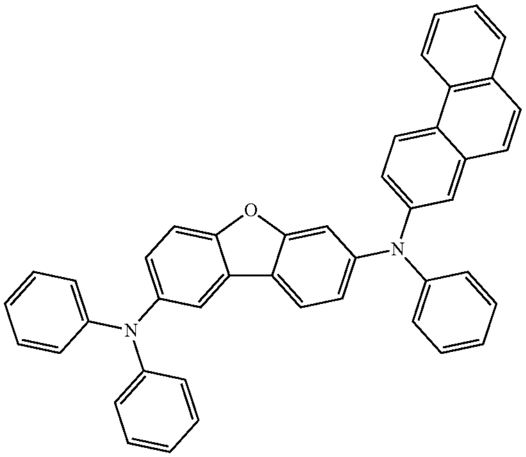
F-69
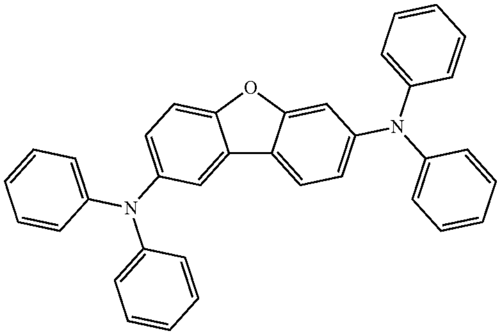
-continued
F-70
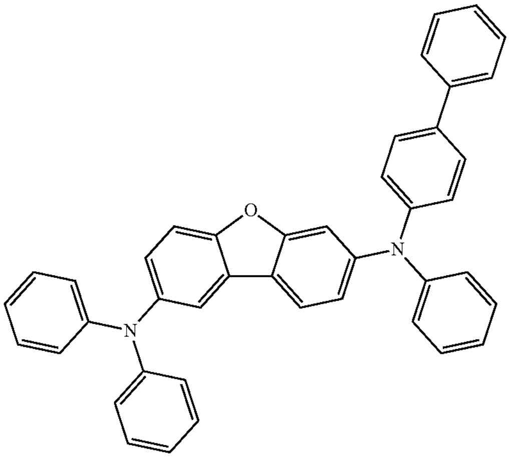
F-71
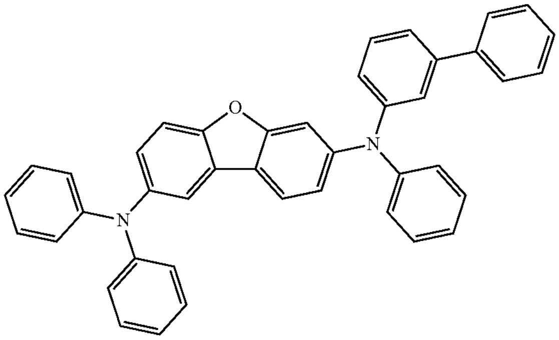
F-72
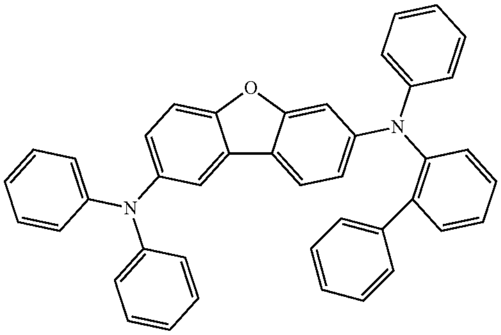
F-73
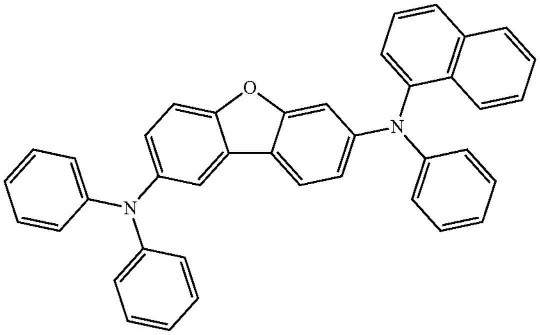

-continued
F-74
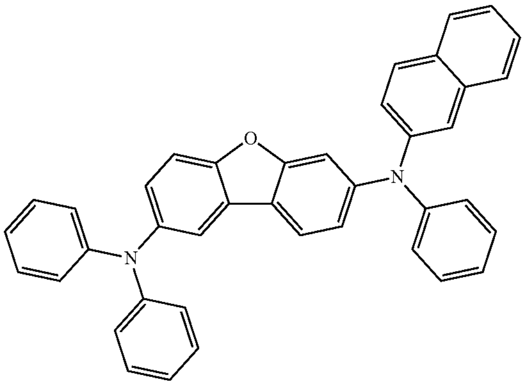
F-75
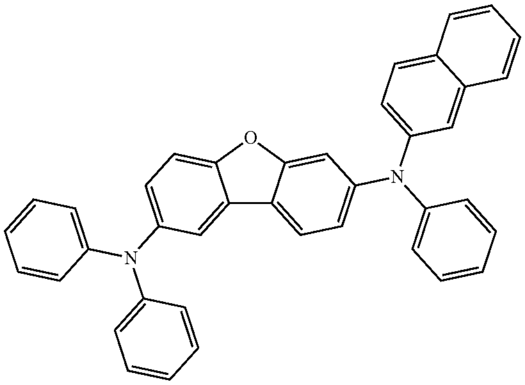
F-76
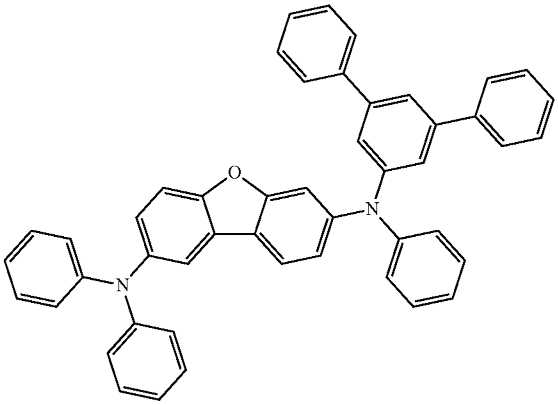
-continued
F-77
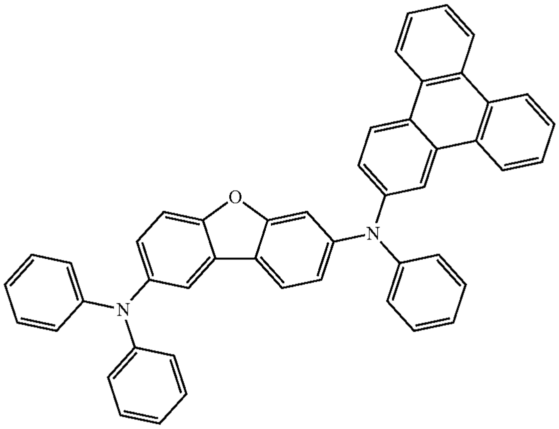
F-78
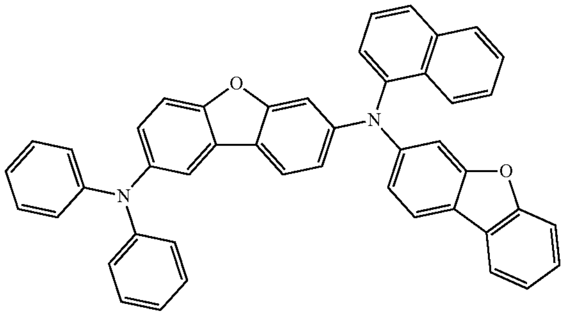
F-79
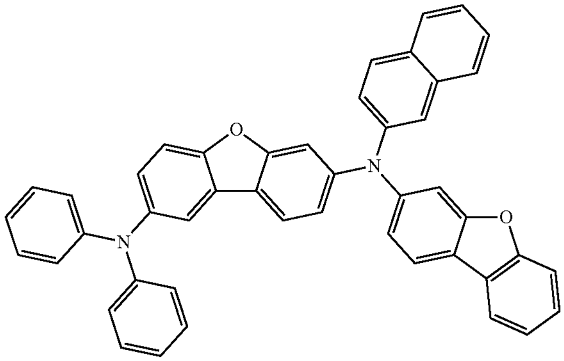
F-80
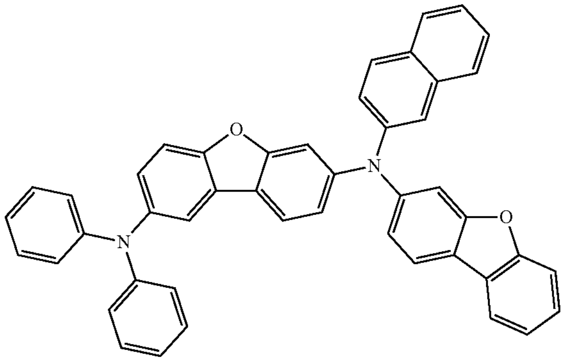

-continued
F-81
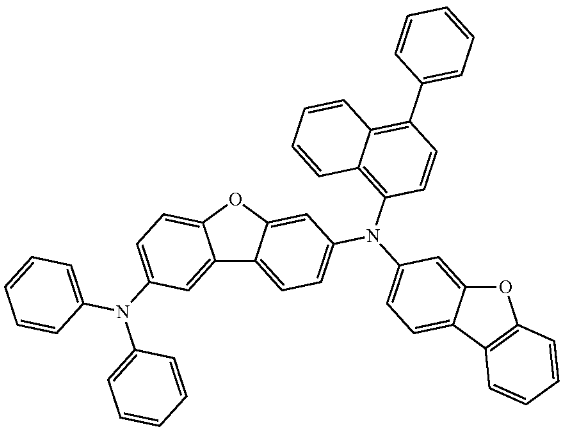
F-82
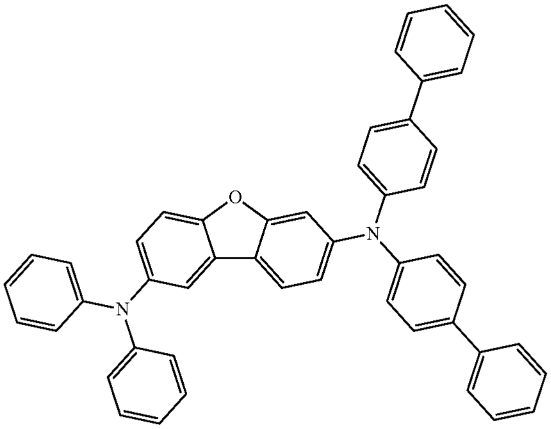
F-83
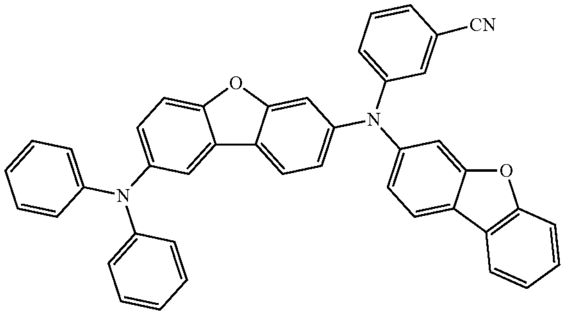
F-84
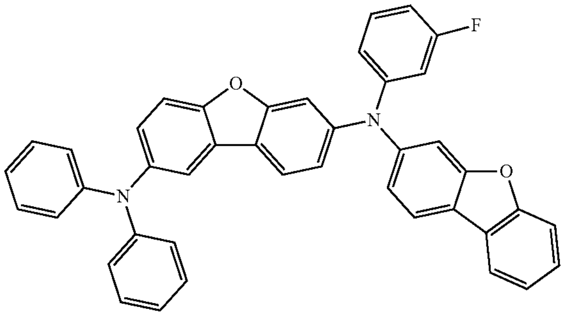
-continued
F-85
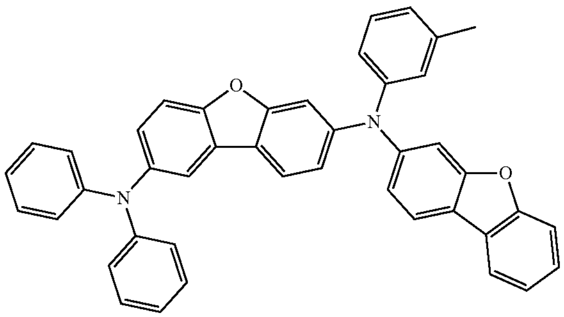
F-86
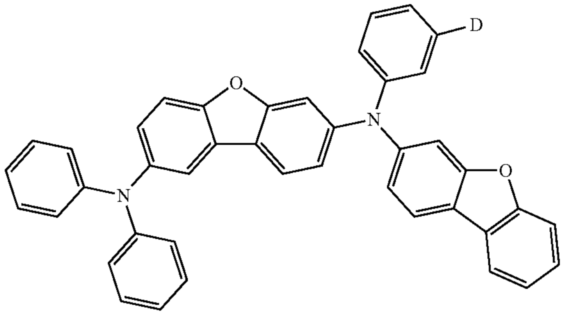
F-87
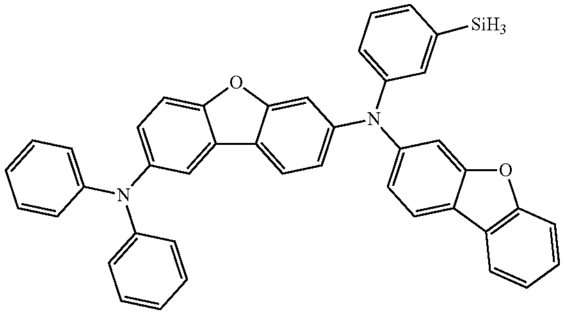
F-88
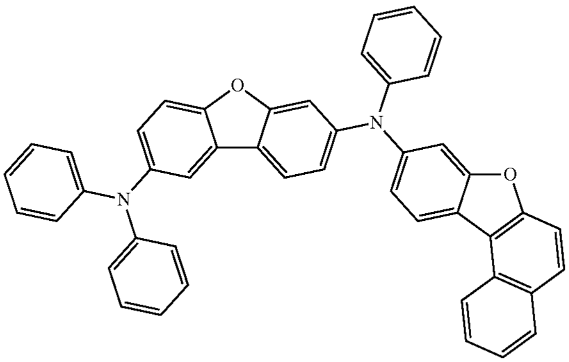

-continued
F-89
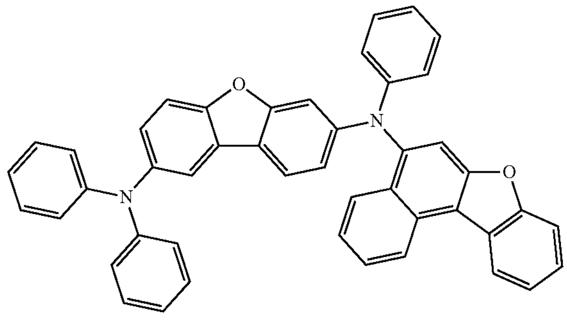
F-90
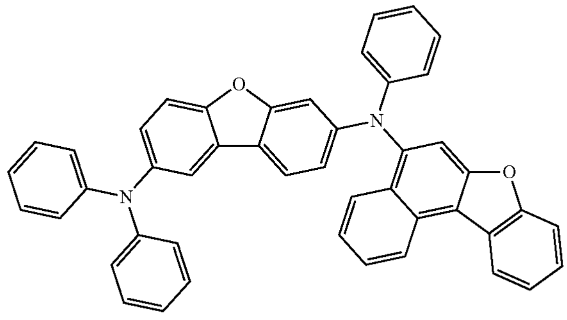
F-91
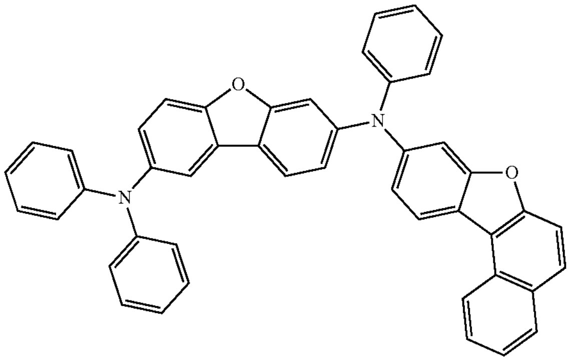
F-92
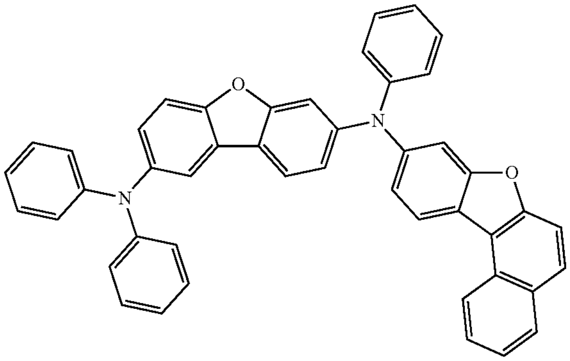
-continued
F-93
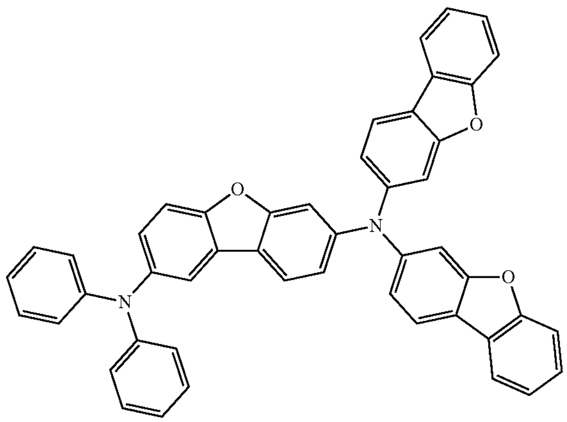
F-94
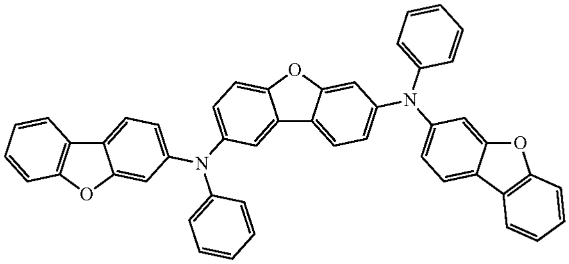
F-95
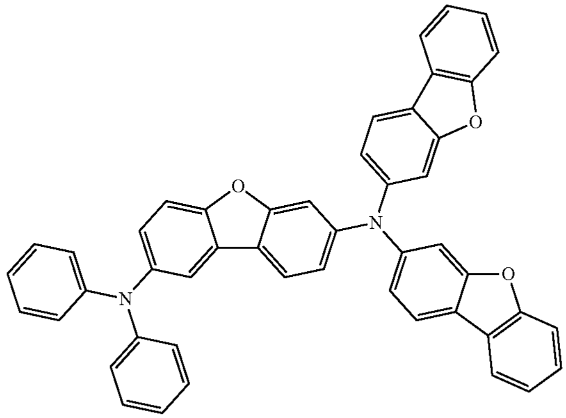
F-96
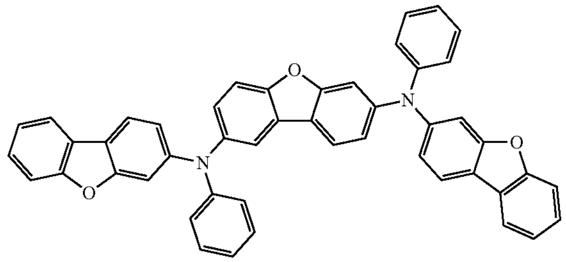

-continued
G-1
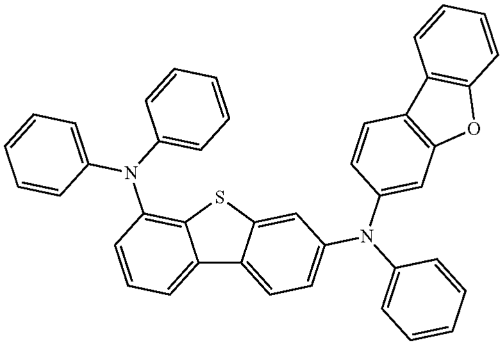
G-2
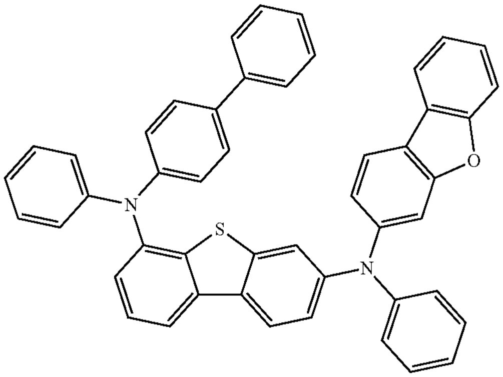
G-3
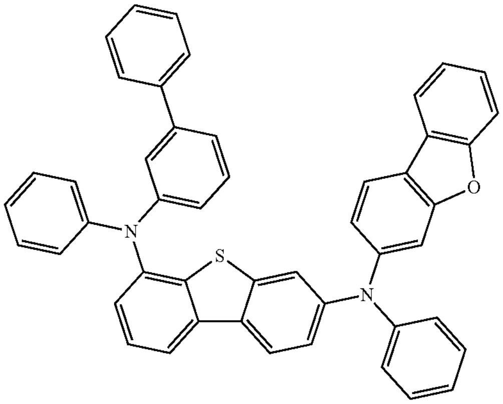
G-4
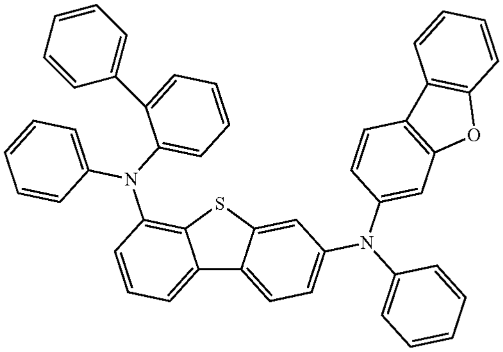
-continued
G-5
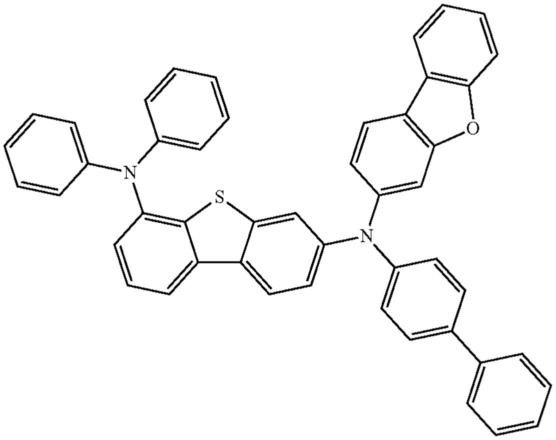
G-6
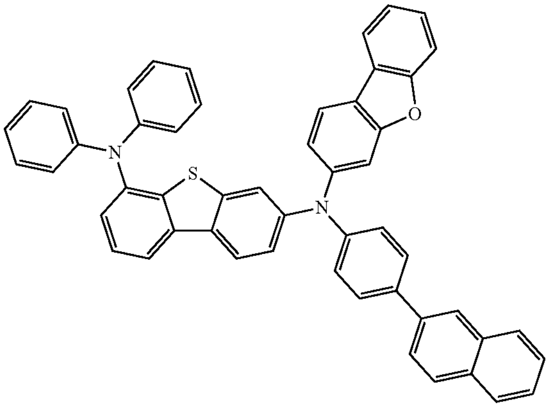
G-7
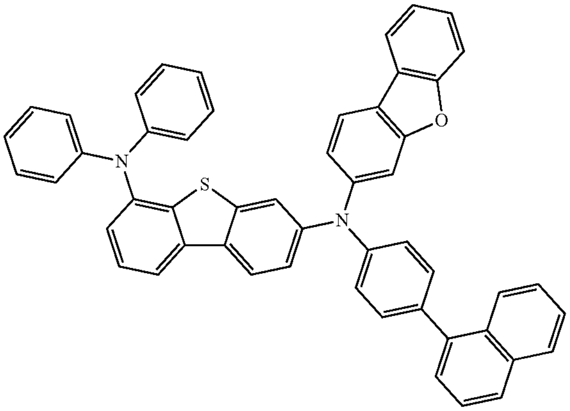

-continued
G-8
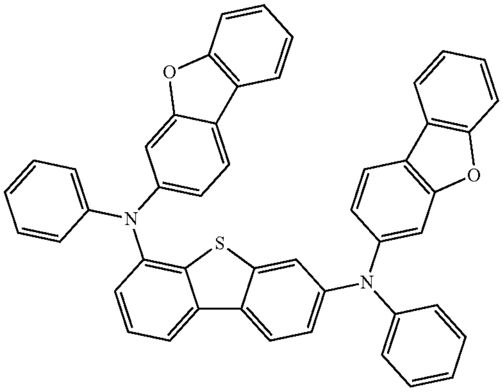
G-9
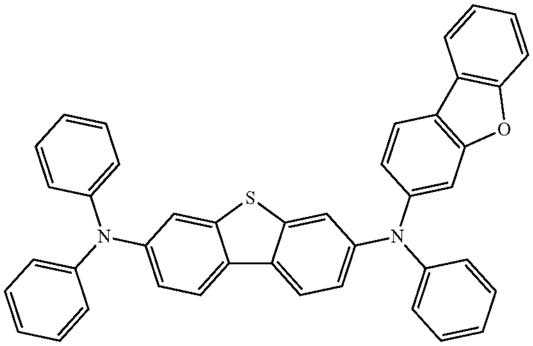
G-10
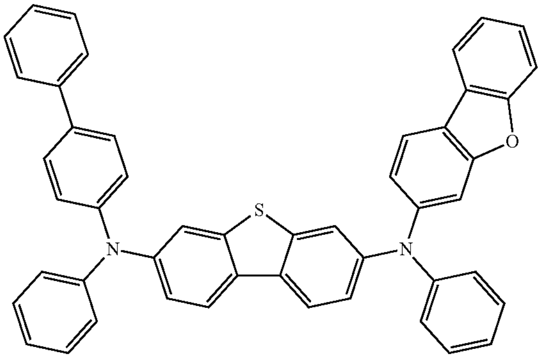
G-11
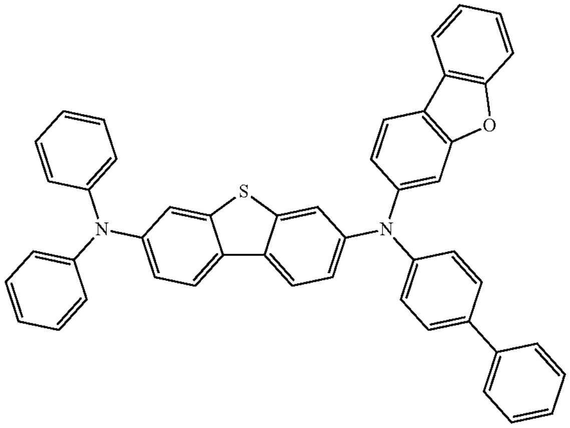
-continued
G-12
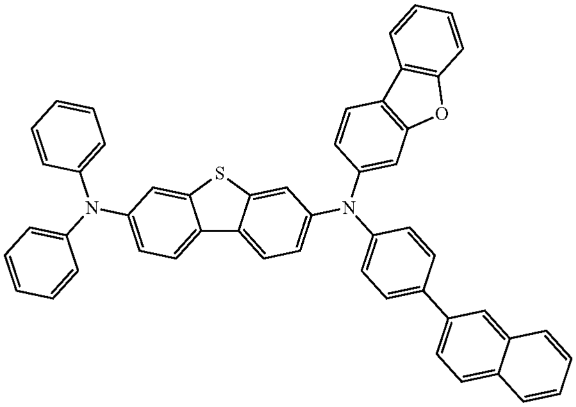
G-13
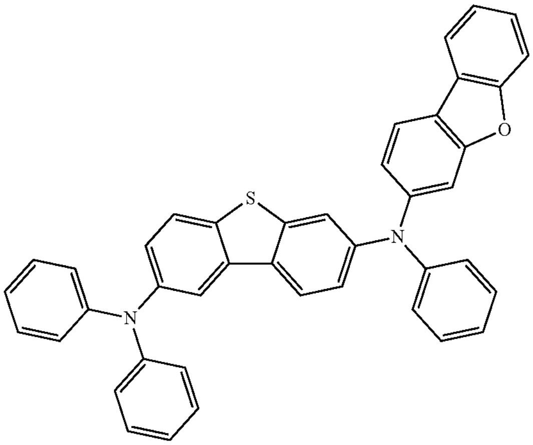
G-14
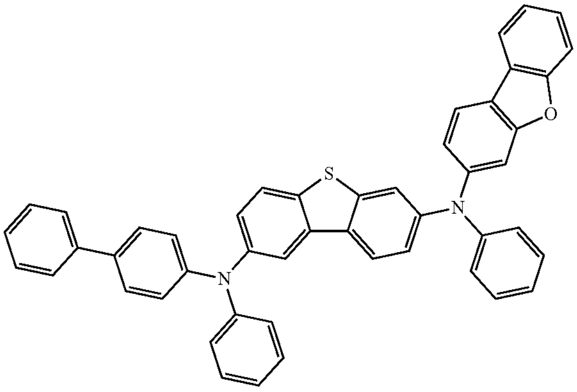

-continued
G-15
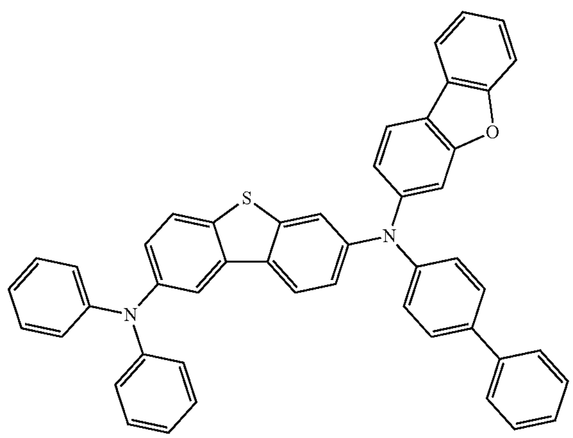
G-16
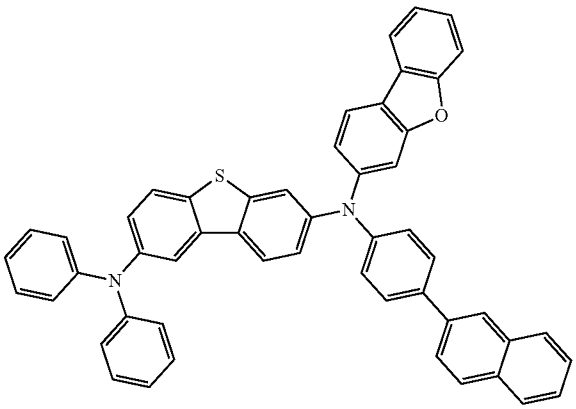
G-17
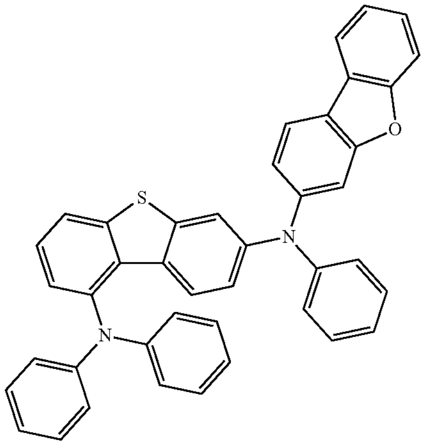
-continued
G-18
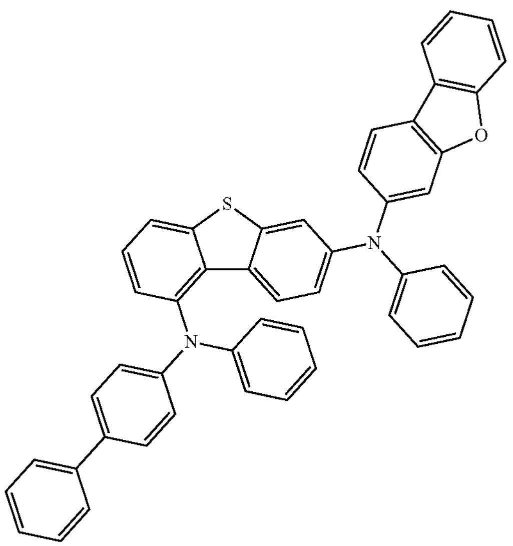
G-19
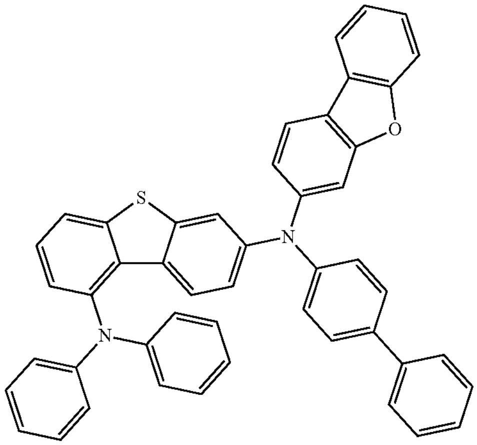
G-20
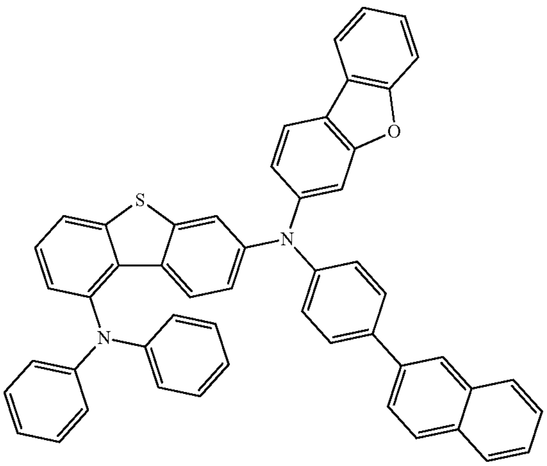

-continued
G-21
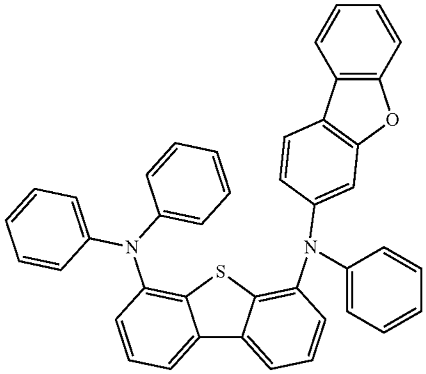
G-22
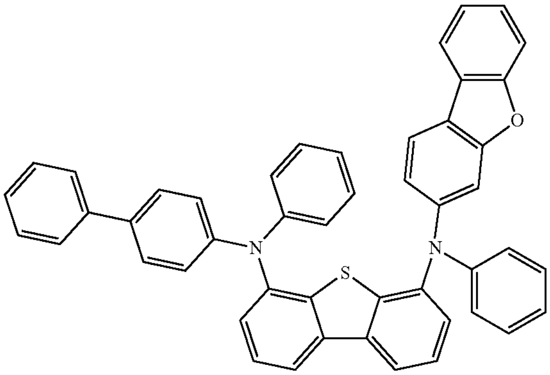
G-23
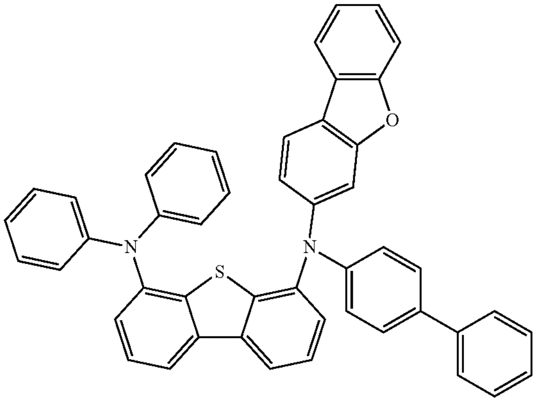
G-24
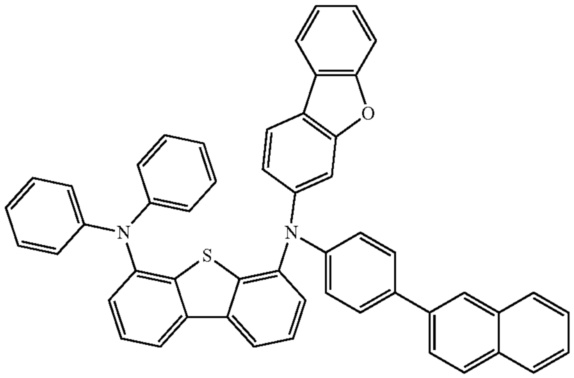
-continued
G-25
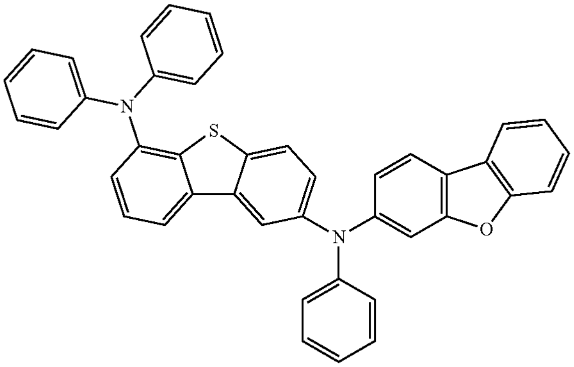
G-26
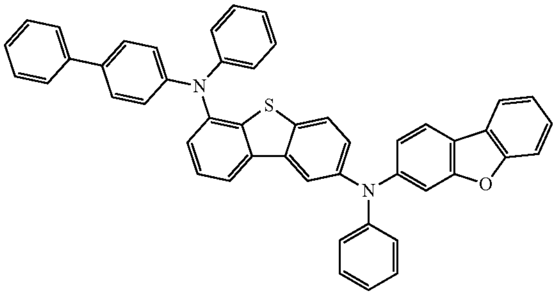
G-27
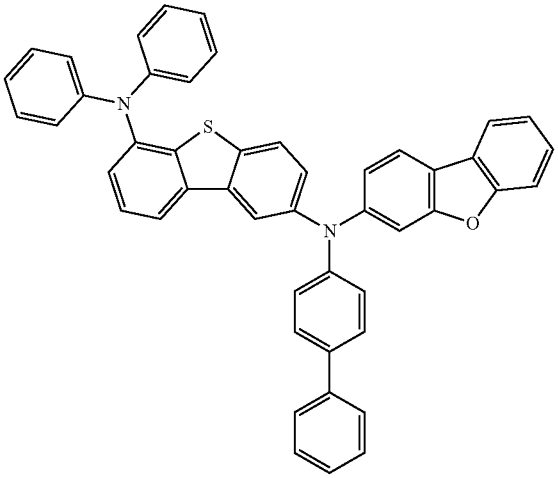

-continued
G-28
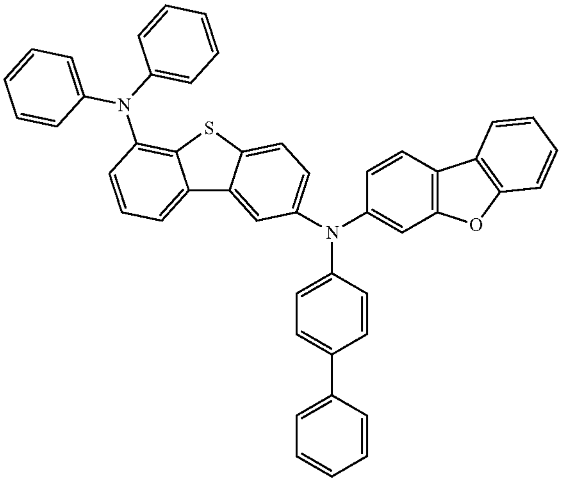
G-29
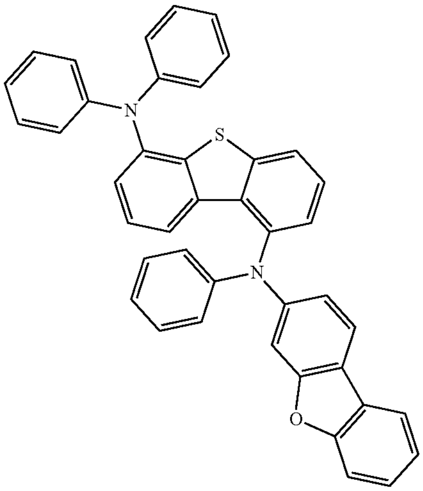
G-30
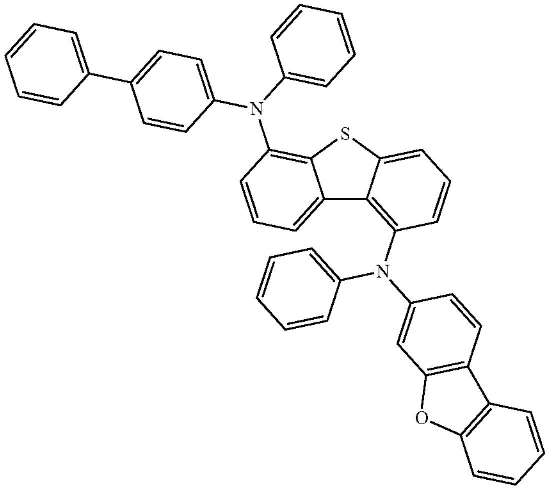
-continued
G-31
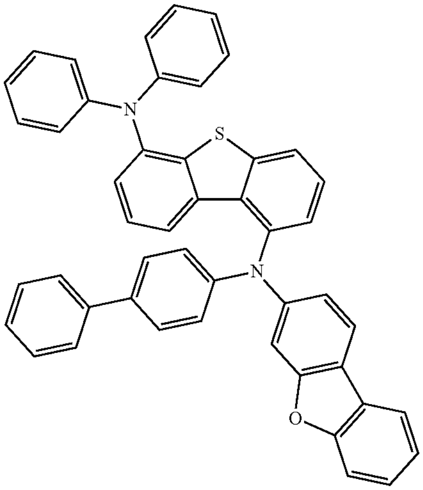
G-32
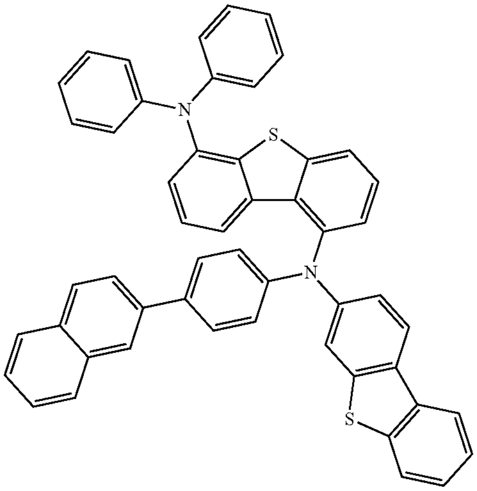
G-33
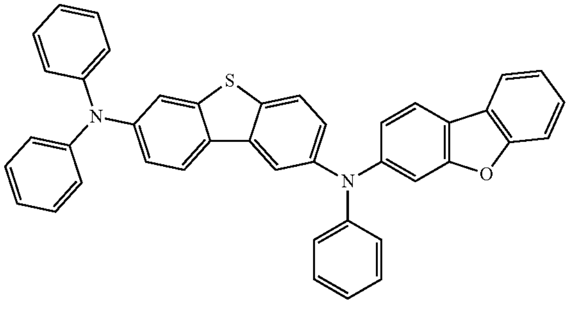

-continued
G-34
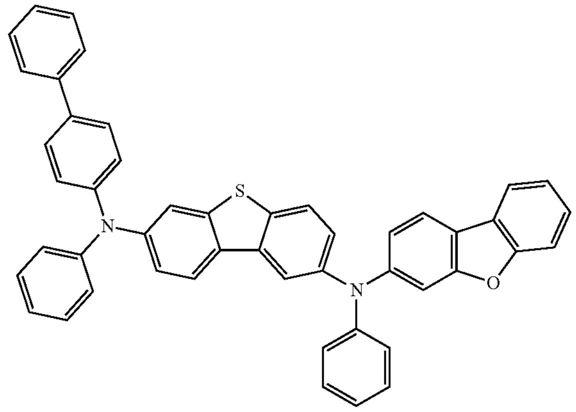
G-35
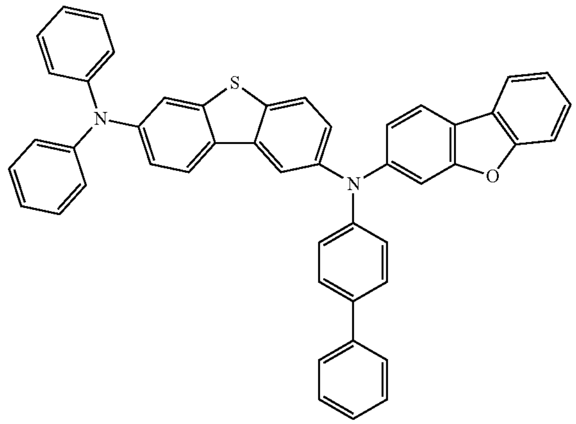
G-36
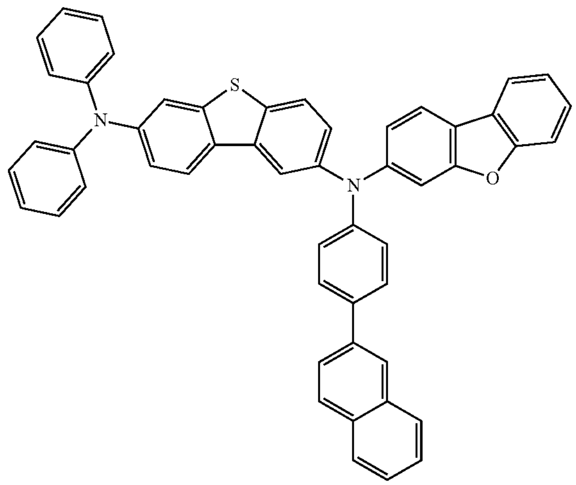
-continued
G-37
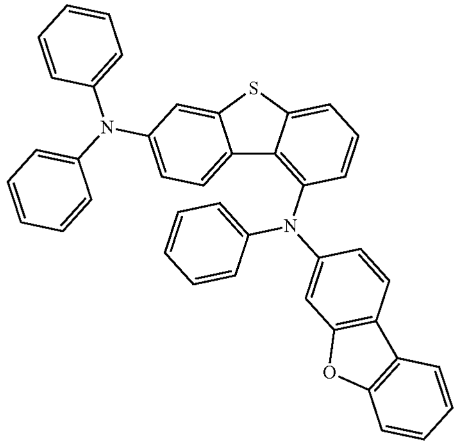
G-38
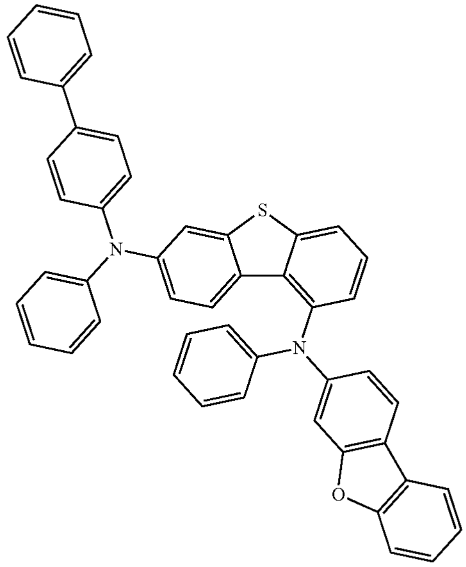
G-39
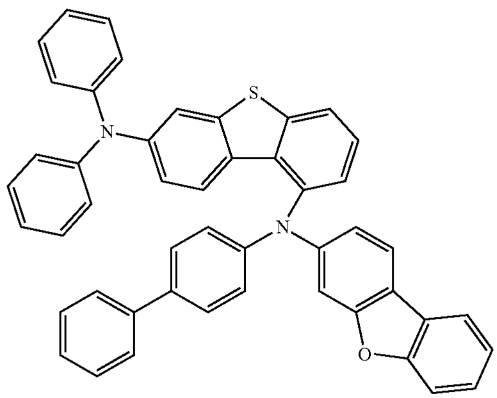

-continued
G-40
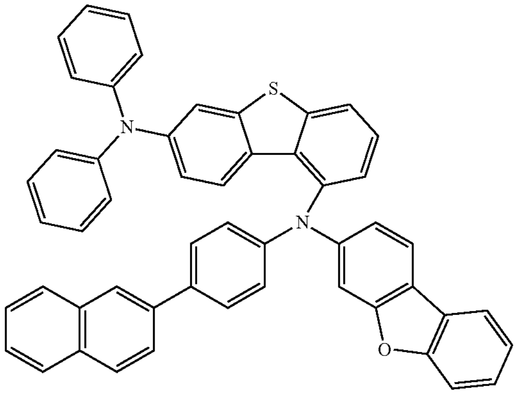
G-41
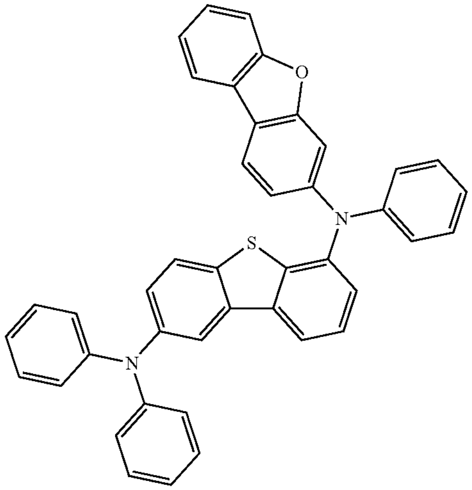
G-42
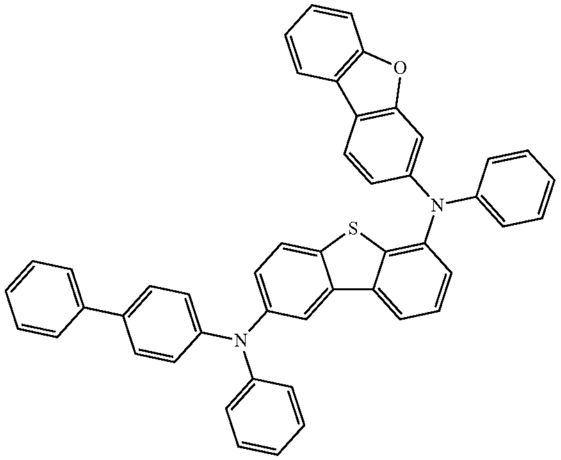
-continued
G-43
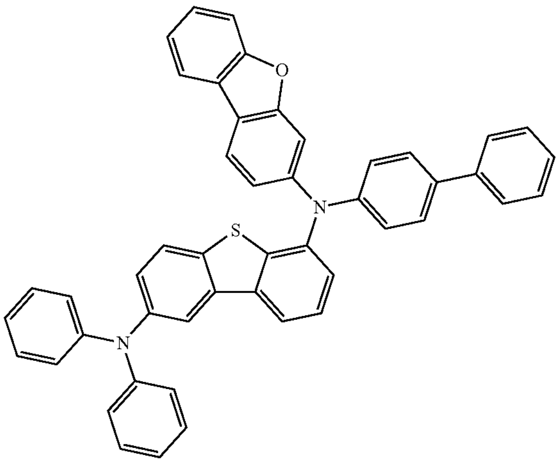
G-44
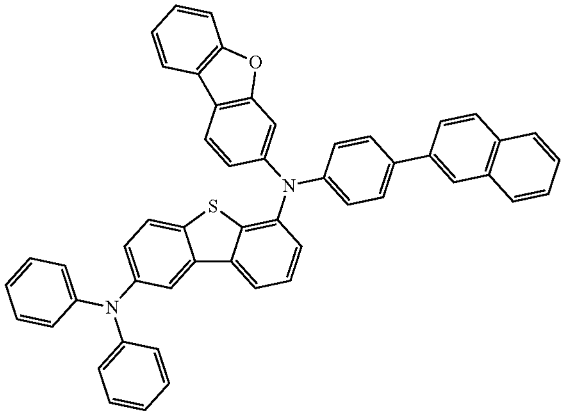
G-45
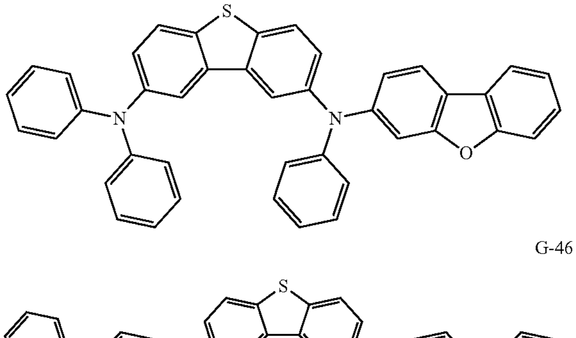
G-46
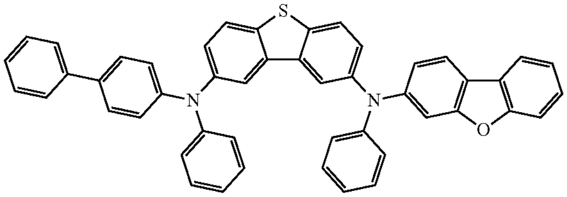

-continued
G-47
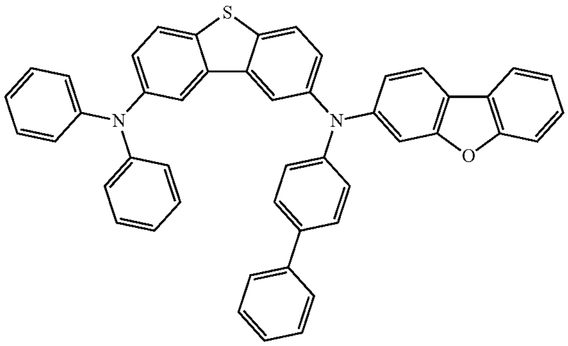
G-48
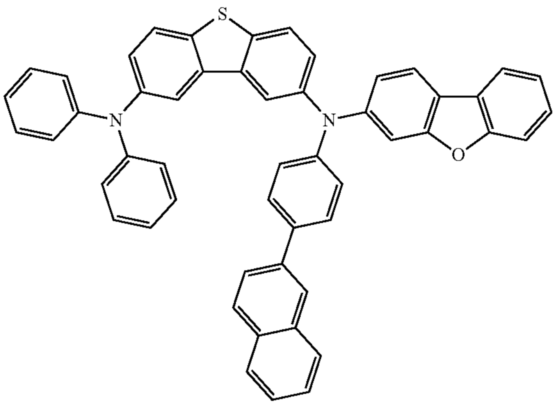
G-49
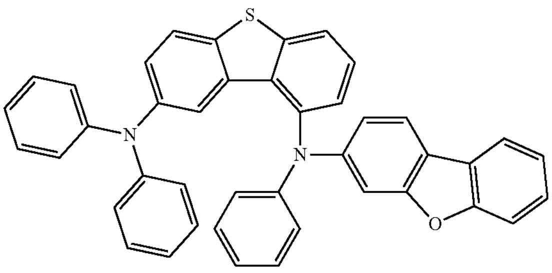
G-50
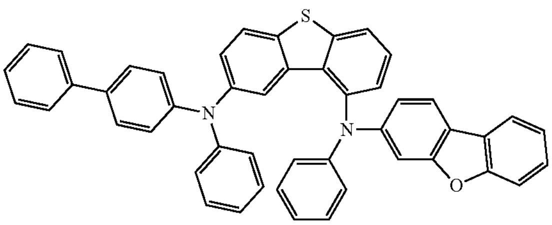
-continued
G-51
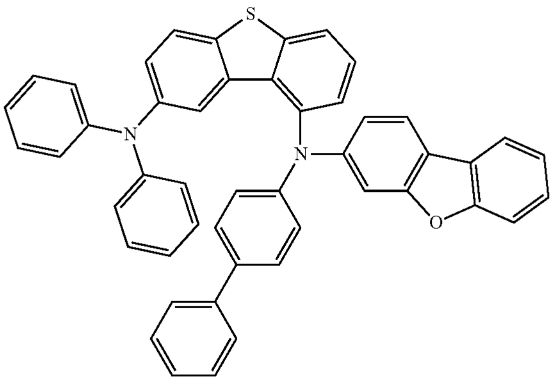
G-52
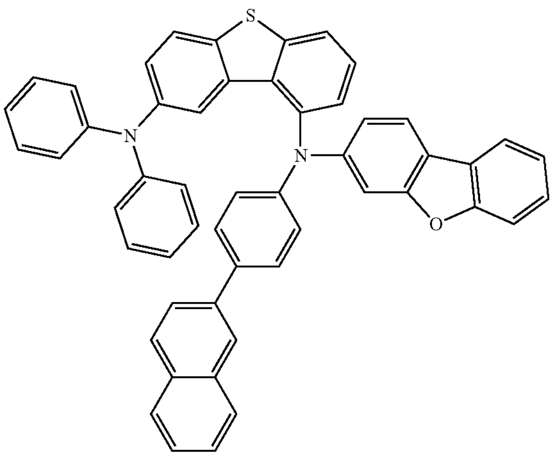
G-53
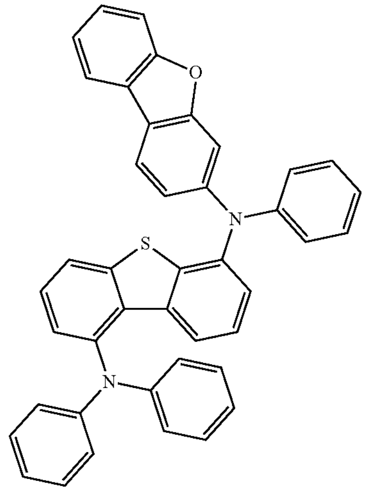

-continued
G-54
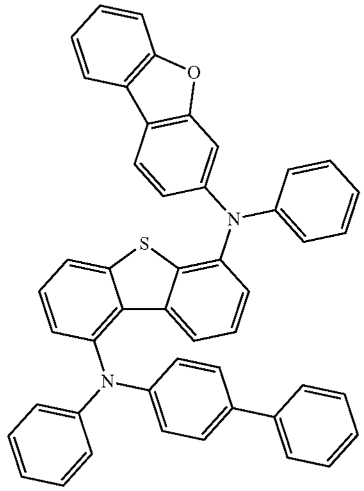
G-55
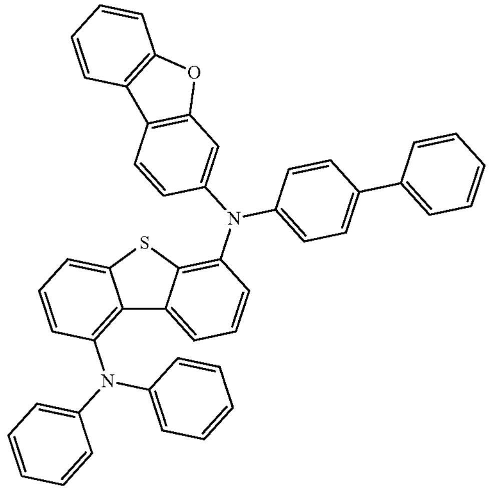
G-56
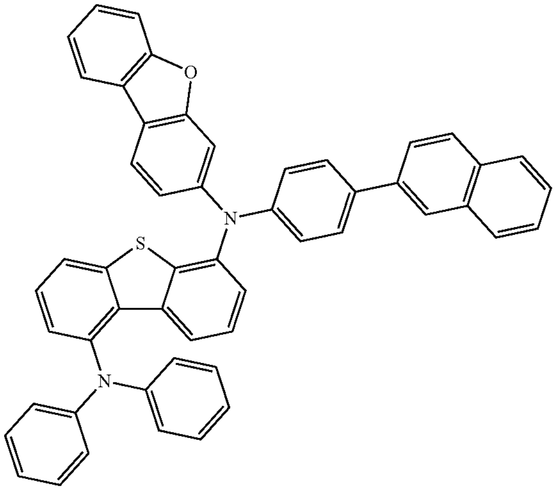
-continued
G-57
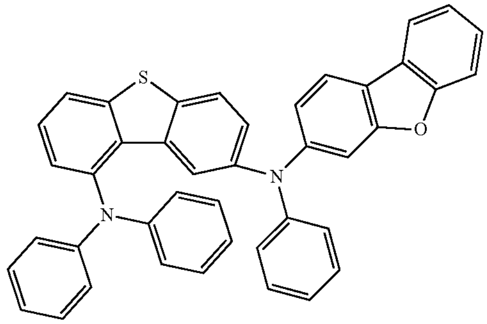
G-58
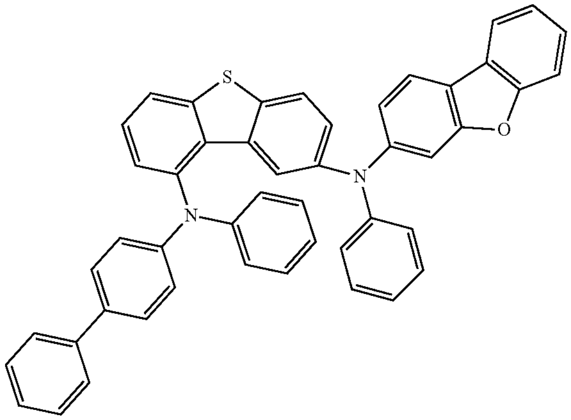
G-59
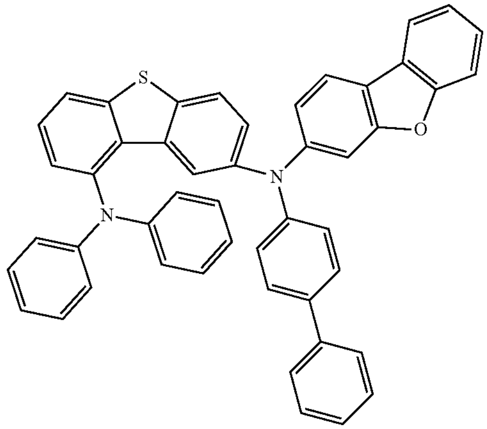

-continued
G-60
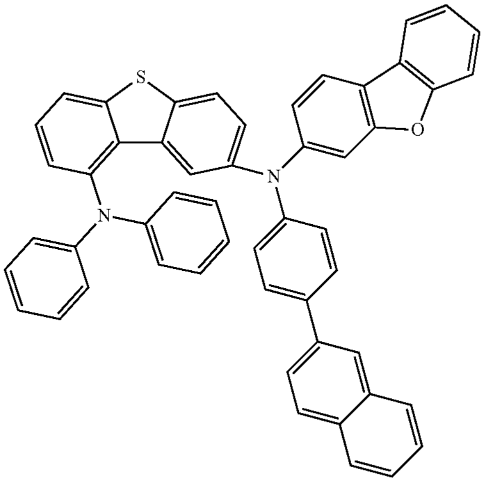
G-61
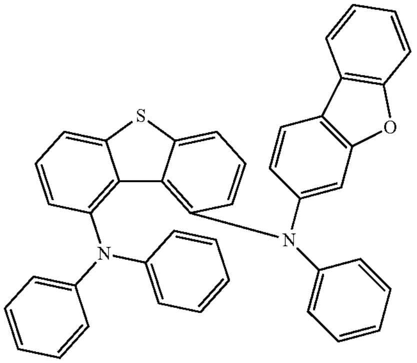
G-62
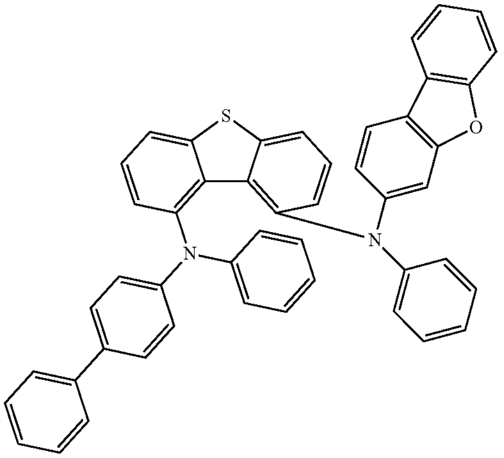
-continued
G-63
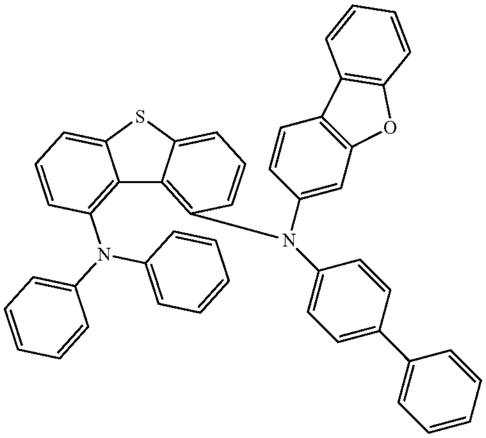
G-64
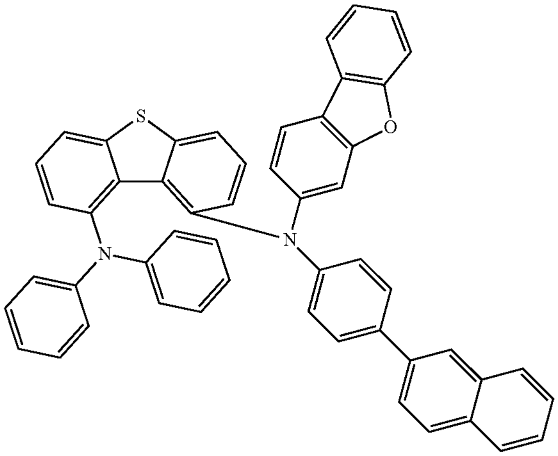
H-1
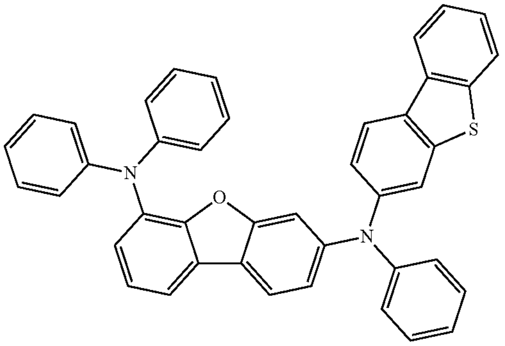

-continued
H-2
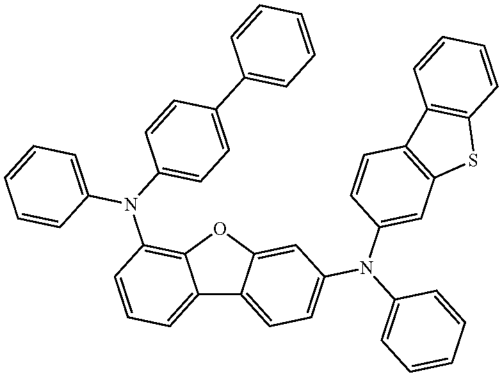
H-3
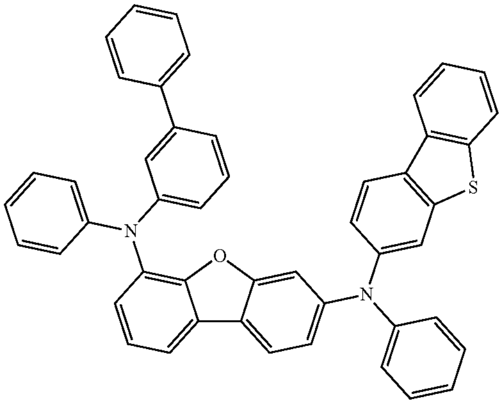
H-4
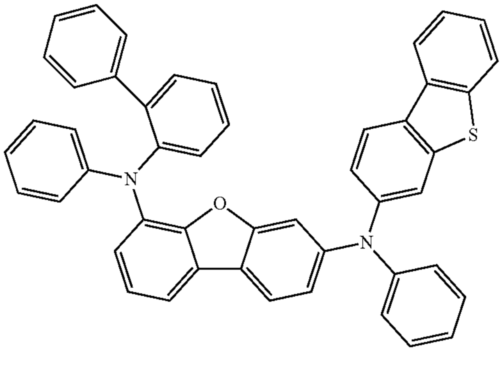
-continued
H-5
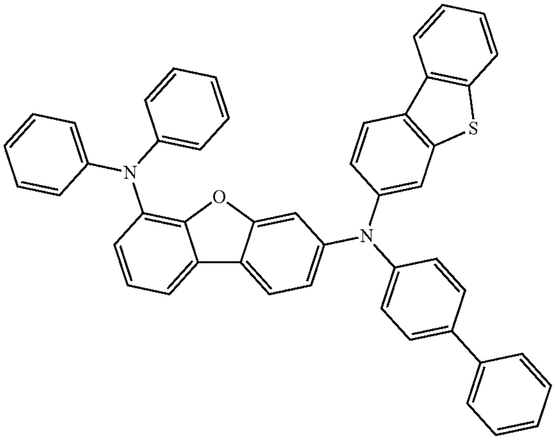
H-6
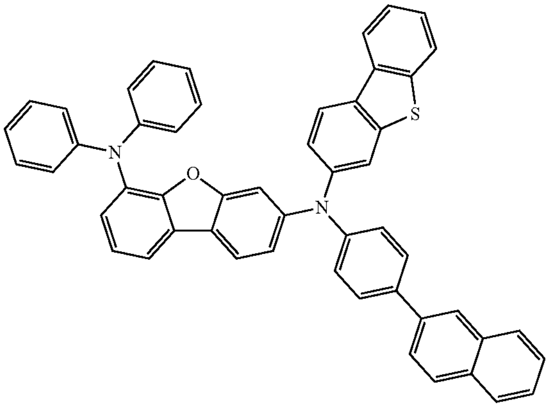
H-7
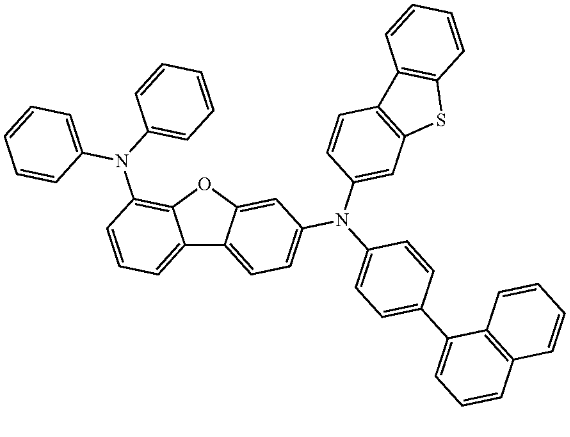

-continued
H-8
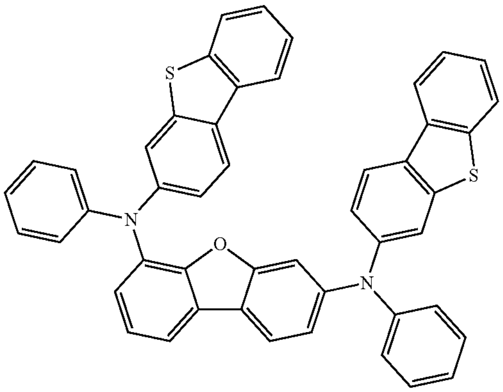
H-9
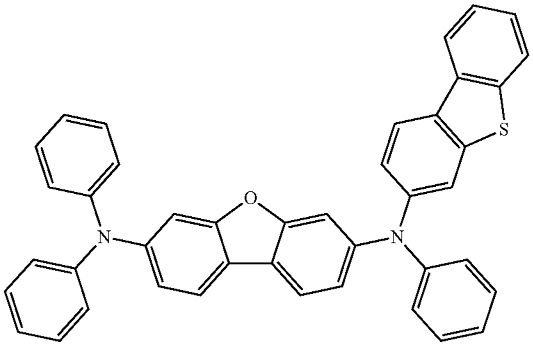
H-10
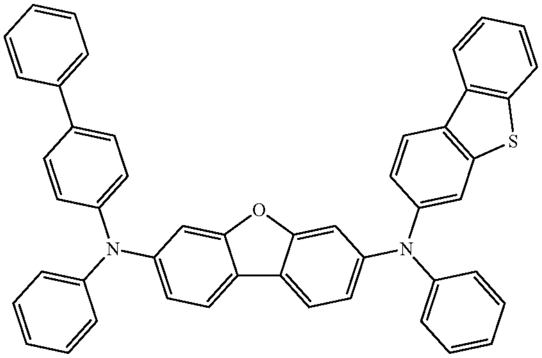
H-11
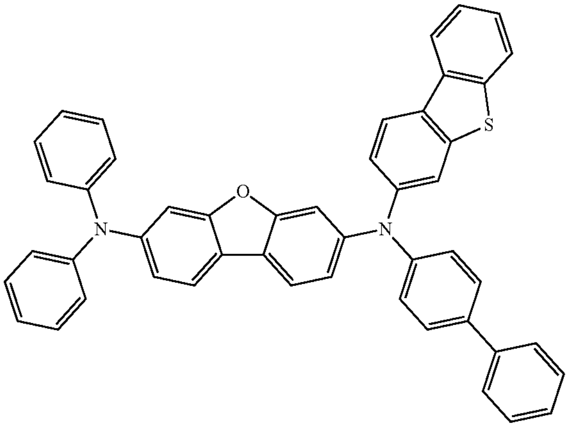
-continued
H-12
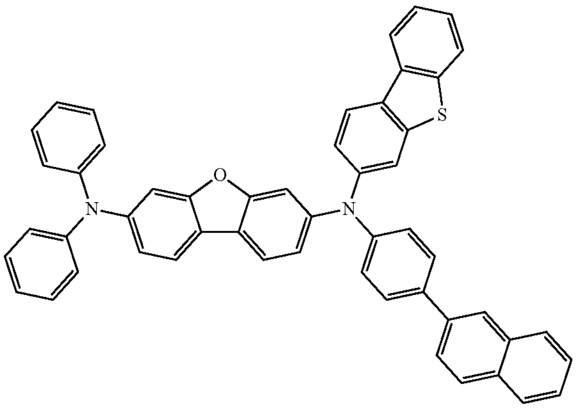
H-13
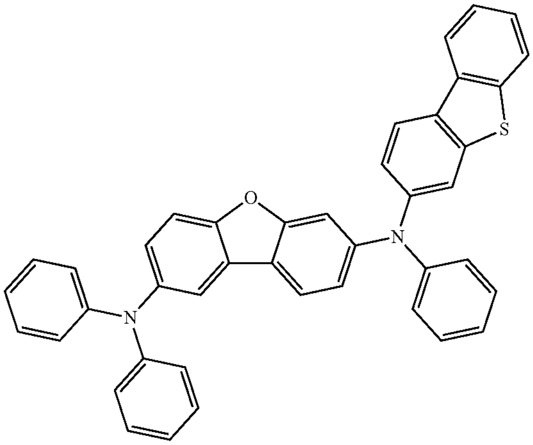
H-14
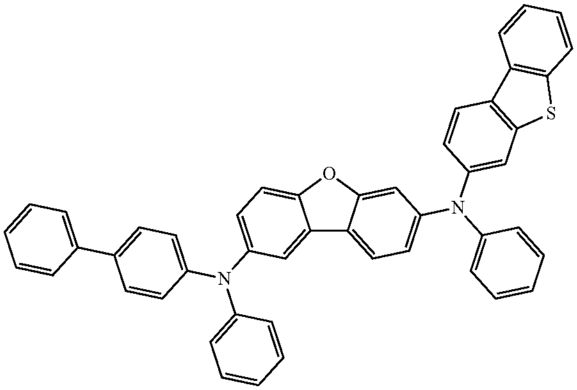

-continued
H-15
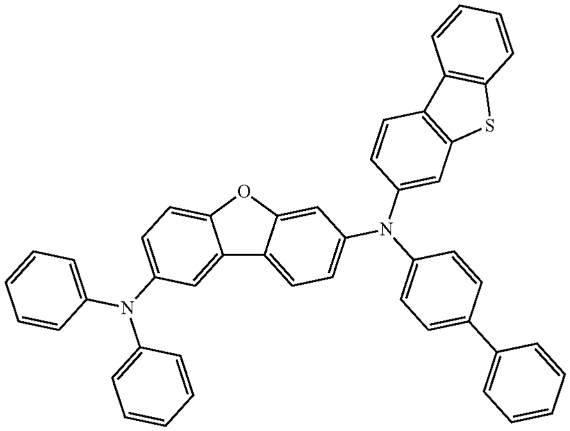
H-16
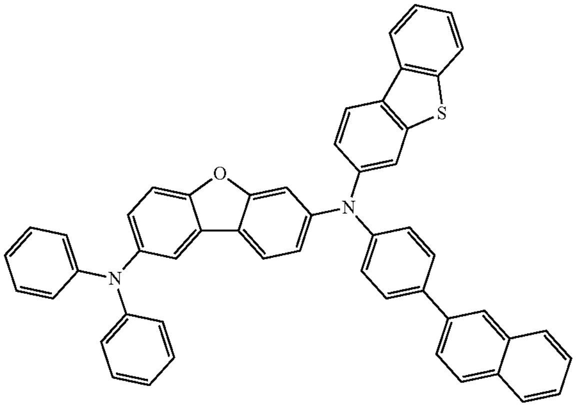
H-17
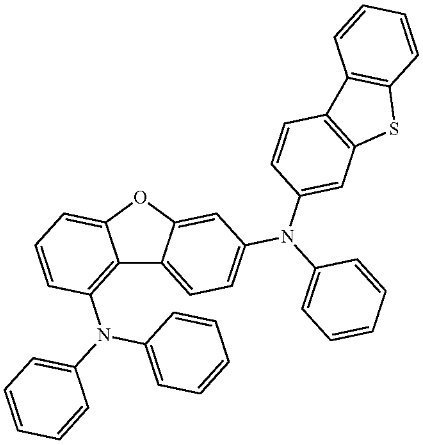
-continued
H-18
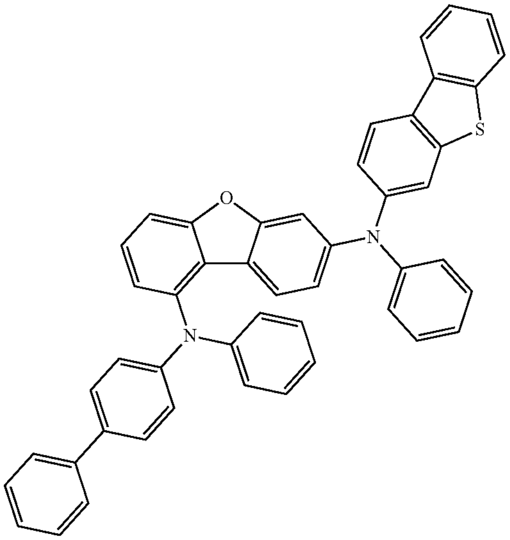
H-19
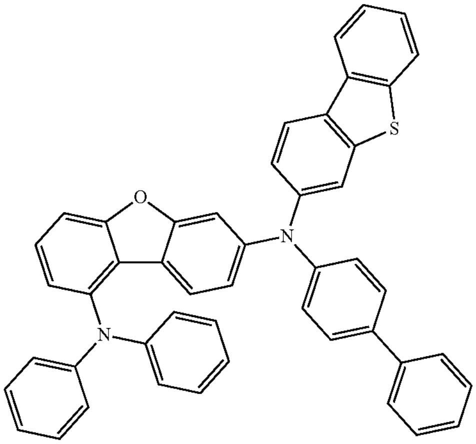
H-20
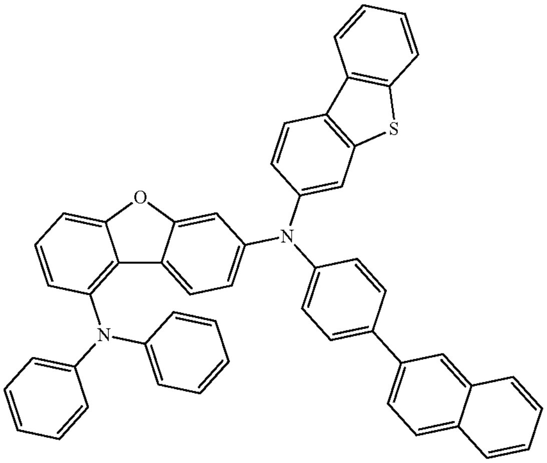

H-21
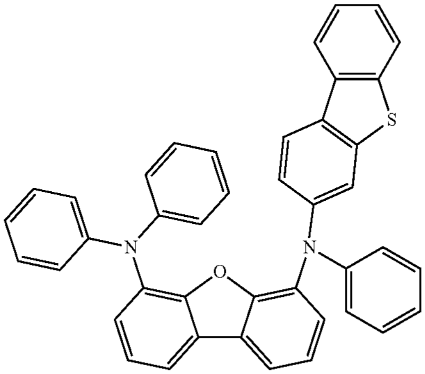
H-22
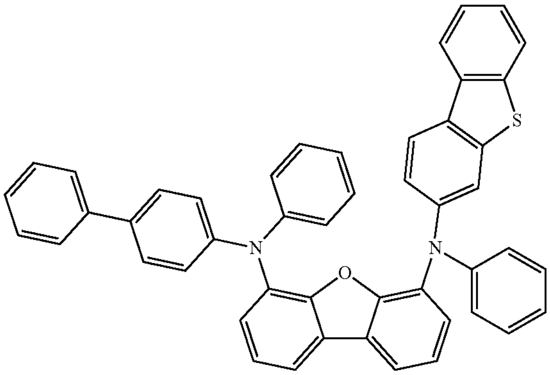
H-23
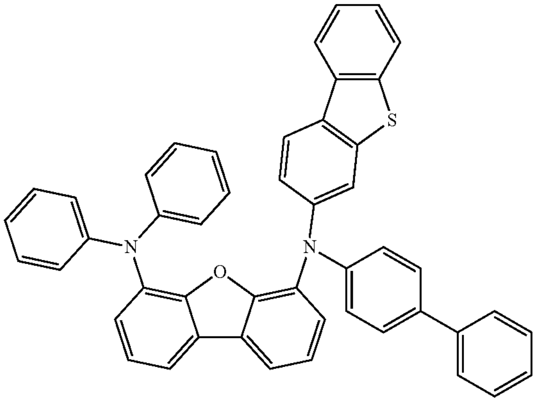
H-24
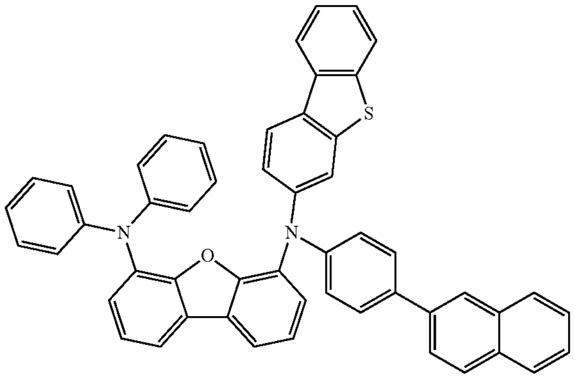
H-25
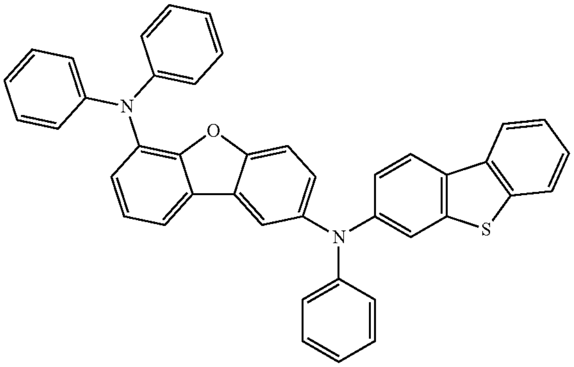
H-26
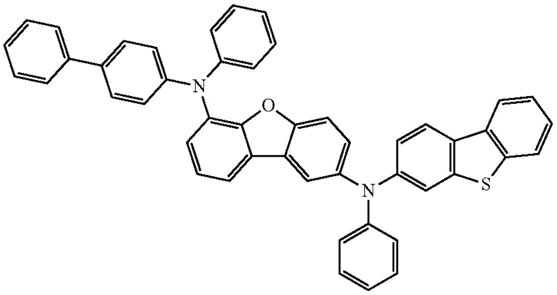
H-27
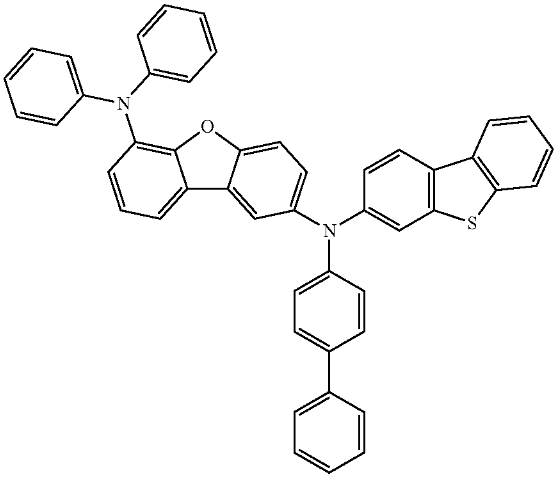

-continued
H-28
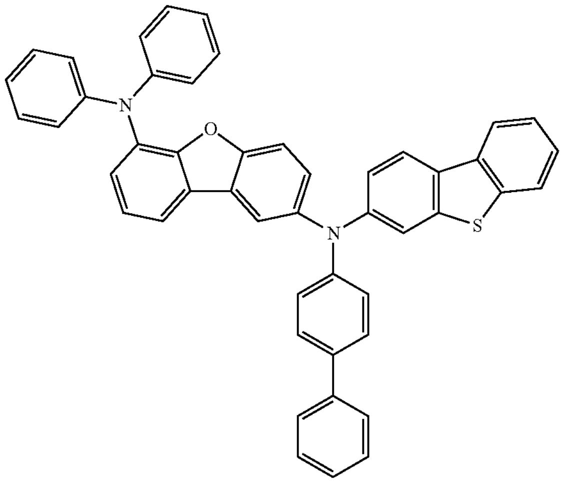
H-29
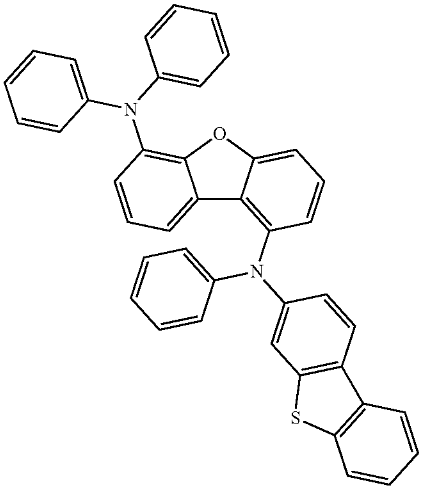
H-30
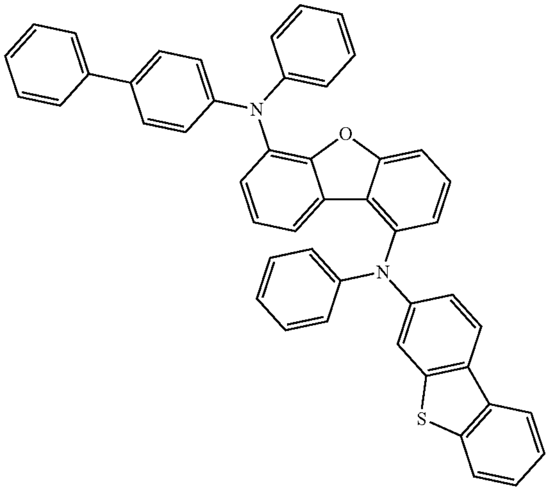
-continued
H-31
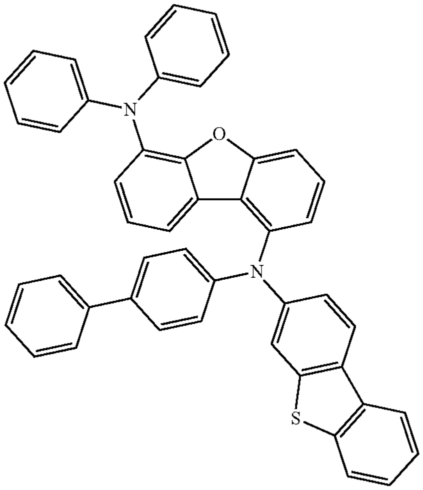
H-32
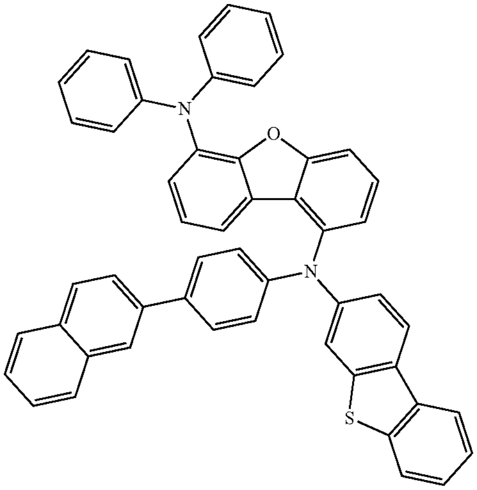
H-33
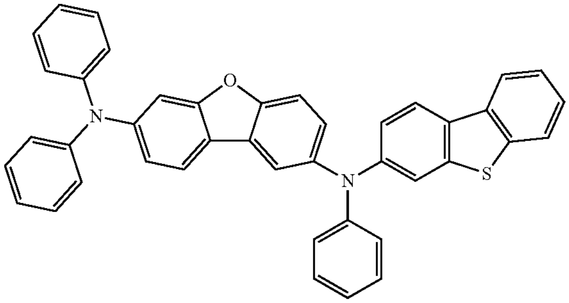

-continued
H-34
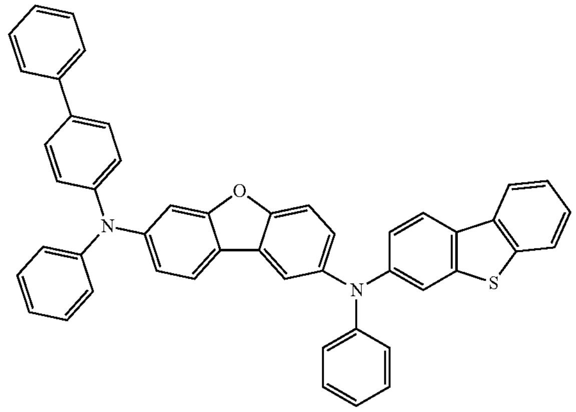
H-35
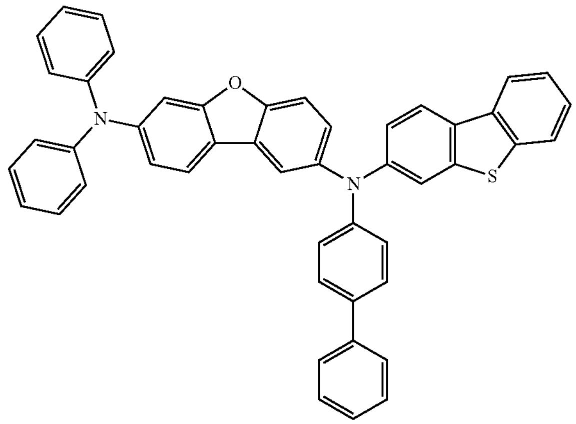
H-36
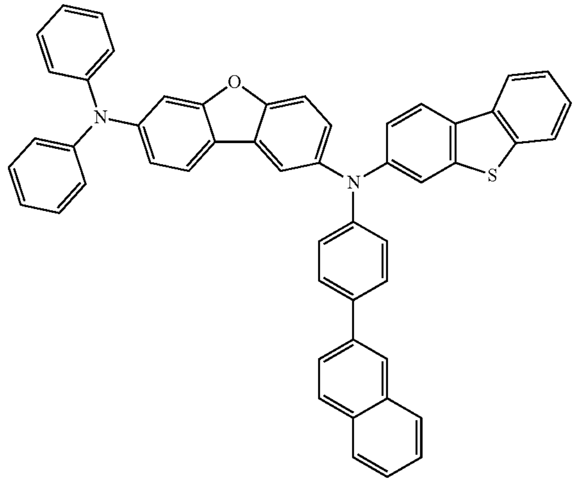
-continued
H-37
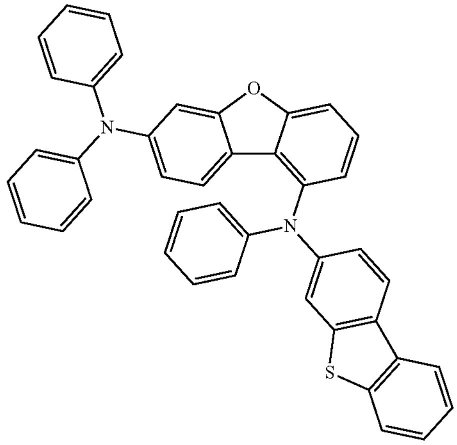
H-38
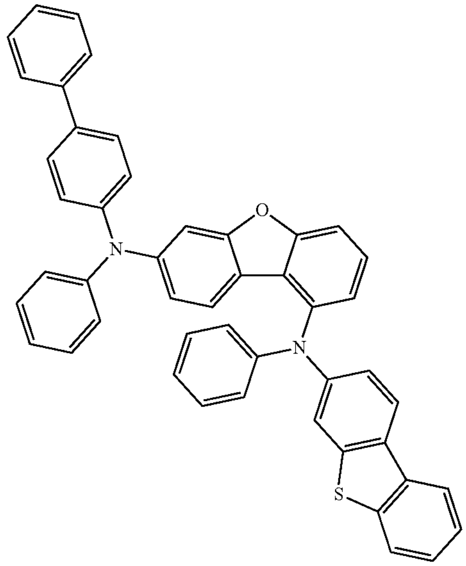
H-39
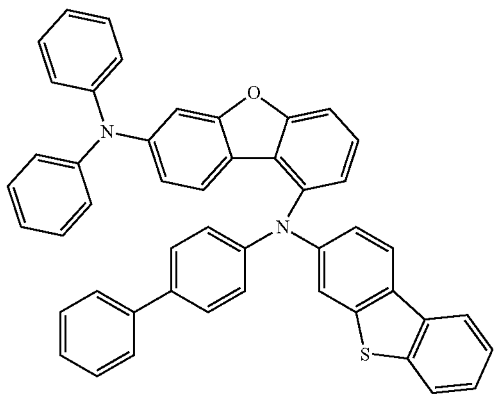

-continued
H-40
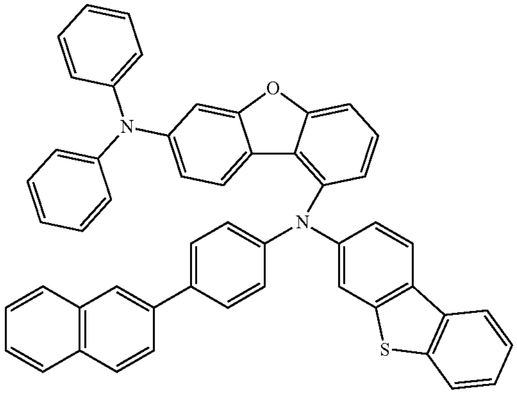
H-41
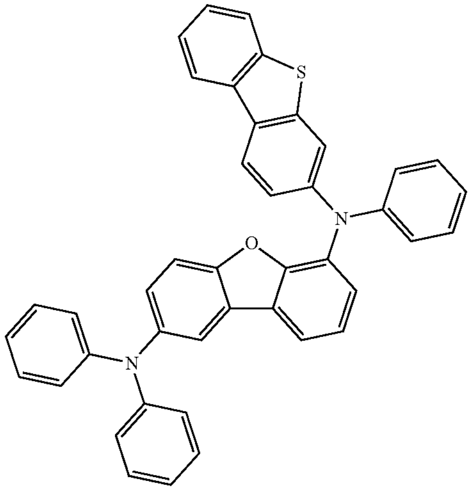
H-42
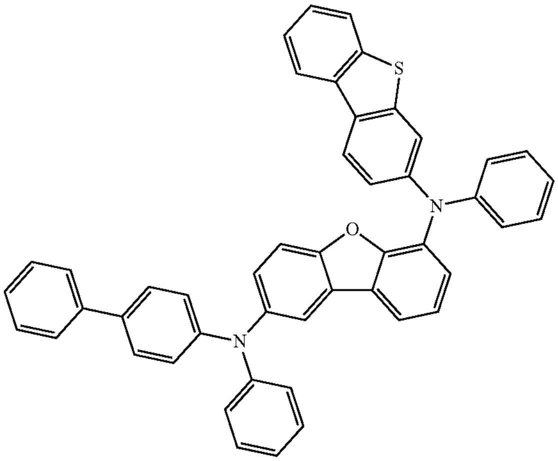
-continued
H-43
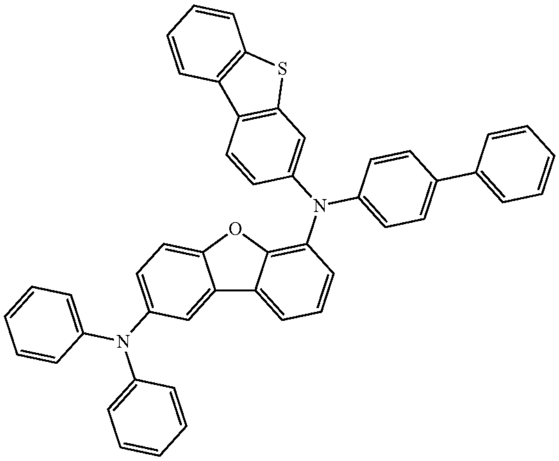
H-44
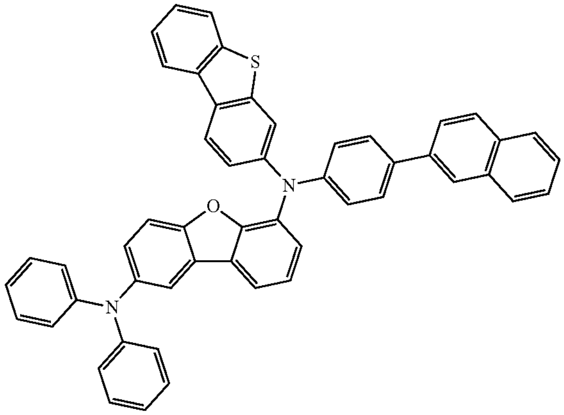
H-45
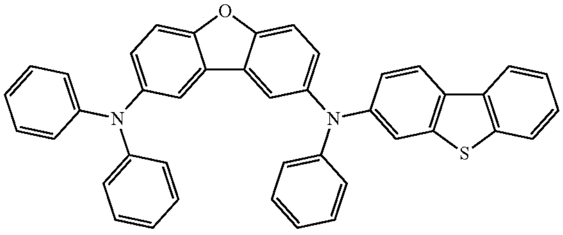
H-46
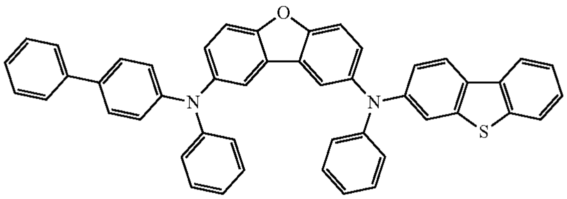

H-47
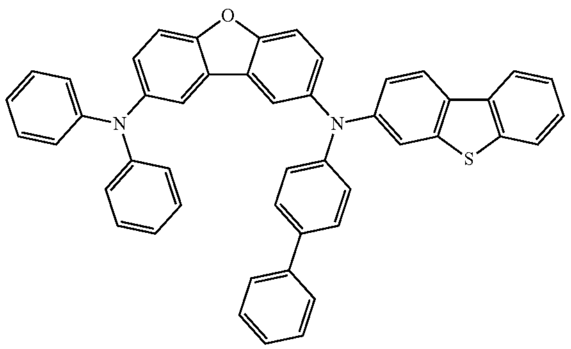
H-48
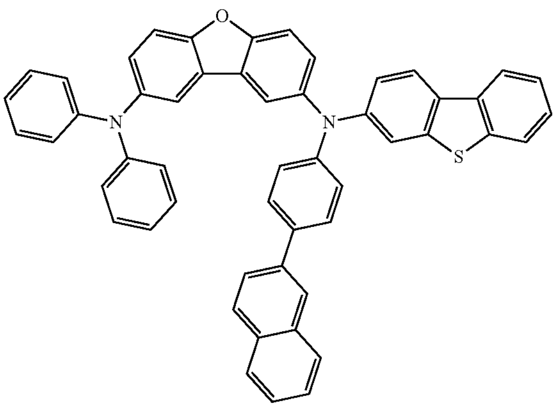
H-49
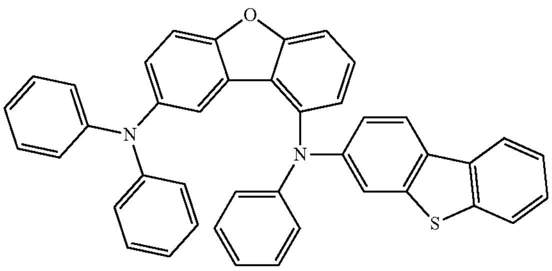
H-50
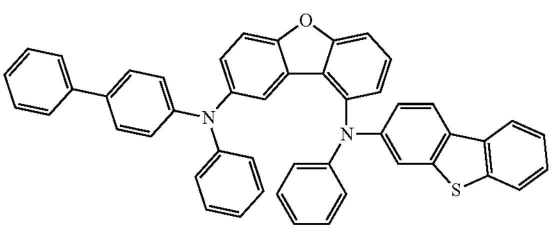
H-51
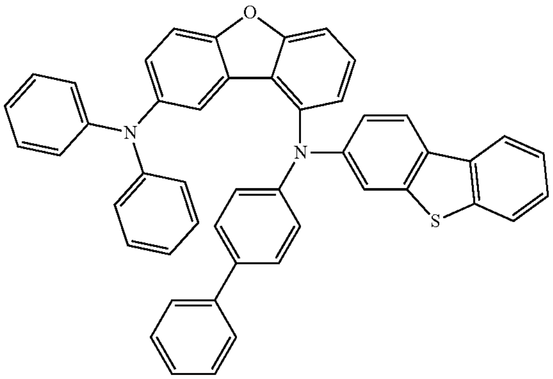
H-52
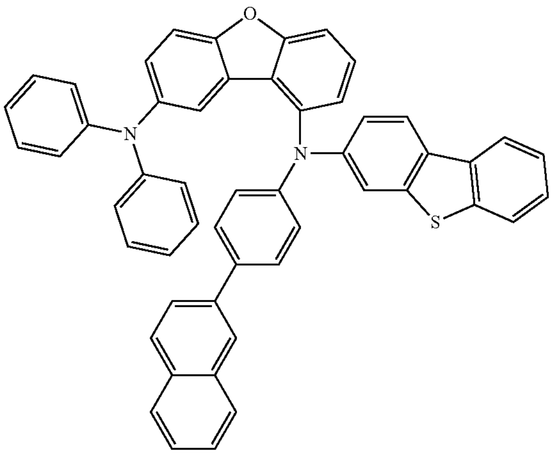
H-53
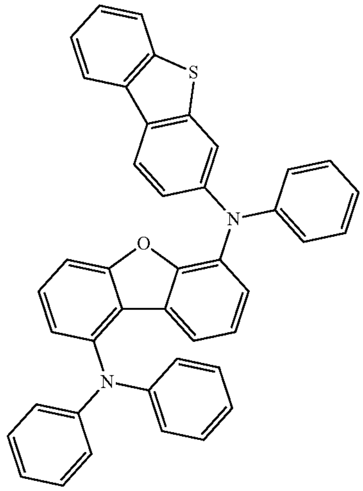

-continued
H-54
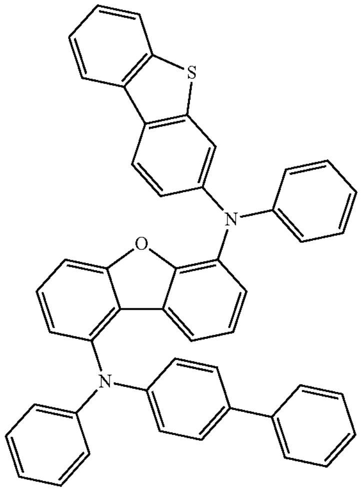
H-55
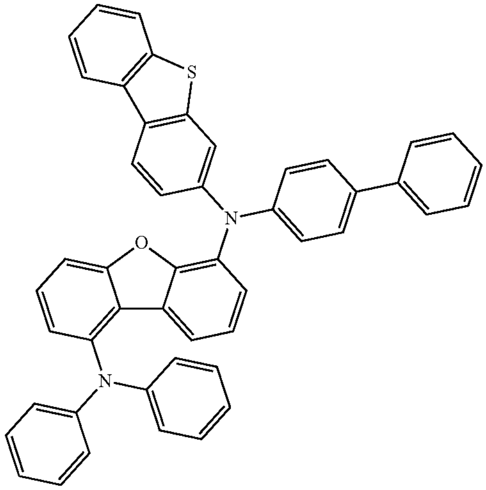
H-56
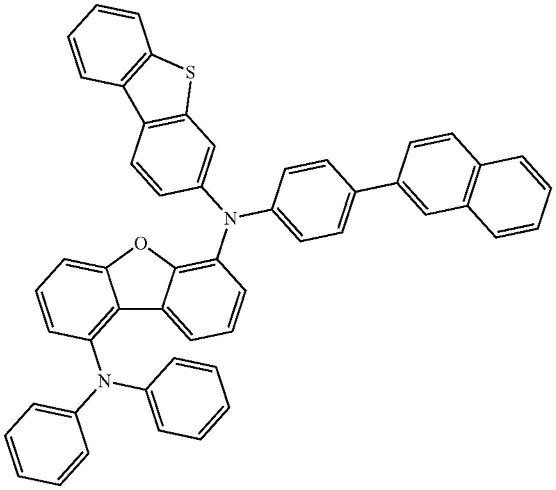
-continued
H-57
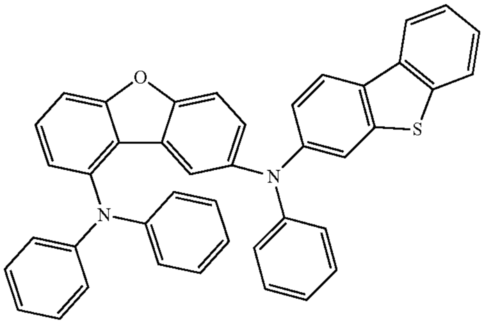
H-58
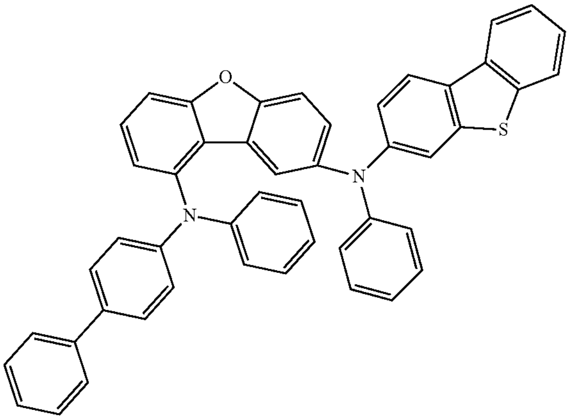
H-59
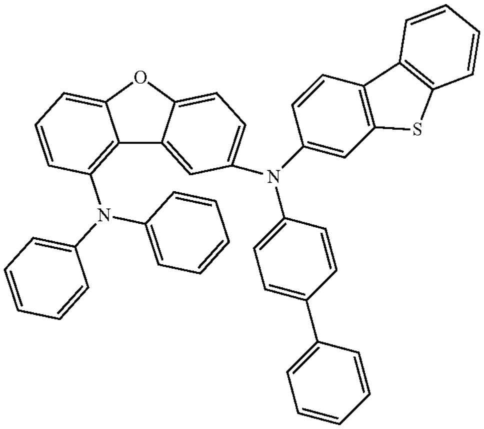

-continued

H-60

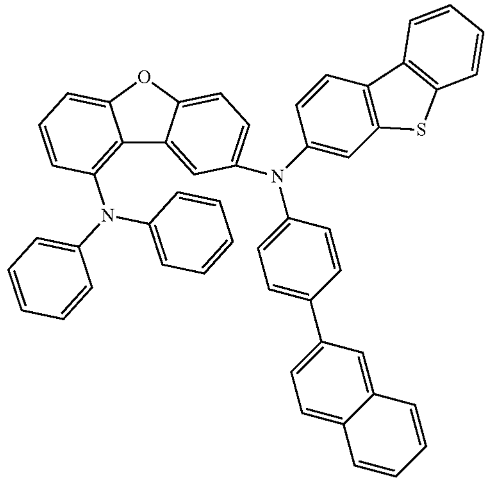

H-61

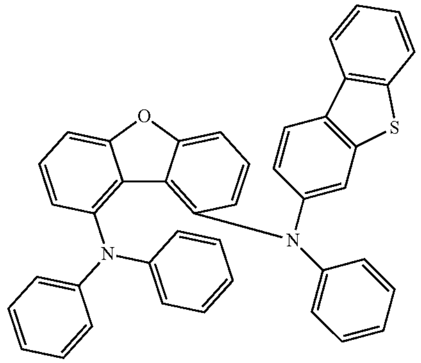

H-62

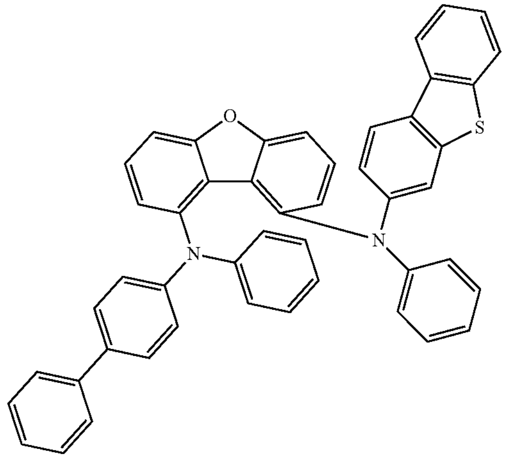

-continued

H-63

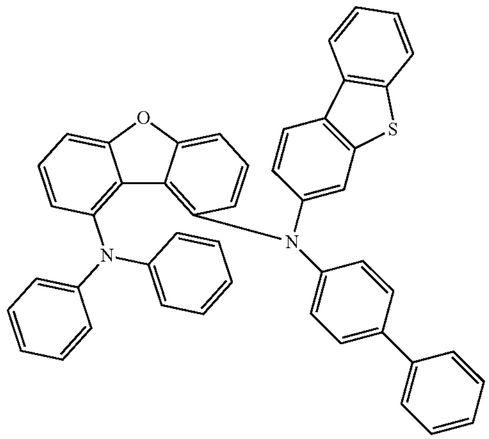

H-64

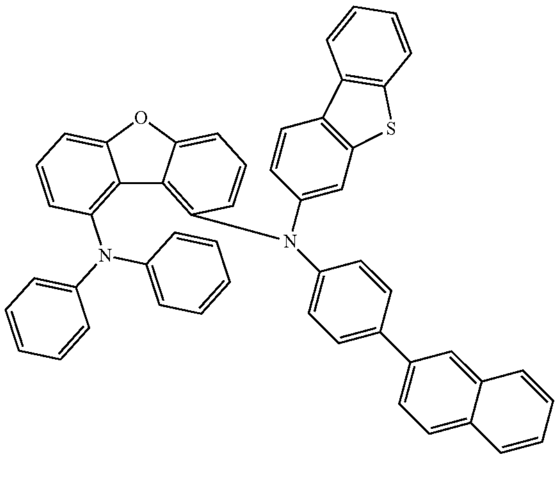

The hole transport layer 141 is disposed between the anode 110 and the light emitting layer 130, and may facilitate hole transport from the anode 110 to the light emitting layer 130. For example, the hole transport layer 141 may include a material having a HOMO energy level between a work function of a conductor of the anode 110 and a HOMO energy level of a material of the light emitting layer 130.

The hole transport layer 141 may include, for example, an amine derivative.

The hole transport layer 141 may include, for example, a compound represented by Chemical Formula 5, for example.

[Chemical Formula 5]

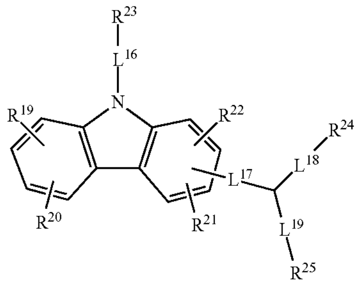

In Chemical Formula 5, $R^{19}$ to $R^{23}$ are each independently hydrogen, deuterium, a substituted or unsubstituted C1 to C10 alkyl group, a substituted or unsubstituted C6 to C30 aryl group, a substituted or unsubstituted C2 to C30 heterocyclic group, or a combination thereof, $R^{19}$ and $R^{20}$ are each independently present or are linked with each other to form a ring, $R^{21}$ and $R^{22}$ are each independently present or are linked with each other to form a ring, $R^{23}$ to $R^{25}$ are each independently a substituted or unsubstituted C6 to C30 aryl group or a substituted or unsubstituted C2 to C30 heterocyclic group, and $L^{16}$ to $L^{19}$ are each independently a single bond, a substituted or unsubstituted C6 to C30 arylene group, a substituted or unsubstituted C2 to C30 heterocyclic group or a combination thereof.

In an example embodiment, $R^{23}$ may be a substituted or unsubstituted C6 to C30 aryl group, and for example $R^{19}$ may be a substituted or unsubstituted phenyl group or a substituted or unsubstituted biphenyl group.

In an example embodiment, $R^{24}$ and $R^{25}$ may each independently be a substituted or unsubstituted phenyl group, a substituted or unsubstituted biphenyl group, a substituted or unsubstituted fluorenyl group, a substituted or unsubstituted bisfluorene group, a substituted or unsubstituted triphenylenyl group, a substituted or unsubstituted anthracenyl group, a substituted or unsubstituted terphenyl group, a substituted or unsubstituted dibenzofuranyl group, a substituted or unsubstituted dibenzothiophenyl group, or a combination thereof.

The compound represented by Chemical Formula 5 may be for example one of compounds of Group 4, for example.

[Group 4]

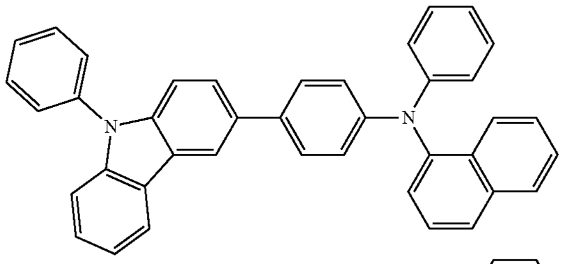

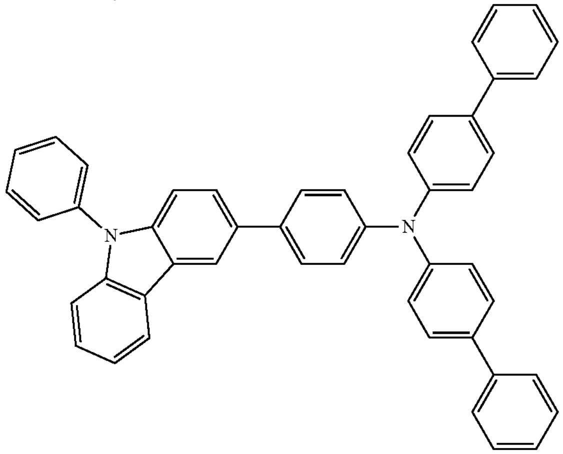

-continued

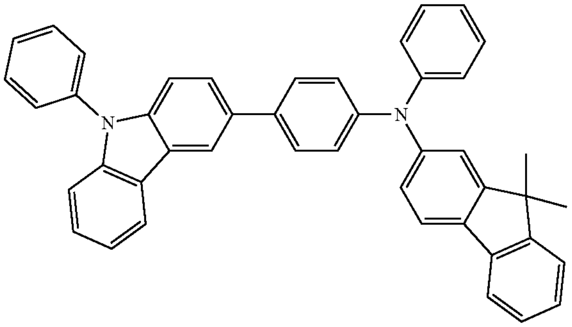

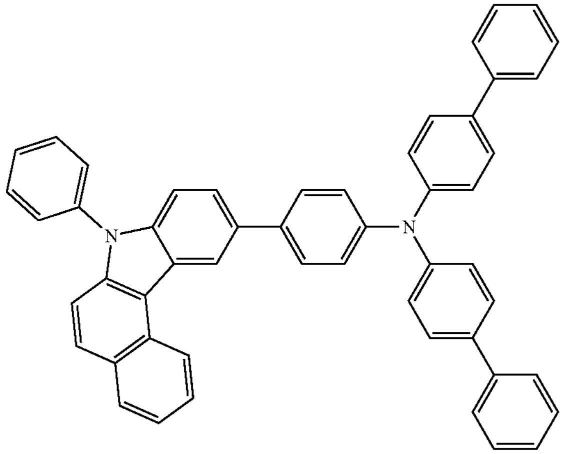

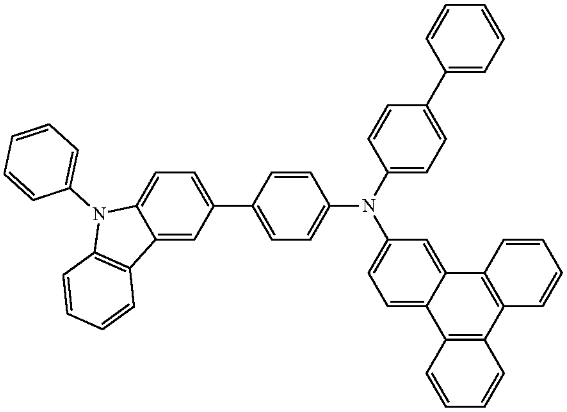

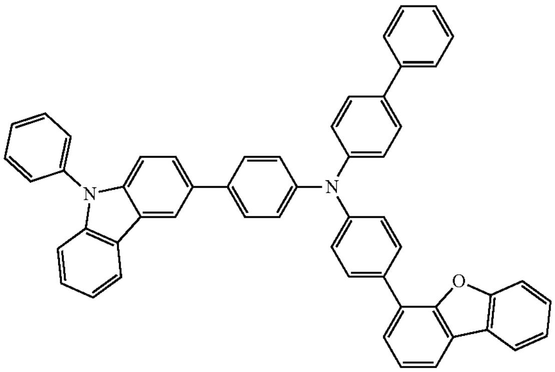

-continued

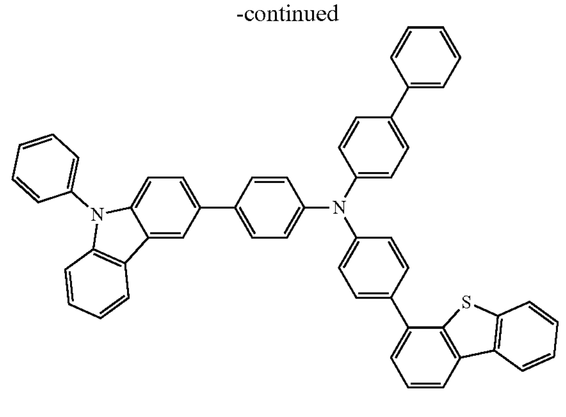

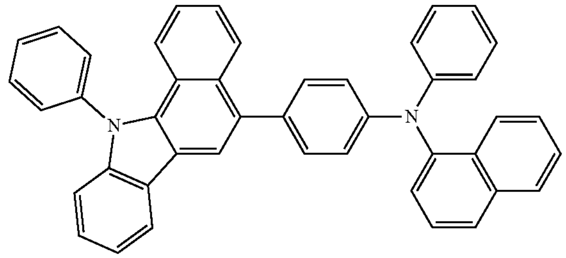

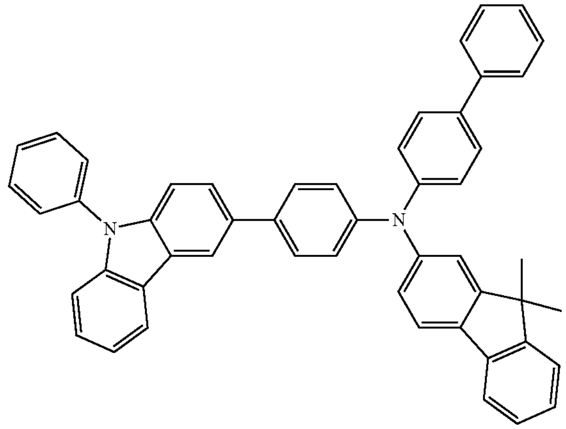

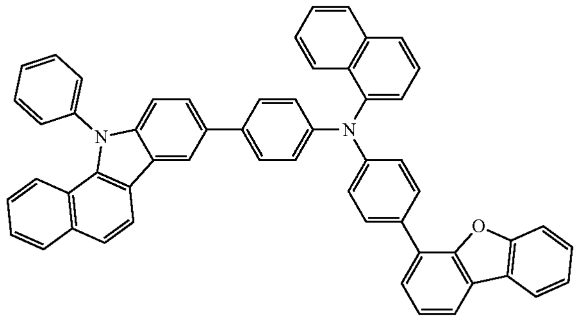

-continued

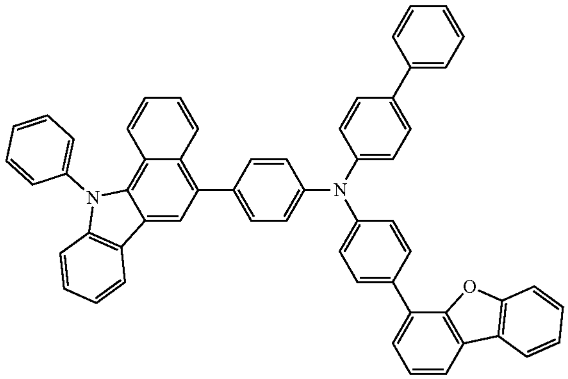

The organic layer 105 may further include a hole injection layer, an electron blocking layer, an electron transport layer, an electron injection layer, and/or a hole blocking layer (not shown) in addition to the aforementioned light emitting layer 130, hole transport auxiliary layer 142, and hole transport layer 141.

The organic light emitting diode 300 may be manufactured by forming an anode or a cathode on a substrate, forming an organic layer using a dry film formation method such as a vacuum deposition method (evaporation), sputtering, plasma plating, and ion plating, or a solution process, and forming a cathode or an anode thereon.

The aforementioned organic optoelectric device may be applied to a display device. For example, the organic light emitting diode may be applied to an organic light emitting diode (OLED) display.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of First Compound

Synthesis Example 1: Synthesis of Compound A-52

[Reaction Scheme 1]

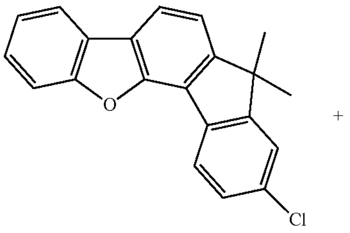

M-3

-continued

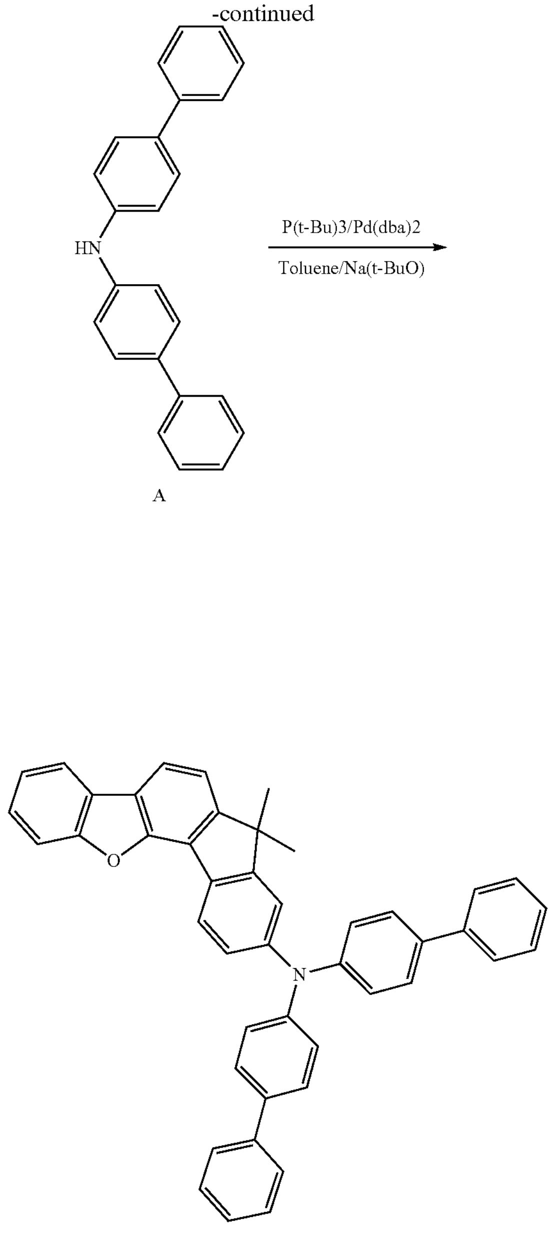

5.0 g (15.68 mmol) of 9-chloro-7,7-dimethyl-7H-benzo[b]fluoreno[3,4-d]furan (Intermediate M-3, CAS no.: 1374677-42-5), 5.04 g (15.68 mmol) of bis(4-biphenylyl) amine (Intermediate A), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto. The mixture was refluxed and stirred under a nitrogen atmosphere for 12 hours. When the reaction was complete, the resultant was extracted with toluene and distilled water. The obtained organic layer was dried with anhydrous magnesium sulfate, filtered, and concentrated under a reduced pressure. The resulting product was purified through silica gel column chromatography using n-hexane/dichloromethane mixed in a volume ratio of 2:1, obtaining 7.8 g (Yield: 82.3%) of a desired compound A-52 as a white solid.

Calculation value: C, 89.52; H, 5.51; N, 2.32; O, 2.65

Analyzed value: C, 89.51; H, 5.52; N, 2.32; O, 2.65

Synthesis Example 2: Synthesis of Compound A-82

[Reaction Scheme 2]

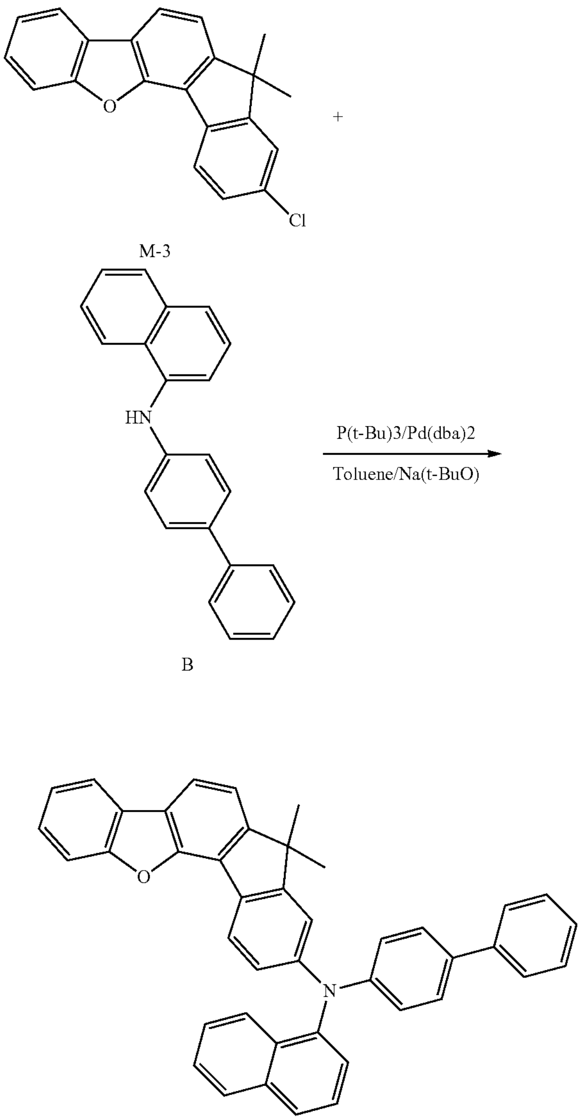

5.0 g (15.68 mmol) of Intermediate M-3, 4.63 g (15.68 mmol) of N-(4-biphenylyl)-1-naphthylamine (Intermediate B), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 7.3 g (Yield: 80.5%) of Compound A-82 as a white solid.

Calculation value: C, 89.40; H, 5.41; N, 2.42; O, 2.77

Analyzed value: C, 89.42; H, 5.39; N, 2.42; O, 2.77

Synthesis Example 3: Synthesis of Compound A-83

[Reaction Scheme 3]

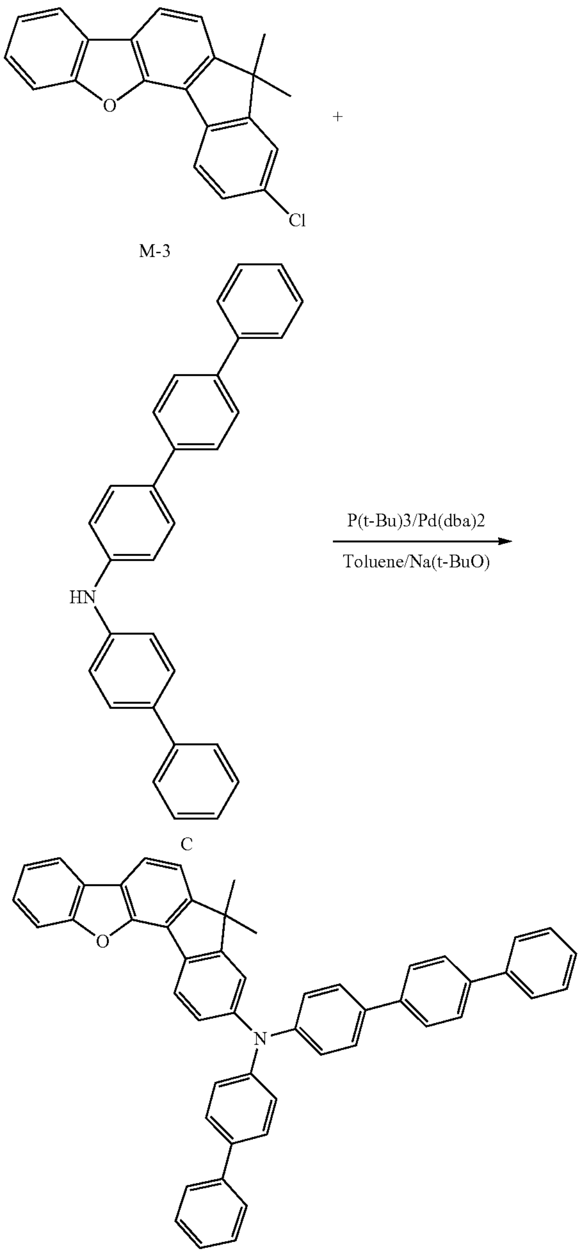

M-3

C 5.0 g (15.68 mmol) of Intermediate M-3, 6.23 g (15.68 mmol) of N-([1,1'-biphenyl]-4-yl)-[1,1': 4',1"-terphenyl]-4-amine (Intermediate C), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate, and the filtrate was concentrated under a reduced pressure. A product therefrom was purified through silica gel column chromatography with n-hexane/dichloromethane (in a volume ratio of 2:1) to obtain 9.2 g (Yield: 86.2%) of Compound A-83 as a white solid.

Calculation value: C, 90.10; H, 5.49; N, 2.06; O, 2.35

Analyzed value: C, 90.12; H, 5.47; N, 2.06; O, 2.35

Synthesis Example 4: Synthesis of Compound A-56

[Reaction Scheme 4]

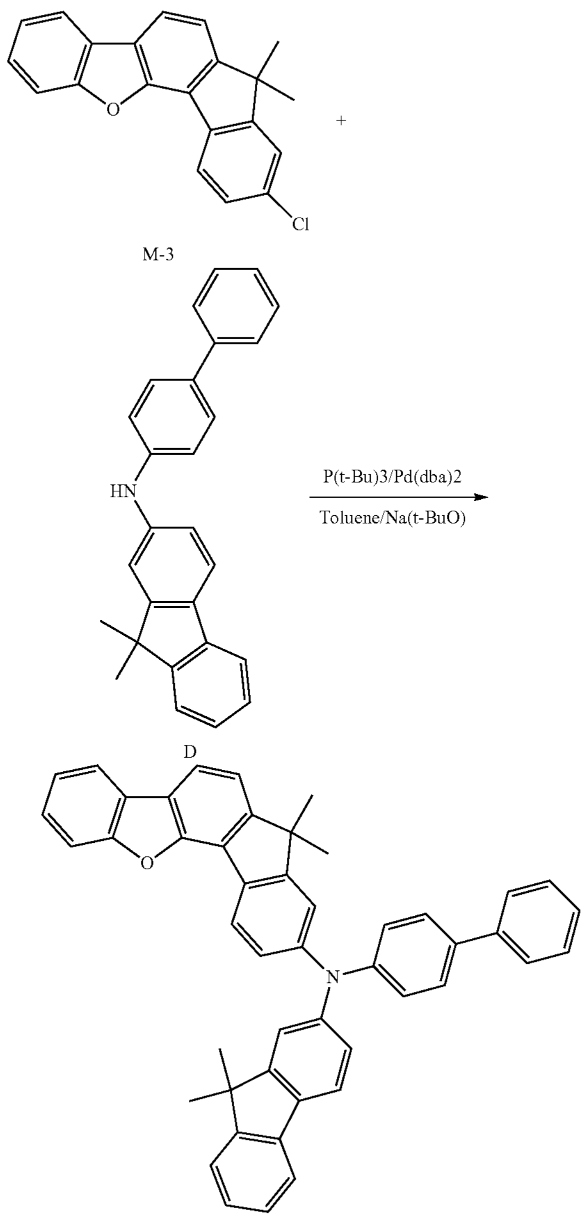

M-3

D 5.0 g (15.68 mmol) of Intermediate M-3, 5.67 g (15.68 mmol) of N-(4-biphenyl)-(9,9-dimethylfluoren-2-yl)amine (Intermediate D, CAS no.: 897671-69-1), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was obtained through silica gel column chromatography with n-hexane/dichloromethane (in a volume ratio of 2:1) to obtain 8.6 g (Yield: 85.1%) of Compound A-56 as a white solid.

Calculation value: C, 89.55; H, 5.79; N, 2.18; O, 2.49

Analyzed value: C, 89.56; H, 5.78; N, 2.18; O, 2.49

Synthesis Example 5: Synthesis of Compound A-70

[Reaction Scheme 5]

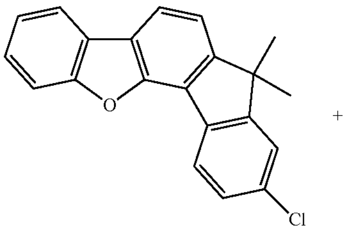

M-3

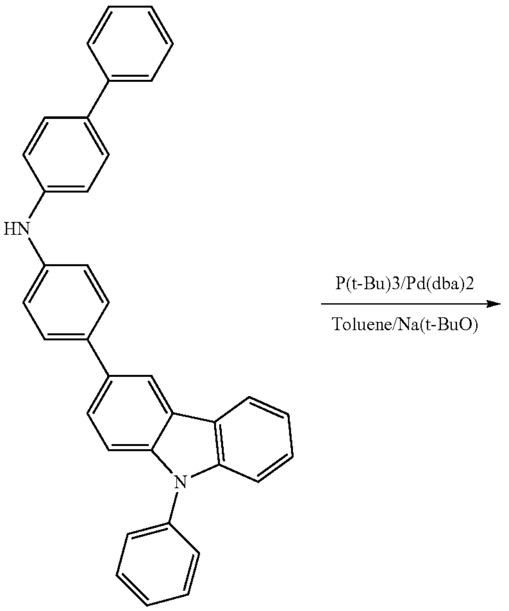

E

-continued

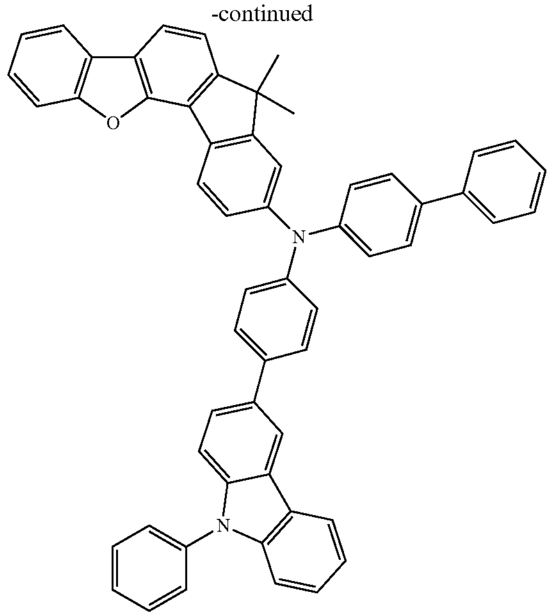

5.0 g (15.68 mmol) of Intermediate M-3, 7.63 g (15.68 mmol) of N-[4-(9-phenyl-9H-carbazol-3-yl)phenyl][1,1'-biphenyl]-4-amine (Intermediate E, CAS no.: 1160294-96-1), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate, and the filtrate was concentrated under a reduced pressure. A product therefrom was purified through silica gel column chromatography with n-hexane/dichloromethane (in a volume ratio of 2:1) to obtain 10.5 g (Yield: 87%) of Compound A-70 as a white solid.

Calculation value: C, 89.03; H, 5.24; N, 3.64; O, 2.08

Analyzed value: C, 89.01; H, 5.26; N, 3.64; O, 2.08

Synthesis Example 6: Synthesis of Compound A-76

[Reaction Scheme 6]

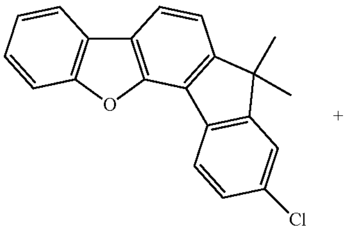

M-3

-continued

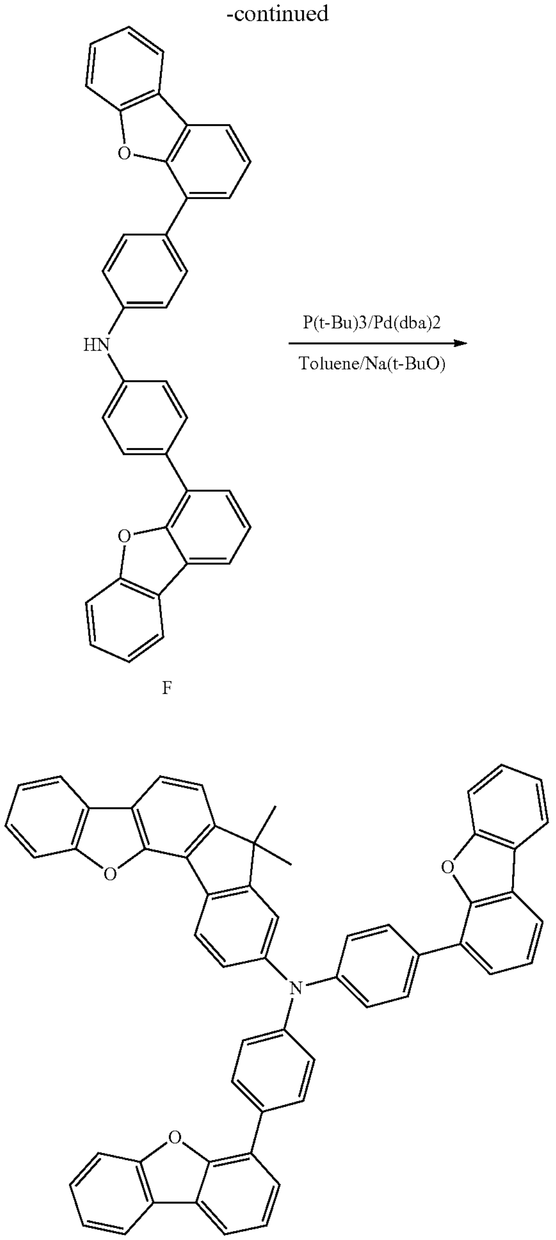

F 5.0 g (15.68 mmol) of Intermediate M-3, 7.87 g (15.68 mmol) of N,N-bis[4-(dibenzofuran-4-yl)phenyl]amine (Intermediate F, CAS no.: 955959-91-8), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 10.7 g (Yield: 87%) of Compound A-76 as a white solid.

Calculation value: C, 87.33; H, 4.76; N, 1.79; O, 6.12

Analyzed value: C, 87.31; H, 4.78; N, 1.79; O, 6.12

Synthesis Example 7: Synthesis of Compound A-78

[Reaction Scheme 7]

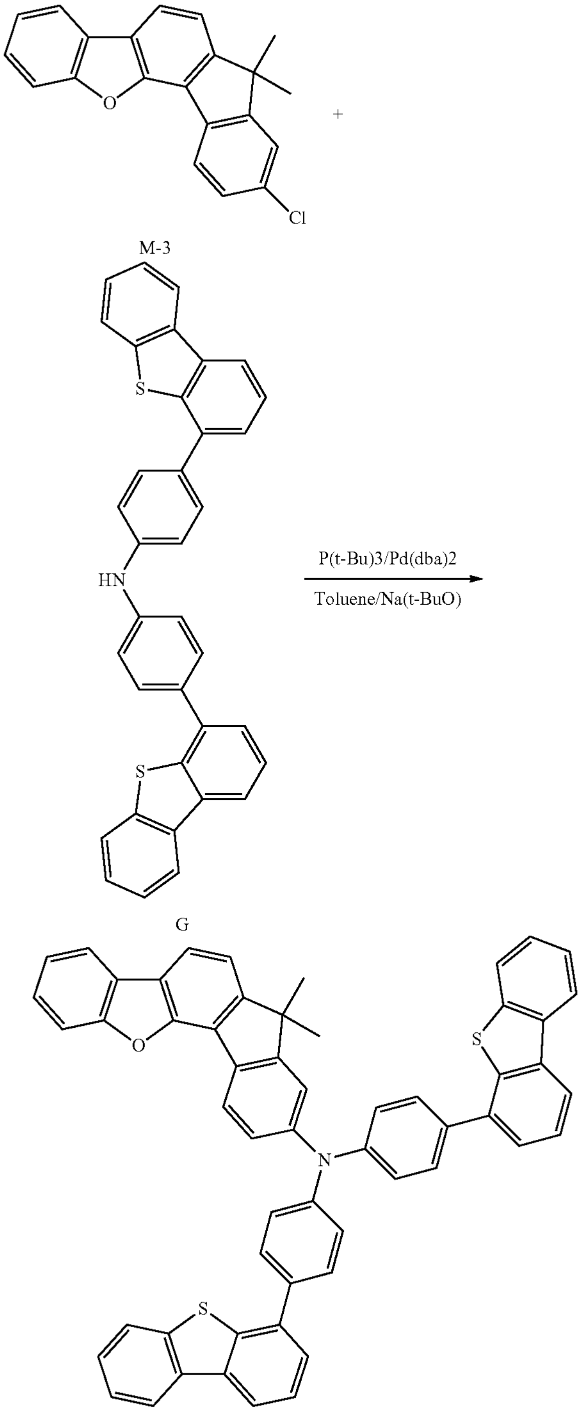

M-3

G 5.0 g (15.68 mmol) of Intermediate M-3, 8.37 g (15.68 mmol) of 4-(4-dibenzothienyl)-N-[4-(4-dibenzothienyl)phenyl]benzenamine (Intermediate G, CAS no.: 1361298-60-3), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 10.4 g (Yield: 81.2%) of Compound A-78 as a white solid.

Calculation value: C, 83.89; H, 4.57; N, 1.72; O, 1.96; S, 7.86

Analyzed value: C, 83.86; H, 4.59; N, 1.72; O, 1.96; S, 7.86

Synthesis Example 8: Synthesis of Compound A-80

[Reaction Scheme 8]

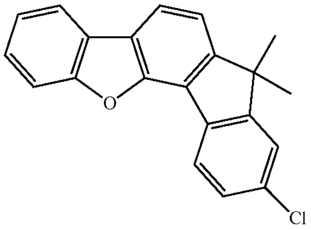

M-3

+

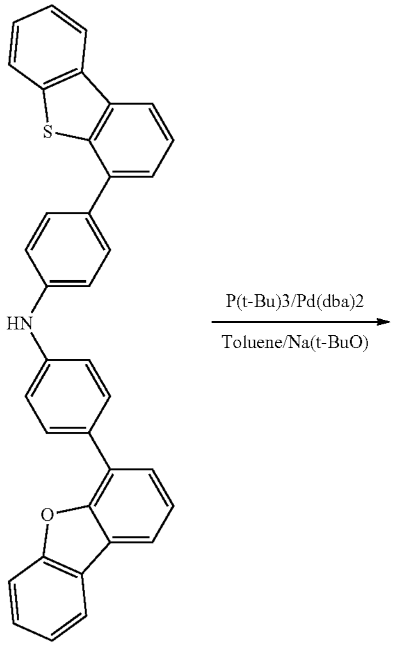

H

-continued

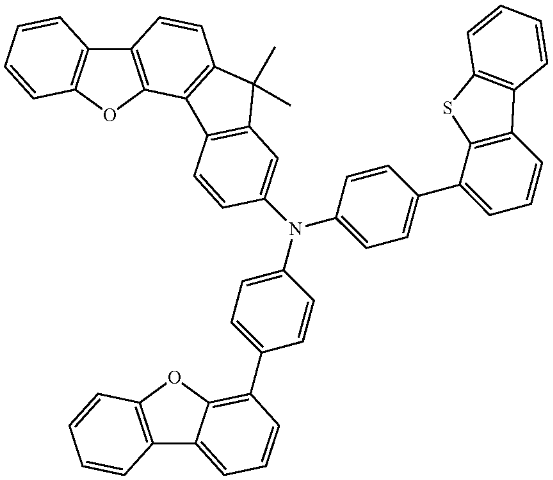

5.0 g (15.68 mmol) of Intermediate M-3, 8.12 g (15.68 mmol) of 4-(4-dibenzofuranyl)-N-[4-(4-dibenzothienyl)phenyl]benzenamine (Intermediate H, CAS no.: 1374677-83-4), 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 10.8 g (Yield: 86%) of Compound A-80 as a white solid.

Calculation value: C, 85.58; H, 4.66; N, 1.75; O, 4.00; S, 4.01

Analyzed value: C, 85.59; H, 4.67; N, 1.75; O, 4.00; S, 4.01

Synthesis Example 9: Synthesis of Compound A-54

[Reaction Scheme 9]

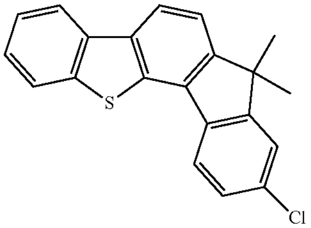

+

M-6

-continued

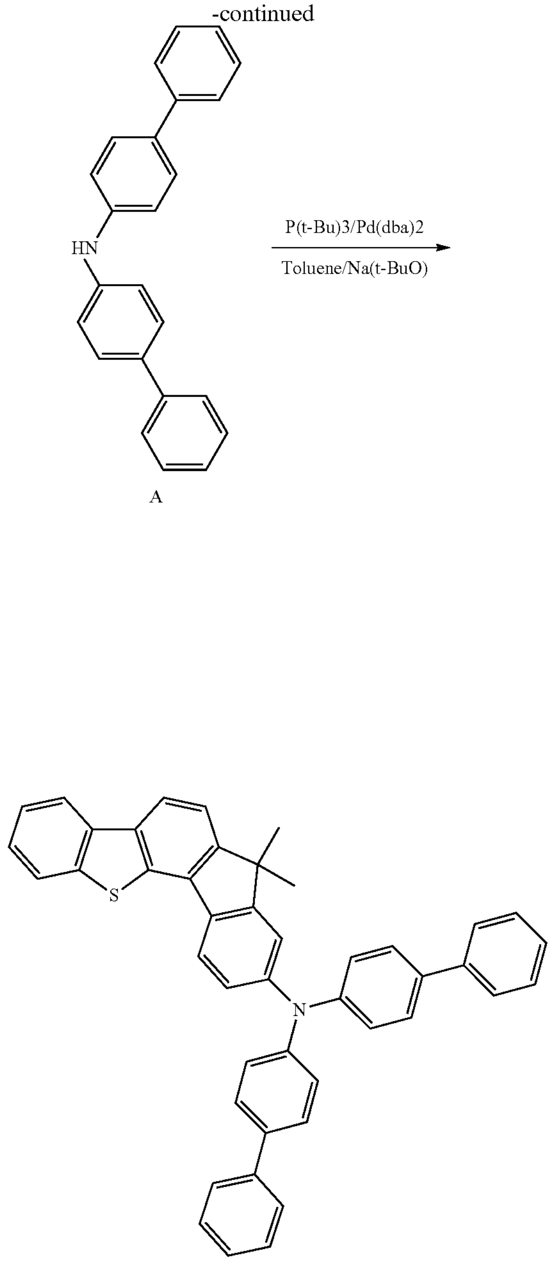

5.0 g (14.93 mmol) of 9-chloro-7,7-dimethyl-7H-benzo[b]-fluoreno[3,4-d]thiophene (Intermediate M-6, CAS no.: 1374677-45-8), 4.8 g (14.93 mmol) of Intermediate A, 4.31 g (44.79 mmol) of sodium t-butoxide, and 0.09 g (0.45 mmol) of tri-tert-butylphosphine were dissolved in 200 ml of toluene, and 0.26 g (0.45 mmol) of $Pd(dba)_2$ were added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 7.5 g (Yield: 81%) of Compound A-54 as a white solid.

Calculation value: C, 87.20; H, 5.37; N, 2.26; S, 5.17

Analyzed value: C, 87.22; H, 5.35; N, 2.26; S, 5.17

Synthesis Example 10: Synthesis of Compound A-59

[Reaction Scheme 10]

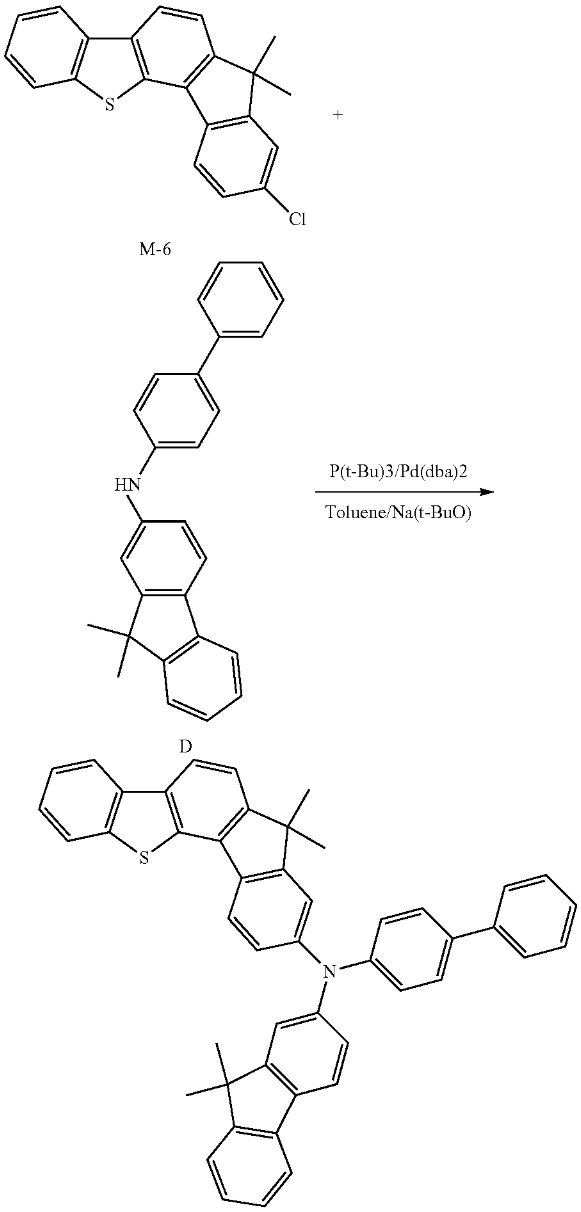

5.0 g (14.93 mmol) of Intermediate M-6, 5.4 g (14.93 mmol) of Intermediate D, 4.31 g (44.79 mmol) of sodium t-butoxide, and 0.09 g (0.45 mmol) of tri-tert-butylphosphine were dissolved in 200 ml of toluene, and 0.26 g (0.45 mmol) of $Pd(dba)_2$ was added thereto, and then refluxed and stirred under a nitrogen atmosphere for 12 hours. When the reaction was complete, the resultant was extracted with toluene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 8.4 g (Yield: 85.2%) of Compound A-59 as a white solid.

Calculation value: C, 87.37; H, 5.65; N, 2.12; S, 4.86

Analyzed value: C, 87.35; H, 5.67; N, 2.12; S, 4.86

Synthesis Example 11: Synthesis of Compound A-93

[Reaction Scheme 11]

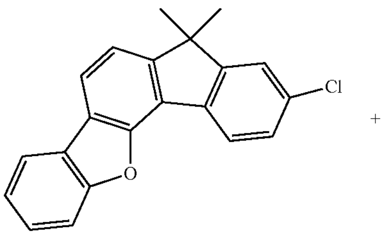

M-3

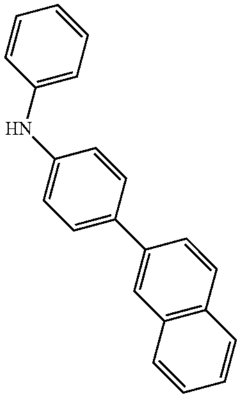

K

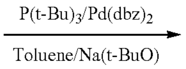

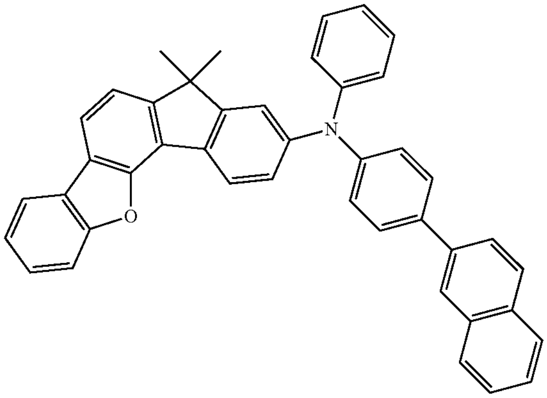

Compound A-93 was synthesized according to the same method as Synthesis Example 1 by using Intermediate M-3 and 4-(2-naphthalenyl)-N-phenylbenzenamine (Intermediate K, CAS no.: 897671-79-3) in an equivalent ratio of 1:1.

LC/MS calculated for: C43H31NO Exact Mass: 577.24 found for 577.77 [M+H].

Synthesis Example 12: Synthesis of Compound A-94

[Reaction Scheme 12]

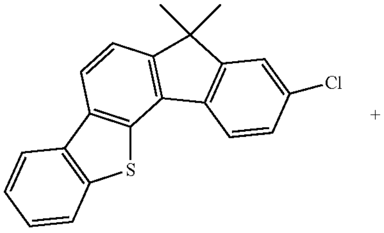

M-6

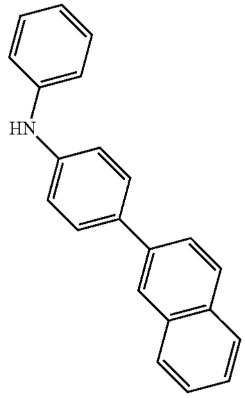

K

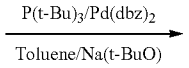

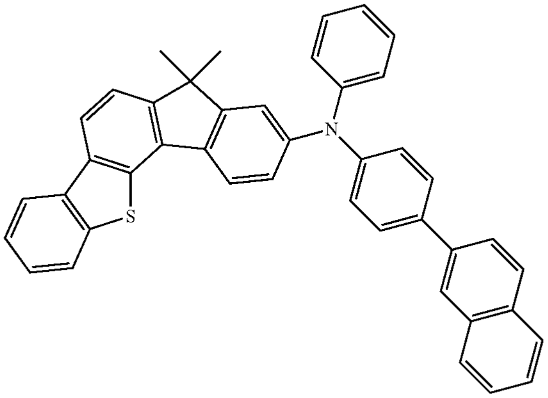

Compound A-94 was synthesized according to the same method as Synthesis Example 1 except that Intermediate M-6 and Intermediate K were used in an equivalent ratio of 1:1.

LC/MS calculated for: C43H31NS Exact Mass: 593.22 found for 593.78 [M+H].

Comparative Synthesis Example 1: Synthesis of Compound V-1

[Reaction Scheme 13]

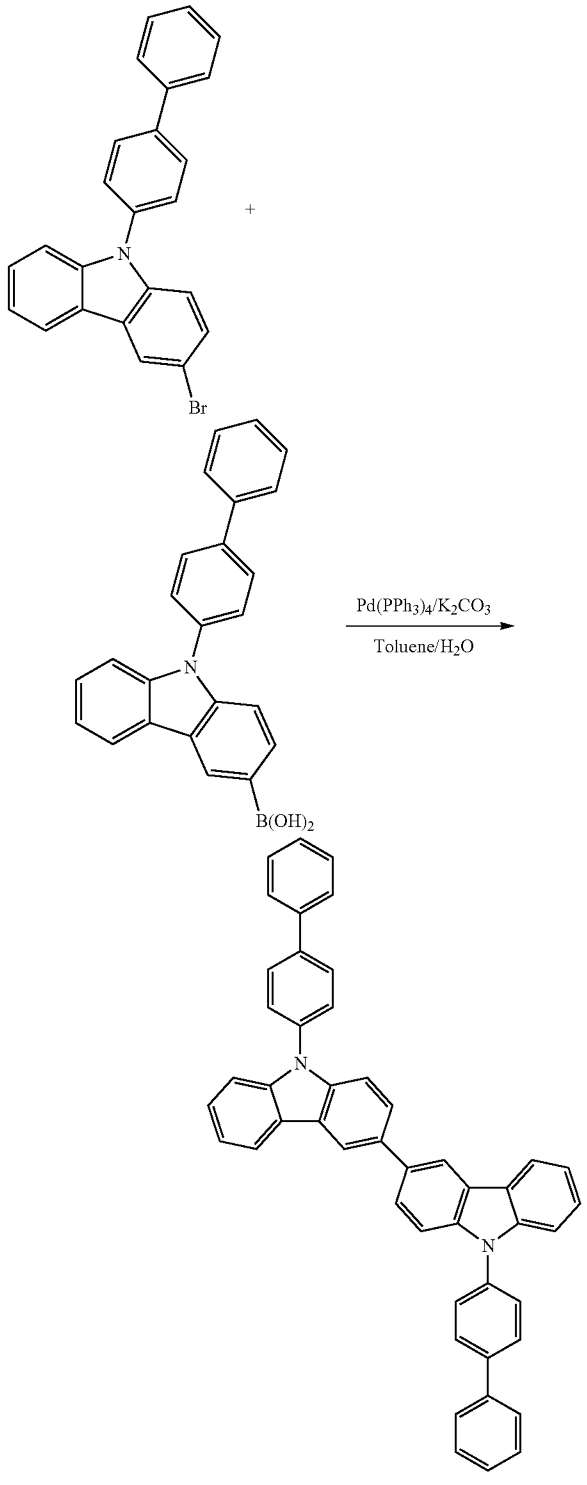

V-1

The compound, biphenylcarbazolyl bromide (12.33 g, 30.95 mmol) was dissolved in 200 mL of toluene in a nitrogen environment, biphenylcarbazolylboronic acid (12.37 g, 34.05 mmol) and tetrakis(triphenylphosphine) palladium (1.07 g, 0.93 mmol) were added thereto, and the obtained mixture was stirred. Potassium carbonate saturated in water (12.83 g, 92.86 mmol) was added thereto, and the obtained mixture was heated and refluxed at 90° C. for 12 hours. When the reaction was complete, water was added to the reaction solution, and the mixture was extracted by using dichloromethane (DCM), filtered after removing moisture therefrom by using anhydrous $MgSO_4$, and concentrated under a reduced pressure. A residue obtained therefrom was separated and purified through flash column chromatography to obtain Compound V-1 (18.7 g, 92%).

LC/MS calculated for: C48H32N2 Exact Mass: 636.26 found for 636.30 [M+H].

Synthesis of Second Compound

Synthesis Example 13: Synthesis of Compound B-17

[Reaction Scheme 14]

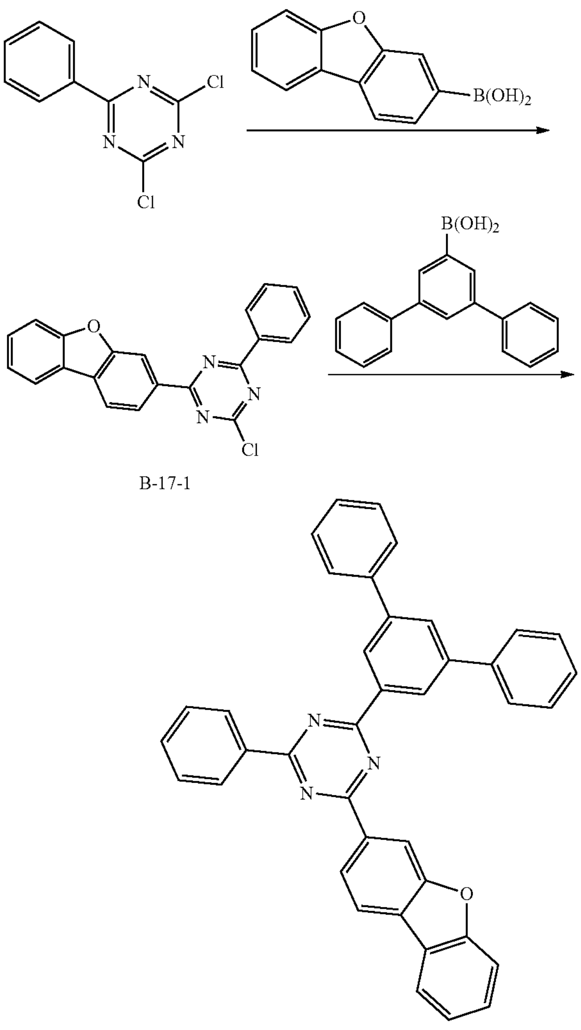

B-17-1

B-17

1st Step: Synthesis of Intermediate B-17-1

22.6 g (100 mmol) of 2,4-dichloro-6-phenyltriazine was added to 100 mL of tetrahydrofuran, 100 mL of toluene, 100 mL of distilled water in a 500 mL round-bottom flask, 0.9 equivalent of dibenzofuran-3-boronic acid (CAS No.: 395087-89-5), 0.03 equivalent of tetrakistriphenylphosphine palladium, and 2 equivalent of potassium carbonate were added thereto, and then heated and refluxed under a nitrogen atmosphere. After 6 hours, the reaction solution was cooled down and then, after removing an aqueous layer therefrom, an organic layer therein was dried under a reduced pressure. The obtained solid was washed with water and hexane and then, recrystallized with 200 mL of toluene to obtain 21.4 g (Yield: 60%) of Intermediate B-17-1.

2nd Step: Synthesis of Compound B-17

Intermediate B-17-1 (56.9 mmol) was added to 200 mL of tetrahydrofuran and 100 mL of distilled water in a 500 mL round-bottom flask, 1.1 equivalent of 3,5-diphenylbenzeneboronic acid (CAS No.: 128388-54-5), 0.03 equivalent of tetrakistriphenylphosphine palladium, and 2 equivalent of potassium carbonate were added thereto under a nitrogen atmosphere, and then heated and refluxed. After 18 hours, the reaction solution was cooled down, and a solid precipitated therein was filtered and washed with 500 mL of water. The solid was recrystallized with 500 mL of monochlorobenzene to obtain Compound B-17.

LC/MS measurement (C39H25N30, theoretical value: 555.1998 g/mol, measured value: 556.21 g/mol)

Synthesis Example 14: Synthesis of Compound B-135

[Reaction Scheme 15]

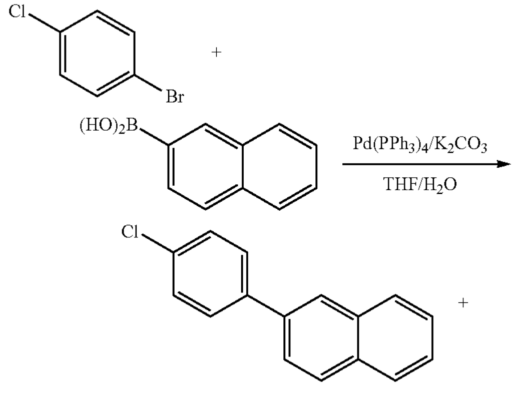

B-135-1

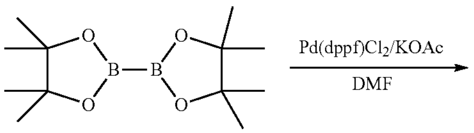

-continued

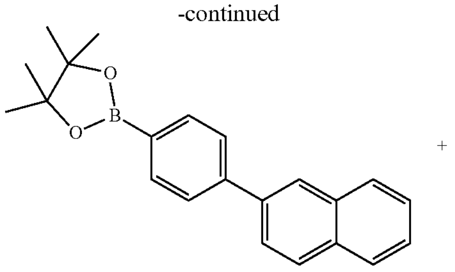

B-135-2

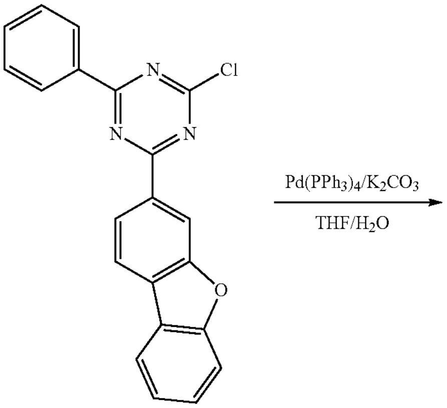

B-17-1

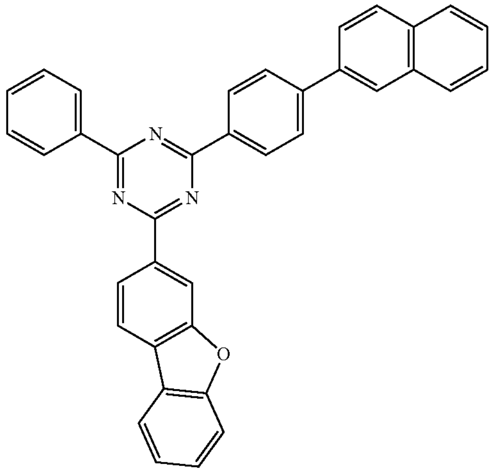

B-135

1st Step: Synthesis of Intermediate B-135-1

Intermediate B-135-1 was synthesized according to the same method as the 1st step of the Synthesis Example 13 except that 1-bromo-4-chloro-benzene and 2-naphthalene boronic acid were respectively used in an amount of 1.0 equivalent.

2nd Step: Synthesis of Intermediate B-135-2

1 equivalent of Intermediate B-135-1 was added to 250 mL of DMF in a 500 mL round-bottom flask, and 0.05 equivalent of dichlorodiphenyl phosphinoferrocene palladium, 1.2 equivalent of bispinacolato diboron, and 2 equivalent of potassium acetate were added thereto, and then heated and refluxed under a nitrogen atmosphere for 18 hours. The reaction solution was cooled down and then, added in a dropwise fashion to 1 L of water to obtain a solid. The obtained solid was dissolved in boiling toluene to treat activated carbon and then, filtered with silica gel, and the filtrate was concentrated. The concentrated solid was stirred with a small amount of hexane, and a solid was filtered therefrom to synthesize Intermediate B-135-2.

3rd Step: Synthesis of Compound B-135

Compound B-135 was synthesized according to the same method as the 2nd step of Synthesis Example 13 except that Intermediate B-135-2 and Intermediate B-17-1 were respectively used in an amount of 1.0 equivalent.

LC/MS measurement (C37H23N3O, theoretical value: 525.18 g/mol, measured value: M=525.22 g/mol)

Synthesis Example 15: Synthesis of Compound B-205

[Reaction Scheme 16]

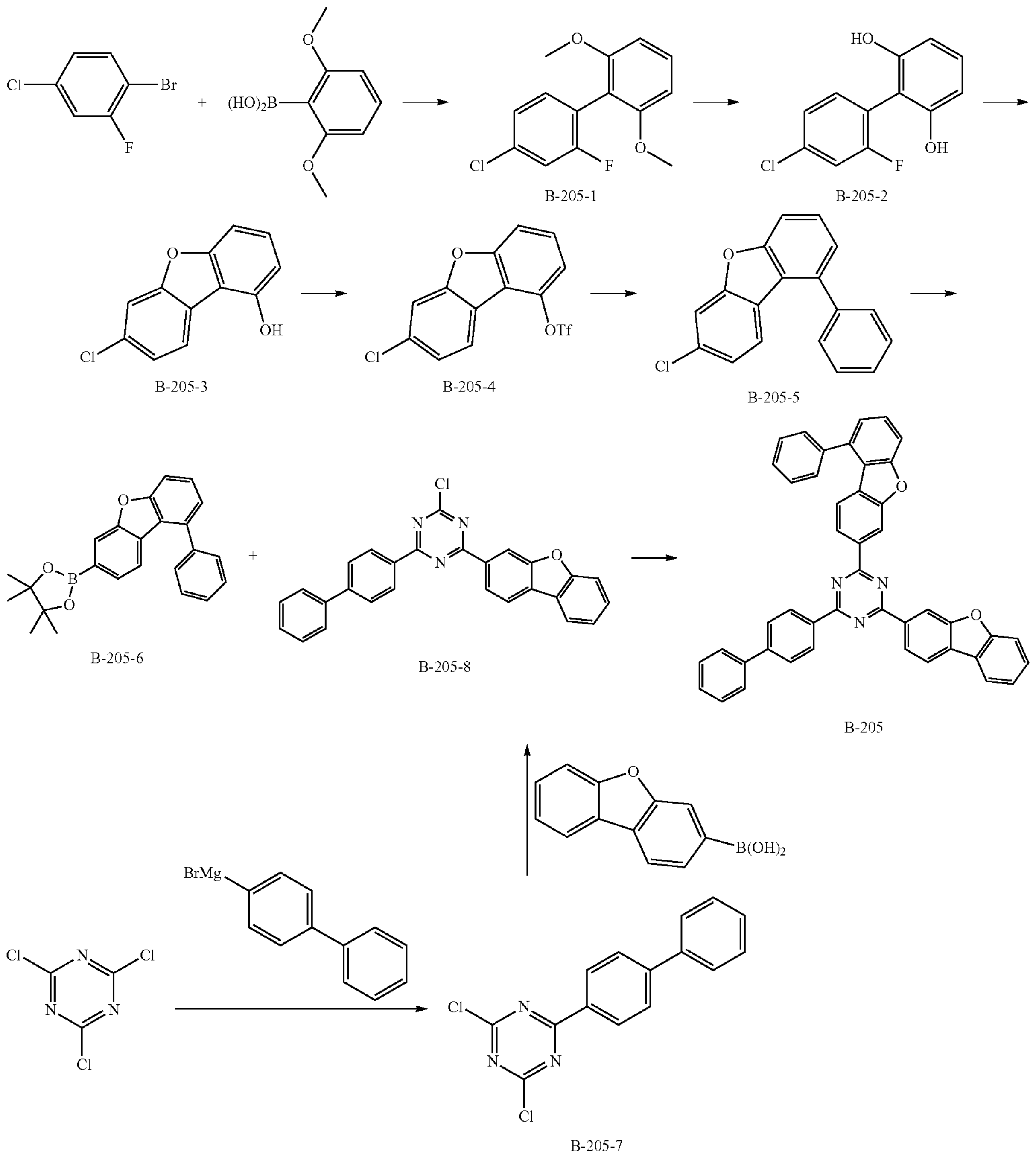

B-205-1

B-205-2

B-205-3

B-205-4

B-205-5

B-205-6

B-205-8

B-205

B-205-7

1st Step: Synthesis of Intermediate B-205-1

1-bromo-4-chloro-2-fluorobenzene (61 g, 291 mmol), 2,6-dimethoxyphenylboronic acid (50.4 g, 277 mmol), $K_2CO_3$ (60.4 g, 437 mmol), and $Pd(PPh_3)_4$ (10.1 g, 8.7 mmol) were put in a round-bottom flask and dissolved in 500 ml of THF and 200 ml of distilled water and then, refluxed and stirred at 60° C. for 12 hours. When the reaction was complete, after removing an aqueous layer therefrom, column chromatography (hexane:DCM (20%)) was used to obtain 38 g (51%) of Intermediate B-205-1.

2nd Step: Synthesis of Intermediate B-205-2

Intermediate B-205-1 (38 g, 142 mmol) and pyridine hydrochloride (165 g, 1425 mmol) were put in a round-bottom flask and then, refluxed and stirred at 200° C. for 24 hours. When the reaction was complete, the resultant was cooled down to room temperature, slowly poured into distilled water, and stirred for 1 hour. A solid therefrom was filtered to obtain 23 g (68%) of Intermediate B-205-2.

3rd Step: Synthesis of Intermediate B-205-3

Intermediate B-205-2 (23 g, 96 mmol) and $K_2CO_3$ (20 g, 144 mmol) were put in a round-bottom flask, dissolved in 100 ml of NMP, and then, refluxed and stirred at 180° C. for 12 hours. When the reaction was complete, the mixture was poured into an excess of distilled water. A solid therefrom was filtered and dissolved in ethyl acetate, and dried with MgSO4, and an organic layer was removed therefrom under a reduced pressure. Column chromatography (hexane:EA 30%) was used to obtain 16 g (76%) of Intermediate B-205-3.

4th Step: Synthesis of Intermediate B-205-4

Intermediate B-205-3 (16 g, 73 mmol) and pyridine (12 ml, 146 mmol) were put in a round-bottom flask and dissolved in 200 ml of DCM. After decreasing the temperature to 0° C., trifluoromethanesulfonic anhydride (14.7 ml, 88 mmol) was slowly added thereto in a dropwise fashion. After stirring the mixture for 6 hours, an excess of distilled water was added thereto, and then stirred for 30 minutes and extracted with DCM. An organic solvent was removed under a reduced pressure and vacuum-dried to obtain 22.5 g (88%) of Intermediate B-205-4.

5th Step: Synthesis of Intermediate B-205-5

14.4 g (81%) of Intermediate B-205-5 was obtained according to the same method as the 2nd step of Synthesis Example 13 except that Intermediate B-205-4 (22.5 g, 64 mmol), phenylboronic acid (7.8 g, 64 mmol), $K_2CO_3$ (13.3 g, 96 mmol), and $Pd(PPh_3)_4$ (3.7 g, 3.2 mmol) were used.

6th Step: Synthesis of Intermediate B-205-6

Intermediate B-205-5 (22.5 g, 80 mmol), bis(pinacolato) diboron (24.6 g, 97 mmol), $Pd(dppf)Cl_2$ (2 g, 2.4 mmol), tricyclohexylphosphine (3.9 g, 16 mmol), and potassium acetate (16 g, 161 mmol) were put in a round-bottom flask and dissolved in 320 ml of DMF. The mixture was refluxed and stirred at 120° C. for 10 hours. When the reaction was complete, the mixture was poured into an excess of distilled water and then stirred for 1 hour. A solid therefrom was filtered and dissolved in DCM. After removing moisture with $MgSO_4$, an organic solvent was filtered by using a silica gel pad and removed under a reduced pressure. A solid therefrom was recrystallized with EA and hexane to obtain 26.9 g (90%) of Intermediate B-205-6.

7th Step: Synthesis of Intermediate B-205-7

15 g (81.34 mmol) of cyanuric chloride was dissolved in 200 mL of anhydrous tetrahydrofuran in a 500 mL round-bottom flask, and 1 equivalent of a 4-biphenyl magnesium bromide solution (0.5 M tetrahydrofuran) was added thereto in a dropwise fashion at 0° C. under a nitrogen atmosphere and then, slowly heated up to room temperature. The reaction solution was stirred for 1 hour at room temperature and put in 500 mL of ice water to separate layers. An organic layer was separated therefrom and treated with anhydrous magnesium sulfate, and the residue was concentrated. The concentrated residue was recrystallized with tetrahydrofuran and methanol to obtain 17.2 g of Intermediate B-205-7.

8th Step: Synthesis of Intermediate B-205-8

Intermediate B-205-8 was synthesized according to the same method as the 1st step of Synthesis Example 20 except that Intermediate B-205-7 was used.

9th Step: Synthesis of Compound B-205

15.5 g (70%) of Compound B-205 was synthesized according to the same method as the 2nd step of Synthesis Example 13 except that Intermediate B-205-6 (12.8 g, 35 mmol), Intermediate 205-8 (15 g, 35 mmol), $K_2CO_3$ (7.2 g, 52 mmol), and $Pd(PPh_3)_4$ (2 g, 1.7 mmol) were used under a nitrogen condition in a round-bottom flask.

LC/MS measurement (C45H27N3O2, theoretical value: 641.21 g/mol, measured value: M=641.25 g/mol)

Synthesis Example 16: Synthesis of Compound B-183

[Reaction Scheme 17]

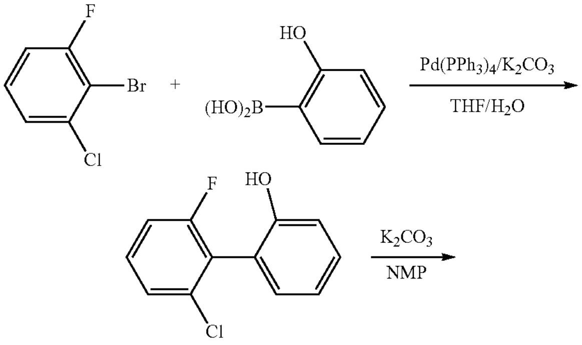

B-183-1

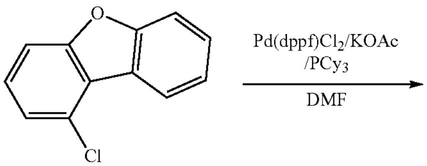

B-183-2

-continued

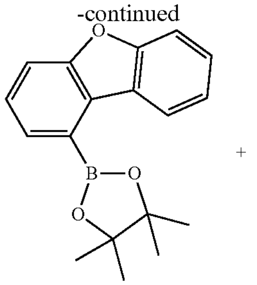

B-183-3

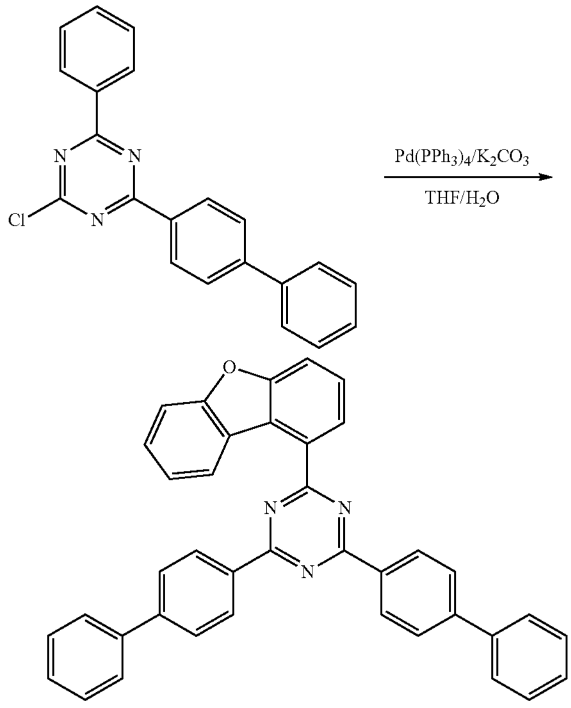

B-183

1st Step: Synthesis of Intermediate B-183-1

Intermediate B-183-1 was synthesized according to the same method as the 1st step of Synthesis Example 15 except that 2-bromo-1-chloro-3-fluoro-benzene and 2-hydroxyphenylboronic acid were used in each amount of 1.0 equivalent.

2nd Step: Synthesis of Intermediate B-183-2

Intermediate B-183-2 was synthesized according to the same method as the 3rd step of Synthesis Example 15 except that Intermediate B-183-1 and $K_2CO_3$ were used in an equivalent ratio of 1:1.5.

3rd Step: Synthesis of Intermediate B-183-3

Intermediate B-183-3 was synthesized according to the same method as the 6th step of Synthesis Example 15 except that Intermediate D-3-2 and bis(pinacolato)diboron were used in an equivalent ratio of 1:1.2.

4th Step: Synthesis of Compound B-183

Compound B-183 was synthesized according to the same method as the 2nd step of Synthesis Example 13 except that Intermediate B-183-3 and 2,4-bis([1,1'-biphenyl]-4-yl)-6-chloro-1,3,5-triazine were used in each amount of 1.0 equivalent.

LC/MS measurement (C39H25N3O theoretical value: 551.20 g/mol, measured value: M=551.24 g/mol)

Synthesis Example 17: Synthesis of Compound B-209

[Reaction Scheme 18]

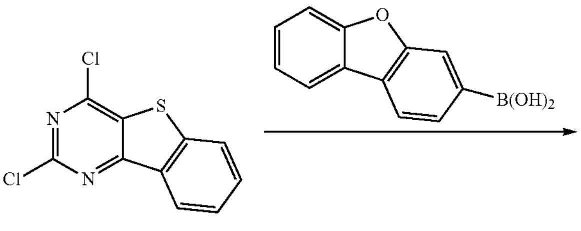

A

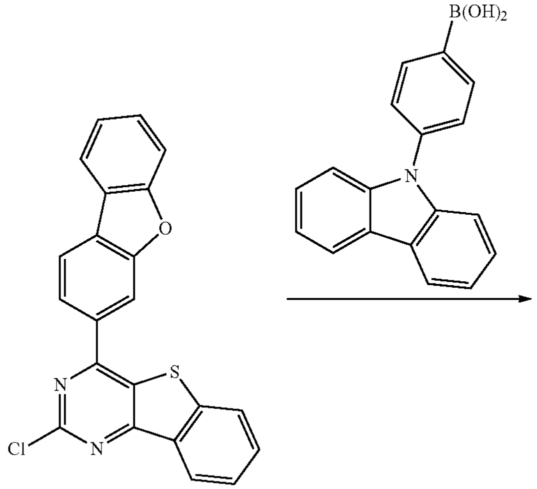

B-209-1

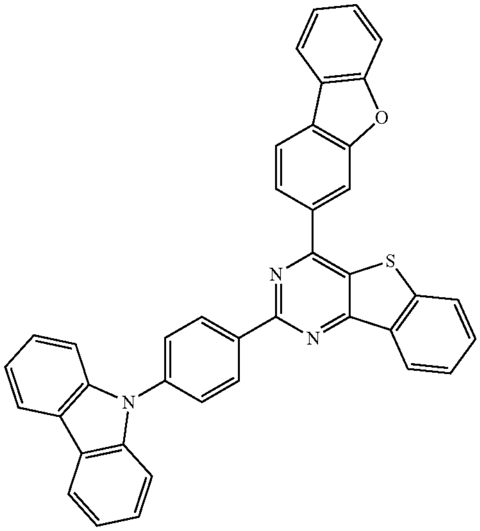

B-209

1st Step: Synthesis of Intermediate B-209-1

10.5 g of Intermediate A (refer to a synthesis method described in Korea Patent Laid-Open Publication No. 10-2017-0005637), 8.8 g of 3-dibenzofuran boronic acid, 11.4 g of potassium carbonate, and 2.4 g of tetrakis(triphenylphosphine)palladium(0) were added to 140 mL of 1,4-dioxane and 70 mL of water in a 500 mL flask, and then heated at 60° C. under a nitrogen flow for 12 hours. The obtained mixture was added to 500 mL of methanol, and a solid crystallized therein was filtered, dissolved in monochlorobenzene, filtered with silica gel/Celite, and after removing an organic solvent in an appropriate amount, recrystallized with methanol to obtain Intermediate B-209-1 (10.7 g, Yield: 67%).

2nd Step: Synthesis of Compound B-209

10.4 g of Intermediate B-209-1, 7.8 g of 4-(9-carbazolyl)phenylboronic acid, 7.5 g of potassium carbonate, and 1.6 g of tetrakis(triphenylphosphine)palladium(0) were added to 90 mL of 1,4-dioxane and 45 mL of water in a 250 mL flask, and then heated at 70° C. under a nitrogen flow for 12 hours. The obtained mixture was added to 250 mL of methanol, and a solid crystallized therein was filtered, dissolved in 1,2-dichlorobenzene, filtered with silica gel/Celite, and after removing an organic solvent in an appropriate amount, recrystallized with methanol to obtain Compound B-209 (13.0 g, Yield: 74%).

LC/MS measurement (C40H23N3OS), theoretical value: 593.16 g/mol, measured value: M=593.23 g/mol)

Synthesis Example 18: Synthesis of Compound C-25

[Reaction Scheme 19]

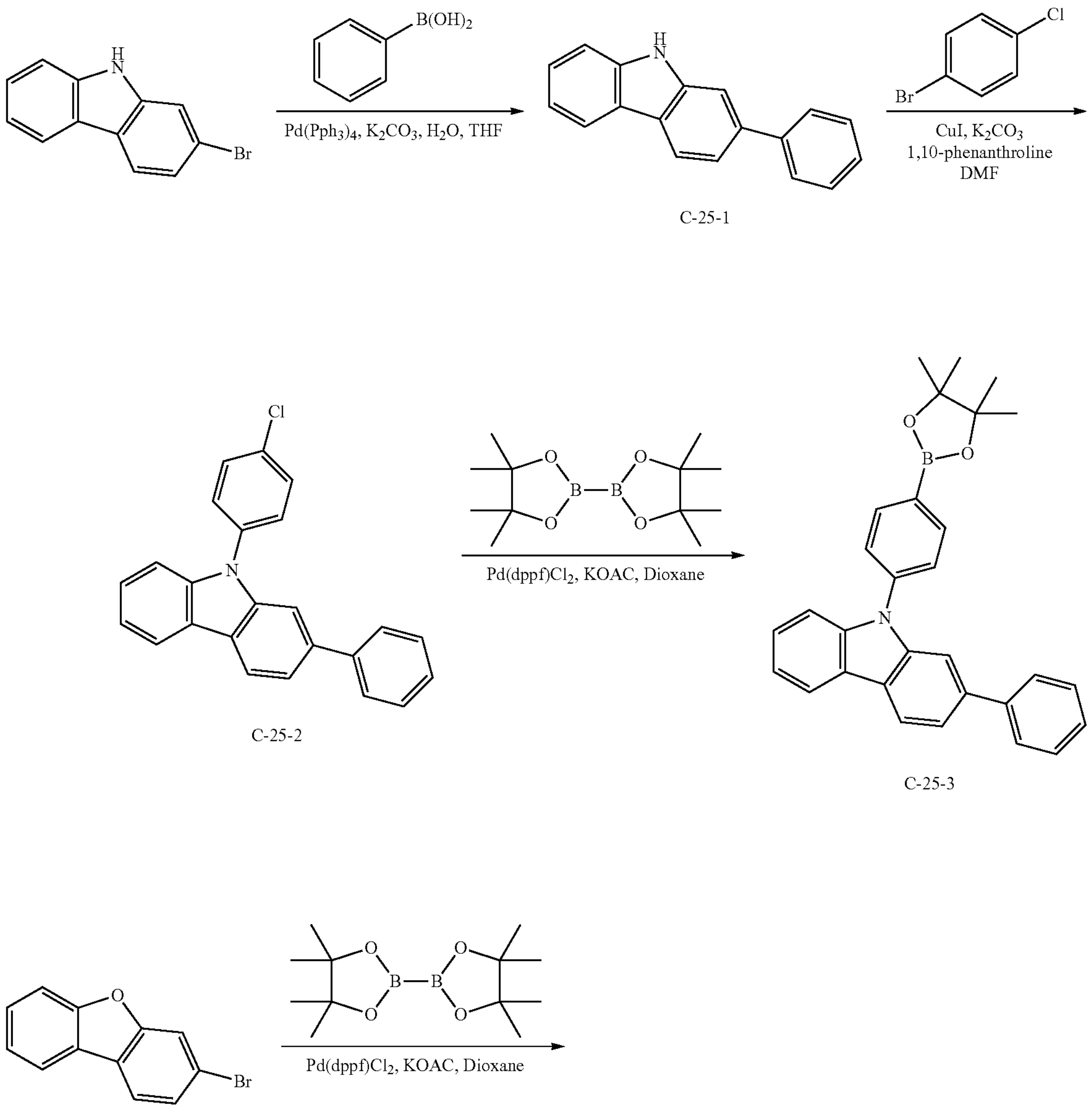

C-25-1

C-25-2

C-25-3

-continued

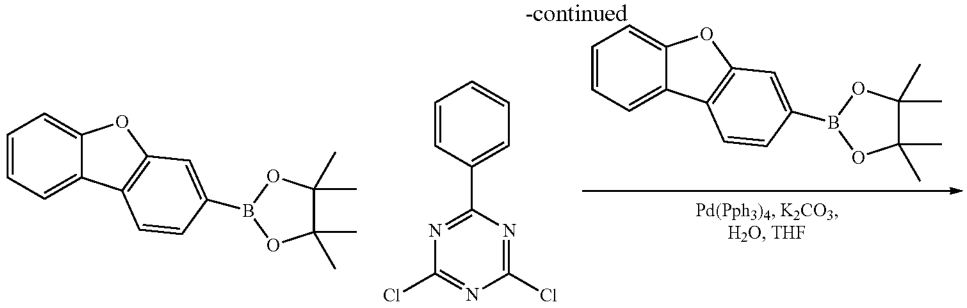

C-25-4

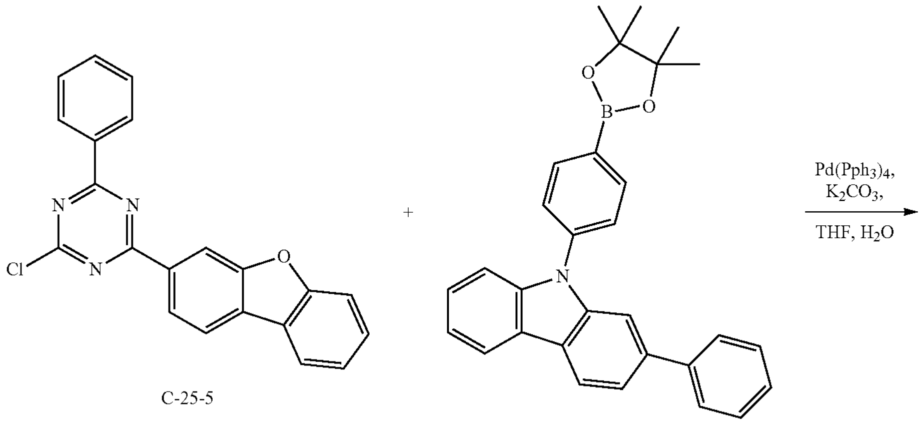

C-25-5

C-25-3

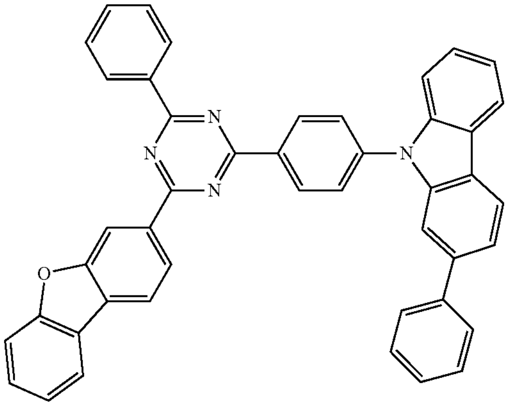

C-25

1st Step: Synthesis of Intermediate C-25-1

2-Bromocarbazole (35 g, 142 mmol) was dissolved in 0.5 L of tetrahydrofuran (THF), and phenyl boronic acid (17.3 g, 142 mmol) and tetrakis(triphenylphosphine)palladium (8.2 g, 7.1 mmol) were added thereto, and then stirred. Subsequently, potassium carbonate saturated in water (49.1 g, 356 mmol) was added thereto, and then heated and refluxed at 80° C. for 12 hours. When the reaction was complete, water was added to the reaction solution, dichloromethane (DCM) was used for an extraction, anhydrous magnesium sulfate was used to remove moisture therefrom, and the residue was filtered and concentrated under a reduced pressure. The obtained residue was separated and purified through flash column chromatography to obtain 22 g (63.6%) of Intermediate C-25-1.

2nd Step: Synthesis of Intermediate C-25-2

Intermediate C-25-1 (22 g, 90.4 mmol), 1-bromo-4-chloro-benzene (25.96 g, 135.61 mmol), CuI (1.71 g, 9 mmol), $K_2CO_3$ (18.74 g, 135.61 mmol), and 1,10-phenanthroline (1.62 g, 9 mmol) were put in a round-bottom flask and then, dissolved in 700 ml of DMF. The solution was stirred at 180° C. for 18 hours. When the reaction was complete, a reaction solvent was removed therefrom under a reduced pressure, dissolved in dichloromethane, and then silica gel-filtered. After concentrating the dichloromethane, hexane was used for recrystallization to obtain 18 g (56.3%) of Intermediate C-25-2.

3rd Step: Synthesis of Intermediate C-25-3

Intermediate C-25-2 (18 g, 51 mmol), bis(pinacolato) diboron (19.43 g, 76.5 mmol), Pd(dppf)$Cl_2$ (2.24 g, 8.64 mmol), tricyclohexylphosphine (2.86 g, 10.2 mmol), and potassium acetate (15.02 g, 153.01 mmol) were put in a round-bottom flask and then, dissolved in 720 ml of DMF. The mixture was refluxed and stirred at 120° C. for 12 hours. When the reaction was complete, the mixture was poured into an excess of distilled water, and then stirred for 1 hour. A solid therein was filtered and then, dissolved in DCM. After removing moisture with $MgSO_4$, an organic solvent was filtered by using a silica gel pad and then, removed under a reduced pressure. A solid therefrom was recrystallized with EA and hexane to obtain 14.8 g (65.3%) of Intermediate C-25-3.

4th Step: Synthesis of Intermediate C-25-4

31 g (65.1%) of Intermediate C-25-4 was synthesized according to the same method as the 3rd step of Synthesis Example 16 except that 3-bromo-dibenzofuran (40 g, 162 mmol) was used instead of Intermediate B-183-2.

5th Step: Synthesis of Intermediate C-25-5

Intermediate C-25-4 was dissolved in 0.3 L of tetrahydrofuran (THF), and 2,4-dichloro-6-phenyl-1,3,5-triazine (21 g, 93 mmol) and tetrakis(triphenylphosphine)palladium (5.38 g, 4.65 mmol) were added thereto, and then stirred. Potassium carbonate saturated in water (32.14 g, 232 mmol) was added thereto, and then heated and refluxed at 80° C. for 12 hours. When the reaction was complete, water was added to the reaction solution, and then stirred for 30 minutes and filtered, a solid therefrom was dissolved in monochlorobenzene at 133° C., treated with anhydrous magnesium sulfate to remove moisture, and filtered with silica gel, and the filtrate was cooled down to room temperature and filtered. The obtained solid was repetitively purified by using monochlorobenzene to obtain 15 g (64.8%) of Intermediate C-25-5.

6th Step: Synthesis of Compound C-25

12.7 g (67.5%) of Compound C-25 were obtained according to the same method as the 4th step of Synthesis Example 16 by using Intermediate C-25-5 (10.5 g, 29.3 mmol) and Intermediate C-25-3 (14.38 g, 32.28 mmol).

LC/MS measurement (C45H28NO), theoretical value: 640.23 g/mol, measured value: M=641.38 g/mol)

Synthesis Example 19: Synthesis of Compound C-23

[Reaction Scheme 20]

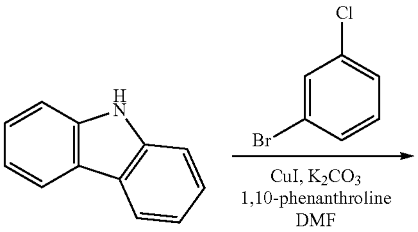

-continued

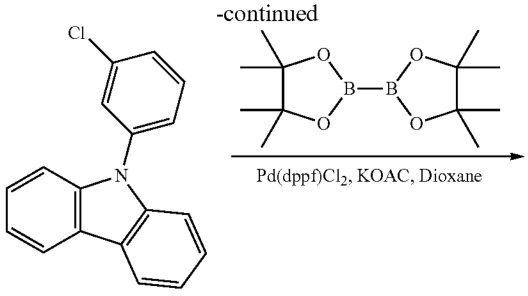

C-23-1

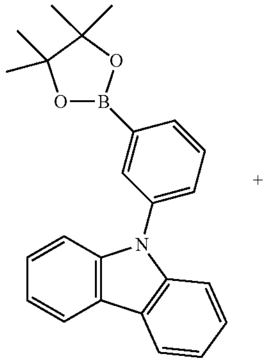

C-23-2

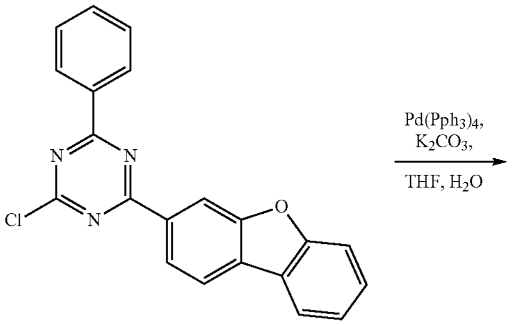

C-25-5

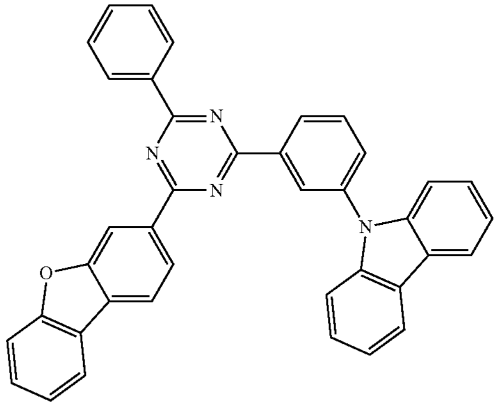

C-23

1st Step: Synthesis of Intermediate C-23-1

31.5 g (79%) of Intermediate C-23-1 were obtained according to the same method as the 2nd step of Synthesis Example 18 except that 9H-carbazole (24.1 g, 144 mmol) and 1-bromo-3-chloro-benzene (27.6 g 144 mmol) were used.

2nd Step: Synthesis of Intermediate C-23-2

16.8 g (70%) of Intermediate C-23-2 were obtained according to the same method as the 3rd step of Synthesis Example 18 except that Intermediate C-23-1 (18 g, 65 mmol) was used instead of Intermediate C-25-2.

3rd Step: Synthesis of Compound C-23

16.4 g (66%) of Intermediate C-23 were obtained according to the same method as the 6th step of Synthesis Example 18 except that Intermediate C-23-2 (16.3 g, 44.3 mmol) and Intermediate C-25-5 (15.8 g, 44.3 mmol) were used.

LC/MS measurement (C39H24N4O), theoretical value: 564.20 g/mol, measured value: M=565.36 g/mol)

Synthesis Example 20: Synthesis of Compound D-57

[Reaction Scheme 21]

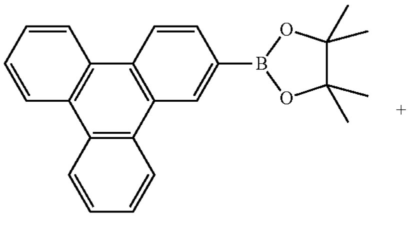

D-57-1

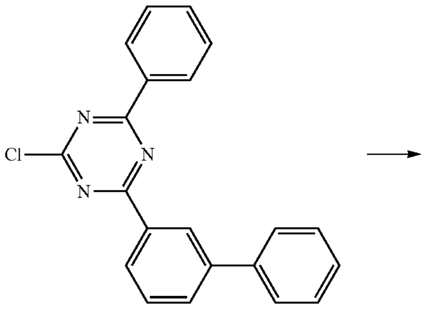

D-57-2

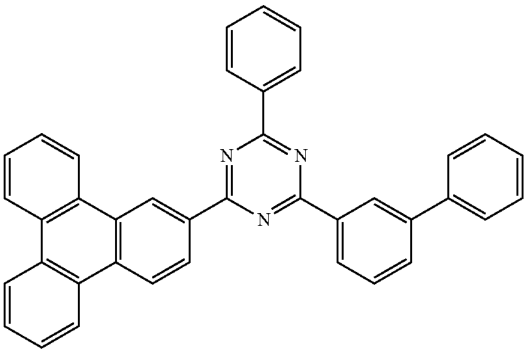

D-57

Compound D-57 was synthesized with a reference to a method described in Korea Patent Laid-Open Publication No. 10-2014-0135524 by using Intermediate D-57-1 and Intermediate D-57-2 (Yield: 88%).

LC/MS measurement (C39H25N3), theoretical value: 535.20 g/mol, measured value: M=535.83 g/mol Comparative Synthesis Example 2: Synthesis of Compound V-2

[Reaction Scheme 22]

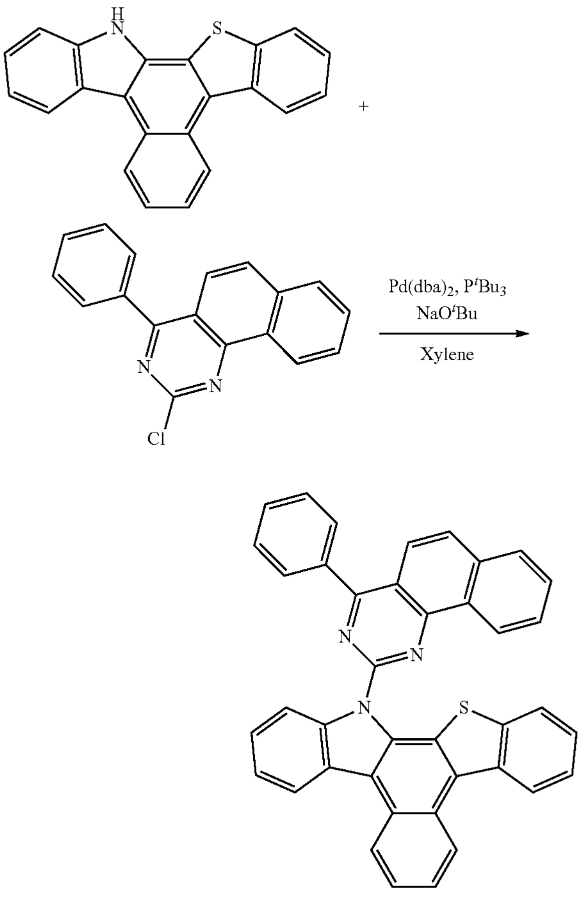

V-2

5.7 g (Yield: 57%) of Compound V-2 was obtained according to the method described in Korean Patent No. 1604647.

Comparative Synthesis Example 3: Synthesis of Compound V-3

[Reaction Scheme 23]

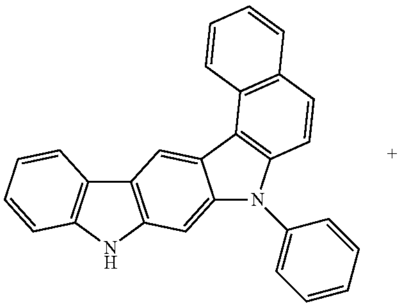

-continued

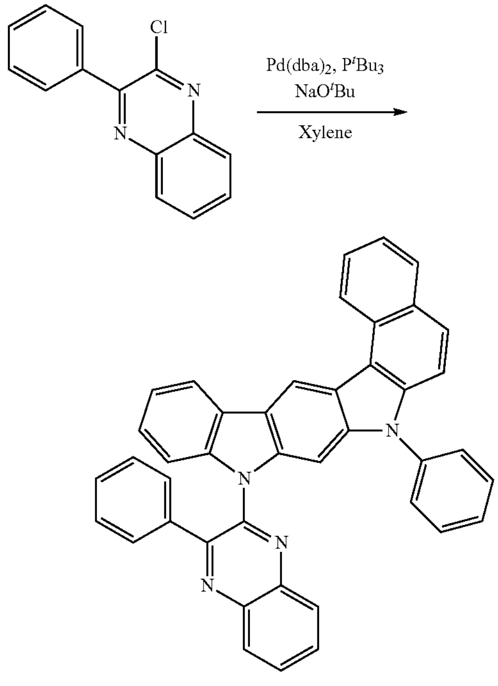

V-3

6.4 g (Yield: 47%) of Compound V-3 was obtained according to the same method as described in KR2015-0077513.

Synthesis of Third Compound

Synthesis Example 21: Synthesis of Compound E-9

[Reaction Scheme 24]

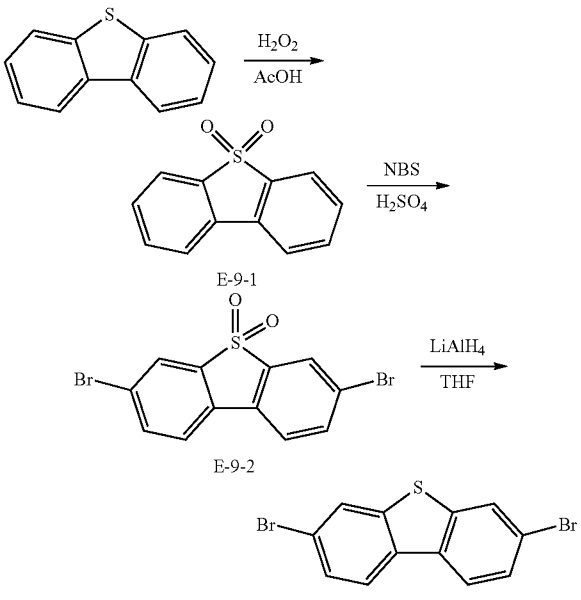

E-9-1

E-9-2

E-9-3

-continued

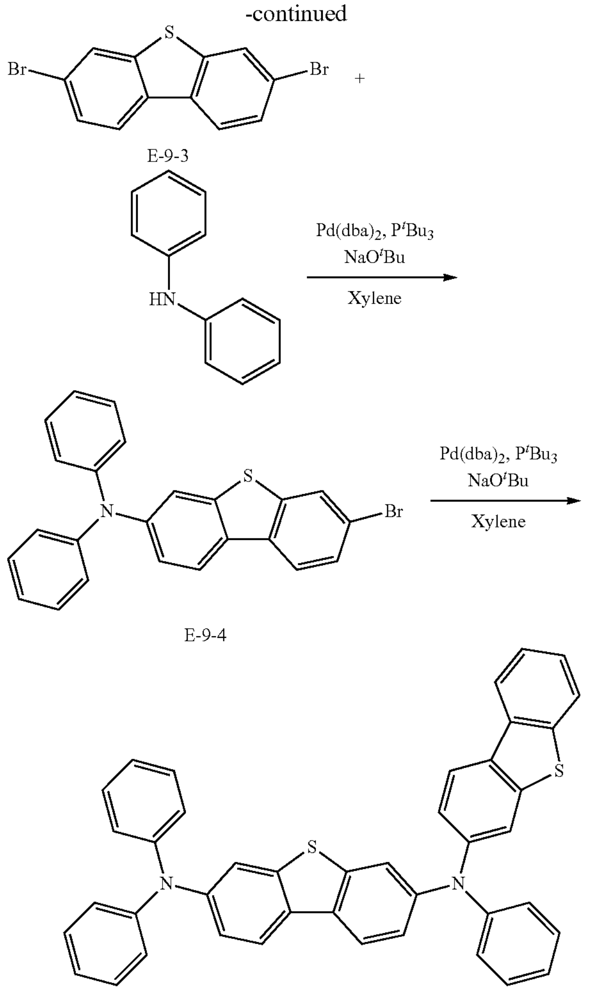

E-9-3

E-9-4

E-9

1st Step: Synthesis of Intermediate E-9-1

50 g (271.43 mmol) of dibenzothiophene was added to 500 mL of acetic acid in a 1 L round-bottom flask, and an internal temperature thereof was set at 0° C. 117 ml (1.36 mol) of hydrogen peroxide was slowly added thereto. Herein, the internal temperature was maintained at 0° C. The obtained mixture was heated under a nitrogen atmosphere at 90° C. After 12 hours, the reaction solution was cooled down, extracted with dichloromethane (DCM), treated with anhydrous magnesium sulfate to remove moisture, filtered, and concentrated under a reduced pressure to obtain 55 g (Yield: 94%) of Intermediate E-9-1.

2nd Step: Synthesis of Intermediate E-9-2

54 g (249.70 mmol) of Intermediate E-9-1 was added to 500 mL of sulfuric acid in a 1 L round-bottom flask, and an internal temperature thereof was set at 0° C. 90.7 g (499.40 mmol) of NBS was slowly added thereto. Herein, the internal temperature was maintained at 0° C. The reaction solution was stirred under a nitrogen atmosphere at room temperature for 4 hours, slowly put in ice water, treated with dichloromethane (DCM) for an extraction, treated with anhydrous magnesium sulfate to remove moisture, filtered, and concentrated under a reduced pressure. The obtained residue was separated and purified with flash column chromatography to obtain 46 g (49%) of Intermediate E-9-2.

3rd Step: Synthesis of Intermediate E-9-3

45 g (120.30 mmol) of Intermediate E-9-2 was added to 500 mL of tetrahydrofuran in a 1 L round-bottom flask, and an internal temperature thereof was set at 0° C. 10.1 g (252.64 mmol) of lithium aluminum hydride was slowly added thereto. Herein, the internal temperature was maintained at 0° C. After stirring at 75° C. under a nitrogen atmosphere for 3 hours, the reaction solution was slowly put in ice water, and then stirred and Celite-filtered. Subsequently, the reaction solution was treated with dichloromethane (DCM) for an extraction, treated with anhydrous magnesium sulfate to remove moisture, filtered, and concentrated under a reduced pressure. The obtained residue was separated and purified through flash column chromatography to obtain 28 g (68%) of Intermediate E-9-3.

4th Step: Synthesis of Intermediate E-9-4

15.0 g (43.92 mmol) of Intermediate E-9-3, 6.69 g (39.30 mmol) of diphenylamine, 10.56 g (109.8 mmol) of sodium t-butoxide, and 1.8 g (4.38 mmol) of tri-tert-butylphosphine were dissolved in 300 ml of xylene, and 2.01 g (2.19 mmol) of $Pd(dba)_2$ was added thereto, and then stirred under a nitrogen atmosphere for 12 hours at 100° C. When the reaction was complete, xylene and distilled water were used for an extraction, an organic layer therefrom was dried with anhydrous magnesium sulfate and filtered, and the filtrate was concentrated under a reduced pressure. A product therefrom was purified through silica, gel column chromatography with n-hexane/dichloromethane (in a volume ratio of 2:1) to obtain 10.5 g (Yield: 56%) of Intermediate E-9-4 as a white solid.

5th Step: Synthesis of Compound E-9

3.5 g (8.15 mmol) of Intermediate E-9-4, 3.3 g (8.96 mmol) of 3-dibenzothiophene-phenylamine, 1.96 g (20.37 mmol) of sodium t-butoxide, and 0.3 g (0.81 mmol) of tri-tert-butylphosphine were dissolved in 50 ml of xylene, and 0.37 g (0.41 mmol) of $Pd(dba)_2$ was added thereto, and then refluxed and stirred under a nitrogen atmosphere for 12 hours. When the reaction was complete, the resultant was extracted with xylene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 3.8 g (Yield: 75%) of Compound E-9 as a white solid.

Calculation value: C, 80.74; H, 4.52; N, 4.48; S, 10.26

Analyzed value: C, 80.73; H, 4.53; N, 4.48; S, 10.26

Synthesis Example 22: Synthesis of Compound E-12

[Reaction Scheme 25]

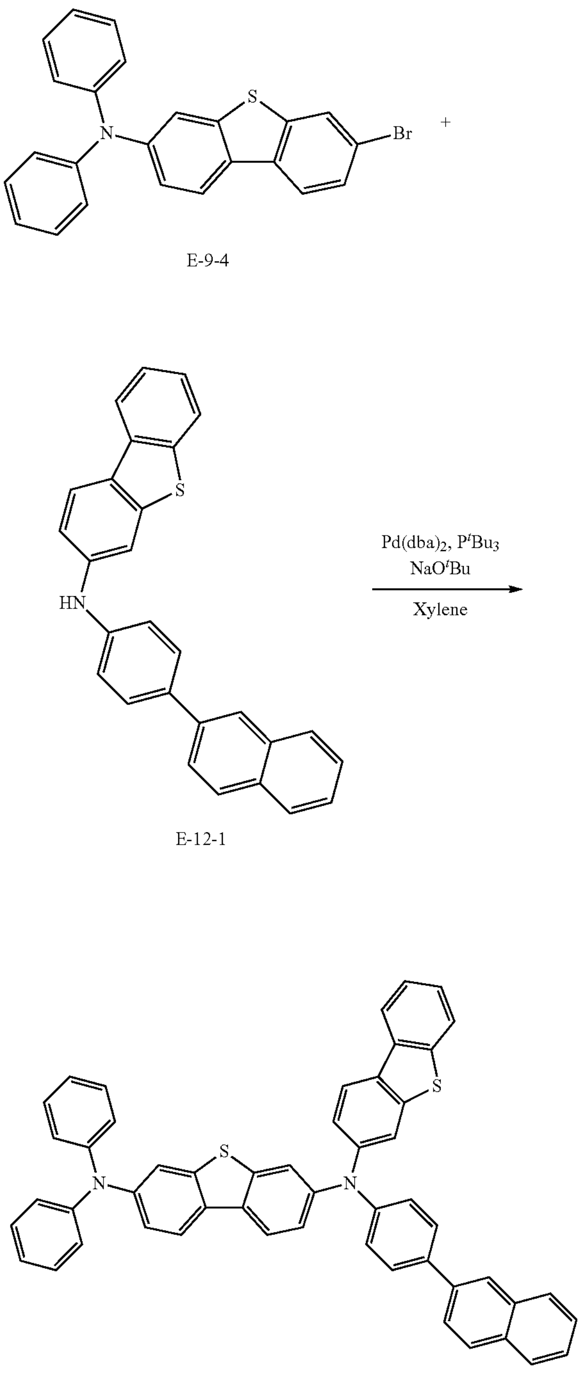

E-9-4

E-12-1

E-12

4.7 g (Yield: 68%) of Compound E-12 as a white solid was obtained according to the same method as Compound E-9 according to the 5th step of Synthesis Example 21.

Calculation value: C, 83.17; 14, 4.56; N, 3.73; S, 8.54

Analyzed value: C, 83.16; H, 4.56; N, 3.74; S, 8.54

Synthesis Example 23: Synthesis of Compound E-13

[Reaction Scheme 26]

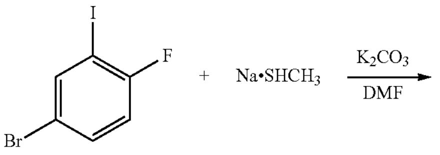

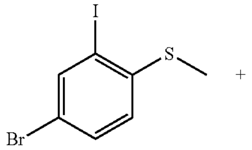

E-13-1

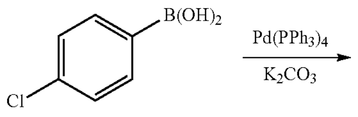

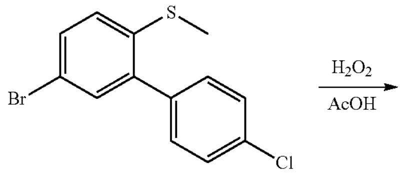

E-13-2

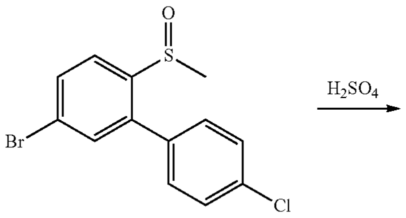

E-13-3

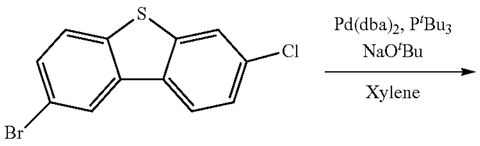

E-13-4

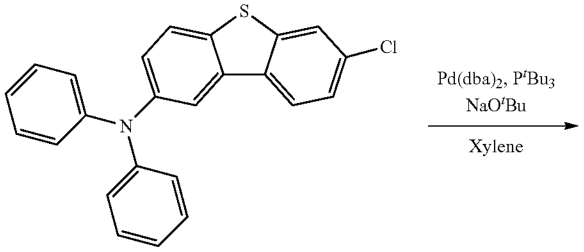

E-13-5

-continued

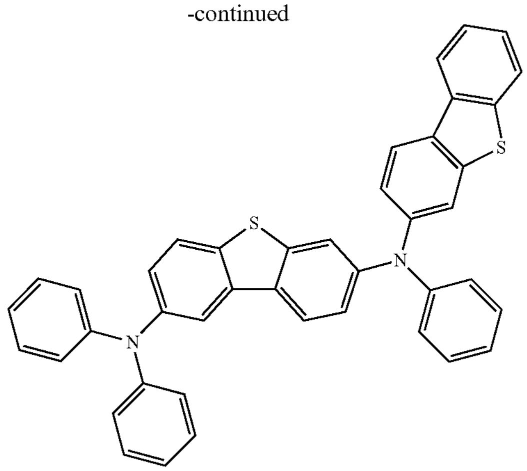

E-13

1st Step: Synthesis of Intermediate E-13-1

150 g (498.5 mmol) of 4-bromo-2-fluoro-1-iodobenzene was added to 1.5 L of N,N-dimethylformamide in a 3 L round-bottom flask, and an internal temperature thereof was set at 0° C. 35.44 g (498.52 mmol) of sodium thiomethoxide (CAS No.: 5188-07-8), 103.19 g (747.98 mmol) of potassium carbonate were slowly added thereto. Herein, the internal temperature was set at 0° C. The obtained mixture was heated at 80° C. under a nitrogen atmosphere. After 6 hours, the reaction solution was cooled down, ethyl acetate and an aqueous layer were added thereto and stifled, and an organic layer therefrom was treated through column chromatography under a reduced pressure to obtain 106.61 g (Yield: 65%) of Intermediate E-13-1.

2nd Step: Synthesis of Intermediate E-13-2

Intermediate E-13-1 (106 g, 322 mmol) was dissolved in 1.0 L of tetrahydrofuran (THF), and 4-chlorophenylboronic acid (57.66 g, 322 mmol) and tetrakis(triphenylphosphine) palladium (11.2 g, 9.7 mmol) were added thereto, and then stirred. Subsequently, potassium carbonate saturated in water (111.32 g, 805 mmol) was added thereto, and then heated and refluxed at 80° C. for 12 hours. When the reaction was complete, water was added to the reaction solution, dichloromethane (DCM) was used for an extraction, anhydrous magnesium sulfate was used to remove moisture, and the residue was filtered and concentrated under a reduced pressure. The obtained residue was separated and purified through flash column chromatography to obtain 63.66 g (63%) of Intermediate E-13-2.

3rd Step: Synthesis of Intermediate E-13-3

63 g (200.87 mmol) of Intermediate E-13-2 was added to 600 mL of acetic acid, and an internal temperature thereof was set at 0° C. 20.4 ml of hydrogen peroxide was slowly added thereto. Herein, the internal temperature was maintained at 0° C. The reaction solution was stirred at room temperature for 6 hours, put in ice water, treated with dichloromethane (DCM) for an extraction, treated with anhydrous magnesium sulfate to remove moisture, filtered, and concentrated under a reduced pressure to obtain 61 g (Yield: 92%) of Intermediate E-13-3.

4th Step: Synthesis of Intermediate E-13-4

60 g (182.12 mmol) of Intermediate E-13-3 was added to 400 mL of sulfuric acid, and then stirred at room temperature for 6 hours, and the reaction solution was put in ice water and adjusted to have pH 9 by using a NaOH aqueous solution. The reaction solution was extracted with dichloromethane (DCM), treated with anhydrous magnesium sulfate to remove moisture, filtered, and concentrated under a reduced pressure to obtain 38 g (Yield: 70%) of Intermediate E-13-4.

5th Step: Synthesis of Intermediate E-13-5

5.0 g (16.82 mmol) of Intermediate E-13-4, 2.85 g (16.82 mmol) of diphenylamine, 4.04 g (42.04 mmol) of sodium t-butoxide, and 0.7 g (1.69 mmol) of tri-tert-butylphosphine were dissolved in 100 ml of xylene, and 0.77 g (0.84 mmol) of $Pd(dba)_2$ was added thereto, and then stirred 100° C. under a nitrogen atmosphere for 12 hours. When the reaction was complete, the resultant was extracted with xylene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 4.7 g (Yield: 72%) of Intermediate E-13-5 as a white solid.

6th Step: Synthesis of Compound E-13

4.5 g (11.68 mmol) of Intermediate E-13-5, 3.3 g (11.68 mmol) of 3-dibenzothiophene-phenylamine, 2.81 g (29.21 mmol) of sodium t-butoxide, and 1.2 g (1.17 mmol) of tri-tert-butylphosphine were dissolved in 50 ml of xylene, and 0.54 g (0.58 mmol) of $Pd(dba)_2$ was added thereto, and then refluxed and stirred under a nitrogen atmosphere for 12 hours. When the reaction was complete, the resultant was extracted with xylene and distilled water, an organic layer therefrom was dried with anhydrous magnesium sulfate and filtered, and the filtrate was concentrated under a reduced pressure. A product therefrom was purified through silica gel column chromatography with n-hexane/dichloromethane (in a volume ratio of 2:1) to obtain 5.5 g (Yield: 75%) of Compound E-13 as a white solid.

Calculation value: C, 80.74; H, 4.52; N, 4.48; S, 10.26

Analyzed value: C, 80.74; H, 4.52; N, 4.48; S, 10.26

Synthesis Example 24: Synthesis of Compound E-16

[Reaction Scheme 27]

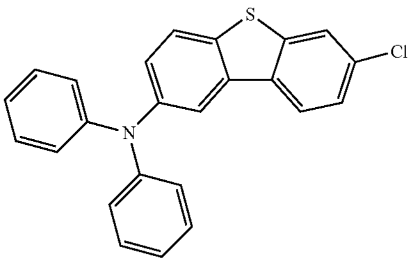

+

E-13-5

-continued

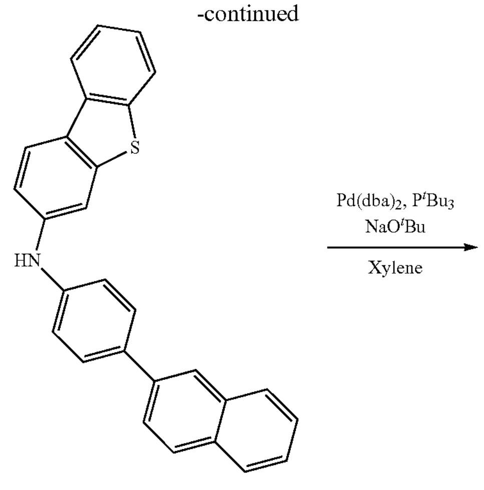

E-12-1

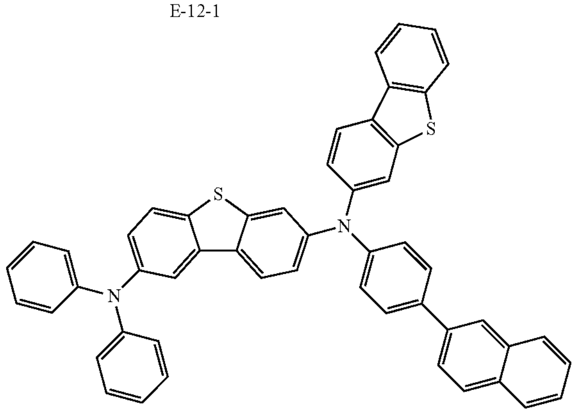

E-16

3.5 g (Yield: 70%) of Compound E-16 as a white solid was obtained according to the same method as Compound E-13 according to the 6th step of Synthesis Example 23.

Calculation value: C, 83.17; H, 4.56; N, 3.73; S, 8.54

Analyzed value: C, 83.17; H, 4.56; N, 3.74; S, 8.54

Synthesis Example 25: Synthesis of Compound E-33

[Reaction Scheme 28]

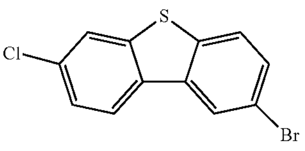

+

E-13-4

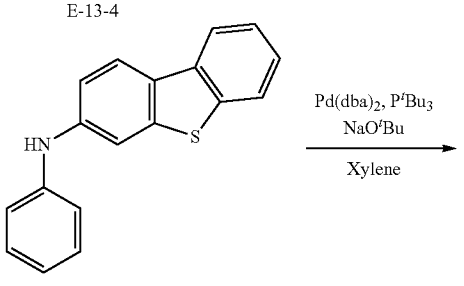

-continued

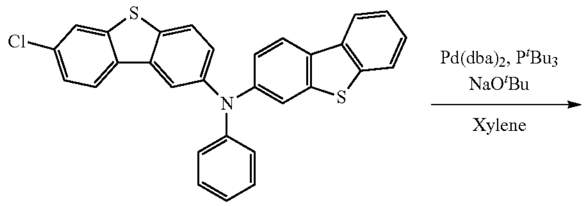

E-33-1

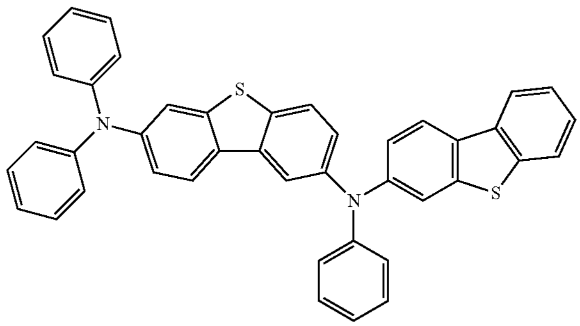

E-33

1st Step: Synthesis of Intermediate E-33-1

Intermediate E-33-1 as a white solid was obtained according to the same method as Intermediate E-13-5 according to the 5th step of Synthesis Example 23 except that 3-dibenzothiophene-phenylamine instead of the diphenylamine was used.

2nd Step: Synthesis of Compound E-33

5.1 g (Yield: 62%) of Intermediate E-33 as a white solid was obtained according to the same method as Intermediate E-13 according to the 6th step of Synthesis Example 23 except that Intermediate E-33-1 instead of Intermediate E-13-5 was used.

Calculation value: C, 80.74; H, 4.52; N, 4.48; S, 10.26

Analyzed value: C, 80.72; H, 4.50; N, 4.48; S, 10.26

Synthesis Example 26: Synthesis of Compound E-65

[Reaction Scheme 29]

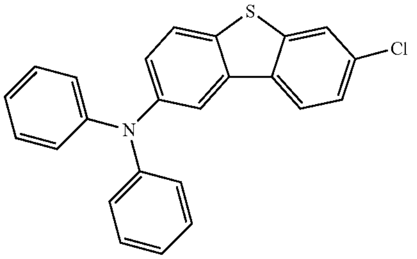

+

E-13-5

-continued

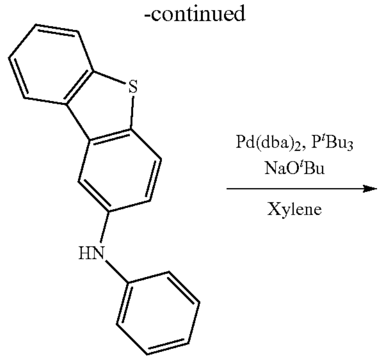

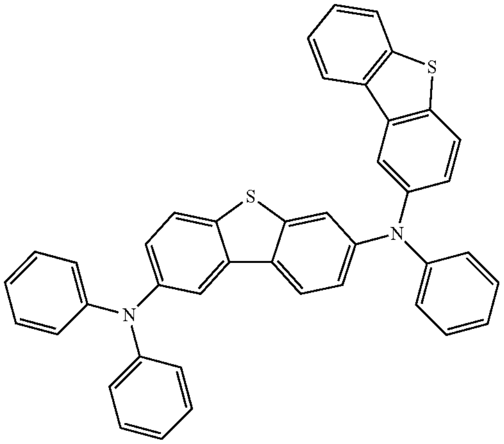

E-65

3.9 g (Yield: 66%) of Intermediate E-65 as a white solid was obtained according to the same method as Intermediate E-13 according to the 6th step of Synthesis Example 23 except that 2-dibenzothiophene-phenylamine instead of the 3-dibenzothiophene-phenylamine was used.

Calculation value: C, 80.74; H, 4.52; N, 4.48; S, 10.26

Analyzed value: C, 80.74; H, 4.52; N, 4.48; S, 10.26

Synthesis Example 27: Synthesis of Compound E-93

[Reaction Scheme 30]

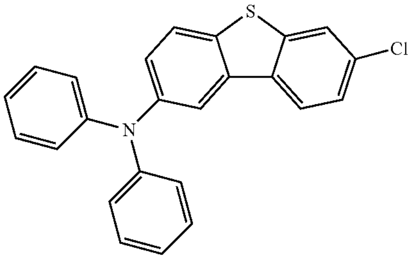

+

E-13-5

-continued

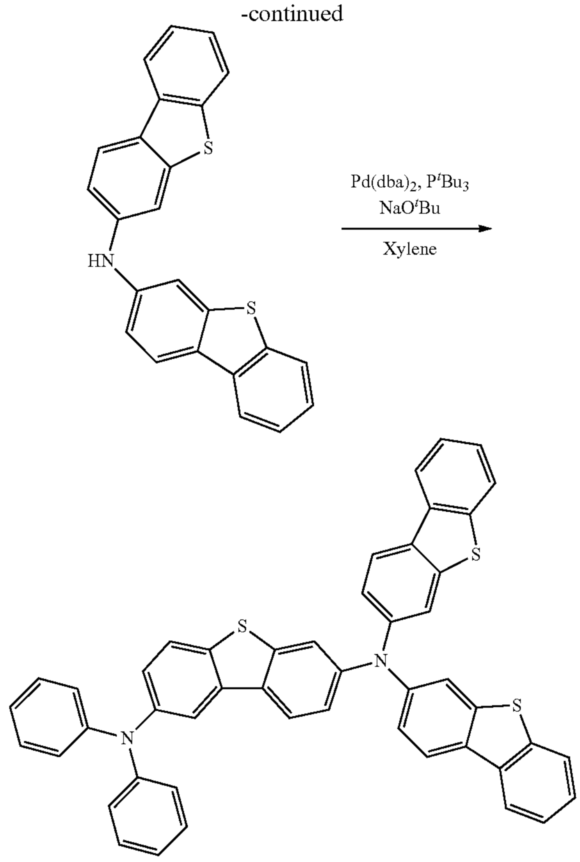

E-93

3.4 g (Yield: 64%) of Intermediate E-93 as a white solid was obtained according to the same method as Intermediate E-13 according to the 6th step of Synthesis Example 23 except that N-3-dibenzothienyl-3-dibenzothiophenamine (CAS no.: 1705596-48-0) instead of the 3-dibenzothiophene-phenylamine was used.

Calculation value: C, 78.87; H, 4.14; N, 3.83; S, 13.16

Analyzed value: C, 78.86; H, 4.14; N, 3.84; S, 13.16

Synthesis Example 28: Synthesis of Compound F-17

[Reaction Scheme 31]

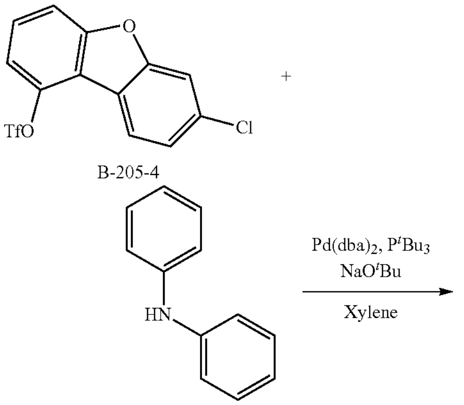

B-205-4

-continued

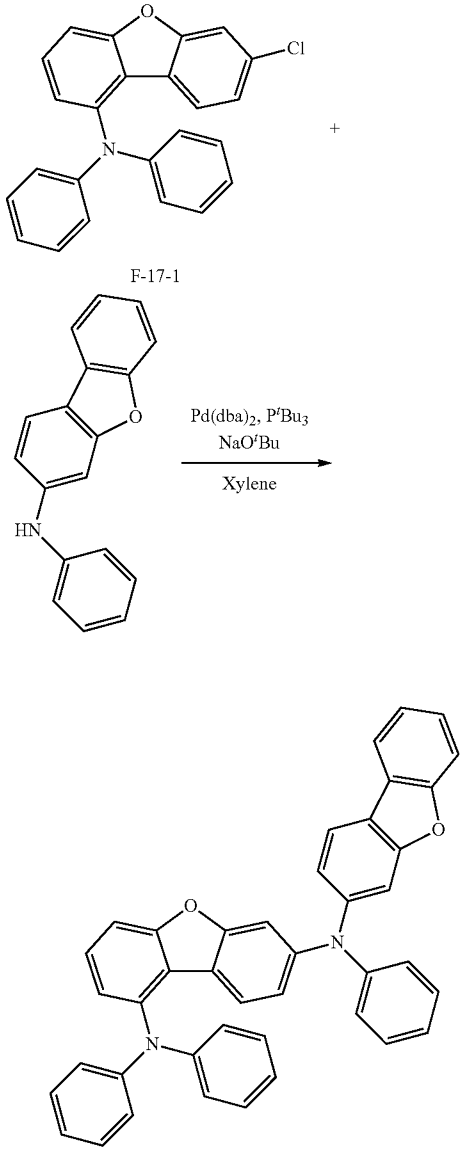

F-17-1

F-17

1st Step: Synthesis of Intermediate F-17-1

Intermediate F-17-1 as a white solid was obtained according to the same method as Intermediate E-13-5 according to the 5th step of Synthesis Example 23 except that Intermediate B-205-4 instead of Intermediate E-13-4 was used.

2nd Step: Synthesis of Compound F-17

6.8 g (Yield: 70%) of Compound F-17 as a white solid was obtained according to the same method as Compound E-13 according to the 6th step of Synthesis Example 23 except that Intermediate F-17-1 and 3-dibenzofuran-phenylamine were used.

Calculation value: C, 85.11; H, 4.76; N, 4.73; O, 5.40

Analyzed value: C, 85.11; H, 4.76; N, 4.73; O, 5.40

Synthesis Example 29: Synthesis of Compound F-37

[Reaction Scheme 32]

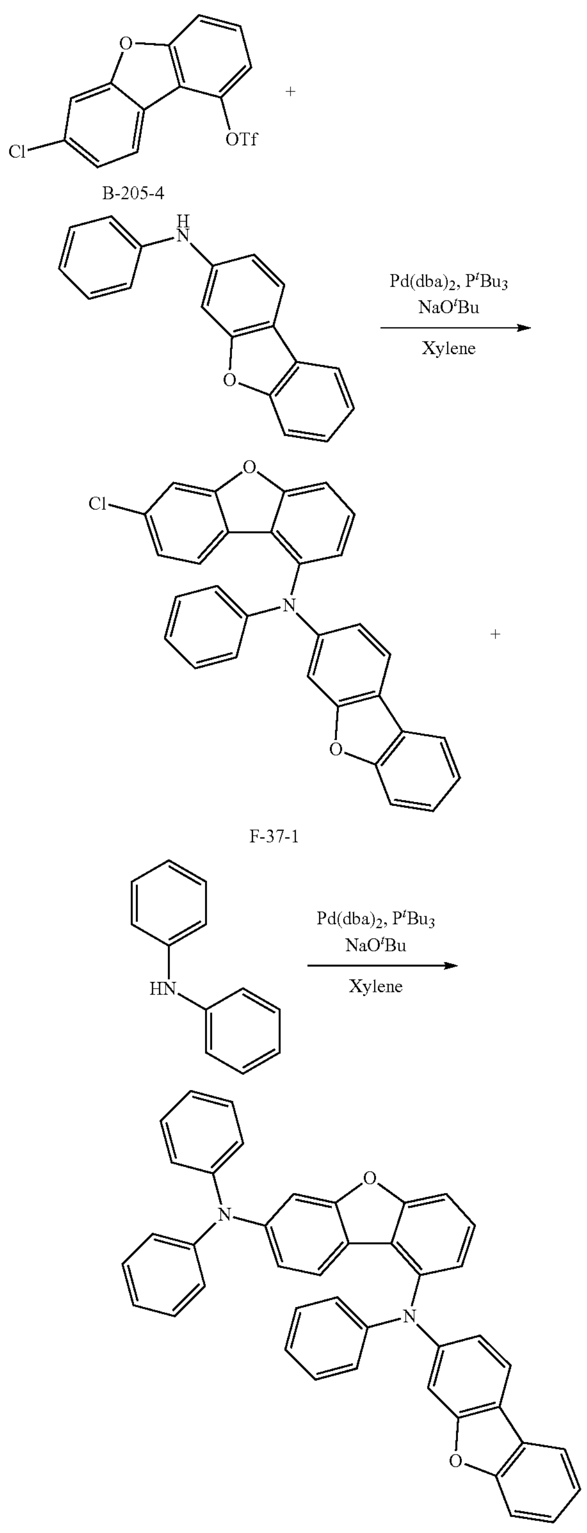

B-205-4

F-37-1

F-37

1st Step: Synthesis of Intermediate F-37-1

Intermediate F-37-1 was obtained according to the same method as Intermediate E-13-5 according to the 5th step of Synthesis Example 23 except that Intermediate B-205-4 and 3-dibenzofuran-phenylamine were used.

2nd Step: Synthesis of Compound F-37

6.2 g (Yield: 69%) of Compound F-37 as a white solid was obtained according to the same method as Compound E-13 according to the 6th step of Synthesis Example 23 except that Intermediate F-37-1 and diphenylamine were used.

Calculation value: C, 85.11; H, 4.76; N, 4.73; O, 5.40

Analyzed value: C, 85.10; H, 4.77; N, 4.73; O, 5.40

Synthesis Example 30: Synthesis of Compound G-13

[Reaction Scheme 33]

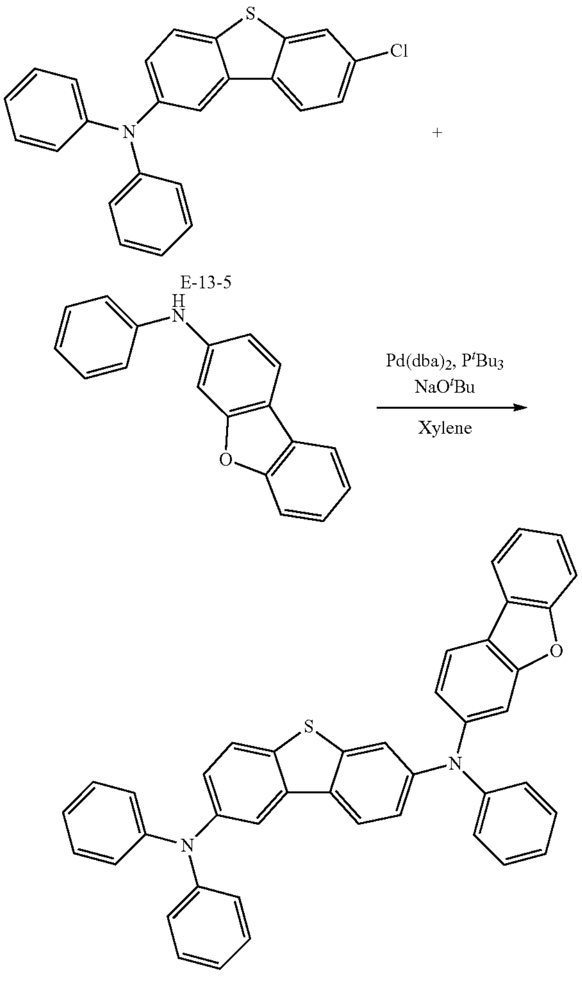

E-13-5

G-13

7.0 g (Yield: 71%) of Compound G-13 as a white solid was obtained according to the same method as Compound E-13 according to the 6th step of Synthesis Example 23 except that Intermediate E-13-5 and 3-dibenzofuran-phenylamine were used.

LC/MS calculated for: C42H28N2OS Exact Mass: 608.19 found for 608.20 [M+H].

Synthesis Example 31: Synthesis of Compound H-17

[Reaction Scheme 34]

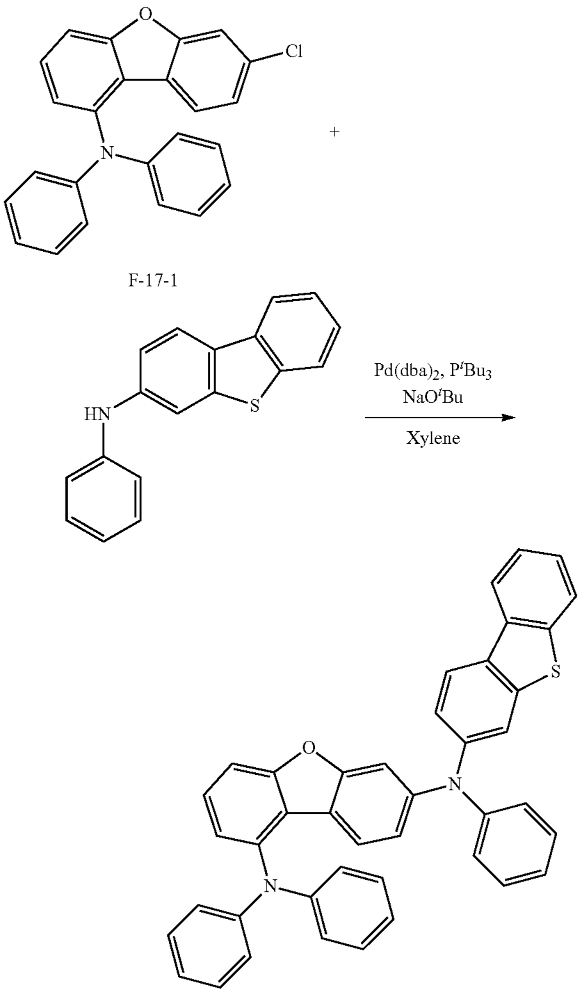

F-17-1

H-17

5.7 g (Yield: 68%) of Compound H-17 as a white solid was obtained according to the same method as Compound E-13 according to the 6th step of Synthesis Example 23 except that Intermediate F-17-1 and 3-dibenzothiophene-phenylamine were used.

Manufacture of Organic Light Emitting Diode

Example 1

A glass substrate coated with ITO (indium tin oxide) as a 1500 Å-thick thin film was washed with distilled water. After washing with the distilled water, the glass substrate was ultrasonic wave-washed with a solvent such as isopropyl alcohol, acetone, methanol, and the like and dried and then, moved to a plasma cleaner, cleaned by using oxygen plasma for 10 minutes, and moved to a vacuum depositor.

This obtained ITO transparent electrode was used as an anode, Compound A was vacuum-deposited on the ITO substrate to form a 700 Å-thick hole injection layer, and Compound B was deposited to be 50 Å-thick on the injection layer, and then Compound C was deposited to be 700 Å-thick to form a hole transport layer. On the hole transport auxiliary layer, Compound E-13 was vacuum-deposited to form a 700 Å-thick hole transport auxiliary layer. On the hole transport auxiliary layer, 400 Å-thick light emitting layer was formed by using Compounds A-94 and B-135 simultaneously as a host and doping 2 wt % of Ir(piq)$_2$acac as a dopant by a vacuum-deposition. Herein Compound A-94 and Compound B-135 were used in a weight ratio of 6:4 and their ratios in the following Examples were separately provided. Subsequently, on the light emitting layer, a 300 Å-thick electron transport layer was formed by simultaneously vacuum-depositing Compound D and Liq in a ratio of 1:1, and on the electron transport layer, Liq and Al were sequentially vacuum-deposited to be 15 Å-thick and 1200 Å-thick, manufacturing an organic light emitting diode.

The organic light emitting diode had a five-layered organic thin layer, and specifically the following structure.

ITO/Compound A (700 Å)/Compound B (50 Å)/Compound C (700 Å)/Compound E-13 (700 Å)/EML[Compound A-94: B-135: Ir(piq)$_2$acac (2 wt %)](400 Å)/Compound D: Liq (300 Å)/Liq (15 Å)/Al (1200 Å).

Compound A: N4,N4'-diphenyl-N4,N4'-bis(9-phenyl-9H-carbazol-3-yl)biphenyl-4,4'-diamine Compound B: 1,4,5,8,9,11-hexaazatriphenylene-hexacarbonitrile (HAT-CN)

Compound C: N-(biphenyl-4-yl)-9,9-dimethyl-N-(4-(9-phenyl-9H-carbazol-3-yl)phenyl)-9H-fluoren-2-amine Compound D: 8-(4-(4,6-di(naphthalen-2-yl)-1,3,5-triazin-2-yl)phenyl)quinoline Examples 2 to 19

Each organic light emitting diode was manufactured according to the same method as Example 1 except for changing compositions as shown in Table 1.

Comparative Example 1 to 3

Each organic light emitting diode was manufactured according to the same method as Example 1 except for changing compositions as shown in Table 1.

Evaluation

Driving voltages and power efficiency of the organic light emitting diodes according to Examples 1 to 19 and Comparative Examples 1 to 3 were evaluated.

Specific measurement methods are as follows, and the results are shown in Table 1.

(1) Measurement of Driving Voltage

A driving voltage of each diode was measured using a current-voltage meter (Keithley 2400) to provide the results.

(2) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(3) Measurement of Luminance Change Depending on Voltage Change

Luminance was measured by using a luminance meter (Minolta Cs-1000A), while the voltage of the organic light emitting diodes was increased from 0 V to 10 V.

(4) Measurement of Power Efficiency

Power efficiency (in lm/w) was calculated by using the luminance, current density, and voltages from the items (2) and (3), and was scaled (as a percentage) relative to Comparative Example 3.

TABLE 1

| | Light emitting layer | | Hole transport auxiliary layer | Driving | Power |
|---|---|---|---|---|---|
| | First compound | Second compound | Third compound | voltage (V) | efficiency (lm/w) |
| Example 1 | A-94 | B-135 | E-13 | 4.00 | 122% |
| Example 2 | A-94 | B-135 | E-16 | 3.90 | 114% |
| Example 3 | A-94 | B-135 | E-33 | 3.98 | 126% |
| Example 4 | A-94 | B-135 | E-65 | 3.98 | 128% |
| Example 5 | A-94 | B-135 | E-93 | 3.97 | 122% |
| Example 6 | A-94 | B-135 | G-13 | 3.96 | 123% |
| Example 7 | A-94 | B-17 | E-13 | 4.08 | 119% |
| Example 8 | A-94 | B-205 | E-13 | 3.88 | 125% |
| Example 9 | A-94 | B-183 | E-13 | 3.92 | 124% |
| Example 10 | A-94 | B-209 | E-13 | 4.28 | 114% |
| Example 11 | A-94 | C-25 | E-13 | 4.20 | 116% |
| Example 12 | A-94 | C-23 | E-13 | 4.20 | 116% |
| Example 13 | A-94 | D-57 | E-13 | 4.12 | 118% |
| Example 14 | A-52 | B-135 | E-13 | 4.07 | 120% |
| Example 15 | A-54 | B-135 | E-13 | 4.08 | 119% |
| Example 16 | A-56 | B-135 | E-13 | 3.96 | 123% |
| Example 17 | A-59 | B-135 | E-13 | 3.92 | 124% |
| Example 18 | A-82 | B-135 | E-13 | 4.06 | 120% |
| Example 19 | A-93 | B-135 | E-13 | 4.06 | 120% |
| Comparative Example 1 | V-1 | B-135 | E-13 | 4.62 | 77% |
| Comparative Example 2 | V-3 | | E-13 | 4.47 | 89% |
| Comparative Example 3 | V-4 | | E-13 | 4.36 | 100% |

Referring to Table 1, the organic light emitting diodes according to Examples 1 to 19 exhibited greatly reduced driving voltages and improved power efficiency compared with the organic light emitting diodes according to Comparative Examples 1 to 3.

As described above, embodiments may provide an organic optoelectronic device exhibiting high efficiency and a long life-span. Embodiments may also provide a display device including the organic optoelectronic device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

300: organic light emitting diode

110: anode

120: cathode

130: light emitting layer

141: hole transport layer

142: hole transport auxiliary layer

105: organic layer

What is claimed is:

1. An organic optoelectronic device, comprising:

an anode and a cathode facing each other, a light emitting layer disposed between the anode and the cathode, the light emitting layer including a first compound represented by Chemical Formula 1E-2-2, and a second compound represented by Chemical Formula 3-1a, Chemical Formula 3-2, or Chemical Formula 3-3a, a hole transport layer disposed between the anode and the light emitting layer, and a hole transport auxiliary layer disposed between the light emitting layer and the hole transport layer, the hole transport auxiliary layer including a third compound represented by Chemical Formula 4,

[Chemical Formula 1E-2-2]

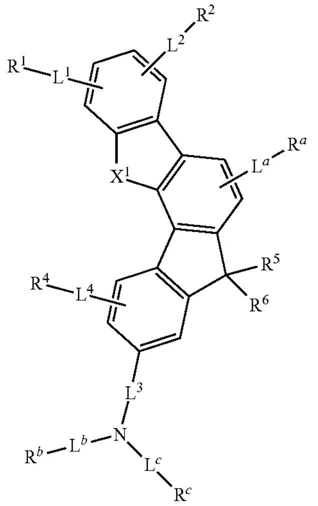

wherein, in Chemical Formula 1E-2-2, $X^1$ is O or S, $L^a$, $L^b$, $L^c$, $L^1$, $L^2$, $L^3$, and $L^4$ are each independently a single bond, a substituted or unsubstituted C6 to C20 arylene group, a substituted or unsubstituted divalent C2 to C20 heterocyclic group, or a combination thereof, provided that at least one of $L^b$ or $L^c$ is a phenylene group, $R^a$, $R^1$, $R^2$, and $R^4$ to $R^6$ are each independently hydrogen, deuterium, a cyano group, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof, $R^b$ is a substituted or unsubstituted phenyl group, a substituted or unsubstituted biphenyl group, a substituted or unsubstituted terphenyl group, a substituted or unsubstituted anthracenyl group, a substituted or unsubstituted naphthyl group, a substituted or unsubstituted phenanthrenyl group, a substituted or unsubstituted triphenylene group, a substituted or unsubstituted fluorenyl group, a substituted or unsubstituted carbazolyl group, a substituted or unsubstituted dibenzofuranyl group, or a substituted or unsubstituted dibenzothiophenyl group, and $R^c$ is a substituted or unsubstituted fluorenyl group,

[Chemical Formula 3-1a]

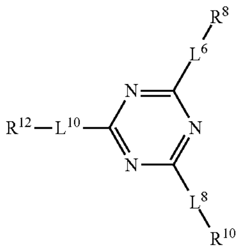

in Chemical Formula 3-1a, $L^6$ is a single bond, $L^8$ and $L^{10}$ are each independently a single bond or a substituted or unsubstituted phenylene group, $R^8$ is an unsubstituted dibenzofuranyl group or an unsubstituted dibenzothiophenyl group, $R^{10}$ and $R^{12}$ are each independently a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group, at least one of $R^{10}$ and $R^{12}$ is a substituted or unsubstituted naphthyl group, and $-L^6-R^8$ is different from $-L^8-R^{10}$, $-L^6-R^8$ is different from $-L^{10}-R^{12}$, and $-L^8-R^{10}$ is different from $-L^{10}-R^{12}$;

[Chemical Formula 3-2]

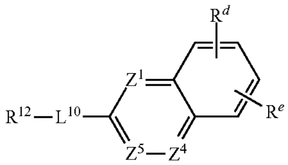

wherein, in Chemical Formula 3-2, $Z^1$ is N or $C-L^5-R^7$, $Z^4$ is N or $C-L^8-R^{10}$, $Z^5$ is N or $C-L^9-R^{11}$, at least two of $Z^1$, $Z^4$, and $Z^5$ are N, $L^5$, $L^8$, $L^9$, and $L^{10}$ are each independently a single bond, an unsubstituted C6 to C20 arylene group, a substituted or unsubstituted divalent C2 to C20 heterocyclic group, or a combination thereof, $R^7$, $R^{10}$, $R^{11}$, and $R^{12}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, at least one of $R^7$, $R^{10}$, and $R^{11}$ is independently an unsubstituted dibenzofuranyl group or an unsubstituted dibenzothiophenyl group, and $R^d$ and $R^e$ are each independently hydrogen, deuterium, a halogen, a cyano group, a C1 to C20 alkyl group, a C6 to C30 aryl group, a C2 to C30 heteroaryl group, or a combination thereof,

[Chemical Formula 3-3a]

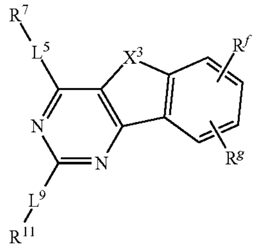

in Chemical Formula 3-3a, $X^3$ is O or S, and $L^5$ and $L^9$ are each independently a single bond, an unsubstituted C6 to C20 arylene group, a substituted or unsubstituted divalent C2 to C20 heterocyclic group, or a combination thereof, $R^7$ is an unsubstituted dibenzofuranyl group or an unsubstituted dibenzothiophenyl group, $R^{11}$ is a substituted or unsubstituted carbazolyl group, and $R^f$ and $R^g$ are each independently hydrogen, deuterium, a halogen, a cyano group, a C1 to C20 alkyl group, a C6 to C30 aryl group, a C2 to C30 heteroaryl group, or a combination thereof;

[Chemical Formula 4]

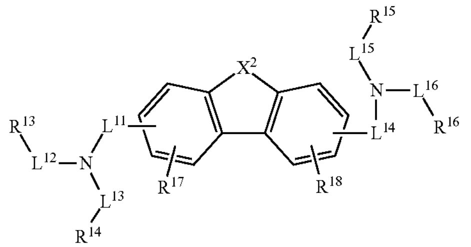

wherein, in Chemical Formula 4, $X^2$ is O or S, $L^{11}$ to $L^{16}$ are each independently a single bond, a substituted or unsubstituted C6 to C20 arylene group, a substituted or unsubstituted divalent C2 to C20 heterocyclic group, or a combination thereof, $R^{13}$ to $R^{16}$ are each independently a substituted or unsubstituted C6 to C30 aryl group, a substituted or unsubstituted C2 to C30 heterocyclic group, or a combination thereof, and $R^{17}$ and $R^{18}$ are each independently hydrogen, deuterium, a cyano group, or a substituted or unsubstituted C1 to C10 alkyl group.

2. The organic optoelectronic device as claimed in claim 1, wherein the third compound is represented by one of Chemical Formula 4-1 to Chemical Formula 4-4:

[Chemical Formula 4-1]

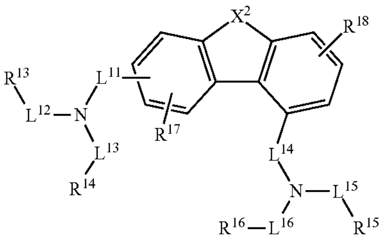

[Chemical Formula 4-2]

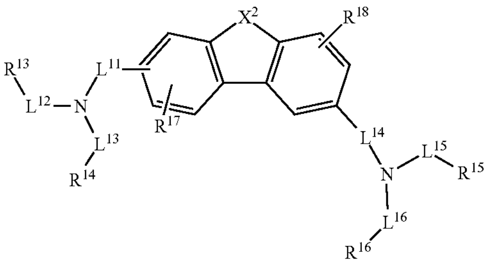

[Chemical Formula 4-3]

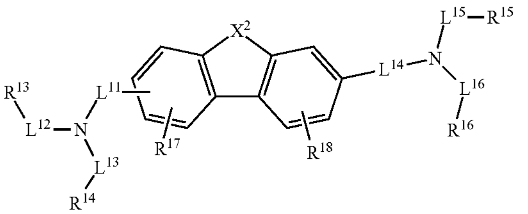

[Chemical Formula 4-4]

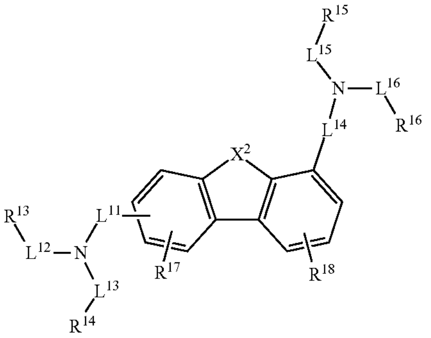

wherein, in Chemical Formula 4-1 to Chemical Formula 4-4, $X^2$ is O or S, $L^{11}$ to $L^{16}$ are each independently a single bond, a substituted or unsubstituted C6 to C20 arylene group, a substituted or unsubstituted divalent C2 to C20 heterocyclic group, or a combination thereof, $R^{13}$ to $R^{16}$ are each independently a substituted or unsubstituted C6 to C30 aryl group, a substituted or unsubstituted C2 to C30 heterocyclic group, or a combination thereof, and $R^{17}$ and $R^{18}$ are each independently hydrogen, deuterium, a cyano group, or a substituted or unsubstituted C1 to C10 alkyl group.

3. The organic optoelectronic device as claimed in claim 1, wherein the third compound is represented by one of Chemical Formula 4-2b, Chemical Formula 4-2c, Chemical Formula 4-3b, and Chemical Formula 4-3c:

[Chemical Formula 4-2b]

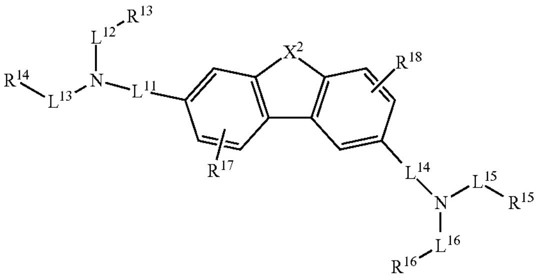

[Chemical Formula 4-2c]

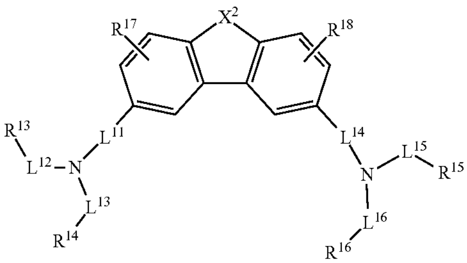

[Chemical Formula 4-3b]

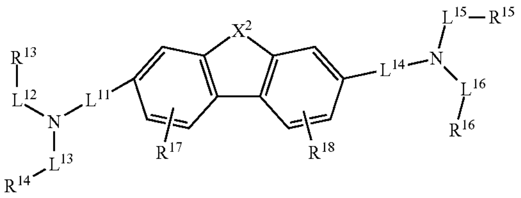

[Chemical Formula 4-3c]

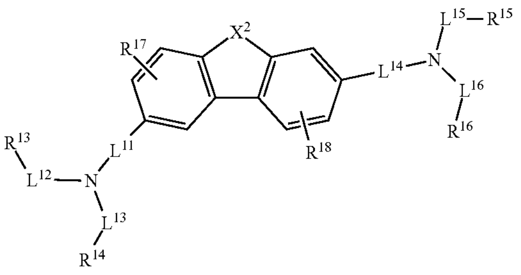

wherein, in Chemical Formula 4-2b, Chemical Formula 4-2c, Chemical Formula 4-3b, and Chemical Formula 4-3c, $X^2$ is O or S, $L^{11}$ to $L^{16}$ are each independently a single bond, a substituted or unsubstituted C6 to C20 arylene group, a substituted or unsubstituted divalent C2 to C20 heterocyclic group, or a combination thereof, $R^{13}$ to $R^{16}$ are each independently a substituted or unsubstituted C6 to C30 aryl group, a substituted or unsubstituted C2 to C30 heterocyclic group, or a combination thereof, and $R^{17}$ and $R^{18}$ are each independently hydrogen, deuterium, a cyano group, or a substituted or unsubstituted C1 to C10 alkyl group.

4. The organic optoelectronic device as claimed in claim 1, wherein:

the third compound is represented by Chemical Formula 4-2b or Chemical Formula 4-3c,

[Chemical Formula 4-2b]

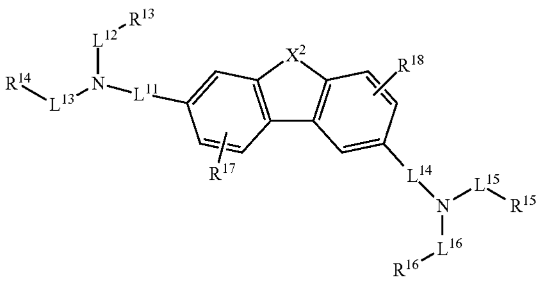

[Chemical Formula 4-3c]

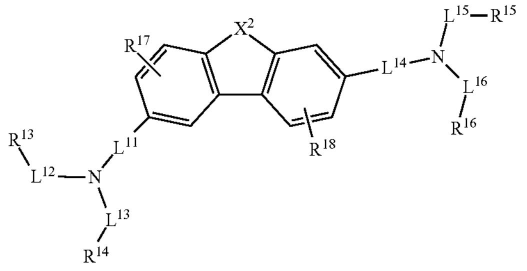

wherein, in Chemical Formula 4-2b and Chemical Formula 4-3c, $X^2$ is O or S, $L^{11}$ to $L^{16}$ are each independently a single bond, or a substituted or unsubstituted phenylene group, $R^{13}$ to $R^{16}$ are each independently a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted fluorenyl group, a substituted or unsubstituted dibenzofuranyl group, a substituted or unsubstituted dibenzothiophenyl group, a fused ring represented by a combination of Chemical Formulae 1 and 2, and $R^{17}$ and $R^{18}$ are each independently hydrogen, deuterium, a cyano group, or a substituted or unsubstituted C1 to C10 alkyl group.

5. The organic optoelectronic device as claimed in claim 1, wherein at least one of $R^{13}$ to $R^{16}$ of Chemical Formula 4 is a substituted or unsubstituted dibenzofuranyl group or a substituted or unsubstituted dibenzothiophenyl group.

6. The organic optoelectronic device as claimed in claim 1, wherein the first compound and the second compound are respectively included as a phosphorescent host of the light emitting layer.

7. The organic optoelectronic device as claimed in claim 1, wherein the light emitting layer further includes a dopant.

8. A display device comprising the organic optoelectronic device as claimed in claim 1.

9. The organic optoelectronic device as claimed in claim 1, wherein an amount of the first compound in the light emitting layer is greater than an amount of the second compound in the light emitting layer.

10. The organic optoelectronic device as claimed in claim 1, wherein the second compound is represented by Chemical Formula 3-1a.

11. The organic optoelectronic device as claimed in claim 1, wherein the second compound is represented by Chemical Formula 3-2.

* * * * *